United States Patent
Sassa

(10) Patent No.: US 8,963,422 B2
(45) Date of Patent: Feb. 24, 2015

(54) METHOD FOR MANUFACTURING ORGANIC LIGHT-EMITTING DEVICE AND ORGANIC LIGHT-EMITTING DEVICE

(75) Inventor: Shuichi Sassa, Tsukuba (JP)

(73) Assignee: Sumitomo Chemical Company, Limited, Tokyo (JP)

(*) Notice: Subject to any disclaimer, the term of this patent is extended or adjusted under 35 U.S.C. 154(b) by 0 days.

(21) Appl. No.: 13/811,004

(22) PCT Filed: Jul. 13, 2011

(86) PCT No.: PCT/JP2011/065974
§ 371 (c)(1),
(2), (4) Date: Jan. 18, 2013

(87) PCT Pub. No.: WO2012/011418
PCT Pub. Date: Jan. 26, 2012

(65) Prior Publication Data
US 2013/0112966 A1    May 9, 2013

(30) Foreign Application Priority Data

Jul. 21, 2010  (JP) .................................. 2010-164233
Jan. 31, 2011  (JP) .................................. 2011-018107

(51) Int. Cl.
*H01L 51/56* (2006.01)
*H01L 51/50* (2006.01)
(Continued)

(52) U.S. Cl.
CPC ............ *H01L 51/56* (2013.01); *H01L 51/0039* (2013.01); *H01L 51/0043* (2013.01);
(Continued)

(58) Field of Classification Search
USPC ................ 313/498–512; 257/40, 72, 98–100; 438/26–29, 34, 82; 427/66, 532–534
See application file for complete search history.

(56) References Cited

U.S. PATENT DOCUMENTS 6,195,142 B1  2/2001  Gyotoku et al.
7,940,000 B2  5/2011  Koshiyama
(Continued)

FOREIGN PATENT DOCUMENTS

JP  10-125463 A  5/1998
JP  2006-004707 A  1/2006
(Continued)

OTHER PUBLICATIONS

Tanahashi et al., Japanese patent Application Publication 2010-103040, Jun. 2010, machine translation.*
(Continued)

*Primary Examiner* — Tracie Y Green
(74) *Attorney, Agent, or Firm* — Sughrue Mion, PLLC

(57) ABSTRACT

The present invention provides a method for manufacturing an organic light-emitting device capable of simply manufacturing the organic light-emitting device without requiring a vacuum atmosphere. The manufacturing method of the present invention includes: a step of preparing a supporting substrate having an organic electroluminescent element formed thereon, the organic electroluminescent element containing an anode, a light-emitting layer, an electron injection layer made by forming a film with a solution containing an ionic polymer, and a cathode; and a step of laminating the supporting substrate and a sealing member to one another so as to seal the organic electroluminescent element.

7 Claims, 3 Drawing Sheets

(51) Int. Cl.
*H01L 51/00* (2006.01)
*H01L 51/52* (2006.01)

(52) U.S. Cl.
CPC ............ *H01L51/50* (2013.01); *H01L 51/5092* (2013.01); *H01L 51/0003* (2013.01); *H01L 51/5032* (2013.01); *H01L 51/524* (2013.01)
USPC .................. 313/512; 257/40; 257/79; 438/46

(56) References Cited

U.S. PATENT DOCUMENTS

| | | | |
|---|---|---|---|
| 2007/0090759 A1 | 4/2007 | Choi et al. | |
| 2008/0106194 A1 | 5/2008 | Logunov et al. | |
| 2010/0051902 A1* | 3/2010 | Hiura et al. | 257/13 |
| 2011/0006294 A1 | 1/2011 | Tanaka et al. | |
| 2011/0018416 A1* | 1/2011 | Sassa | 313/45 |
| 2013/0112966 A1* | 5/2013 | Sassa | 257/40 |
| 2013/0122625 A1* | 5/2013 | Sassa et al. | 438/46 |
| 2013/0183782 A1* | 7/2013 | Mima | 438/46 |
| 2013/0323871 A1* | 12/2013 | Sassa | 438/46 |

FOREIGN PATENT DOCUMENTS

| | | |
|---|---|---|
| JP | 2007-115692 A | 5/2007 |
| JP | 2007-149589 A | 6/2007 |
| JP | 2007-179783 A | 7/2007 |
| JP | 2008-117767 A | 5/2008 |
| JP | 2009-110785 A | 5/2009 |
| JP | 2009-239279 A | 10/2009 |
| JP | 2010-103040 A | 5/2010 |

OTHER PUBLICATIONS

Tanaka et al. (japanese Patent Application Publication 2009-239279, Oct. 2009, machine translation.*

* cited by examiner

METHOD FOR MANUFACTURING ORGANIC LIGHT-EMITTING DEVICE AND ORGANIC LIGHT-EMITTING DEVICE

CROSS REFERENCE TO RELATED APPLICATIONS

This application is a National Stage of International Application No. PCT/JP2011/065974 filed Jul. 13, 2011, claiming priority based on Japanese Patent Application Nos. 2010-164233 filed Jul. 21, 2010 and 2011-018107 filed Jan. 31, 2011, the contents of all of which are incorporated herein by reference in their entirety.

TECHNICAL FIELD

The present invention relates to a method for manufacturing an organic light-emitting device, and an organic light-emitting device.

BACKGROUND ART

The organic light-emitting device having an organic electroluminescent element (hereinafter may also be referred to as an organic EL element) as a light-emitting source comprises a supporting substrate, one or two or more organic EL element(s) formed on the supporting substrate, and a sealing member laminated to the supporting substrate through the organic EL element so that the organic EL element is sealed therebetween. In the above configuration, one or two or more organic EL element(s) on the supporting substrate is sealed with the supporting substrate and the sealing member to be protected from the external environment.

The organic EL element formed on the supporting substrate may be either one or two or more monochromatic organic EL element(s) or numbers of organic EL elements emitting light of each color of RGB (red, green, and blue). An organic light-emitting device having the former configuration is mainly used for a light source and an organic light-emitting device having the latter configuration is mainly used for a color display device.

The organic EL element constituting the above organic light-emitting device has a basic configuration in which a light-emitting layer of an organic light-emitting material is formed as a thin film between an anode and a cathode. In the organic EL element having such a basic configuration, when a voltage is applied between both electrodes, holes are injected from the anode and electrons are injected from the cathode. Then, the holes and the electrons are coupled with each other in the light-emitting layer to generate light emission.

It is usually difficult for the organic EL element to obtain desired characteristics with the basic configuration alone. Therefore, in addition to the light-emitting layer, a predetermined organic layer is provided. Examples of the predetermined organic layer may include a hole injection layer, a hole transport layer, an electron injection layer, and an electron transport layer.

The electron injection layer is formed conventionally by vapor-depositing an electron injecting material such as Ba, BaO, NaF and LiF in high vacuum. These electron injecting materials are unstable in air. When the formed electron injection layer is left under the air environment, the electron injection layer is easily reacted with moisture or oxygen to be chemically changed. This degradation of the electron injection layer causes a dark spot or lowering of the life in the organic light-emitting device.

In the manufacturing of the organic light-emitting device having the electron injection layer, in order to prevent the above degradation of the electron injection layer, the lamination of the sealing member is performed in a vacuum atmosphere (for example, see Patent Document 1, Patent Document 2, and Patent Document 3).

However, when the lamination of the sealing member is performed in a vacuum atmosphere, the whole system including a device for laminating the sealing member is required to be retained in vacuum, so that the device becomes enlarged and the step becomes complicated, which leads to a cause for cost-up of the organic light-emitting device.

RELATED ART DOCUMENTS

Patent Documents

Patent Document 1: JP 2006-004707 A
Patent Document 2: JP 2007-149589 A
Patent Document 3: JP 2009-110785 A

SUMMARY OF THE INVENTION

Problem to be Solved by the Invention

It is an object of the present invention to provide a method for manufacturing an organic light-emitting device capable of simply manufacturing the organic light-emitting device without requiring a vacuum atmosphere.

Means for Solving Problem

The inventors of the present invention has found that an ionic polymer having a specific structure has excellent electron injection properties and is stable even in an atmosphere at around normal pressure. The inventors of the present invention has found also that a stable electron injection layer can be obtained in an atmosphere at around normal pressure by making a film with a solution that is prepared by dissolving the ionic polymer in a solvent. The present invention has been invented based on such knowledge. The present invention provides a method for manufacturing an organic light-emitting device of the configurations below.

The "air" referred in the present invention means, according to the object of the present invention, in a broad sense, all atmospheres allowing the presence of oxygen and moisture. More specifically, the "air" includes an unadjusted air atmosphere at so-called normal temperature and pressure, and further includes an adjusted atmosphere in which the conditions such as temperature, pressure and composition are adjusted relative to the air atmosphere while oxygen and moisture are contained therein. The adjusted atmosphere has been subjected to a treatment of adjusting components such as nitrogen, hydrogen, oxygen and carbon dioxide relative to the air atmosphere or a treatment of adjusting the ratio of these components, provided that the manufacturing method of the present invention comprising "applying" can be carried out. The adjusted atmosphere may also have been adjusted in cleanliness with respect to airborne fine particles or airborne microbes. Furthermore, the adjusted atmosphere may have been adjusted in the environmental conditions such as temperature, humidity and pressure, provided that the manufacturing method of the present invention can be carried out. Usually, the pressure of the adjusted atmosphere is normal pressure of 1,013 hPa±100 hPa.

In the description below, one direction of the thickness direction of the supporting substrate may be called upper (or upper side) and another direction of the thickness direction of the supporting substrate may be called lower (or lower side). This expression of the upper-lower relationship is set for convenience of the description and is not necessarily applied to an actual step of manufacturing the organic EL element or to an actual situation in which the organic EL element is used.

[1] A method for manufacturing an organic light-emitting device, comprising the steps of:

preparing a supporting substrate having an organic electroluminescent element formed thereon, the organic electroluminescent element that comprises an anode, a light-emitting layer, an electron injection layer made by forming a film with a solution containing an ionic polymer, and a cathode; and laminating the supporting substrate and a sealing member to one another so as to seal the organic electroluminescent element.

[2] The method for manufacturing the organic light-emitting device according to [1], wherein the step of laminating the supporting substrate and the sealing member to one another is performed in an atmosphere of normal pressure.

[3] The method for manufacturing the organic light-emitting device according to [1] or [2], wherein, in the step of laminating the supporting substrate and the sealing member to one another, a curable resin adhesive is used as an adhesive member for laminating the supporting substrate and the sealing member to one another.

[4] The method for manufacturing the organic light-emitting device according to any one of [1] to [3], wherein, in the step of laminating the supporting substrate and the sealing member to one another, a fritted glass sealant is used as an adhesive member for laminating the supporting substrate and the sealing member to one another.

[5] The method for manufacturing the organic light-emitting device according to any one of [1] to [4], wherein using a first belt-shaped flexible substrate as the supporting substrate, and a second belt-shaped flexible substrate as the sealing member, and contacting the second belt-shaped flexible substrate with the organic electroluminescent element on the first belt-shaped flexible, and passing the first and second-shaped flexible substrates between two laminating rollers, thereby laminating the first and second belt-shaped flexible substrates to one another.

[6] An organic light-emitting device manufactured by the method of any one of [1] to [5].

Effect of the Invention

The present invention can provide a method for manufacturing an organic light-emitting device, capable of reducing the manufacturing cost and capable of preventing the performance degradation of the organic EL element in the manufacturing process comprising a sealing step.

EXPLANATIONS OF LETTERS OR NUMERALS

Figure 1:
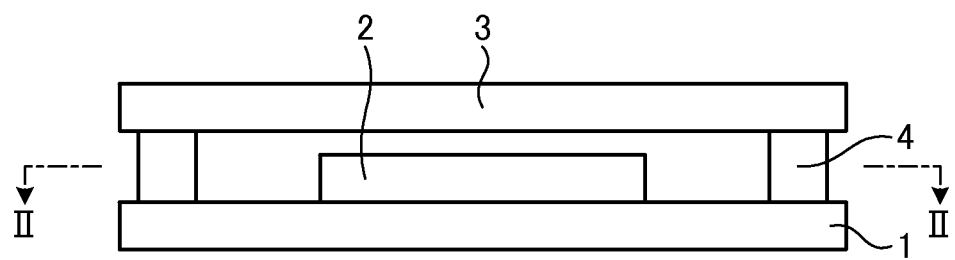
FIG. 1 is a sectional side block diagram illustrating a first embodiment of an organic light-emitting device according to the present invention.

1 Supporting substrate
2 Organic EL element
3 Sealing member
4, 4a Adhesive member
5 Getter agent
6, 6a Adhesive member
10 Organic light-emitting device
12 First belt-shaped flexible substrate (supporting substrate)
14 Second belt-shaped flexible substrate (sealing member)
90 Adhesive member
110 Continuously laminating device
120 Unwinding roll
122 First unwinding roll
124 Second unwinding roll
130 Laminating roll
132 First laminating roll
134 Second laminating roll
140 Winding roll
150 Treating device
152 Applying device
154 Drying device
160 Assistant roll Embodiments for Carrying out the Invention As described above, the method for manufacturing the organic light-emitting device of the present invention comprises the steps of: preparing a supporting substrate having an organic EL element formed thereon, the organic EL element comprising an anode, a light-emitting layer, an electron injection layer made by forming a film with a solution containing an ionic polymer, and a cathode; and laminating the supporting substrate and the sealing member to one another so as to seal the organic EL element.

Each component of the present invention will be described in detail below. First, there will be described the ionic polymer which is an electron injecting material capable of forming a stable electron injection layer in an atmosphere at around normal pressure by forming a film with a solution of the electron injecting material. The ionic polymer is stable even in air. Next, the configuration of the organic EL element will be described, and then the method for manufacturing the organic light-emitting device will be described in detail.

[Ionic Polymer]

Examples of the ionic polymer applicable to the present invention may include polymers having a structural unit comprising one or more type(s) of group selected from the group consisting of a group represented by Formula (1) below and a group represented by Formula (2) below. An embodiment of the ionic polymer may include a polymer having a structural unit comprising one or more type(s) of group selected from the group consisting of a group represented by Formula (1)

and a group represented by Formula (2) in a content of 15% by mole to 100% by mole, based on the number of moles of all structural units.

$$-(Q^1)_{n1}-Y^1(M^1)_{a1}(Z^1)_{b1} \quad (1)$$

In Formula (1), $Q^1$ represents a divalent organic group; $Y^1$ represents $-CO_2^-$, $-SO_3^-$, $-SO_2^-$, $-PO_3^{2-}$ or $-B(R^a)_{3-}$; $M^1$ represents a metal cation or an ammonium cation optionally having a substituent; $Z^1$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$; n1 represents an integer of 0 or more; a1 represents an integer of 1 or more and b1 represents an integer of 0 or more, with the proviso that a1 and b1 are selected so that the electric charge of the group represented by Formula (1) becomes 0; $R^a$ represents a $C_{1-30}$ alkyl group optionally having a substituent or a $C_{6-50}$ aryl group optionally having a substituent; when $Q^1$ is plurally present, they may be the same as or different from each other; when $M^1$ is plurally present, they may be the same as or different from each other; and when $Z^1$ is plurally present, they may be the same as or different from each other.

$$-(Q^2)_{n2}-Y^2(M^2)_{a2}(Z^2)_{b2} \quad (2)$$

In Formula (2), $Q^2$ represents a divalent organic group; $Y^2$ represents a carbo cation, an ammonium cation, a phosphonyl cation, a sulfonyl cation or an iodonium cation; $M^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$; $Z^2$ represents a metal cation or an ammonium cation optionally having a substituent; n2 represents an integer of 0 or more; a2 represents an integer of 1 or more and b2 represents an integer of 0 or more, with the proviso that a2 and b2 are selected so that the electric charge of the group represented by Formula (2) becomes 0; $R^b$ represents a $C_{1-30}$ alkyl group optionally having a substituent or a $C_{6-50}$ aryl group optionally having a substituent; when $Q^2$ is plurally present, they may be the same as or different from each other; when $M^2$ is plurally present, they may be the same as or different from each other; and when $Z^2$ is plurally present, they may be the same as or different from each other.

An embodiment of the ionic polymer used in the present invention may further include a polymer having a group represented by Formula (3) below. When the ionic polymer has the group represented by Formula (3), the group represented by Formula (3) may be contained in a structural unit of the ionic polymer. For example, the group represented by Formula (3) may be contained in the same structural unit as the structural unit comprising one or more type(s) of group selected from the group consisting of a group represented by Formula (1) and a group represented by Formula (2), or may be contained in other different structural units. An embodiment of the ionic polymer may include a polymer having a structural unit comprising at least one type selected from among a group represented by Formula (1), a group represented by Formula (2) and a group represented by Formula (3) in a content of 15% by mole to 100% by mole, based on the number of moles of all structural units.

$$-(Q^3)_{n3}-Y^3 \quad (3)$$

In Formula (3), $Q^3$ represents a divalent organic group; $Y^3$ represents $-CN$ or a group represented by any one of Formulae (4) to (12); and n3 represents an integer of 0 or more.

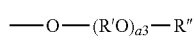

$$-O-(R'O)_{a3}-R'' \quad (4)$$

[Chemical Formula 1]

$$-R'''\!\!\begin{array}{c}-O\\ \diagdown (OR')_{a3}\end{array} \quad (5)$$

$$-S-(R'S)_{a4}-R'' \quad (6)$$

$$-C(=O)-(R'-C(=O))_{a4}-R'' \quad (7)$$

$$-C(=S)-(R'-C(=S))_{a4}-R'' \quad (8)$$

$$-N[(R')_{a4}-R'']_2 \quad (9)$$

$$-C(=O)O-(R'-C(=O)O)_{a4}-R'' \quad (10)$$

$$-C(=O)O-(R'O)_{a4}-R'' \quad (11)$$

$$-NHC(=O)-(R'NHC(=O))_{a4}-R'' \quad (12)$$

In Formula (4) to (12), R' represents a divalent hydrocarbon group optionally having a substituent; R" represents a hydrogen atom, a monovalent hydrocarbon group optionally having a substituent, $-COOH$, $-SO_3H$, $-OH$, $-SH$, $-NR^c_2$, $-CN$ or $-C(=O)NR^c_2$; R'" represents a trivalent hydrocarbon group optionally having a substituent; a3 represents an integer of 1 or more; a4 represents an integer of 0 or more; $R^c$ represents a $C_{1-30}$ alkyl group optionally having a substituent or a $C_{6-50}$ aryl group optionally having a substituent; when R' is plurally present, they may be the same as or different from each other; when R" is plurally present, they may be the same as or different from each other; and when R'" is plurally present, they may be the same as or different from each other.

The ionic polymer preferably comprises one or more type(s) of structural unit selected from the group consisting of a structural unit represented by Formula (13), a structural unit represented by Formula (15), a structural unit represented by Formula (17) and a structural unit represented by Formula (20) in a content of 15% by mole to 100% by mole, based on the number of moles of all structural units.

[Chemical Formula 2]

$$\begin{array}{c}(R^1)_{n4}\\ |\\ -(Ar^1)-\end{array} \quad (13)$$

In Formula (13), $R^1$ is a monovalent group comprising a group represented by Formula (14); $Ar^1$ represents a (2+n4) valent aromatic group optionally having a substituent other than $R^1$; n4 represents an integer of 1 or more; and when $R^1$ is plurally present, they may be the same as or different from each other.

[Chemical Formula 3]

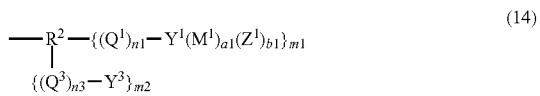

$$\begin{array}{c}-R^2-\{(Q^1)_{n1}-Y^1(M^1)_{a1}(Z^1)_{b1}\}_{m1}\\ |\\ \{(Q^3)_{n3}-Y^3\}_{m2}\end{array} \quad (14)$$

In Formula (14), $R^2$ represents a (1+m1+m2) valent organic group; $Q^1$, $Q^3$, $Y^1$, $M^1$, $Z^1$, $Y^3$, n1, a1, b1 and n3 represent the same as defined above; m1 and m2 represent independently an integer of 1 or more; when $Q^1$ is plurally present, they may be the same as or different from each other; when $Q^3$ is plurally present, they may be the same as or different from each other; when $Y^1$ is plurally present, they may be the same as or different from each other; when $M^1$ is plurally present, they may be the same as or different from each other; when $Z^1$ is plurally present, they may be the same as or different from each other; when $Y^3$ is plurally present, they may be the same as or different from each other; when n1 is plurally present, they may be the same as or different from each other; when a1 is plurally present, they may be the same as or different from each other; when b1 is plurally present, they may be the same as or different from each other; and when n3 is plurally present, they may be the same as or different from each other.

[Chemical Formula 4]

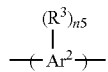

(15)

In Formula (15), $R^3$ is a monovalent group comprising a group represented by Formula (16); $Ar^2$ represents a (2+n5) valent aromatic group optionally having a substituent other than $R^3$; n5 represents an integer of 1 or more; and when $R^3$ is plurally present, they may be the same as or different from each other.

[Chemical Formula 5]

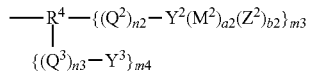

(16)

In Formula (16), $R^4$ represents a (1+m3+m4) valent organic group; $Q^2$, $Q^3$, $Y^2$, $M^2$, $Z^2$, $Y^3$, n2, a2, b2 and n3 represent the same as defined above; m3 and m4 represent independently an integer of 1 or more; when $Q^2$ is plurally present, they may be the same as or different from each other; when $Q^3$ is plurally present, they may be the same as or different from each other; when $Y^2$ is plurally present, they may be the same as or different from each other; when $M^2$ is plurally present, they may be the same as or different from each other; when $Z^2$ is plurally present, they may be the same as or different from each other; when $Y^3$ is plurally present, they may be the same as or different from each other; when n2 is plurally present, they may be the same as or different from each other; when a2 is plurally present, they may be the same as or different from each other; when b2 is plurally present, they may be the same as or different from each other; and when n3 is plurally present, they may be the same as or different from each other.

[Chemical Formula 6]

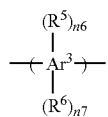

(17)

In Formula (17), $R^5$ is a monovalent group comprising a group represented by Formula (18); $R^6$ is a monovalent group comprising a group represented by Formula (19); $Ar^3$ represents a (2+n6+n7) valent aromatic group optionally having a substituent other than $R^5$ and $R^6$; n6 and n7 represent independently an integer of 1 or more; when $R^5$ is plurally present, they may be the same as or different from each other; and when $R^6$ is plurally present, they may be the same as or different from each other.

   (18)

In Formula (18), $R^7$ represents a direct bond or a (1+m5) valent organic group; $Q^1$, $Y^1$, $M^1$, $Z^1$, n1, a1 and b1 represent the same as defined above; m5 represents an integer of 1 or more; when $Q^1$ is plurally present, they may be the same as or different from each other; when $Y^1$ is plurally present, they may be the same as or different from each other; when $M^1$ is plurally present, they may be the same as or different from each other; when $Z^1$ is plurally present, they may be the same as or different from each other; when n1 is plurally present, they may be the same as or different from each other; when a1 is plurally present, they may be the same as or different from each other; and when b1 is plurally present, they may be the same as or different from each other.

   (19)

In Formula (19), $R^8$ represents a single bond or a (1+m6) valent organic group; $Y^3$ and n3 represent the same as defined above; m6 represents an integer of 1 or more, with the proviso that when $R^8$ is a single bond, m6 represents 1; when $Q^3$ is plurally present, they may be the same as or different from each other; when $Y^3$ is plurally present, they may be the same as or different from each other; and when $n^3$ is plurally present, these may be the same as or different from each other.

[Chemical Formula 7]

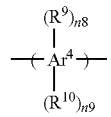

(20)

In Formula (20), $R^9$ is a monovalent group comprising a group represented by Formula (21); $R^{18}$ is a monovalent group comprising a group represented by Formula (22); $Ar^4$ represents a (2+n8+n9) valent aromatic group optionally having a substituent other than $R^9$ and $R^{18}$; n8 and n9 represent independently an integer of 1 or more; when $R^9$ is plurally present, they may be the same as or different from each other; and when $R^{18}$ is plurally present, they may be the same as or different from each other.

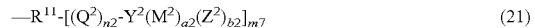   (21)

In Formula (21), $R^{11}$ represents a single bond or a (1+m7) valent organic group; $Q^2$, $Y^2$, $M^2$, $Z^2$, n2, a2 and b2 represent the same as defined above; m7 represents an integer of 1 or more, with the proviso that when $R^{11}$ is a single bond, m7 represents 1; when $Q^2$ is plurally present, they may be the same as or different from each other; when $Y^2$ is plurally present, they may be the same as or different from each other; when $M^2$ is plurally present, they may be the same as or different from each other; when $Z^2$ is plurally present, they may be the same as or different from each other; when n2 is plurally present, they may be the same as or different from each other; when a2 is plurally present, they may be the same as or different from each other; and when b2 is plurally present, they may be the same as or different from each other.

   (22)

In Formula (22), $R^{12}$ represents a single bond or a (1+m8) valent organic group; $Y^3$ and n3 represent the same as defined above; m8 represents an integer of 1 or more, with the proviso that when $R^{12}$ is a single bond, m8 represents 1; when $Q^3$ is plurally present, they may be the same as or different from each other; when $Y^3$ is plurally present, they may be the same as or different from each other; and when $n^3$ is plurally present, these may be the same as or different from each other.

The structural unit in the ionic polymer may comprise two or more types of group represented by Formula (1), two or more types of group represented by Formula (2), or two or more types of group represented by Formula (3).

Group Represented by Formula (1)

In Formula (1), examples of the divalent organic group represented by $Q^2$ may include: a $C_{1-50}$ divalent saturated hydrocarbon group optionally having a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group, and a group in which at least one hydrogen atom in these groups is substituted with a substituent; a $C_{6-50}$ alkenylene group optionally having a substituent (for example, an ethenylene group, a propenylene group, a 3-butenylene group, a 2-butenylene group, a 2-pentenylene group, a 2-hexenylene group, a 2-nonenylene group, a 2-dodecenylene group, and a group in which at least one hydrogen atom in these groups is substituted with a substituent), and a $C_{2-50}$ divalent unsaturated hydrocarbon group optionally having a substituent such as an ethynylene group; a $C_{3-50}$ divalent saturated cyclic hydrocarbon group optionally having a substituent such as a cyclopropylene group, a cyclobutylene group, a cyclopentylene group, a cyclohexylene group, a cyclononylene group, a cyclododecylene group, a norbornylene group, an adamantylene group, and a group in which at least one hydrogen atom in these groups is substituted with a substituent; a $C_{6-50}$ arylene group optionally having a substituent such as a 1,3-phenylene group, a 1,4-phenylene group, a 1,4-naphthylene group, a 1,5-naphthylene group, a 2,6-naphthylene group, a biphenyl-4,4'-diyl group, and a group in which at least one hydrogen atom in these groups is substituted with a substituent; a $C_{1-50}$ alkyleneoxy group optionally having a substituent such as a methyleneoxy group, an ethyleneoxy group, a propyleneoxy group, a butyleneoxy group, a pentyleneoxy group, a hexyleneoxy group, and a group in which at least one hydrogen atom in these groups is substituted with a substituent; an imino group having a substituent containing a carbon atom; and a silylene group having a substituent containing a carbon atom. From the viewpoint of simplicity of synthesis of a monomer becoming a raw material for the ionic polymer (hereinafter referred to as a "raw material monomer"), the divalent organic group represented by $Q^1$ is preferably a divalent saturated hydrocarbon group, an arylene group, and an alkyleneoxy group.

Examples of the above substituent may include an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, a halogen atom, an acyl group, an acyloxy group, an imine residue, an amido group, an acid imido group, a monovalent heterocyclic group, a hydroxy group, a carboxyl group, a substituted carboxyl group, a cyano group and a nitro group. When the substituent is plurally present, they may be the same as or different from each other. Among these substituents, substituents other than an amino group, a silyl group, a halogen atom, a hydroxy group and a nitro group contain a carbon atom.

Hereinafter, the substituent is described in detail. The term "$C_{m-n}$" (m and n are a positive integer satisfying m<n) represents that the number of carbon atoms of the organic group described after this term is m to n. For example, a $C_{m-n}$ alkyl group represents an alkyl group in which the number of carbon atoms is m to n; a $C_{m-n}$ alkylaryl group represents an alkylaryl group in which the number of carbon atoms of the alkyl group is m to n; and an aryl-$C_{m-n}$ alkyl group represents an arylalkyl group in which the number of carbon atoms of the alkyl group is m to n.

The alkyl group may be linear or branched. The alkyl group may also be a cycloalkyl group. The alkyl group has usually 1 to 20 carbon atoms, preferably 1 to 10 carbon atoms. Examples of the alkyl group may include a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group and a dodecyl group. A hydrogen atom in the alkyl group may be substituted with a fluorine atom. Examples of such a fluorine atom-substituted alkyl group may include a trifluoromethyl group, a pentafluoroethyl group, a perfluorobutyl group, a perfluorohexyl group, and a perfluorooctyl group. Examples of the $C_{1-12}$ alkyl group may include a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group and a dodecyl group.

The alkoxy group may be linear or branched. The alkoxy group may also be a cycloalkyloxy group. The alkoxy group may have a substituent. The alkoxy group has usually 1 to 20 carbon atoms, preferably 1 to 10 carbon atoms. Examples of the alkoxy group may include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a nonyloxy group, a decyloxy group and a dodecyloxy group. A hydrogen atom in the alkoxy group may be substituted with a fluorine atom. Examples of such a fluorine atom-substituted alkoxy group may include a trifluoromethoxy group, a pentafluoroethoxy group, a perfluorobutoxy group, a perfluorohexyloxy group and a perfluorooctyloxy group. Examples of the alkoxy group may also include a methoxymethyloxy group and a 2-methoxyethyloxy group. Examples of the $C_{1-12}$ alkoxy group include a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group and a dodecyloxy group.

The alkylthio group may be linear or branched. The alkylthio group may also be a cycloalkylthio group. The alkylthio group may have a substituent. The alkylthio group has usually 1 to 20 carbon atoms, preferably 1 to 10 carbon atoms. Examples of the alkylthio group may include a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a nonylthio group, a decylthio group and a dodecylthio group. A hydrogen atom in the alkylthio group may be substituted with a fluorine atom. Examples of such a fluorine atom-substituted alkylthio group may include a trifluoromethylthio group.

The aryl group is an atomic group remaining after removing one hydrogen atom that is bonded to a carbon atom constituting an aromatic ring from an aromatic hydrocarbon, and also includes a group having a benzene ring, a group having a fused ring, and a group in which two or more independent benzene rings or fused rings are bonded through a single bond or a divalent organic group (for example, an alkenylene group such as a vinylene group). The aryl group has usually 6 to 60 carbon atoms, preferably 7 to 48 carbon atoms. Examples of the aryl group may include a phenyl group, a $C_{1-12}$ alkoxyphenyl group, a $C_{1-12}$ alkylphenyl group, a 1-naphthyl group, a 2-naphthyl group, a 1-anthracenyl group, a 2-anthracenyl group and a 9-anthracenyl group. A hydrogen atom in the aryl group may be substituted with a fluorine atom. Examples of such a fluorine atom-substituted aryl group may include a pentafluorophenyl group. Among them, a $C_{1-12}$ alkoxyphenyl group and a $C_{1-12}$ alkylphenyl group are preferred.

Among the aryl groups, examples of the $C_{1-12}$ alkoxyphenyl group may include a methoxyphenyl group, an ethoxyphenyl group, a propyloxyphenyl group, an isopropyloxyphenyl group, a butoxyphenyl group, an isobutoxyphenyl group, a sec-butoxyphenyl group, a tert-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group and a dodecyloxyphenyl group.

Among the aryl groups, examples of the $C_{1-12}$ alkylphenyl group may include a methylphenyl group, an ethylphenyl group, a dimethylphenyl group, a propylphenyl group, a mesityl group, a methylethylphenyl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group and a dodecylphenyl group.

The aryloxy group has usually 6 to 60 carbon atoms, preferably 7 to 48 carbon atoms. Examples of the aryloxy group may include a phenoxy group, a $C_{1-12}$ alkoxyphenoxy group, a $C_{1-12}$ alkylphenoxy group, a 1-naphthyloxy group, a 2-naphthyloxy group and a pentafluorophenyloxy group. Among them, a $C_{1-12}$ alkoxyphenoxy group and a $C_{1-12}$ alkylphenoxy group are preferred.

Among the aryloxy groups, examples of the $C_{1-12}$ alkoxyphenoxy group may include a methoxyphenoxy group, an ethoxyphenoxy group, a propyloxyphenoxy group, an isopropyloxyphenoxy group, a butoxyphenoxy group, an isobutoxyphenoxy group, a sec-butoxyphenoxy group, a tert-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group and a dodecyloxyphenoxy group.

Among the aryloxy groups, examples of the $C_{1-12}$ alkylphenoxy group may include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a sec-butylphenoxy group, a tert-butylphenoxy group, a pentylphenoxy group, an isoamylphenoxy group, a hexylphenoxy group, a heptylphenoxy group, an octylphenoxy group, a nonylphenoxy group, a decylphenoxy group and a dodecylphenoxy group.

The arylthio group is, for example, a group in which a sulfur atom is bonded to the above aryl group. The arylthio group may have a substituent on an aromatic ring of an aryl group. The arylthio group has usually 6 to 60 carbon atoms, preferably 6 to 30 carbon atoms. Examples of the arylthio group may include a phenylthio group, a $C_{1-12}$ alkoxyphenylthio group, a $C_{1-12}$ alkylphenylthio group, a 1-naphthylthio group, a 2-naphthylthio group and a pentafluorophenylthio group.

The arylalkyl group is, for example, a group in which the above alkyl group is bonded to the above aryl group. The arylalkyl group may have a substituent. The arylalkyl group has usually 7 to 60 carbon atoms, preferably 7 to 30 carbon atoms. Examples of the arylalkyl group may include a phenyl-$C_{1-12}$ alkyl group, a $C_{1-12}$ alkoxyphenyl-$C_{1-12}$ alkyl group, a $C_{1-12}$ alkylphenyl-$C_{1-12}$ alkyl group, a 1-naphthyl-$C_{1-12}$ alkyl group, and a 2-naphthyl-$C_{1-12}$ alkyl group.

The arylalkoxy group is, for example, a group in which the above alkoxy group is bonded to the above aryl group. The arylalkoxy group may have a substituent. The arylalkoxy group has usually 7 to 60 carbon atoms, preferably 7 to 30 carbon atoms. Examples of the arylalkoxy group may include a phenyl-$C_{1-12}$ alkoxy group, a $C_{1-12}$ alkoxyphenyl-$C_{1-12}$ alkoxy group, a $C_{1-12}$ alkylphenyl-$C_{1-12}$ alkoxy group, a 1-naphthyl-$C_{1-12}$ alkoxy group and a 2-naphthyl-$C_{1-12}$ alkoxy group.

The arylalkylthio group is, for example, a group in which the above alkylthio group is bonded to the above aryl group. The arylalkylthio group may have a substituent. The arylalkylthio group has usually 7 to 60 carbon atoms, preferably 7 to 30 carbon atoms. Examples of the arylalkylthio group may include a phenyl-$C_{1-12}$ alkylthio group, a $C_{1-12}$ alkoxyphenyl-$C_{1-12}$ alkylthio group, a $C_{1-12}$ alkylphenyl-$C_{1-12}$ alkylthio group, a 1-naphthyl-$C_{1-12}$ alkylthio group, and a 2-naphthyl-$C_{1-12}$ alkylthio group.

The arylalkenyl group is, for example, a group in which an alkenyl group is bonded to the above aryl group. The arylalkenyl group has usually 8 to 60 carbon atoms, preferably 8 to 30 carbon atoms. Examples of the arylalkenyl group may include a phenyl-$C_{2-12}$ alkenyl group, a $C_{1-12}$ alkoxyphenyl-$C_{2-12}$ alkenyl group, a $C_{1-12}$ alkylphenyl-$C_{2-12}$ alkenyl group, a 1-naphthyl-$C_{2-12}$ alkenyl group and a 2-naphthyl-$C_{2-12}$ alkenyl group. Among them, a $C_{1-12}$ alkoxyphenyl-$C_2$-$C_{12}$ alkenyl group and a $C_{2-12}$ alkylphenyl-$C_{2-12}$ alkenyl group are preferred. Examples of the $C_{2-12}$ alkenyl group may include a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group and a 1-octenyl group.

The arylalkynyl group is, for example, a group in which an alkynyl group is bonded to the above aryl group. The arylalkynyl group has usually 8 to 60 carbon atoms, preferably 8 to 30 carbon atoms. Examples of the arylalkynyl group may include a phenyl-$C_{2-12}$ alkynyl group, a $C_{1-12}$ alkoxyphenyl-$C_{2-12}$ alkynyl group, a $C_{1-12}$ alkylphenyl-$C_{2-12}$ alkynyl group, a 1-naphthyl-$C_{2-12}$ alkynyl group and a 2-naphthyl-$C_{2-12}$ alkynyl group. Among them, a $C_{1-12}$ alkoxyphenyl-$C_{2-12}$ alkynyl group and a $C_{1-12}$ alkylphenyl-$C_{2-12}$ alkynyl group are preferred. Examples of the $C_{2-12}$ alkynyl group may include an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group and a 1-octynyl group.

The substituted amino group is preferably an amino group in which at least one hydrogen atom in an amino group is substituted with one or two group(s) selected from the group consisting of an alkyl group, an aryl group, an arylalkyl group and a monovalent heterocyclic group. The alkyl group, the aryl group, the arylalkyl group and the monovalent heterocyclic group may further have a substituent (also referred to as a second substituent. Examples of the second substituent are the same as those of the substituent). The substituted amino group has usually 1 to 60 carbon atoms, preferably 2 to 48 carbon atoms, without including the number of carbon atoms of the second substituent. Examples of the substituted amino group may include a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a dodecylamino group, a cyclopentylamino group, a dicyclopentylamino group, a cyclohexylamino group, a dicyclohexylamino group, a ditrifluoromethylamino group, a phenylamino group, a diphenylamino group, a ($C_{1-12}$ alkoxyphenyl)amino group, a di($C_{1-12}$ alkoxyphenyl)amino group, a di($C_{1-12}$ alkylphenyl)amino group, a 1-naphthylamino group, a 2-naphthylamino group, a pentafluorophenylamino group, a pyridylamino group, a pyridazinylamino group, a pyrimidinylamino group, a pyrazinylamino group, a triazinylamino group, a (phenyl-$C_{1-12}$ alkyl)amino group, a ($C_{1-12}$ alkoxyphenyl-$C_{1-12}$ alkyl)amino group, a ($C_{1-12}$ alkylphenyl-$C_{1-12}$ alkyl)amino group, a di($C_{1-12}$ alkoxyphenyl-$C_{1-12}$ alkyl)amino group, a di($C_{1-12}$ alkylphenyl-$C_{1-12}$ alkyl)amino group, a 1-naphthyl-$C_{1-12}$ alkylamino group and a 2-naphthyl-$C_{1-12}$ alkylamino group.

Examples of the substituted silyl group are preferably a silyl group in which at least one hydrogen atom in a silyl group is substituted with one to three group(s) selected from the group consisting of an alkyl group, an aryl group, an arylalkyl group and a monovalent heterocyclic group. The alkyl group, the aryl group, the arylalkyl group and the monovalent heterocyclic group may further have a substituent (also referred to as a second substituent. Examples of the second substituent are the same as those of the substituent). The substituted silyl group has usually 1 to 60 carbon atoms, preferably 3 to 48 carbon atoms, without including the number of carbon atoms of the second substituent. Examples of the substituted silyl group may include a trimethylsilyl group, a triethylsilyl group, a tripropylsilyl group, a triisopropylsilyl group, an isopropyldimethylsilyl group, an isopropyldiethylsilyl group, a tert-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a dodecyldimethylsilyl group, a (phenyl-$C_{1-12}$ alkyl)silyl group, a ($C_{1-12}$ alkoxyphenyl-$C_{1-12}$ alkyl)silyl group, a ($C_{1-12}$ alkylphenyl-$C_{1-12}$ alkyl)silyl group, a (1-naphthyl-$C_{1-12}$ alkyl)silyl group, a (2-naphthyl-$C_{1-12}$ alkyl)silyl group, a (phenyl-$C_{1-12}$ alkyl)dimethylsilyl group, a triphenylsilyl group, a tri(p-xylyl)silyl group, a tribenzylsilyl group, a diphenylmethylsilyl group, a tert-butyldiphenylsilyl group and a dimethylphenylsilyl group.

Examples of the halogen atom may include a fluorine atom, a chlorine atom, a bromine atom and an iodine atom.

The acyl group has usually 2 to 20 carbon atoms, preferably 2 to 18 carbon atoms. Examples of the acyl group may include an acetyl group, a propionyl group, a butyryl group, an isobutyryl group, a pivaloyl group, a benzoyl group, a trifluoroacetyl group and a pentafluorobenzoyl group.

The acyloxy group has usually 2 to 20 carbon atoms, preferably 2 to 18 carbon atoms. Examples of the acyloxy group may include an acetoxy group, a propionyloxy group, a butyryloxy group, an isobutyryloxy group, a pivaloyloxy group, a benzoyloxy group, a trifluoroacetyloxy group and a pentafluorobenzoyloxy group.

The imine residue means a residue remaining after removing one hydrogen atom from an imine compound having a structure represented by at least any one of a formula: H—N=C< and a formula: —N=CH—. Examples of such an imine compound may include aldimine; ketimine; and a compound in which a hydrogen atom bonded to a nitrogen atom in aldimine is substituted with a group such as an alkyl group, an aryl group, an arylalkyl group, an arylalkenyl group and an arylalkynyl group. The imine residue has usually 2 to 20 carbon atoms, preferably 2 to 18 carbon atoms. Examples of the imine residue may include a group represented by a general formula: —CR$^\beta$=N—R$^\gamma$ or a general formula: —N=C(R$^7$)$_2$, wherein R$^\beta$ represents a hydrogen atom, an alkyl group, an aryl group, an arylalkyl group, an arylalkenyl group or an arylalkynyl group; R$^\gamma$ represents an alkyl group, an aryl group, an arylalkyl group, an arylalkenyl group or an arylalkynyl group. In the latter general formula, two R$^\gamma$ may be the same as or different from each other. The two R$^\gamma$ may be combined with each other to form a divalent group (e.g., a $C_{2-18}$ alkylene group such as an ethylene group, a trimethylene group, a tetramethylene group, a pentamethylene group and a hexamethylene group), and then may be integrated with the carbon atom bonded to the nitrogen atom to form a ring. Examples of the imine residue may include the following groups.

[Chemical Formula 8]

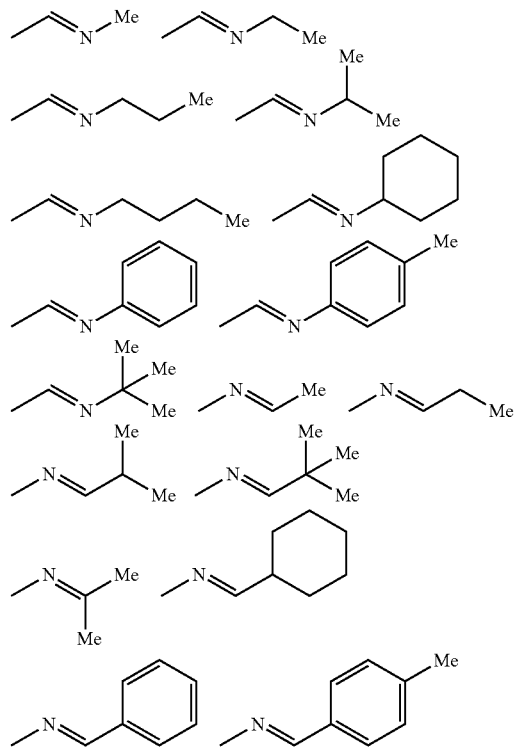

-continued

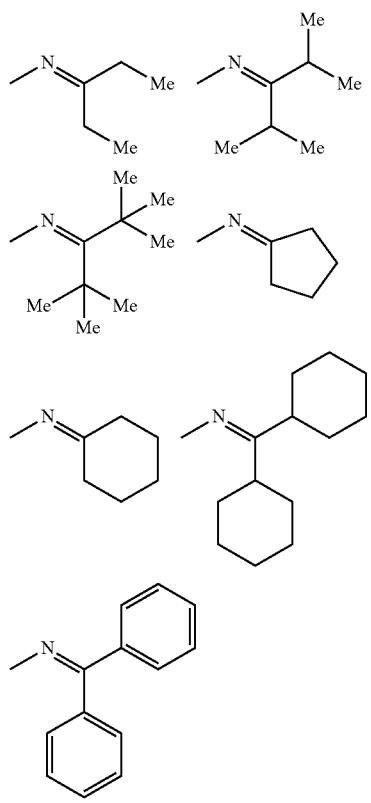

In the formulae, Me indicates a methyl group, the same shall apply hereinafter.

The amido group has usually 1 to 20 carbon atoms, preferably 2 to 18 carbon atoms. Examples of the amido group may include a formamido group, an acetamido group, a propioamido group, a butyroamido group, a benzamido group, a trifluoroacetamido group, a pentafluorobenzamido group, a diformamido group, a diacetamido group, a dipropioamido group, a dibutyroamido group, a dibenzamido group, a ditrifluoroacetamido group and a dipentafluorobenzamido group.

The acid imido group is a residue obtained by removing a hydrogen atom that is bonded to a nitrogen atom from an acid imide. The acid imido group has usually 4 to 20 carbon atoms, preferably 4 to 18 carbon atoms. Examples of the acid imido group may include the following groups.

[Chemical Formula 9]

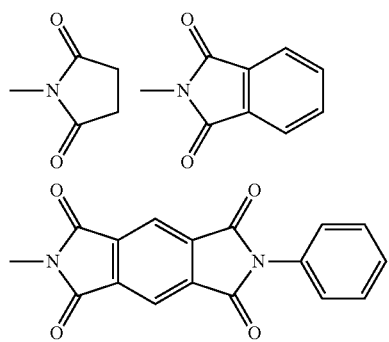

-continued

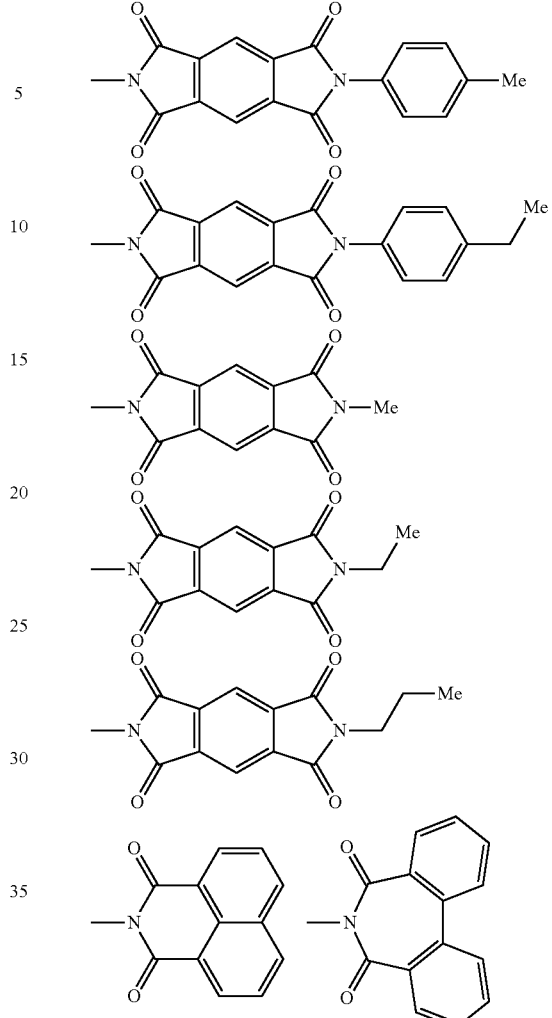

The monovalent heterocyclic group refers to an atomic group remaining after removing one hydrogen atom from a heterocyclic compound. Here, the heterocyclic compound refers to an organic compound containing not only a carbon atom, but also a hetero atom such as an oxygen atom, a sulfur atom, a nitrogen atom, a phosphorus atom, a boron atom, a silicon atom, a selenium atom, a tellurium atom and an arsenic atom as an element constituting the ring, among organic compounds having a cyclic structure. The monovalent heterocyclic group may have a substituent. The monovalent heterocyclic group has usually 3 to 60 carbon atoms, preferably 3 to 20 carbon atoms. The number of carbon atoms of the monovalent heterocyclic group does not include the number of carbon atoms of the substituent. Examples of such a monovalent heterocyclic group may include a thienyl group, a $C_{1-12}$ alkylthienyl group, a pyrrolyl group, a furyl group, a pyridyl group, a $C_{1-12}$ alkylpyridyl group, a pyridazinyl group, a pyrimidyl group, a pyrazinyl group, a triazinyl group, a pyrrolidyl group, a piperidyl group, a quinolyl group and an isoquinolyl group. Among them, a thienyl group, a $C_{1-12}$ alkylthienyl group, a pyridyl group and a $C_{1-12}$ alkylpyridyl group are preferred. The monovalent heterocyclic group is preferably a monovalent aromatic heterocyclic group.

The substituted carboxyl group is a group in which a hydrogen atom in a carboxyl group is substituted with an alkyl group, an aryl group, an arylalkyl group or a monovalent heterocyclic group, that is, a group represented by a formula: —C(=O)OR* wherein R* is an alkyl group, an aryl group, an arylalkyl group or a monovalent heterocyclic group. The substituted carboxyl group has usually 2 to 60 carbon atoms, preferably 2 to 48 carbon atoms. The alkyl group, the aryl group, the arylalkyl group and the monovalent heterocyclic group may have a substituent (also referred to as a second substituent. Examples of the second substituent are the same as those of the substituent). Here, the above number of carbon atoms does not include the number of carbon atoms of the second substituent. Examples of the substituted carboxyl group may include a methoxycarbonyl group, an ethoxycarbonyl group, a propoxycarbonyl group, an isopropoxycarbonyl group, a butoxycarbonyl group, an isobutoxycarbonyl group, a sec-butoxycarbonyl group, a tert-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyoxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group and a pyridyloxycarbonyl group.

In Formula (1), $Y^1$ represents a monovalent group such as —$CO_2^-$, —$SO_3^-$, —$SO_2^-$, —$PO_3^-$ or —$B(R^a)_3^-$. From the viewpoint of the acidity of the ionic polymer, $Y^1$ is preferably —$CO_2^-$, —$SO_2^-$ or —$PO_3^-$, more preferably –$CO_2^-$. From the viewpoint of the stability of the ionic polymer, $Y^1$ is preferably —$CO_2^-$, —$SO_3^-$, —$SO_2^-$ or —$PO_3^-$.

In Formula (1), $M^1$ represents a metal cation or an ammonium cation optionally having a substituent. The metal cation is preferably a monovalent, divalent, or trivalent ion.

Examples of the metal cation include an ion of Li, Na, K, Cs, Be, Mg, Ca, Ba, Ag, Al, Bi, Cu, Fe, Ga, Mn, Pb, Sn, Ti, V, W, Y, Yb, Zn, Zr, or the like. Among them, $Li^+$, $Na^+$, $K^+$, $Cs^+$, $Ag^+$, $Mg^{2+}$ and $Ca^{2+}$ are preferred. Examples of the substituent that the ammonium cation may have include a $C_{1-10}$ alkyl group such as a methyl group, an ethyl group, a propyl group, an isopropyl group, a n-butyl group, an i-butyl group and a tert-butyl group.

In Formula (1), $Z^2$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$.

In Formula (1), n1 represents an integer of 0 or more. From the viewpoint of the synthesis of the raw material monomer, n1 is preferably an integer of 0 to 8, more preferably an integer of 0 to 2.

In Formula (1), a1 represents an integer of 1 or more and b1 represents an integer of 0 or more.

The above a1 and b1 are selected so that the electric charge of the group represented by Formula (1) becomes 0. For example, when $Y^1$ is -$CO_2^-$, —$SO_3^-$, —$SO_2^-$, —$PO_3^-$, or —$B(R^a)_3^-$; $M^1$ is a monovalent metal cation or an ammonium cation optionally having a substituent; and $Z^1$ is $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$, a1 and b1 are selected so as to satisfy a1=b1+1. When $Y^1$ is -$CO_2^-$, —$SO_3^-$, —$SO_2^-$, —$PO_3^-$ or —$B(R^a)_3^-$; $M^1$ is a divalent metal cation; and $Z^1$ is $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$, a1 and b1 are selected so as to satisfy b1=2×a1-1. When $Y^1$ is -$CO_2^-$, —$SO_3^-$, —$SO_2^-$, —$PO_3^-$ or —$B(R^a)_3^-$; $M^1$ is a trivalent metal cation; and $Z^1$ is $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$, a1 and b1 are selected so as to satisfy b1=3×a1-1. When $Y^1$ is -$CO_2^-$, —$SO_3^-$, —$SO_2^-$, —$PO_3^-$ or —$B(R^a)_3^-$; $M^1$ is a monovalent metal cation or an ammonium cation optionally having a substituent; and $Z^1$ is $SO_4^{2-}$ or $HPO_4^{2-}$, a1 and b1 are selected so as to satisfy a1=2×b1+1. In any one of the above numerical formulae expressing the relationship between a1 and b1, a1 is preferably an integer of 1 to 5, more preferably 1 or 2.

$R^a$ represents a $C_{1-30}$ alkyl group optionally having a substituent or a $C_{6-50}$ aryl group optionally having a substituent. Examples of the substituent that these groups may have include the same substituent exemplified in the description with respect to $Q^1$. When the substituent is plurally present, they may be the same as or different from each other. Examples of $R^a$ may include a $C_{1-20}$ alkyl group such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group and a dodecyl group; and a $C_{6-30}$ aryl group such as a phenyl group, a 1-naphthyl group, a 2-naphthyl group, a 1-anthracenyl group, a 2-anthracenyl group and a 9-anthracenyl group.

Examples of the group represented by Formula (1) may include the following groups.

[Chemical Formula 10]

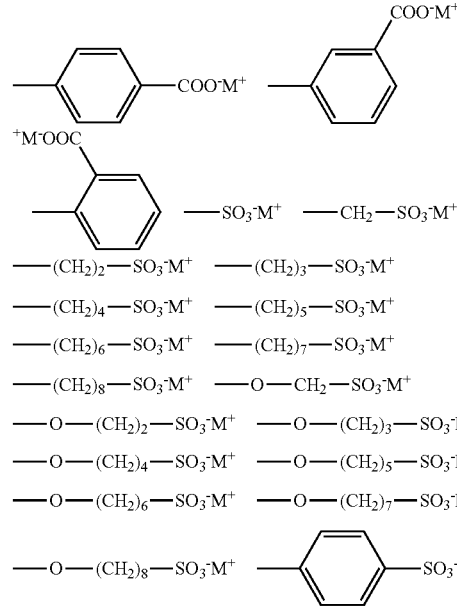

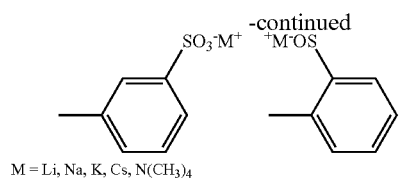

M = Li, Na, K, Cs, N(CH₃)₄

Group Represented by Formula (2)

In Formula (2), examples of the divalent organic group represented by $Q^2$ may include the same group as the group exemplified with respect to the divalent organic group represented by $Q^1$. From the viewpoint of simplicity of synthesis of the raw material monomer, the divalent organic group represented by $Q^2$ is preferably a divalent saturated hydrocarbon group, an arylene group and an alkyleneoxy group.

The group exemplified for the divalent organic group represented by $Q^2$ may have a substituent. Examples of the substituent may include the same as the substituent exemplified in the description with respect to $Q^1$. When the substituent is plurally present, they may be the same as or different from each other.

In Formula (2), $Y^2$ represents a carbo cation, an ammonium cation, a phosphonyl cation, a sulfonyl cation or an iodonium cation.

Examples of the carbo cation may include a group represented by

—C⁺R₂ wherein two R may be the same as or different from each other and represent independently an alkyl group or an aryl group.

Examples of the ammonium cation may include a group represented by

—N⁺R₃ wherein two R may be the same as or different from each other and represent independently an alkyl group or an aryl group.

Examples of the phosphonyl cation may include a group represented by

—P⁺R₃ wherein two R may be the same as or different from each other and represent independently an alkyl group or an aryl group.

Examples of the sulfonyl cation may include a group represented by

—S⁺R₂ wherein two R may be the same as or different from each other and represent independently an alkyl group or an aryl group).

Examples of the iodonium cation may include a group represented by

—I⁺R₂ wherein two R may be the same as or different from each other and represent independently an alkyl group or an aryl group.

In Formula (2), $Y^2$ is preferably a carbo cation, an ammonium cation, a phosphonyl cation or a sulfonyl cation, more preferably an ammonium cation, from the viewpoints of simplicity of synthesis of the raw material monomer, and the stability of the raw material monomer and the ionic polymer against air, moisture and heat.

In Formula (2), $Z^2$ represents a metal cation or an ammonium cation optionally having a substituent. The metal cation is preferably a monovalent, divalent, or trivalent ion. Examples of the metal cation may include an ion of Li, Na, K, Cs, Be, Mg, Ca, Ba, Ag, Al, Bi, Cu, Fe, Ga, Mn, Pb, Sn, Ti, V, W, Y, Yb, Zn, Zr, or the like. Examples of the substituent that the ammonium cation may have include a $C_{1-10}$ alkyl group such as a methyl group, an ethyl group, a propyl group, an isopropyl group, a n-butyl group, an isobutyl group and a tert-butyl group.

In Formula (2), $M^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$.

In Formula (2), n2 represents an integer of 0 or more. n2 represents preferably an integer of 0 to 6, more preferably an integer of 0 to 2.

In Formula (2), a2 represents an integer of 1 or more and b2 represents an integer of 0 or more.

The above a2 and b2 are selected so that the electric charge of the group represented by Formula (2) becomes 0. For example, in the case where $M^2$ is $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$: when $Z^2$ is a monovalent metal ion or an ammonium ion optionally having a substituent, a2 and b2 are selected so as to satisfy a2=b2+1; when $Z^2$ is a divalent metal ion, a2 and b2 are selected so as to satisfy a2=2×b2+1; and when $Z^2$ is a trivalent metal ion, a2 and b2 are selected so as to satisfy a2=3×b2+1. In the case where $M^2$ is $SO_4^{2-}$ or $HPO_4^{2-}$: when $Z^2$ is a monovalent metal ion or an ammonium ion optionally having a substituent, a2 and b2 are selected so as to satisfy b2=2×a2−1; and when $Z^2$ is a trivalent metal ion, a2 and b2 are selected so as to satisfy the relationship of 2×a2=3×b2+1. In any one of the above numerical formulae expressing the relationship between a2 and b2, a2 is preferably an integer of 1 to 3, more preferably 1 or 2.

$R^b$ represents a $C_{1-30}$ alkyl group optionally having a substituent or a $C_{6-50}$ aryl group optionally having a substituent. Examples of the substituent that these groups may have include the same as the substituent exemplified in the description with respect to $Q^1$. When the substituent is plurally present, they may be the same as or different from each other. Examples of $R^b$ may include a $C_{1-20}$ alkyl group such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group and a dodecyl group; and a $C_{6-30}$ aryl group such as a phenyl group, a 1-naphthyl group, a 2-naphthyl group, a 1-anthracenyl group, a 2-anthracenyl group and a 9-anthracenyl group.

Examples of the group represented by Formula (2) may include the following groups.

[Chemical Formula 12]

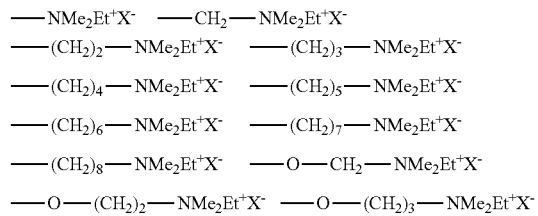

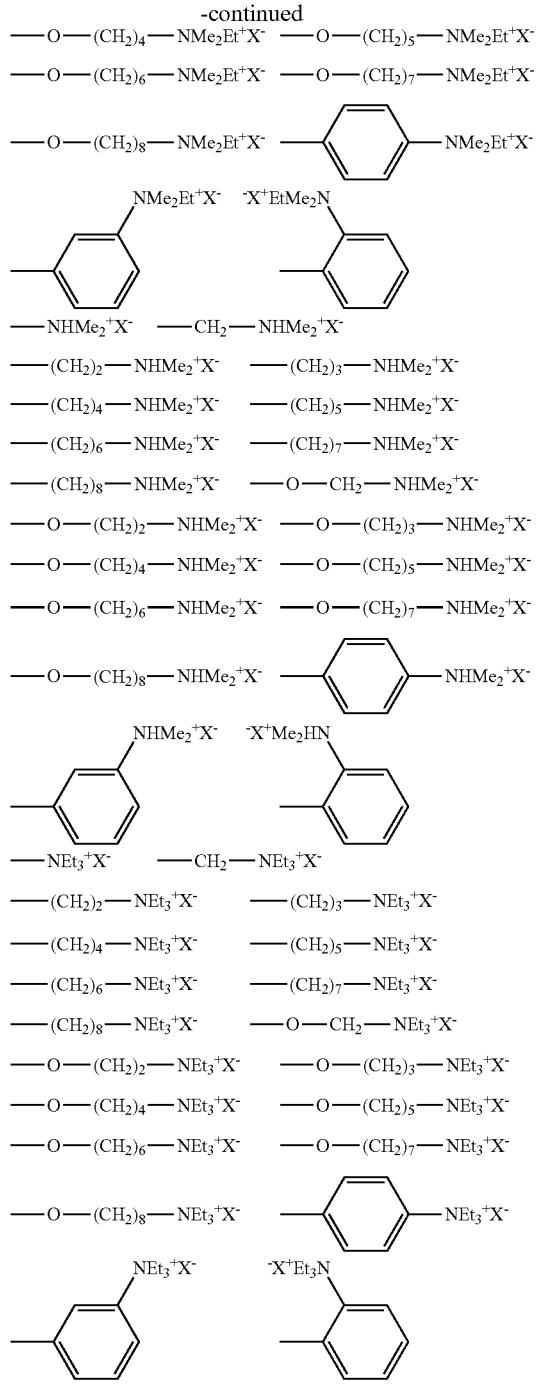
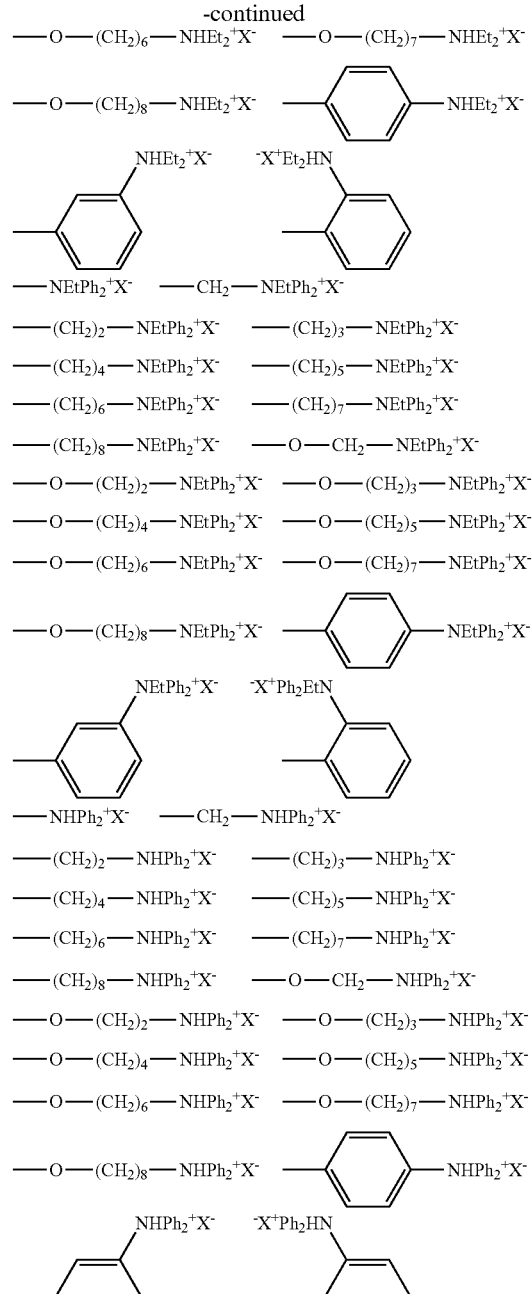
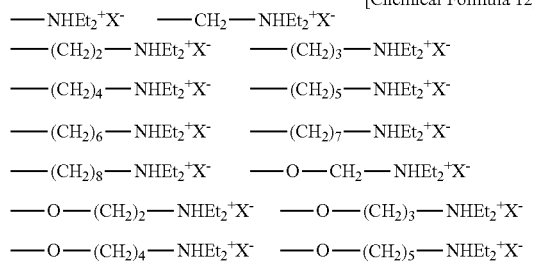

Group Represented by Formula (3)

In Formula (3), examples of the divalent organic group represented by $Q^3$ may include the same as the group exemplified with respect to the divalent organic group represented by $Q^1$. From the viewpoint of simplicity of synthesis of the raw material monomer, the divalent organic group represented by $Q^3$ is preferably a divalent saturated hydrocarbon group, an arylene group and an alkyleneoxy group.

The group exemplified for the divalent organic group represented by $Q^3$ may have a substituent. Examples of the substituent may include the same as the substituent exemplified in the description with respect to $Q^1$. When the substituent is plurally present, they may be the same as or different from each other.

The divalent organic group represented by $Q^3$ is preferably a group represented by —$(CH_2)$—.

n3 represents an integer of 0 or more, preferably an integer of 0 to 20, more preferably an integer of 0 to 8.

In Formula (3), $Y^3$ represents —CN or a group represented by any one of Formulae (4) to (12).

In Formulae (4) to (12), examples of the divalent hydrocarbon group represented by R' may include: a $C_{1-50}$ divalent saturated hydrocarbon group optionally having a substituent such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group, a 1,12-dodecylene group and a group in which at least one hydrogen atom in these groups is substituted with a substituent; a $C_{2-50}$ divalent unsaturated hydrocarbon group optionally having a substituent, e.g., a $C_{2-50}$ alkenylene group optionally having a substituent such as an ethenylene group, a propenylene group, a 3-butenylene group, a 2-butenylene group, a 2-pentenylene group, a 2-hexenylene group, a 2-nonenylene group, a 2-dodecenylene group and a group in which at least one hydrogen atom in these groups is substituted with a substituent, and an ethynylene group; a $C_{3-50}$ divalent saturated cyclic hydrocarbon group optionally having a substituent such as a cyclopropylene group, a cyclobutylene group, a cyclopentylene group, a cyclohexylene group, a cyclononylene group, a cyclododecylene group, a norbornylene group, an adamantylene group and a group in which at least one hydrogen atom in these groups is substituted with a substituent; a $C_{6-50}$ arylene group optionally having a substituent such as a 1,3-phenylene group, a 1,4-phenylene group, a 1,4-naphthylene group, a 1,5-naphthylene group, a 2,6-naphthylene group, a biphenyl-4,4'-diyl group and a group in which at least one hydrogen atom in these groups is substituted with a substituent; and a $C_{1-50}$ alkyleneoxy group optionally having a substituent such as a methyleneoxy group, an ethyleneoxy group, a propyleneoxy group, a butyleneoxy group, a pentyleneoxy group, a hexyleneoxy group and a group in which at least one hydrogen atom in these groups is substituted with a substituent.

Examples of the substituent may include the same as the substituent exemplified in the description with respect to $Q^1$. When the substituent is plurally present, they may be the same as or different from each other.

In Formulae (4) to (12), examples of the monovalent hydrocarbon group represented by R'' may include: a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; and a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent. From the viewpoint of the solubility of the ionic polymer, a methyl group, an ethyl group, a phenyl group, a 1-naphthyl group and a 2-naphthyl group are preferred. Examples of the substituent may include the same as the substituent exemplified in the description with respect to $Q^1$. When the substituent is plurally present, they may be the same as or different from each other.

In Formula (5), examples of the trivalent hydrocarbon group represented by R''' may include: a $C_{1-20}$ alkyltriyl group optionally having a substituent such as a methanetriyl group, an ethanetriyl group, a 1,2,3-propanetriyl group, a 1,2,4-butanetriyl group, a 1,2,5-pentanetriyl group, a 1,3,5-pentanetriyl group, a 1,2,6-hexanetriyl group, a 1,3,6-hexanetriyl group and a group in which at least one hydrogen atom in these groups is substituted with a substituent; and a $C_{6-30}$ aryl group optionally having a substituent such as a 1,2,3-benzenetriyl group, a 1,2,4-benzenetriyl group, a 1,3,5-benzenetriyl group and a group in which at least one hydrogen atom in these groups is substituted with a substituent. From the viewpoint of the solubility of the ionic polymer, a methanetriyl group, an ethanetriyl group, a 1,2,4-benzenetriyl group and a 1,3,5-benzenetriyl group are preferred. Examples of the substituent may include the same as the substituent exemplified in the description with respect to $Q^1$. When the substituent is plurally present, they may be the same as or different from each other.

In Formulae (4) to (12), $R^c$ is preferably a methyl group, an ethyl group, a phenyl group, a 1-naphthyl group or a 2-naphthyl group, from the viewpoint of the solubility of the ionic polymer.

In Formula (4) and Formula (5), a3 represents an integer of 1 or more, preferably an integer of 3 to 10. In Formulae (6) to (12), a4 represents an integer of 0 or more. In Formula (6), a4 is preferably an integer of 0 to 30, more preferably an integer of 3 to 20. In Formulae (7) to (10), a4 is preferably an integer of 0 to 10, more preferably an integer of 0 to 5. In Formula (11), a4 is preferably an integer of 0 to 20, more preferably an integer of 3 to 20. In Formula (12), a4 is preferably an integer of 0 to 20, more preferably an integer of 0 to 10.

From the viewpoint of simplicity of synthesis of the raw material monomer, $Y^3$ is preferably —CN⁻, a group represented by Formula (4), a group represented by Formula (6), a group represented by Formula (10) or a group represented by Formula (11), more preferably a group represented by Formula (4), a group represented by Formula (6) or a group represented by Formula (11), particularly preferably the following groups.

[Chemical Formula 13]

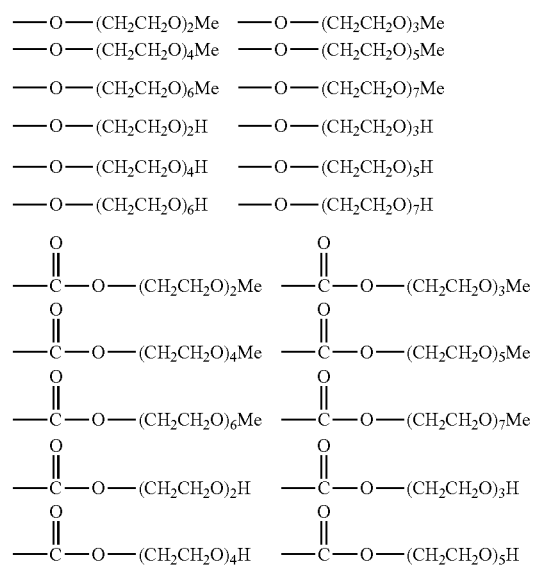

-continued

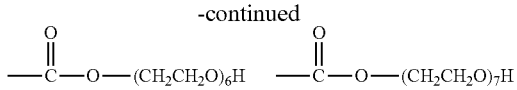

Structural Unit in Ionic Polymer

The ionic polymer used in the present invention preferably comprises a structural unit represented by Formula (13), a structural unit represented by Formula (15), a structural unit represented by Formula (17) or a structural unit represented by Formula (20). The ionic polymer used in the present invention preferably comprises these structural units in a content of 15% by mole to 100% by mole, based on the number of moles of all structural units.

Structural Unit Represented by Formula (13)

In Formula (13), $R^1$ is a monovalent group comprising a group represented by Formula (14); $Ar^1$ represents a (2+n4) valent aromatic group optionally having a substituent other than R'; and n4 represents an integer of 1 or more.

The group represented by Formula (14) may be bonded to $Ar^1$ directly. Alternatively, the group represented by Formula (14) may be bonded to $Ar^1$ through: a $C_{1-50}$ alkylene group optionally having a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group and a group in which at least one hydrogen atom in these groups is substituted with a substituent; a $C_{1-50}$ oxyalkylene group optionally having a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom and a sulfur atom.

$Ar^1$ may have a substituent other than $R^1$. Examples of the substituent may include the same as the substituent exemplified in the description with respect to $Q^1$. When the substituent is plurally present, they may be the same as or different from each other.

From the viewpoint of simplicity of synthesis of the raw material monomer, the substituent other than $R^1$ that $Ar^1$ may have is preferably an alkyl group, an alkoxy group, an aryl group, an aryloxy group, a carboxyl group or a substituted carboxyl group.

In Formula (13), n4 represents an integer of 1 or more, preferably an integer of 1 to 4, more preferably an integer of 1 to 3.

Examples of the (2+n4) valent aromatic group represented by $Ar^1$ in Formula (13) may include a (2+n4) valent aromatic hydrocarbon group and a (2+n4) valent aromatic heterocyclic group. The (2+n4) valent aromatic group represented by $Ar^1$ preferably comprises a carbon atom alone or a carbon atom and one or more atom(s) selected from the group consisting of a hydrogen atom, a nitrogen atom and an oxygen atom.

Examples of the (2+n4) valent aromatic group may include: a (2+n4) valent group remaining after removing (2+n4) hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring and an azadiazole ring; a (2+n4) valent group remaining after removing (2+n4) hydrogen atoms from a fused polycyclic aromatic ring in which two or more rings selected from the group consisting of the above monocyclic aromatic rings are fused; a (2+n4) valent group remaining after removing (2+n4) hydrogen atoms from an aromatic ring assembly in which two or more aromatic rings selected from the group consisting of the above monocyclic aromatic rings and the above fused polycyclic aromatic rings are linked through a single bond, an ethenylene group or an ethynylene group; and a (2+n4) valent group remaining after removing (2+n4) hydrogen atoms from a crosslinkage-having polycyclic aromatic ring in which two aromatic rings adjacent to each other of the above fused polycyclic aromatic ring or the above aromatic ring assembly are crosslinked through a divalent group such as a methylene group, an ethylene group and a carbonyl group.

Examples of the monocyclic aromatic ring may include the following rings.

[Chemical Formula 14]

1

2

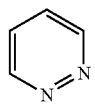

3

4

5

6

7

8

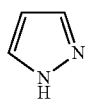
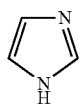
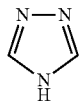
Examples of the fused polycyclic aromatic ring may include the following rings.
[Chemical Formula 15]
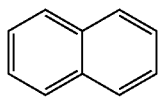
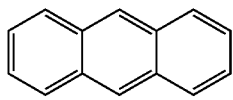
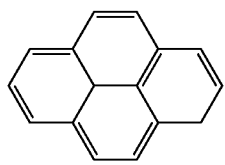
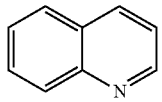
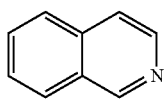
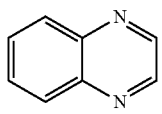
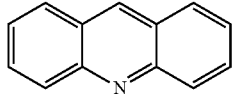
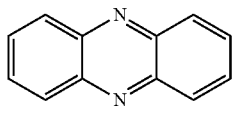
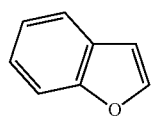
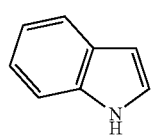
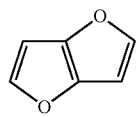
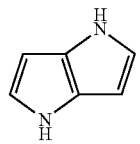
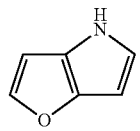
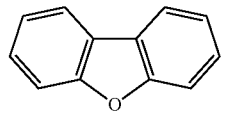
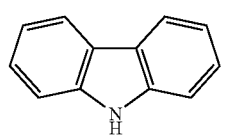
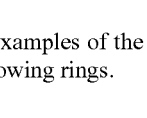
Examples of the aromatic ring assembly may include the following rings.
[Chemical Formula 16]
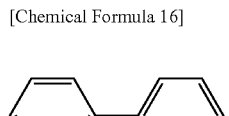
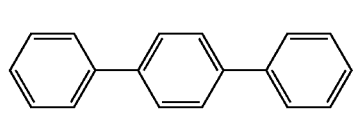
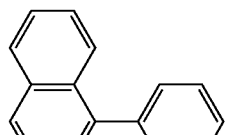

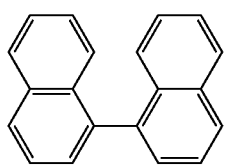
31

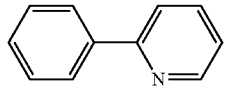
32

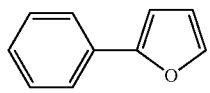
33

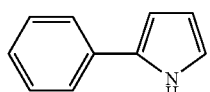
34

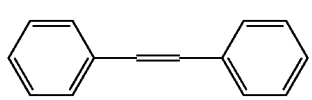
35

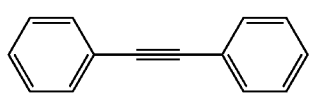
36

Examples of the crosslinkage-having polycyclic aromatic ring may include the following rings.

[Chemical Formula 17]

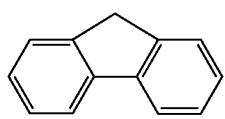
37

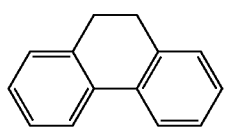
38

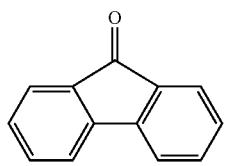
39

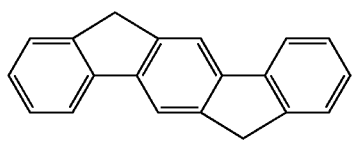
40

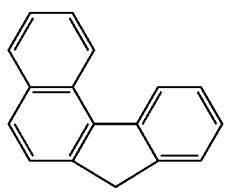
41

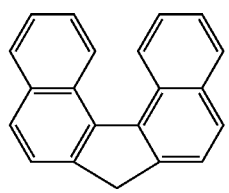
42

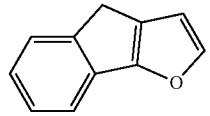
43

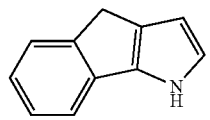
44

From the viewpoint of simplicity of synthesis of the raw material monomer, the (2+n4) valent aromatic group is preferably a group remaining after removing (2+n4) hydrogen atoms from a ring represented by any one of Formulae 1 to 14, 26 to 29, 37 to 39, and 41, more preferably a group remaining after removing (2+n4) hydrogen atoms from a ring represented by any one of Formulae 1 to 6, 8, 13, 26, 27, 37 and 41, further preferably a group remaining after removing (2+n4) hydrogen atoms from a ring represented by Formula 1, 37 or 41.

In Formula (14), examples of the (1+m1+m2) valent organic group represented by $R^2$ may include: a group remaining after removing (m1+m2) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m1+m2) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m1+m2) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m1+m2) hydrogen atoms from an amino group having a substituent containing a carbon atom; and a group remaining after removing (m1+m2) hydrogen atoms from a silyl group having a substituent containing a carbon atom. From the viewpoint of simplicity of synthesis of the raw material monomer, the (1+m1+m2) valent organic group represented by $R^2$ is preferably a group remaining after removing (m1+m2) hydrogen atoms from an alkyl group, a group remaining after removing (m1+m2) hydrogen atoms from an aryl group, and a group remaining after removing (m1+m2) hydrogen atoms from an alkoxy group.

Examples of the substituent may include the same as the substituent exemplified in the description with respect to $Q^1$. When the substituent is plurally present, they may be the same as or different from each other.

Structural Unit Represented by Formula (15)

In Formula (15), $R^3$ is a monovalent group comprising a group represented by Formula (16); $Ar^2$ represents a (2+n5) valent aromatic group optionally having a substituent other than $R^3$; and n5 represents an integer of 1 or more.

The group represented by Formula (16) may be bonded to $Ar^2$ directly. Alternatively, the group represented by Formula (16) may be bonded to $Ar^1$ through: a $C_{1-50}$ alkylene group optionally having a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group and a group in which at least one hydrogen atom in these groups is substituted with a substituent; a $C_{1-50}$ oxyalkylene group optionally having a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom and a sulfur atom.

$Ar^2$ may have a substituent other than $R^3$. Examples of the substituent may include the same as the substituent exemplified in the description with respect to $Q^1$. When the substituent is plurally present, they may be the same as or different from each other.

From the viewpoint of simplicity of synthesis of the raw material monomer, the substituent other than $R^3$ that $Ar^2$ may have is preferably an alkyl group, an alkoxy group, an aryl group, an aryloxy group, a carboxyl group or a substituted carboxyl group.

In Formula (15), n5 represents an integer of 1 or more, preferably an integer of 1 to 4, more preferably an integer of 1 to 3.

Examples of the (2+n5) valent aromatic group represented by $Ar^2$ in Formula (15) may include a (2+n5) valent aromatic hydrocarbon group and a (2+n5) valent aromatic heterocyclic group. The (2+n5) valent aromatic group represented by $Ar^2$ in Formula (15) preferably comprises a carbon atom alone or a carbon atom and one or more atom(s) selected from the group consisting of a hydrogen atom, a nitrogen atom and an oxygen atom. Examples of the (2+n5) valent aromatic group may include: a (2+n5) valent group remaining after removing (2+n5) hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring and an azadiazole ring; a (2+n5) valent group remaining after removing (2+n5) hydrogen atoms from a fused polycyclic aromatic ring in which two or more rings selected from the group consisting of the above monocyclic aromatic rings are fused; a (2+n5) valent group remaining after removing (2+n5) hydrogen atoms from an aromatic ring assembly in which two or more aromatic rings selected from the group consisting of the above monocyclic aromatic rings and the above fused polycyclic aromatic rings are linked through a single bond, an ethenylene group or an ethynylene group; and a (2+n5) valent group remaining after removing (2+n5) hydrogen atoms from a crosslinkage-having polycyclic aromatic ring in which two aromatic rings adjacent to each other of the above fused polycyclic aromatic ring or the above aromatic ring assembly are crosslinked through a divalent group such as a methylene group, an ethylene group and a carbonyl group.

Examples of the monocyclic aromatic ring may include rings represented by Formulae 1 to 12 exemplified in the description with respect to the structural unit represented by Formula (13).

Examples of the fused polycyclic aromatic ring may include rings represented by Formulae 13 to 27 exemplified in the description with respect to the structural unit represented by Formula (13).

Examples of the aromatic ring assembly may include rings represented by Formulae 28 to 36 exemplified in the description with respect to the structural unit represented by Formula (13).

Examples of the crosslinkage-having polycyclic aromatic ring may include rings represented by Formulae 37 to 44 exemplified in the description with respect to the structural unit represented by Formula (13).

From the viewpoint of simplicity of synthesis of the raw material monomer, the (2+n5) valent aromatic group is preferably a group remaining after removing (2+n5) hydrogen atoms from a ring represented by any one of Formulae 1 to 14, 26 to 29, 37 to 39, and 41, more preferably a group remaining after removing (2+n5) hydrogen atoms from a ring represented by any one of Formulae 1 to 6, 8, 13, 26, 27, 37 and 41, further preferably a group remaining after removing (2+n5) hydrogen atoms from a ring represented by Formula 1, 37 or 41.

In Formula (16), m3 and m4 represent independently an integer of 1 or more.

In Formula (16), examples of the (1+m3+m4) valent organic group represented by $R^4$ may include: a group remaining after removing (m3+m4) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m3+m4) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m3+m4) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m3+m4) hydrogen atoms from an amino group having a substituent containing a carbon atom; and a group remaining after removing (m3+m4) hydrogen atoms from a silyl group having a substituent containing a carbon atom. From the viewpoint of simplicity of synthesis of the raw material monomer, the (1+m3+m4) valent organic group represented by $R^4$ is preferably a group remaining after removing (m3+m4) hydrogen atoms from an alkyl group, a group remaining after removing (m3+m4) hydrogen atoms from an aryl group, or a group remaining after removing (m3+m4) hydrogen atoms from an alkoxy group.

Examples of the substituent may include the same as the substituent exemplified in the description with respect to $Q^1$. When the substituent is plurally present, they may be the same as or different from each other.

Structural Unit Represented by Formula (17)

In Formula (17), $R^5$ is a monovalent group comprising a group represented by Formula (18); $R^6$ is a monovalent group comprising a group represented by Formula (19); $Ar^3$ represents a (2+n6+n7) valent aromatic group optionally having a substituent other than $R^5$ and $R^6$; and n6 and n7 represent independently an integer of 1 or more.

Each of the group represented by Formula (18) and the group represented by Formula (19) may be independently bonded to $Ar^3$ directly or may be bonded to $Ar^3$ through: a $C_{1-50}$ alkylene group optionally having a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group and a group in which at least one hydrogen atom in these groups is substituted with a substituent; a $C_{1-50}$ oxyalkylene group optionally having a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom and a sulfur atom.

$Ar^3$ may have a substituent other than $R^5$ and $R^6$. Examples of the substituent may include the same as the substituent exemplified in the description with respect to $Q^1$. When the substituent is plurally present, they may be the same as or different from each other.

From the viewpoint of simplicity of synthesis of the raw material monomer, the substituent other than $R^5$ and $R^6$ that $Ar^3$ may have is preferably an alkyl group, an alkoxy group, an aryl group, an aryloxy group, a carboxyl group or a substituted carboxyl group.

In Formula (17), n6 represents an integer of 1 or more, preferably an integer of 1 to 4, more preferably an integer of 1 to 3.

In Formula (17), n7 represents an integer of 1 or more, preferably an integer of 1 to 4, more preferably an integer of 1 to 3.

Examples of the (2+n6+n7) valent aromatic group represented by $Ar^3$ in Formula (17) may include a (2+n6+n7) valent aromatic hydrocarbon group and a (2+n6+n7) valent aromatic heterocyclic group. The (2+n6+n7) valent aromatic group represented by $Ar^3$ in Formula (17) preferably comprises a carbon atom alone or a carbon atom and one or more atom(s) selected from the group consisting of a hydrogen atom, a nitrogen atom and an oxygen atom. Examples of the (2+n6+n7) valent aromatic group may include: a (2+n6+n7) valent group remaining after removing (2+n6+n7) hydrogen atoms from a monocyclic aromatic ring such as a benzene ring, a pyridine ring, a 1,2-diazine ring, a 1,3-diazine ring, a 1,4-diazine ring, a furan ring, a pyrrole ring, a pyrazole ring, an imidazole ring and an oxazole ring; a (2+n6+n7) valent group remaining after removing (2+n6+n7) hydrogen atoms from a fused polycyclic aromatic ring in which two or more rings selected from the group consisting of the above monocyclic aromatic rings are fused; a (2+n6+n7) valent group remaining after removing (2+n6+n7) hydrogen atoms from an aromatic ring assembly in which two or more aromatic rings selected from the group consisting of the above monocyclic aromatic rings and the above fused polycyclic aromatic rings are linked through a single bond, an ethenylene group or an ethynylene group; and a (2+n6+n7) valent group remaining after removing (2+n6+n7) hydrogen atoms from a crosslinkage-having polycyclic aromatic ring in which two aromatic rings adjacent to each other of the above fused polycyclic aromatic ring or the above aromatic ring assembly are crosslinked through a divalent group such as a methylene group, an ethylene group and a carbonyl group.

Examples of the monocyclic aromatic ring may include rings represented by Formulae 1 to 5 and Formulae 7 to 10 exemplified in the description with respect to the structural unit represented by Formula (13).

Examples of the fused polycyclic aromatic ring may include rings represented by Formulae 13 to 27 exemplified in the description with respect to the structural unit represented by Formula (13).

Examples of the aromatic ring assembly may include rings represented by Formula 28 to 36 exemplified in the description with respect to the structural unit represented by Formula (13).

Examples of the crosslinkage-having polycyclic aromatic ring may include rings represented by Formulae 37 to 44 exemplified in the description with respect to the structural unit represented by Formula (13).

From the viewpoint of simplicity of synthesis of the raw material monomer, the (2+n6+n7) valent aromatic group is preferably a group remaining after removing (2+n6+n7) hydrogen atoms from a ring represented by any one of Formulae 1 to 5, 7 to 10, 13, 14, 26 to 29, 37 to 39, and 41, more preferably a group remaining after removing (2+n6+n7) hydrogen atoms from a ring represented by Formula 1, 37, or 41, further preferably a group remaining after removing (2+n6+n7) hydrogen atoms from a ring represented by Formula 1, 38, or 42.

In Formula (18), $R^7$ represents a single bond or a (1+m5) valent organic group, preferably a (1+m5) valent organic group.

In Formula (18), examples of the (1+m5) valent organic group represented by $R^7$ may include: a group remaining after removing m5 hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing m5 hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing m5 hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing m5 hydrogen atoms from an amino group having a substituent containing a carbon atom; and a group remaining after removing m5 hydrogen atoms from a silyl group having a substituent containing a carbon atom. From the viewpoint of simplicity of synthesis of the raw material monomer, the (1+m5) valent organic group represented by $R^7$ is preferably a group remaining after removing m5 hydrogen atoms from an alkyl group, a group remaining after removing m5 hydrogen atoms from an aryl group, and a group remaining after removing m5 hydrogen atoms from an alkoxy group.

Examples of the substituent may include the same as the substituent exemplified in the description with respect to $Q^1$. When the substituent is plurally present, they may be the same as or different from each other.

In Formula (18), m5 represents an integer of 1 or more, with the proviso that when $R^7$ is a single bond, m5 represents 1.

In Formula (19), $R^8$ represents a single bond or a (1+m6) valent organic group, preferably a (1+m6) organic group.

In Formula (19), examples of the (1+m6) valent organic group represented by $R^8$ may include: a group remaining after removing m6 hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing m6 hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing m6 hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing m6 hydrogen atoms from an amino group having a substituent containing a carbon atom; and a group remaining after removing m6 hydrogen atoms from a silyl group having a substituent containing a carbon atom. From the viewpoint of simplicity of synthesis of the raw material monomer, the (1+m6) valent organic group represented by $R^8$ is preferably a group remaining after removing m6 hydrogen atoms from an alkyl group, a group remaining after removing m6 hydrogen atoms from an aryl group, or a group remaining after removing m6 hydrogen atoms from an alkoxy group.

Examples of the substituent may include the same as the substituent exemplified in the description with respect to $Q^1$. When the substituent is plurally present, they may be the same as or different from each other.

In Formula (19), m6 represents an integer of 1 or more, with the proviso that when $R^8$ is a single bond, m6 represents 1.

Structural Unit Represented by Formula (20)

In Formula (20), $R^9$ is a monovalent group comprising a group represented by Formula (21); $R^{19}$ is a monovalent group comprising a group represented by Formula (22); $Ar^4$ represents a (2+n8+n9) valent aromatic group optionally having a substituent other than $R^9$ and $R^{19}$; and n8 and n9 represent independently an integer of 1 or more.

Each of the group represented by Formula (21) and the group represented by Formula (22) may be independently bonded to $Ar^4$ directly or may be bonded to $Ar^4$ through: a $C_{1-50}$ alkylene group optionally having a substituent such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group, an adamantylene group and a group in which at least one hydrogen atom in these groups is substituted with a substituent; a $C_{1-50}$ oxyalkylene group optionally having a substituent such as an oxymethylene group, an oxyethylene group, an oxypropylene group, an oxybutylene group, an oxypentylene group, an oxyhexylene group, an oxynonylene group, an oxydodecylene group, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group, an adamantyleneoxy group and a group in which at least one hydrogen atom in these groups is substituted with a substituent; an imino group optionally having a substituent; a silylene group optionally having a substituent; an ethenylene group optionally having a substituent; an ethynylene group; a methanetriyl group optionally having a substituent; and a hetero atom such as an oxygen atom, a nitrogen atom and a sulfur atom.

$Ar^4$ may have a substituent other than $R^9$ and $R^{10}$. Examples of the substituent may include the same as the substituent exemplified in the description with respect to $Q^1$. When the substituent is plurally present, they may be the same as or different from each other.

From the viewpoint of simplicity of synthesis of the raw material monomer, the substituent other than $R^9$ and $R^{10}$ that $Ar^4$ may have is preferably an alkyl group, an alkoxy group, an aryl group, an aryloxy group, a carboxyl group or a substituted carboxyl group.

In Formula (20), n8 represents an integer of 1 or more, preferably an integer of 1 to 4, more preferably an integer of 1 to 3.

In Formula (20), n9 represents an integer of 1 or more, preferably an integer of 1 to 4, more preferably an integer of 1 to 3.

Examples of the (2+n8+n9) valent aromatic group represented by $Ar^4$ in Formula (20) may include a (2+n8+n9) valent aromatic hydrocarbon group and a (2+n8+n9) valent aromatic heterocyclic group. The (2+n8+n9) valent aromatic group represented by $Ar^4$ preferably comprises a carbon atom alone or a carbon atom and one or more atom(s) selected from the group consisting of a hydrogen atom, a nitrogen atom and an oxygen atom. Examples of the (2+n8+n9) valent aromatic group may include: a (2+n8+n9) valent group remaining after removing (2+n8+n9) hydrogen atoms from a monocyclic aromatic ring such as a benzene ring, a pyridine ring, a 1,2-diazine ring, a 1,3-diazine ring, a 1,4-diazine ring, a furan ring, a pyrrole ring, a pyrazole ring and an imidazole ring; a (2+n8+n9) valent group remaining after removing (2+n8+n9) hydrogen atoms from a fused polycyclic aromatic ring in which two or more rings selected from the group consisting of the above monocyclic aromatic rings are fused; a (2+n8+n9) valent group remaining after removing (2+n8+n9) hydrogen atoms from an aromatic ring assembly in which two or more aromatic rings selected from the group consisting of the above monocyclic aromatic rings and the above fused polycyclic aromatic rings are linked through a single bond, an ethenylene group or an ethynylene group; and a (2+n8+n9) valent group remaining after removing (2+n8+n9) hydrogen atoms from a crosslinkage-having polycyclic aromatic ring in which two aromatic rings adjacent to each other of the above fused polycyclic aromatic ring or the above aromatic ring assembly are crosslinked through a divalent group such as a methylene group, an ethylene group and a carbonyl group.

Examples of the monocyclic aromatic ring may include rings represented by Formulae 1 to 5 and Formulae 7 to 10 exemplified in the description with respect to the structural unit represented by Formula (13).

Examples of the fused polycyclic aromatic ring may include rings represented by Formulae 13 to 27 exemplified in the description with respect to the structural unit represented by Formula (13).

Examples of the aromatic ring assembly may include rings represented by Formulae 28 to 36 exemplified in the description with respect to the structural unit represented by Formula (13).

Examples of the crosslinkage-having polycyclic aromatic ring may include rings represented by Formulae 37 to 44 exemplified in the description with respect to the structural unit represented by Formula (13).

From the viewpoint of simplicity of synthesis of the raw material monomer, the (2+n8+n9) valent aromatic group is preferably a group remaining after removing (2+n8+n9) hydrogen atoms from a ring represented by any one of Formulae 1 to 5, 7 to 10, 13, 14, 26 to 29, 37 to 39, and 41, more preferably a group remaining after removing (2+n8+n9) hydrogen atoms from a ring represented by any one of Formulae 1 to 6, 8, 14, 27, 28, 38 and 42, further preferably a group remaining after removing (2+n8+n9) hydrogen atoms from a ring represented by Formula 1, 37 or 41.

In Formula (21), $R^{11}$ represents a single bond or a (1+m7) valent organic group, preferably a (1+m7) valent organic group.

In Formula (21), examples of the (1+m7) valent organic group represented by $R^{11}$ may include: a group remaining after removing m7 hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing m7 hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing m7 hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing m7 hydrogen atoms from an amino group having a substituent containing a carbon atom; and a group remaining after removing m7 hydrogen atoms from a silyl group having a substituent containing a carbon atom. From the viewpoint of simplicity of synthesis of the raw material monomer, the (1+m7) valent organic group represented by $R^{11}$ is preferably a group remaining after removing m7 hydrogen atoms from an alkyl group, a group remaining after removing m7 hydrogen atoms from an aryl group, or a group remaining after removing m7 hydrogen atoms from an alkoxy group.

Examples of the substituent may include the same as the substituent exemplified in the description with respect to $Q^1$. When the substituent is plurally present, they may be the same as or different from each other.

In Formula (21), m7 represents an integer of 1 or more, with the proviso that when $R^{11}$ is a single bond, m7 represents 1.

In Formula (22), $R^{12}$ represents a single bond or a (1+m8) valent organic group, preferably a (1+m8) valent organic group.

In Formula (22), examples of the (1+m8) valent organic group represented by $R^{12}$ may include: a group remaining after removing m8 hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing m8 hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing m8 hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing m8 hydrogen atoms from an amino group having a substituent containing a carbon atom; and a group remaining after removing m8 hydrogen atoms from a silyl group having a substituent containing a carbon atom. From the viewpoint of simplicity of synthesis of the raw material monomer, the (1+m8) valent organic group represented by $R^{12}$ is preferably a group remaining after removing m8 hydrogen atoms from an alkyl group, a group remaining after removing m8 hydrogen atoms from an aryl group, or a group remaining after removing m8 hydrogen atoms from an alkoxy group.

Examples of the substituent may include the same as the substituent exemplified in the description with respect to $Q^1$. When the substituent is plurally present, they may be the same as or different from each other.

In Formula (22), m8 represents an integer of 1 or more, with the proviso that when $R^{12}$ is a single bond, m8 represents 1.

Example of Structural Unit Represented by Formula (13)

From the viewpoint of the electron transport property of the obtained ionic polymer, the structural unit represented by Formula (13) is preferably a structural unit represented by Formula (23) or a structural unit represented by Formula (24), more preferably a structural unit represented by Formula (24).

[Chemical Formula 18]

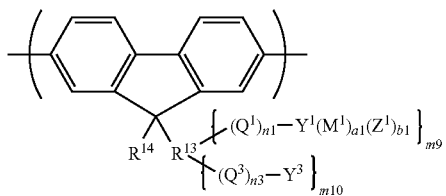

(23)

In Formula (23), $R^{13}$ represents a (1+m9+m10) valent organic group; $R^{14}$ represents a monovalent organic group; $Q^1$, $Q^3$, $Y^1$, $M^1$, $Z^1$, $Y^3$, n1, a1, b1 and n3 represent the same as defined above; m9 and m10 represent independently an integer of 1 or more; when $Q^1$ is plurally present, they may be the same as or different from each other; when $Q^3$ is plurally present, they may be the same as or different from each other; when $Y^1$ is plurally present, they may be the same as or different from each other; when $M^1$ is plurally present, they may be the same as or different from each other; when $Z^1$ is plurally present, they may be the same as or different from each other; when $Y^3$ is plurally present, they may be the same as or different from each other; when n1 is plurally present, they may be the same as or different from each other; when $a^1$ is plurally present, they may be the same as or different from each other; when $b^1$ is plurally present, they may be the same as or different from each other; and when n3 is plurally present, they may be the same as or different from each other.

In Formula (23), examples of the (1+m9+m10) valent organic group represented by $R^{13}$ may include: a group remaining after removing (m9+m10) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m9+m10) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m9+m10) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m9+m10) hydrogen atoms from an amino group having a substituent containing a carbon atom; and a group remaining after removing (m9+m10) hydrogen atoms from a silyl group having a substituent containing a carbon atom. From the viewpoint of simplicity of synthesis of the raw material monomer, the (1+m9+m10) valent organic group represented by $R^{13}$ is preferably a group remaining after removing (m9+m10) hydrogen atoms from an alkyl group, a group remaining after removing (m9+m10) hydrogen atoms from an aryl group, and a group remaining after removing (m9+m10) hydrogen atoms from an alkoxy group.

In Formula (23), examples of the monovalent organic group represented by $R^{14}$ may include: a group remaining after removing one hydrogen atom from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing one hydrogen atom from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing one hydrogen atom from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing one hydrogen atom from an amino group having a substituent containing a carbon atom; and a group remaining after removing one hydrogen atom from a silyl group having a substituent containing a carbon atom. From the viewpoint of simplicity of synthesis of the raw material monomer, the monovalent organic group represented by $R^{14}$ is preferably a group remaining after removing one hydrogen atom from an alkyl group, a group remaining after removing one hydrogen atom from an aryl group, or a group remaining after removing one hydrogen atom from an alkoxy group.

Examples of the structural unit represented by Formula (23) may include the following structural units.

[Chemical Formula 19]

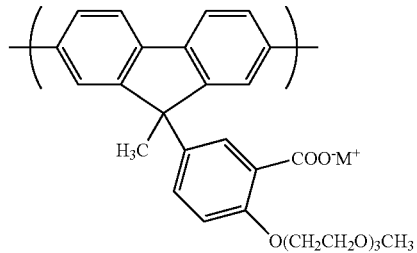

M = Li, Na, K, Cs, N(CH$_3$)$_4$

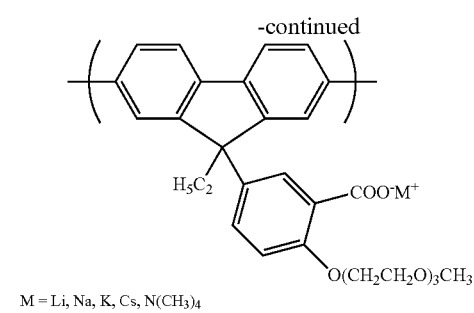
M = Li, Na, K, Cs, N(CH₃)₄
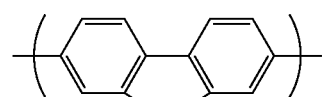
M = Li, Na, K, Cs, N(CH₃)₄
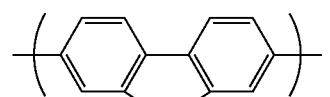
M = Li, Na, K, Cs, N(CH₃)₄
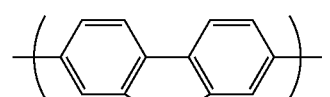
M = Li, Na, K, Cs, N(CH₃)₄
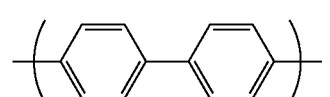
M = Li, Na, K, Cs, N(CH₃)₄
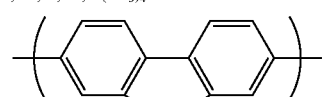
M = Li, Na, K, Cs, N(CH₃)₄
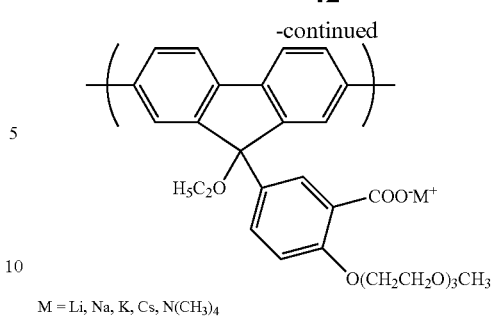
M = Li, Na, K, Cs, N(CH₃)₄
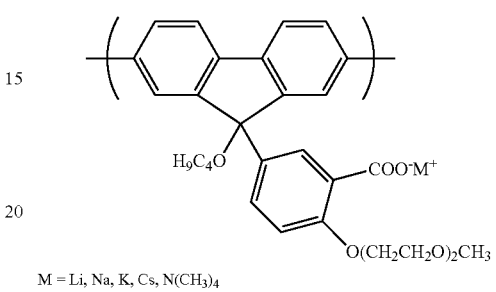
M = Li, Na, K, Cs, N(CH₃)₄
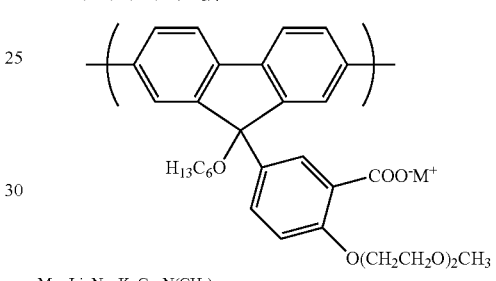
M = Li, Na, K, Cs, N(CH₃)₄
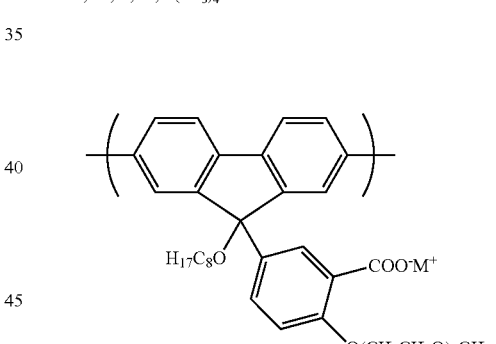
M = Li, Na, K, Cs, N(CH₃)₄
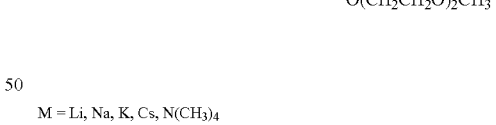
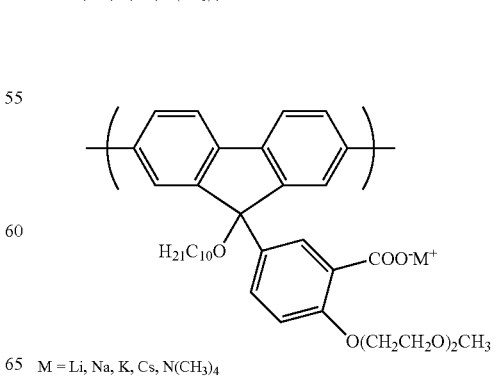
M = Li, Na, K, Cs, N(CH₃)₄

[Chemical Formula 20]

(24)

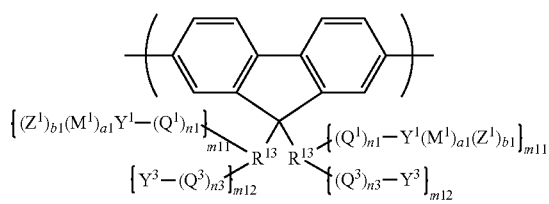

In Formula (24), $R^{13}$ represents a (1+m11+m12) valent 3-1 organic group; $Q^1$, $Q^3$, $Y^1$, $M^1$, $Z^1$, $Y^3$, n1, a1, b1 and n3 represent the same as defined above; m11 and m12 represent independently an integer of 1 or more; when $R^{13}$ is plurally present, they may be the same as or different from each other; when m11 is plurally present, they may be the same as or different from each other; when m12 is plurally present, they may be the same as or different from each other; when $Q^1$ is plurally present, they may be the same as or different from each other; when $Q^3$ is plurally present, they may be the same as or different from each other; when $Y^1$ is plurally present, they may be the same as or different from each other; when $M^1$ is plurally present, they may be the same as or different from each other; when $Z^1$ is plurally present, they may be the same as or different from each other; when $Y^3$ is plurally present, they may be the same as or different from each other; when n1 is plurally present, they may be the same as or different from each other; when a1 is plurally present, they may be the same as or different from each other; when b1 is plurally present, they may be the same as or different from each other; and when n3 is plurally present, they may be the same as or different from each other.

In Formula (24), examples of the (1+m11+m12) valent organic group represented by $R^{13}$ may include: a group remaining after removing (m11+m12) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m11+m12) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m11+m12) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m11+m12) hydrogen atoms from an amino group having a substituent containing a carbon atom; and a group remaining after removing (m11+m12) hydrogen atoms from a silyl group having a substituent containing a carbon atom. From the viewpoint of simplicity of synthesis of the raw material monomer, the (1+m11+m12) valent organic group represented by $R^{13}$ is preferably a group remaining after removing (m11+m12) hydrogen atoms from an alkyl group, a group remaining after removing (m11+m12) hydrogen atoms from an aryl group, or a group remaining after removing (m11+m12) hydrogen atoms from an alkoxy group.

Examples of the structural unit represented by Formula (24) may include the following structural units.

[Chemical Formula 21]

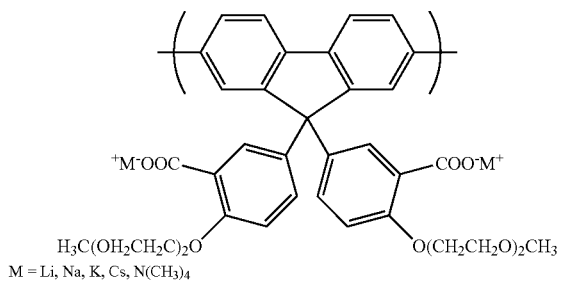

M = Li, Na, K, Cs, N(CH$_3$)$_4$

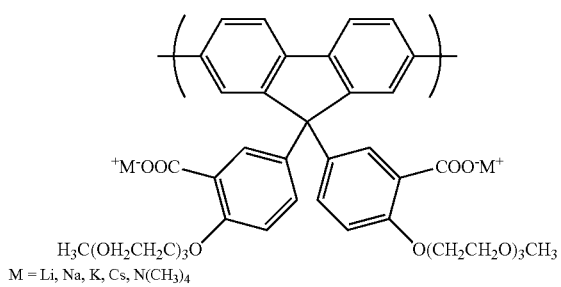

M = Li, Na, K, Cs, N(CH$_3$)$_4$

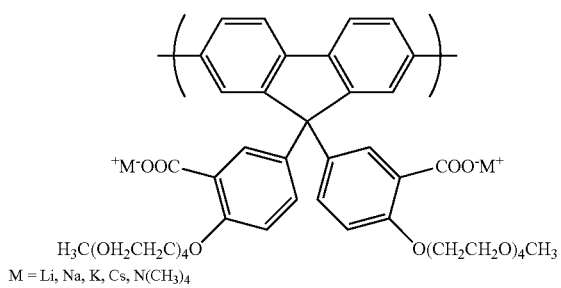

M = Li, Na, K, Cs, N(CH$_3$)$_4$

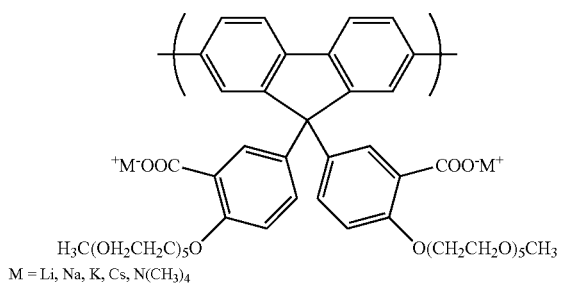

M = Li, Na, K, Cs, N(CH$_3$)$_4$

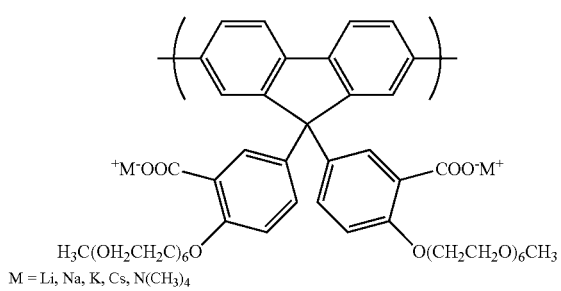

M = Li, Na, K, Cs, N(CH$_3$)$_4$

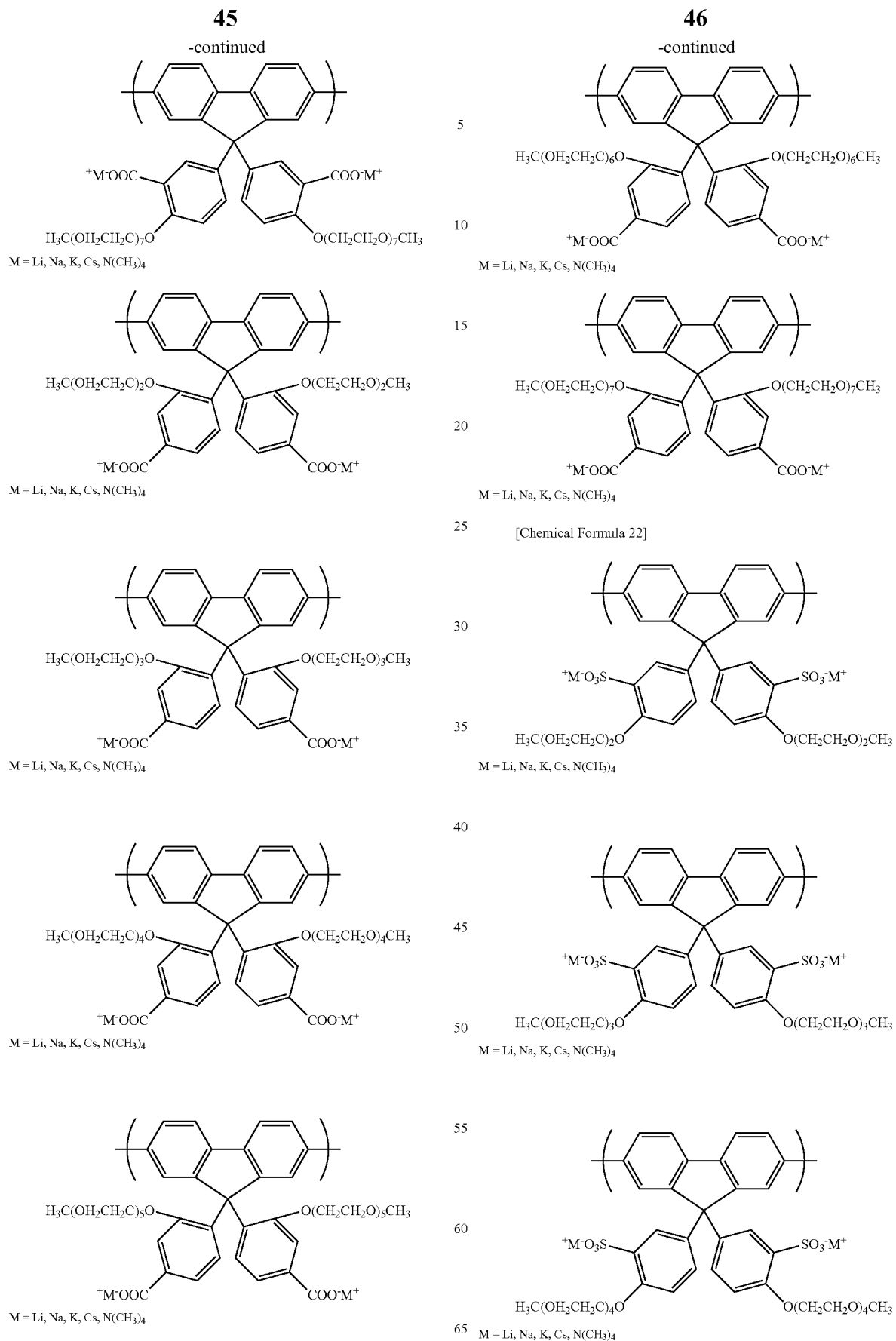

-continued
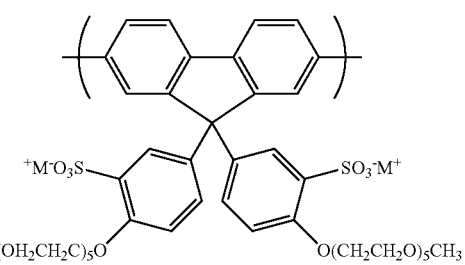
M = Li, Na, K, Cs, N(CH$_3$)$_4$
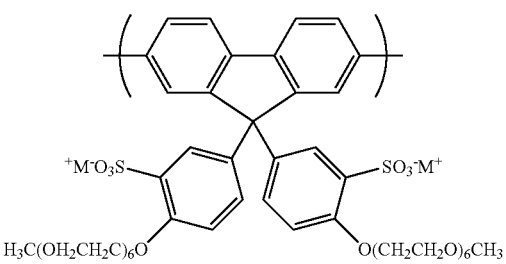
M = Li, Na, K, Cs, N(CH$_3$)$_4$
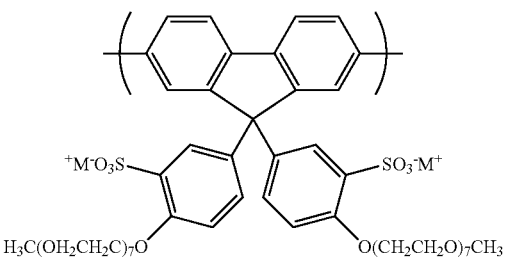
M = Li, Na, K, Cs, N(CH$_3$)$_4$
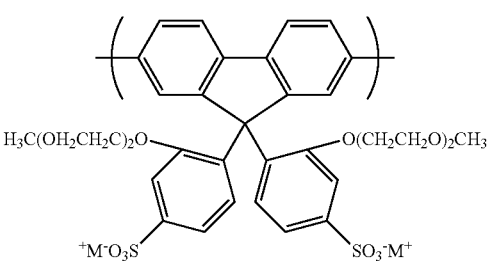
M = Li, Na, K, Cs, N(CH$_3$)$_4$
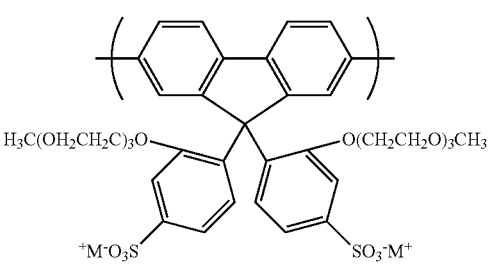
M = Li, Na, K, Cs, N(CH$_3$)$_4$
-continued
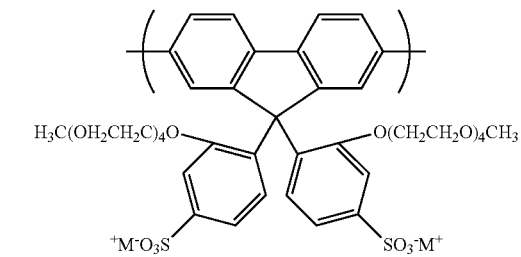
M = Li, Na, K, Cs, N(CH$_3$)$_4$
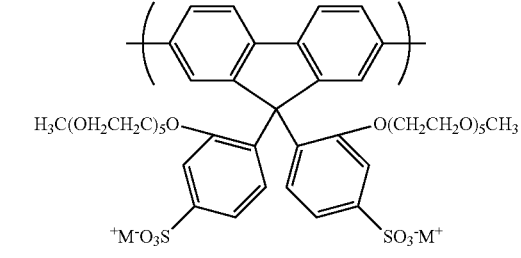
M = Li, Na, K, Cs, N(CH$_3$)$_4$
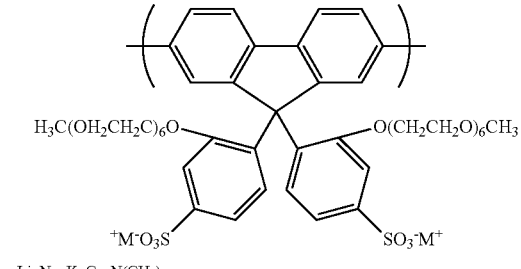
M = Li, Na, K, Cs, N(CH$_3$)$_4$
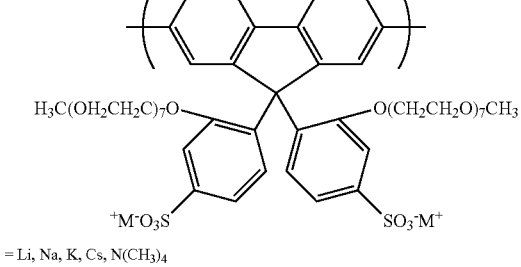
M = Li, Na, K, Cs, N(CH$_3$)$_4$
[Chemical Formula 23]
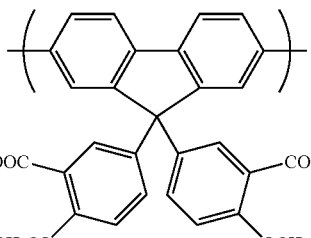
M = Li, Na, K, Cs, N(CH$_3$)$_4$ 49
-continued
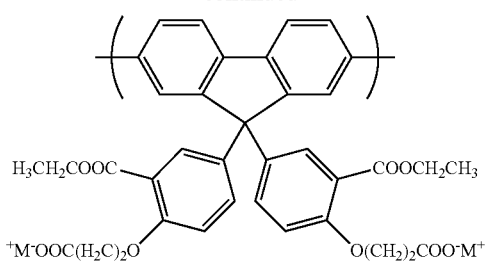
M = Li, Na, K, Cs, N(CH$_3$)$_4$
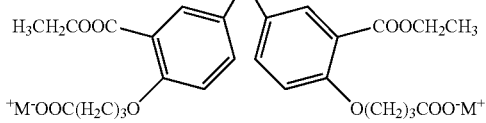
M = Li, Na, K, Cs, N(CH$_3$)$_4$
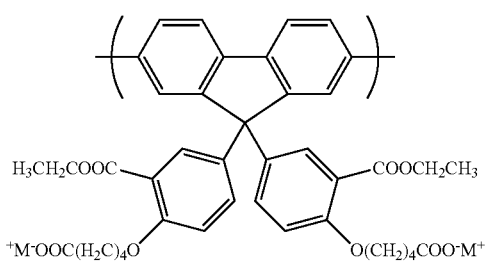
M = Li, Na, K, Cs, N(CH$_3$)$_4$
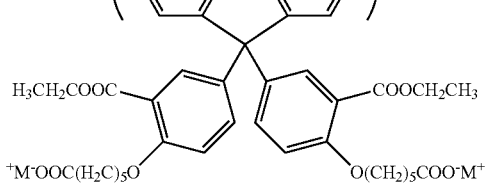
M = Li, Na, K, Cs, N(CH$_3$)$_4$
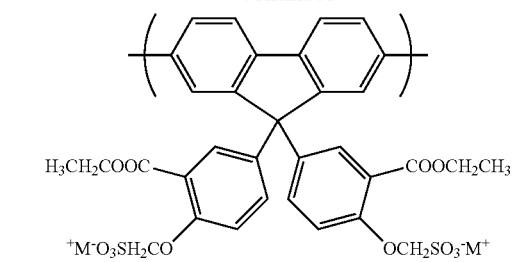
M = Li, Na, K, Cs, N(CH$_3$)$_4$
50
-continued
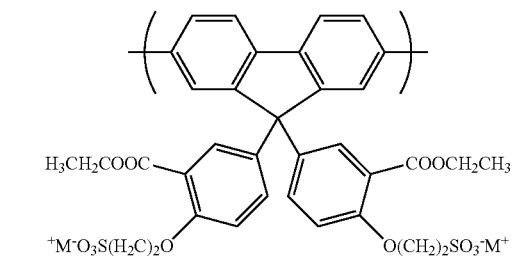
M = Li, Na, K, Cs, N(CH$_3$)$_4$
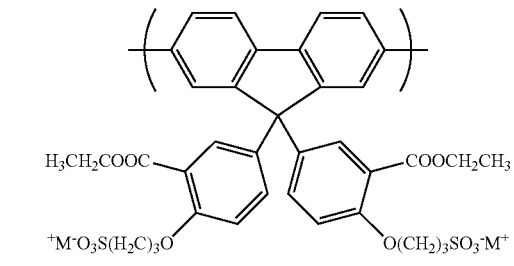
M = Li, Na, K, Cs, N(CH$_3$)$_4$
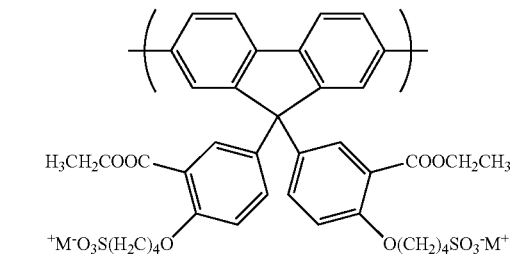
M = Li, Na, K, Cs, N(CH$_3$)$_4$
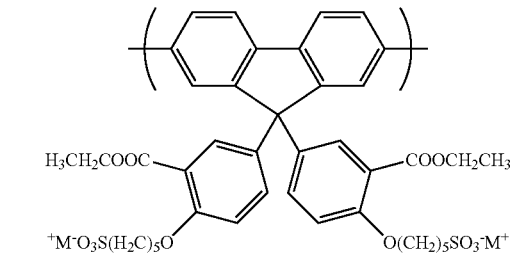
M = Li, Na, K, Cs, N(CH$_3$)$_4$ -continued
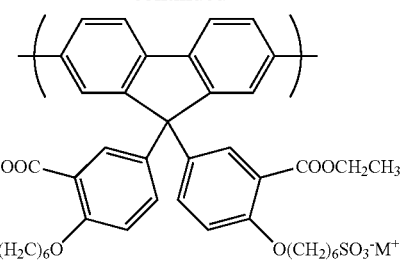
M = Li, Na, K, Cs, N(CH₃)₄
[Chemical Formula 24]
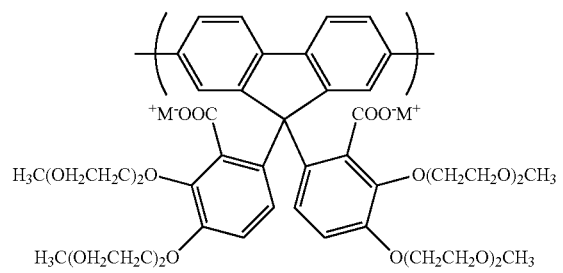
M = Li, Na, K, Cs, N(CH₃)₄
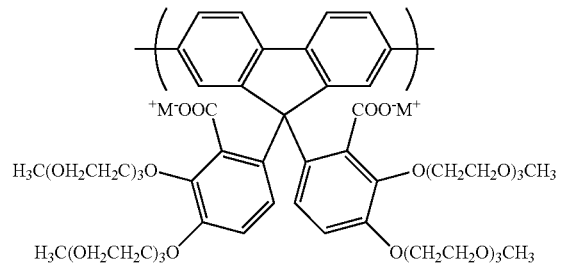
M = Li, Na, K, Cs, N(CH₃)₄
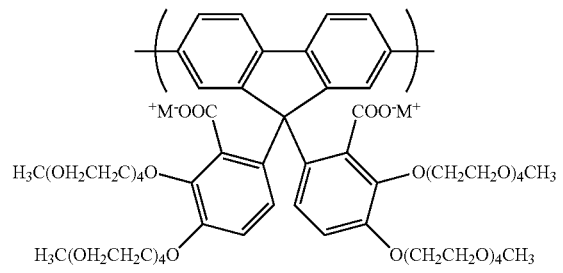
M = Li, Na, K, Cs, N(CH₃)₄
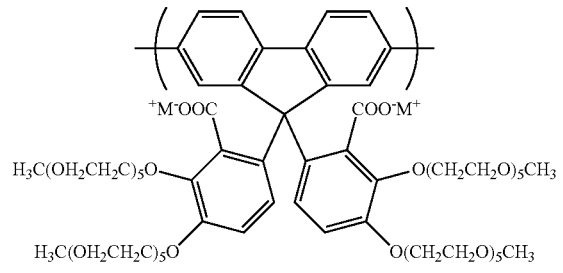
M = Li, Na, K, Cs, N(CH₃)₄
-continued
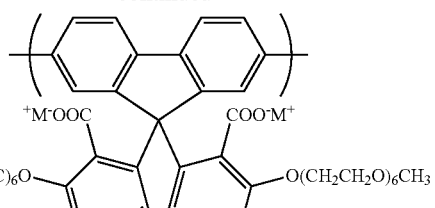
M = Li, Na, K, Cs, N(CH₃)₄
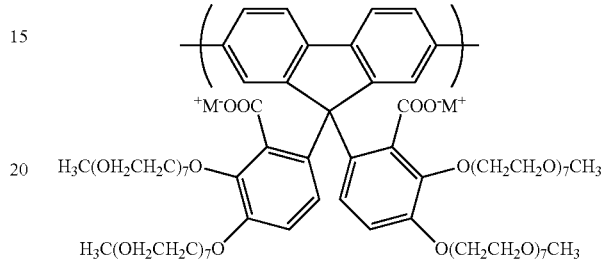
M = Li, Na, K, Cs, N(CH₃)₄
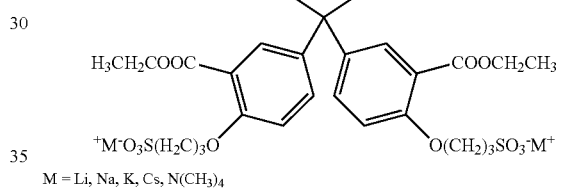
M = Li, Na, K, Cs, N(CH₃)₄
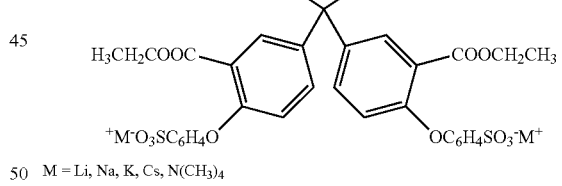
M = Li, Na, K, Cs, N(CH₃)₄
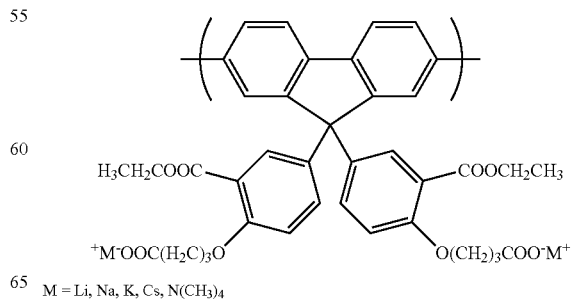
M = Li, Na, K, Cs, N(CH₃)₄

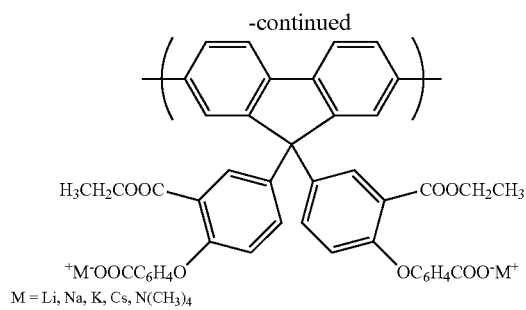

M = Li, Na, K, Cs, N(CH₃)₄

From the viewpoint of the durability of the obtained ionic polymer, the structural unit represented by Formula (13) is preferably a structural unit represented by Formula (25).

[Chemical Formula 25]

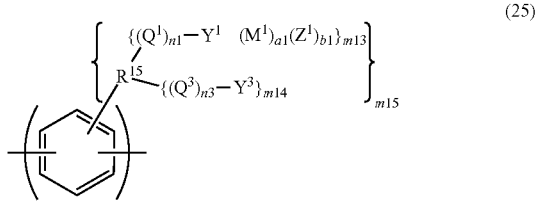

(25)

In Formula (25), $R^{15}$ represents a (1+m13+m14) valent organic group; $Q^1$, $Q^3$, $Y^1$, $M^1$, $Z^1$, $Z^3$, n1, a1, b1 and n3 represent the same as defined above; m13, m14 and m15 represent independently an integer of 1 or more; when $R^{15}$ is plurally present, they may be the same as or different from each other; when m13 is plurally present, they may be the same as or different from each other; when m14 is plurally present, they may be the same as or different from each other; when $Q^1$ is plurally present, they may be the same as or different from each other; when $Q^3$ is plurally present, they may be the same as or different from each other; when $Y^1$ is plurally present, they may be the same as or different from each other; when $M^1$ is plurally present, they may be the same as or different from each other; when $Z^1$ is plurally present, they may be the same as or different from each other; when $Y^3$ is plurally present, they may be the same as or different from each other; when n1 is plurally present, they may be the same as or different from each other; when a1 is plurally present, they may be the same as or different from each other; when b1 is plurally present, they may be the same as or different from each other; and when n3 is plurally present, they may be the same as or different from each other.

In Formula (25), examples of the (1+m13+m14) valent organic group represented by $R^{15}$ may include: a group remaining after removing (m13+m14) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m13+m14) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m13+m14) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m13+m14) hydrogen atoms from an amino group having a substituent containing a carbon atom; and a group remaining after removing (m13+m14) hydrogen atoms from a silyl group having a substituent containing a carbon atom. From the viewpoint of simplicity of synthesis of the raw material monomer, the (1+m13+m14) valent organic group represented by $R^{15}$ is preferably a group remaining after removing (m13+m14) hydrogen atoms from an alkyl group, a group remaining after removing (m13+m14) hydrogen atoms from an aryl group, or a group remaining after removing (m13+m14) hydrogen atoms from an alkoxy group.

Examples of the structural unit represented by Formula (25) may include the following structural units.

[Chemical Formula 26]

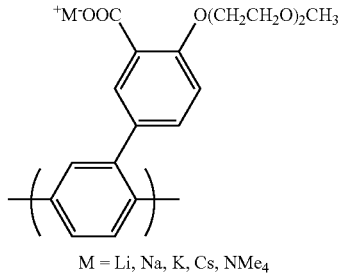

M = Li, Na, K, Cs, NMe₄

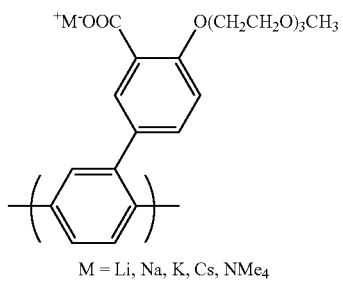

M = Li, Na, K, Cs, NMe₄

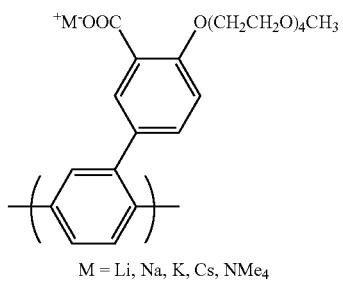

M = Li, Na, K, Cs, NMe₄

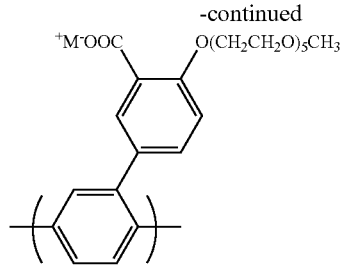

M = Li, Na, K, Cs, NMe₄

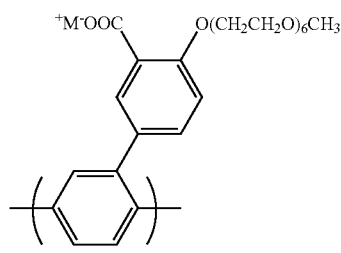

M = Li, Na, K, Cs, NMe₄

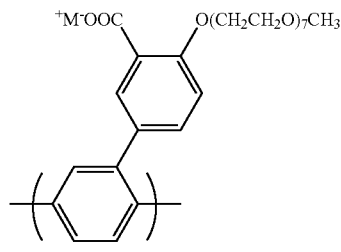

M = Li, Na, K, Cs, NMe₄

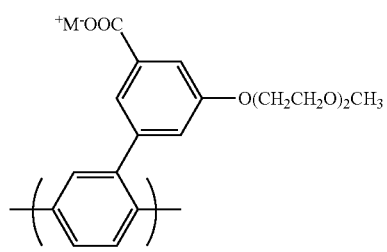

M = Li, Na, K, Cs, NMe₄

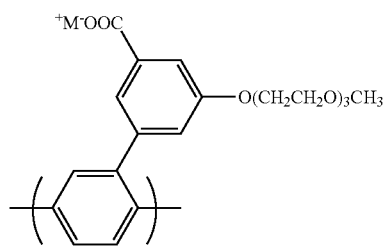

M = Li, Na, K, Cs, NMe₄

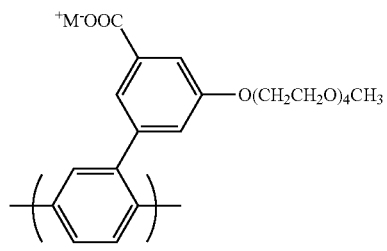

M = Li, Na, K, Cs, NMe₄

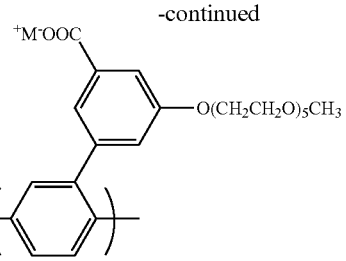

M = Li, Na, K, Cs, NMe₄

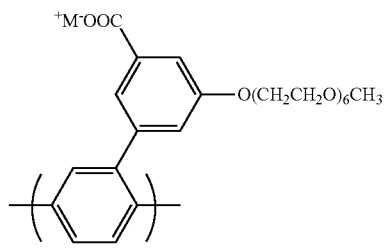

M = Li, Na, K, Cs, NMe₄

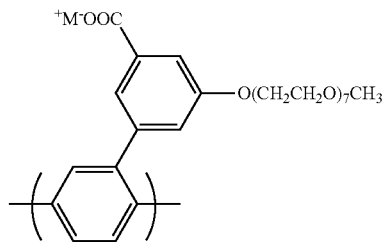

M = Li, Na, K, Cs, NMe₄

Example of Structural Unit Represented by Formula (15)

From the viewpoint of the electron transport property of the obtained ionic polymer, the structural unit represented by Formula (15) is preferably a structural unit represented by Formula (26) or a structural unit represented by Formula (27), more preferably a structural unit represented by Formula (27).

[Chemical Formula 27]

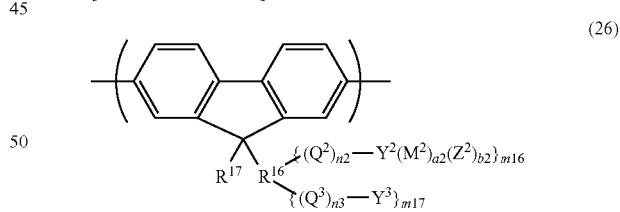

(26)

In Formula (26), $R^{16}$ represents a (1+m16+m17) valent organic group; $R^{17}$ represents a monovalent organic group; $Q^2$, $Q^3$, $Y^2$, $M^2$, $Z^2$, $Y^3$, n2, a2, b2 and n3 represent the same as defined above; m16 and m17 represent independently an integer of 1 or more; when $Q^2$ is plurally present, they may be the same as or different from each other; and when each of $Q^3$ is plurally present, they may be the same as or different from each other; when $Y^2$ is plurally present, they may be the same as or different from each other; when $M^2$ is plurally present, they may be the same as or different from each other; when $Z^2$ is plurally present, they may be the same as or different from each other; when $Y^3$ is plurally present, they may be the same as or different from each other; when n2 is plurally present, they may be the same as or different from each other; when a2 is plurally present, they may be the same as or different from each other; when b2 is plurally present, they may be the same as or different from each other; and when n3 is plurally present, they may be the same as or different from each other.

In Formula (26), examples of the (1+m16+m17) valent organic group represented by $R^{16}$ may include: a group remaining after removing (m16+m17) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m16+m17) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m16+m17) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m16+m17) hydrogen atoms from an amino group having a substituent containing a carbon atom; and a group remaining after removing (m16+m17) hydrogen atoms from a silyl group having a substituent containing a carbon atom. From the viewpoint of simplicity of synthesis of the raw material monomer, the (1+m16+m17) valent organic group represented by $R^{16}$ is preferably a group remaining after removing (m16+m17) hydrogen atoms from an alkyl group, a group remaining after removing (m16+m17) hydrogen atoms from an aryl group, or a group remaining after removing (m16+m17) hydrogen atoms from an alkoxy group.

In Formula (26), examples of the monovalent organic group represented by $R^{17}$ may include: a group remaining after removing one hydrogen atom from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing one hydrogen atom from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing one hydrogen atom from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing one hydrogen atom from an amino group having a substituent containing a carbon atom; and a group remaining after removing one hydrogen atom from a silyl group having a substituent containing a carbon atom. From the viewpoint of simplicity of synthesis of the raw material monomer, the monovalent organic group represented by $R^{17}$ is preferably a group remaining after removing one hydrogen atom from an alkyl group, a group remaining after removing one hydrogen atom from an aryl group, or a group remaining after removing one hydrogen atom from an alkoxy group.

Examples of the structural unit represented by Formula (26) may include the following structural units.

[Chemical Formula 28]

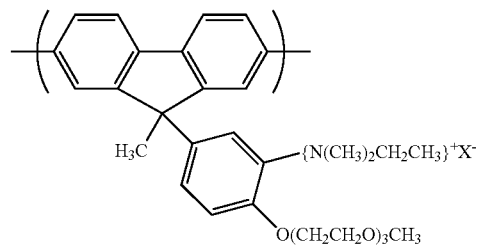

X = F, Cl, Br, I, $BPh_4$, $CF_3SO_3$, $CH_3COO$

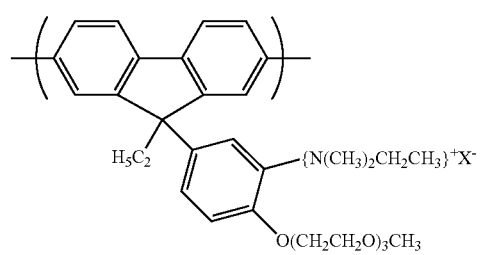

X = F, Cl, Br, I, $BPh_4$, $CF_3SO_3$, $CH_3COO$

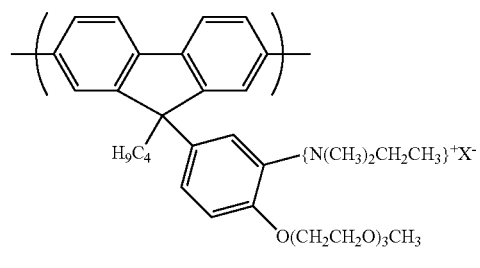

X = F, Cl, Br, I, $BPh_4$, $CF_3SO_3$, $CH_3COO$

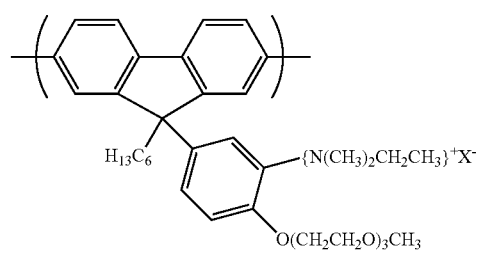

X = F, Cl, Br, I, $BPh_4$, $CF_3SO_3$, $CH_3COO$

-continued

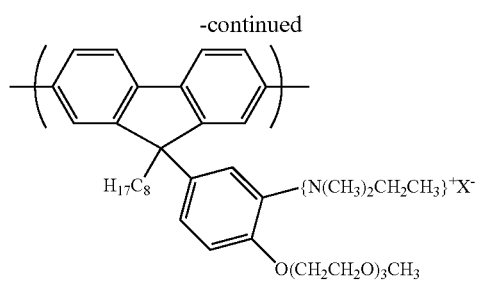

X = F, Cl. Br, I, BPh$_4$, CF$_3$SO$_3$, CH$_3$COO

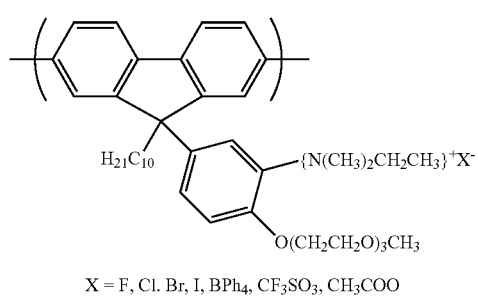

X = F, Cl. Br, I, BPh$_4$, CF$_3$SO$_3$, CH$_3$COO

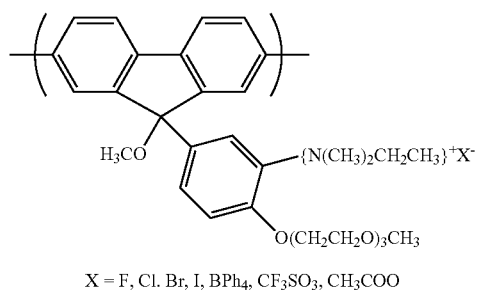

X = F, Cl. Br, I, BPh$_4$, CF$_3$SO$_3$, CH$_3$COO

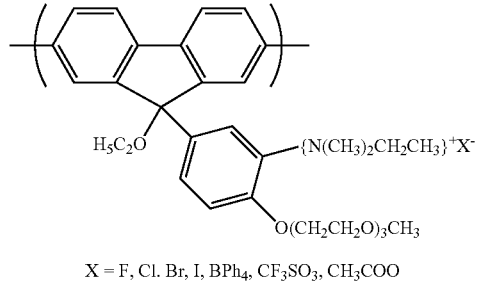

X = F, Cl. Br, I, BPh$_4$, CF$_3$SO$_3$, CH$_3$COO

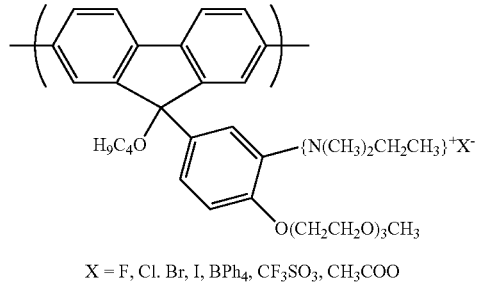

X = F, Cl. Br, I, BPh$_4$, CF$_3$SO$_3$, CH$_3$COO

-continued

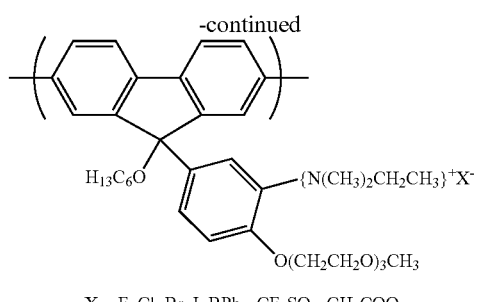

X = F, Cl. Br, I, BPh$_4$, CF$_3$SO$_3$, CH$_3$COO

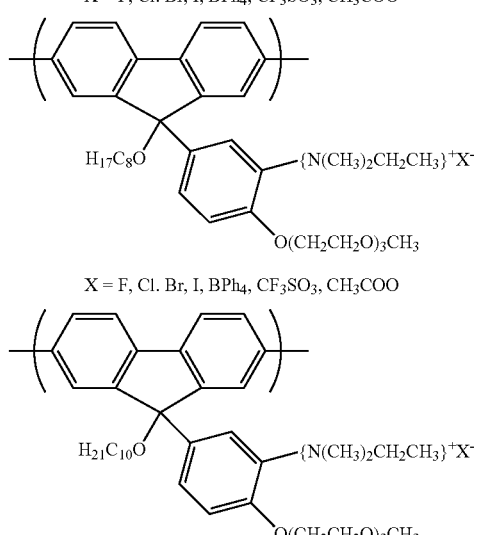

X = F, Cl. Br, I, BPh$_4$, CF$_3$SO$_3$, CH$_3$COO

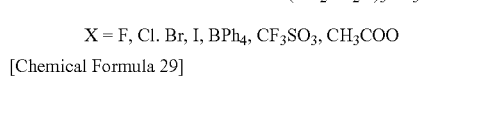

X = F, Cl. Br, I, BPh$_4$, CF$_3$SO$_3$, CH$_3$COO

[Chemical Formula 29]

(27)

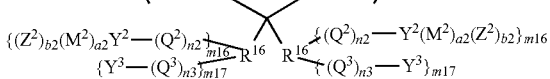

In Formula (27), $R^{16}$ represents a (1+m16+m17) valent organic group; $Q^2$, $Q^3$, $Y^2$, $M^2$, $Z^2$, $Y^3$, n2, a2, b2 and n3 represent the same as defined above; m16 and m17 represent independently an integer of 1 or more; when $R^{16}$ is plurally present, they may be the same as or different from each other; when m16 is plurally present, they may be the same as or different from each other; when m17 is plurally present, they may be the same as or different from each other; when $Q^2$ is plurally present, they may be the same as or different from each other; when $Q^3$ is plurally present, they may be the same as or different from each other; when $Y^2$ is plurally present, they may be the same as or different from each other; when $M^2$ is plurally present, they may be the same as or different from each other; when $Z^2$ is plurally present, they may be the same as or different from each other; when $Y^3$ is plurally present, they may be the same as or different from each other; when n2 is plurally present, they may be the same as or different from each other; when a2 is plurally present, they may be the same as or different from each other; when b2 is plurally present, they may be the same as or different from each other; and when n3 is plurally present, they may be the same as or different from each other.

In Formula (27), examples of the (1+m16+m17) valent organic group represented by $R^{16}$ may include: a group remaining after removing (m16+m17) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m16+m17) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m16+m17) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m16+m17) hydrogen atoms from an amino group having a substituent containing a carbon atom; and a group remaining after removing (m16+m17) hydrogen atoms from a silyl group having a substituent containing a carbon atom. From the viewpoint of simplicity of synthesis of the raw material monomer, the (1+m16+m17) valent organic group represented by $R^{16}$ is preferably a group remaining after removing (m16+m17) hydrogen atoms from an alkyl group, a group remaining after removing (m16+m17) hydrogen atoms from an aryl group, or a group remaining after removing (m16+m17) hydrogen atoms from an alkoxy group.

Examples of the structural unit represented by Formula (27) may include the following structural units.

[Chemical Formula 30]

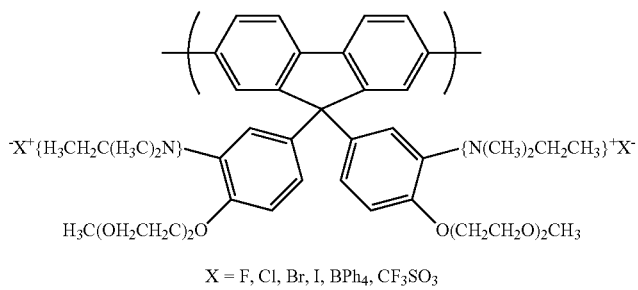

X = F, Cl, Br, I, BPh$_4$, CF$_3$SO$_3$

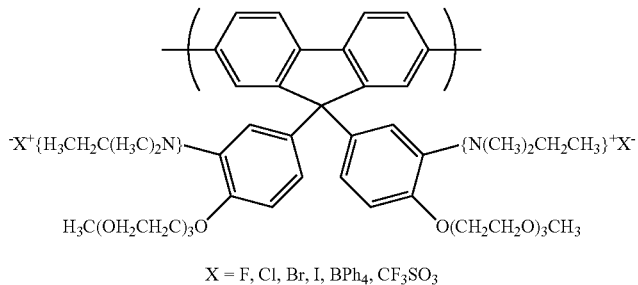

X = F, Cl, Br, I, BPh$_4$, CF$_3$SO$_3$

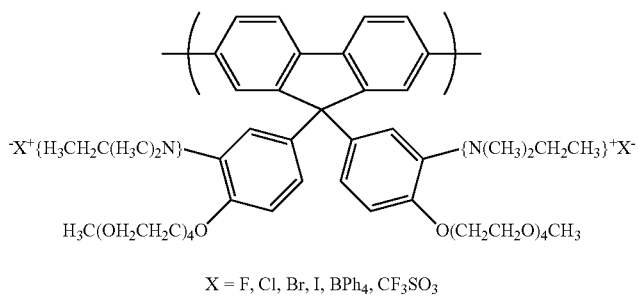

X = F, Cl, Br, I, BPh$_4$, CF$_3$SO$_3$

-continued
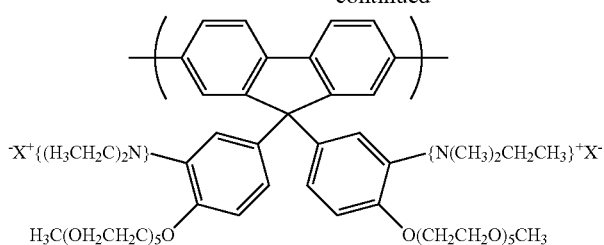
X = F, Cl, Br, I, BPh4, CF3SO3
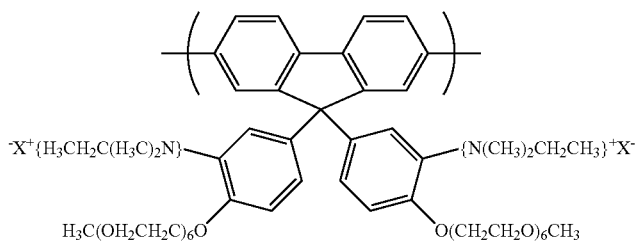
X = F, Cl, Br, I, BPh4, CF3SO3
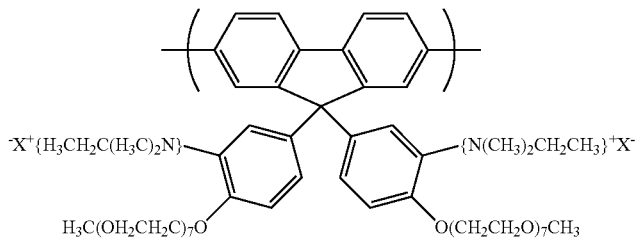
X = F, Cl, Br, I, BPh4, CF3SO3
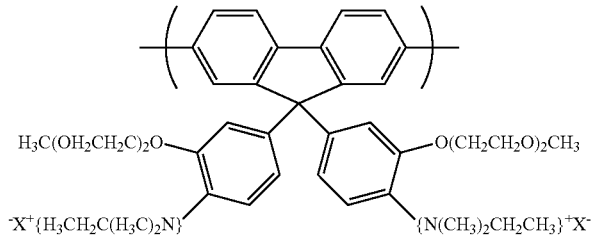
X = F, Cl, Br, I, BPh4, CF3SO3
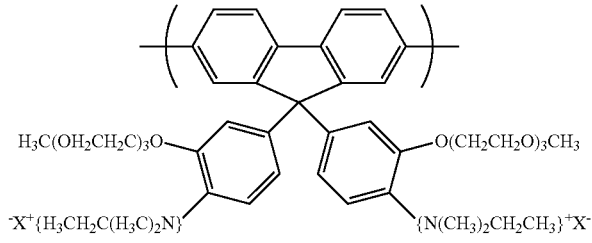
X = F, Cl, Br, I, BPh4, CF3SO3

-continued
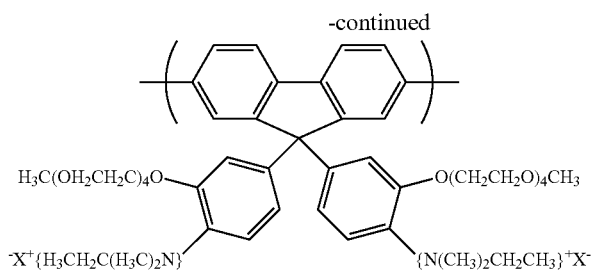
X = F, Cl, Br, I, BPh₄, CF₃SO₃
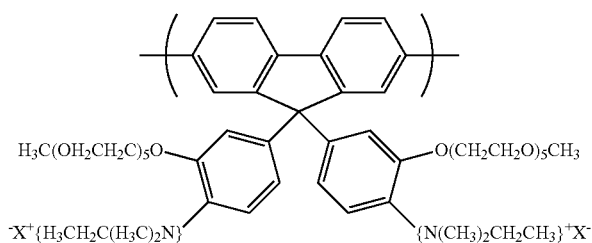
X = F, Cl, Br, I, BPh₄, CF₃SO₃
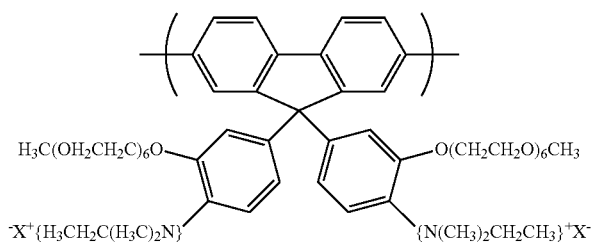
X = F, Cl, Br, I, BPh₄, CF₃SO₃
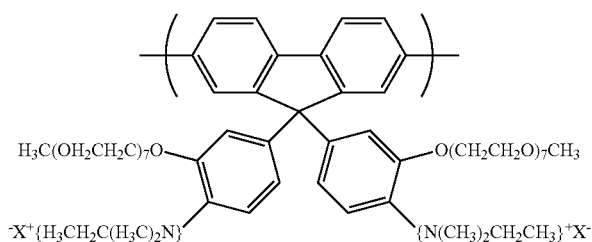
X = F, Cl, Br, I, BPh₄, CF₃SO₃
[Chemical Formula 31]
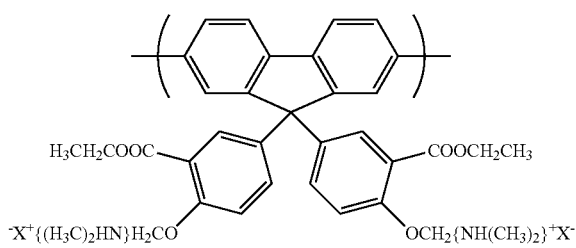
X = F, Cl, Br, I, BPh₄, CF₃SO₃, CH₃COO -continued
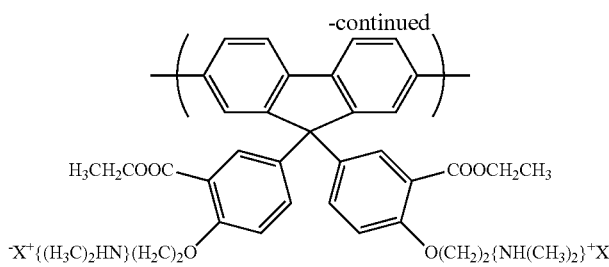
X = F, Cl, Br, I, BPh₄, CF₃SO₃, CH₃COO
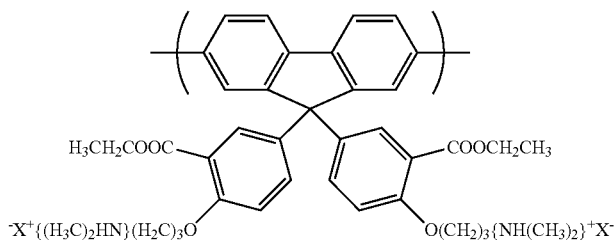
X = F, Cl, Br, I, BPh₄, CF₃SO₃, CH₃COO
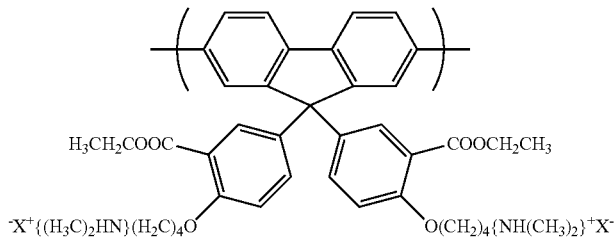
X = F, Cl, Br, I, BPh₄, CF₃SO₃, CH₃COO
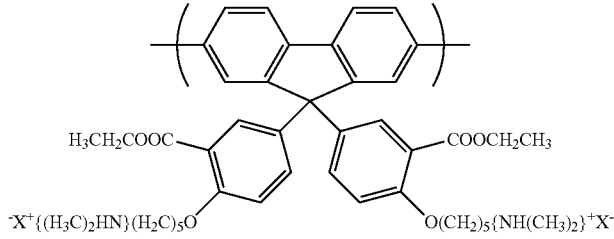
X = F, Cl, Br, I, BPh₄, CF₃SO₃, CH₃COO
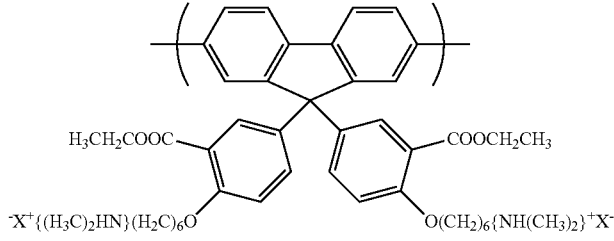
X = F, Cl, Br, I, BPh₄, CF₃SO₃, CH₃COO
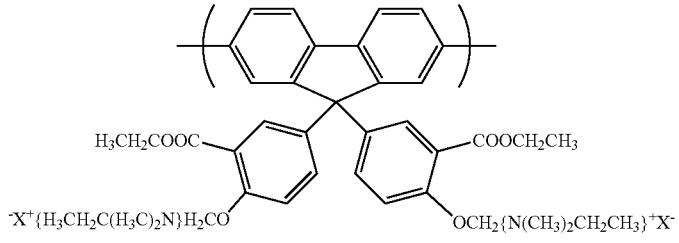
X = F, Cl, Br, I, BPh₄, CF₃SO₃, CH₃COO

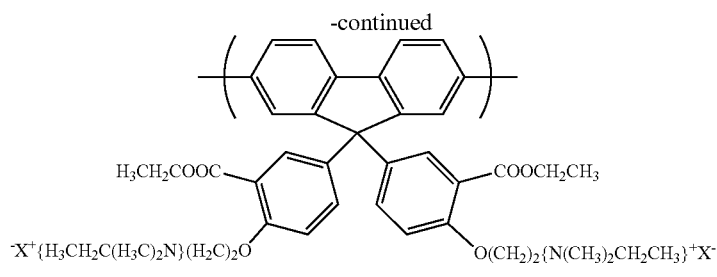
X = F, Cl, Br, I, BPh4, CF3SO3, CH3COO
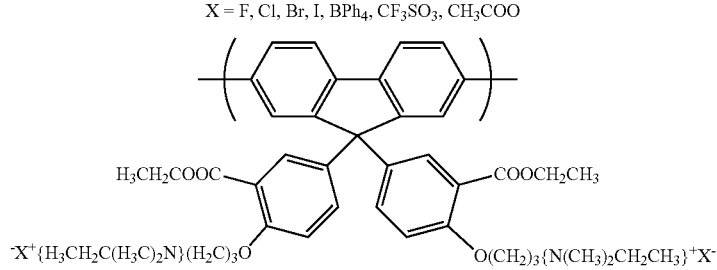
X = F, Cl, Br, I, BPh4, CF3SO3, CH3COO
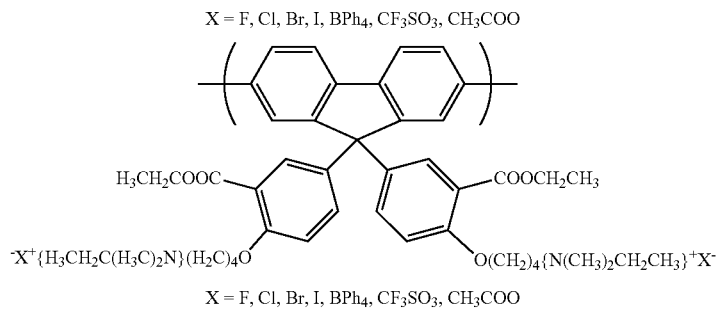
X = F, Cl, Br, I, BPh4, CF3SO3, CH3COO
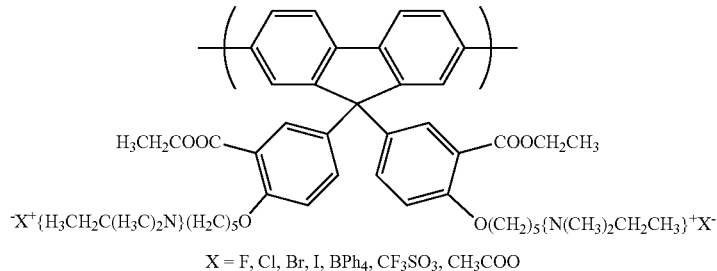
X = F, Cl, Br, I, BPh4, CF3SO3, CH3COO
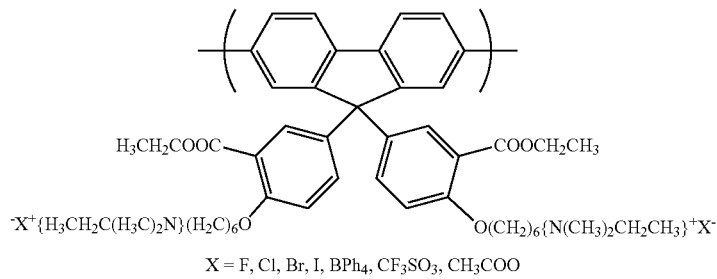
X = F, Cl, Br, I, BPh4, CF3SO3, CH3COO
[Chemical Formula 32]
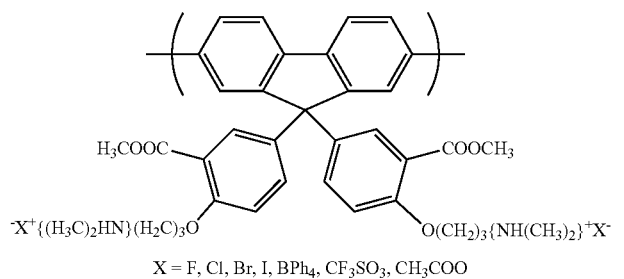
X = F, Cl, Br, I, BPh4, CF3SO3, CH3COO

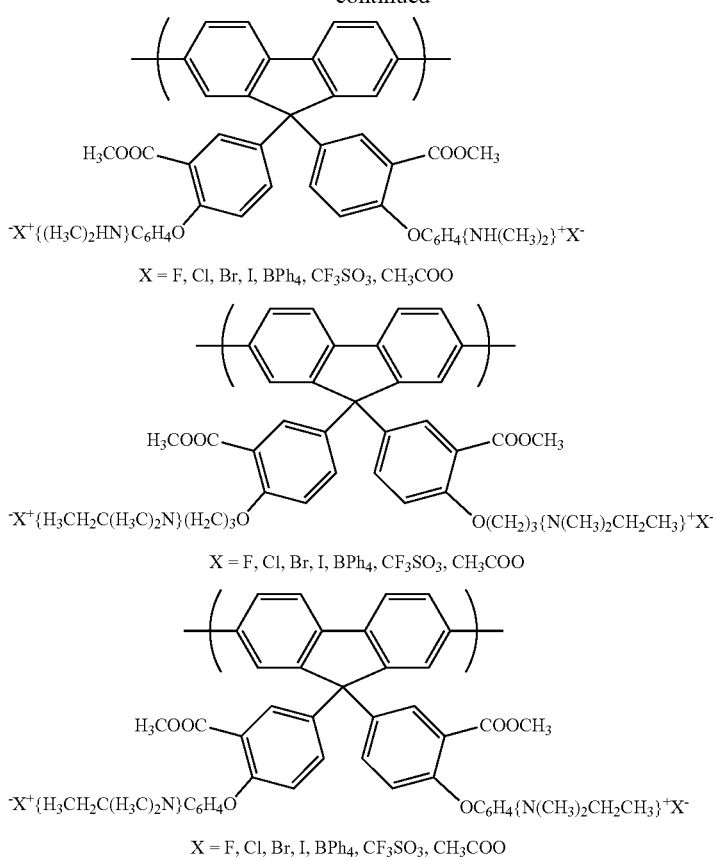
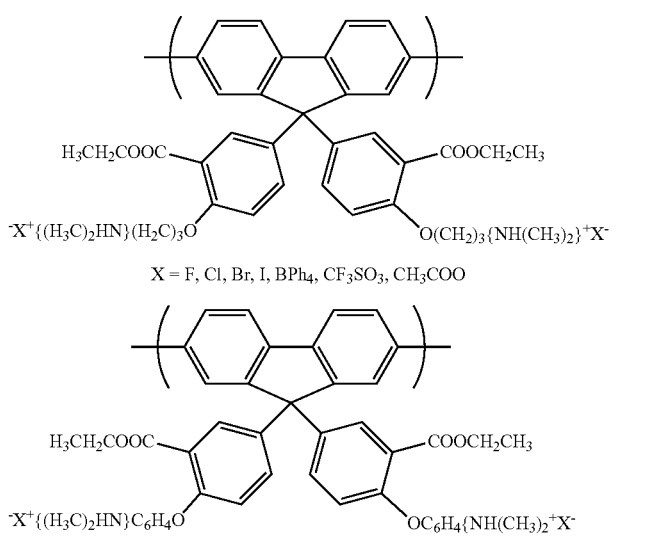
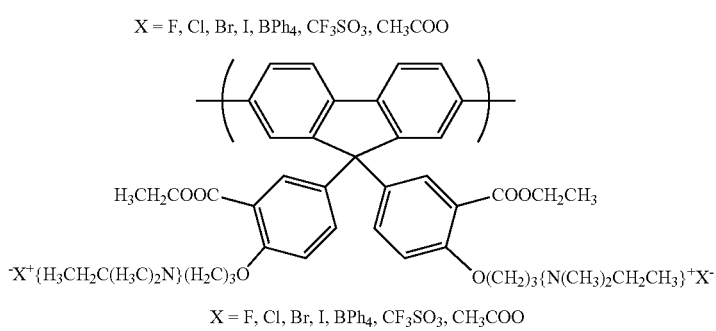

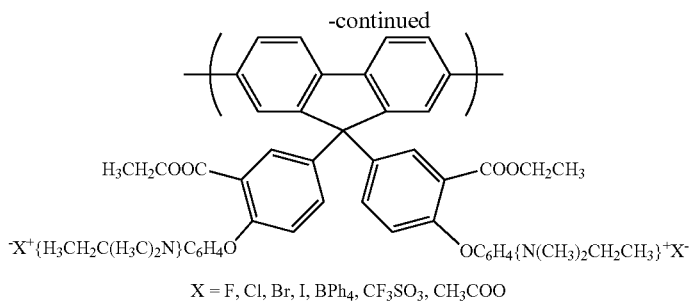

X = F, Cl, Br, I, BPh₄, CF₃SO₃, CH₃COO

From the viewpoint of the durability of the obtained ionic polymer, the structural unit represented by Formula (15) is preferably a structural unit represented by Formula (28).

[Chemical Formula 33]

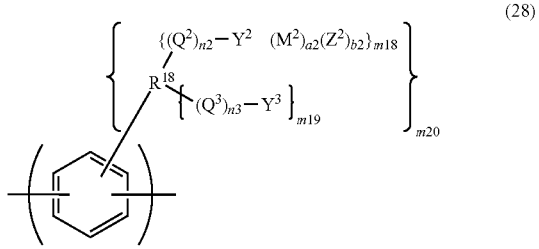

(28)

In Formula (28), $R^{18}$ represents a (1+m18+m19) valent organic group; $Q^2$, $Q^3$, $Y^2$, $M^2$, $Z^2$, $Y^3$, n2, a2, b2 and n3 represent the same as defined above; m18, m19 and m20 represent independently an integer of 1 or more; when $R^{18}$ is plurally present, they may be the same as or different from each other; when m18 is plurally present, they may be the same as or different from each other; when m19 is plurally present, they may be the same as or different from each other; when $Q^2$ is plurally present, they may be the same as or different from each other; when $Q^3$ is plurally present, they may be the same as or different from each other; when $Y^2$ is plurally present, they may be the same as or different from each other; when $M^2$ is plurally present, they may be the same as or different from each other; when $Z^2$ is plurally present, they may be the same as or different from each other; when $Y^3$ is plurally present, they may be the same as or different from each other; when n2 is plurally present, they may be the same as or different from each other; when a2 is plurally present, they may be the same as or different from each other; when b2 is plurally present, they may be the same as or different from each other; and when n3 is plurally present, they may be the same as or different from each other.

In Formula (28), examples of the (1+m18+m19) valent organic group represented by $R^{18}$ may include: a group remaining after removing (m18+m19) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m18+m19) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m18+m19) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m18+m19) hydrogen atoms from an amino group having a substituent containing a carbon atom; and a group remaining after removing (m18+m19) hydrogen atoms from a silyl group having a substituent containing a carbon atom. From the viewpoint of simplicity of synthesis of the raw material monomer, the (1+m18+m19) valent organic group represented by $R^{18}$ is preferably a group remaining after removing (m18+m19) hydrogen atoms from an alkyl group, a group remaining after removing (m18+m19) hydrogen atoms from an aryl group, or a group remaining after removing (m18+m19) hydrogen atoms from an alkoxy group.

Examples of the structural unit represented by Formula (28) may include the following structural units.

[Chemical Formula 34]

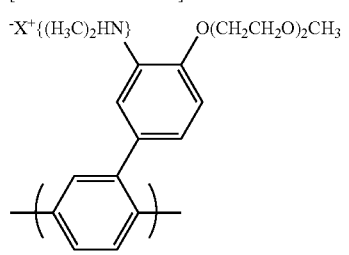

X = F, Cl, Br, I, BPh₄, CF₃SO₃, CH₃COO

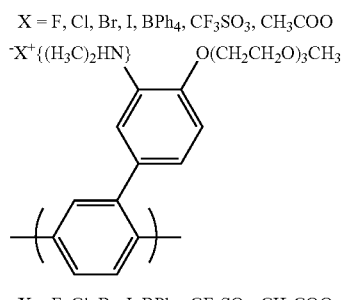

X = F, Cl, Br, I, BPh₄, CF₃SO₃, CH₃COO

-continued

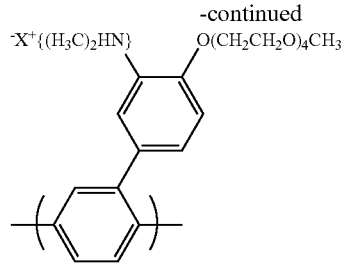

X = F, Cl, Br, I, BPh₄, CF₃SO₃, CH₃COO

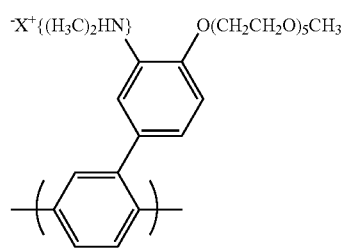

X = F, Cl, Br, I, BPh₄, CF₃SO₃, CH₃COO

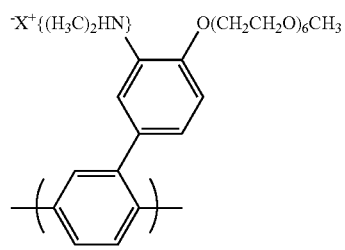

X = F, Cl, Br, I, BPh₄, CF₃SO₃, CH₃COO

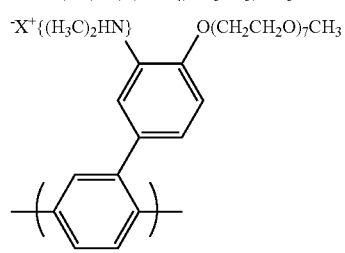

X = F, Cl, Br, I, BPh₄, CF₃SO₃, CH₃COO

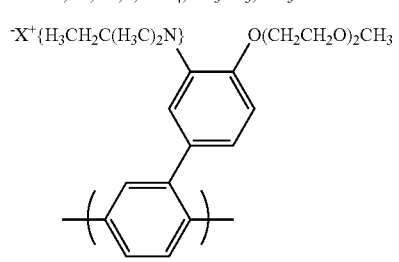

X = F, Cl, Br, I, BPh₄, CF₃SO₃, CH₃COO

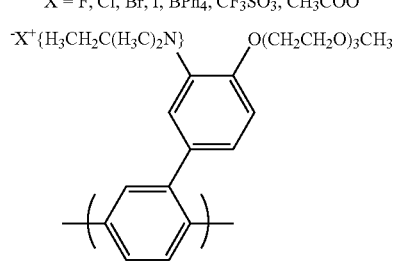

X = F, Cl, Br, I, BPh₄, CF₃SO₃, CH₃COO

-continued

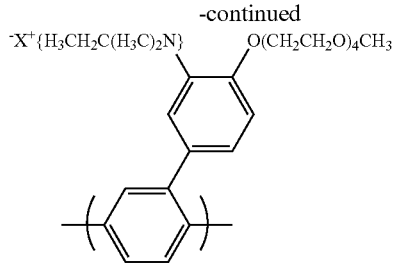

X = F, Cl, Br, I, BPh₄, CF₃SO₃, CH₃COO

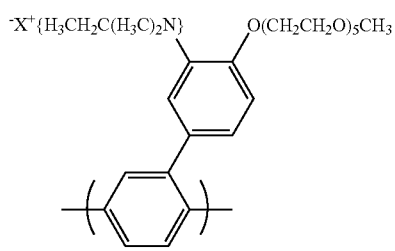

X = F, Cl, Br, I, BPh₄, CF₃SO₃, CH₃COO

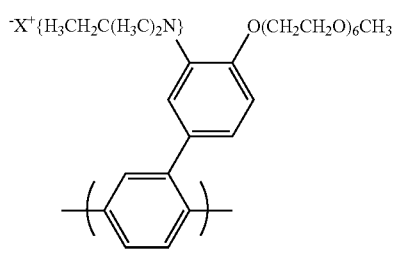

X = F, Cl, Br, I, BPh₄, CF₃SO₃, CH₃COO

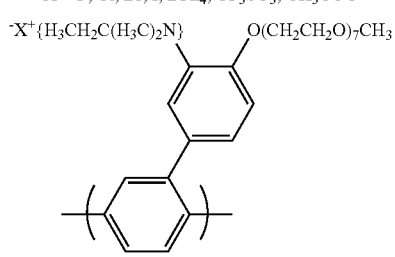

X = F, Cl, Br, I, BPh₄, CF₃SO₃, CH₃COO

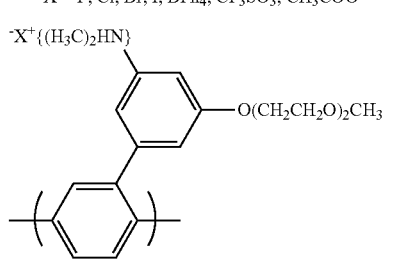

X = F, Cl, Br, I, BPh₄, CF₃SO₃, CH₃COO

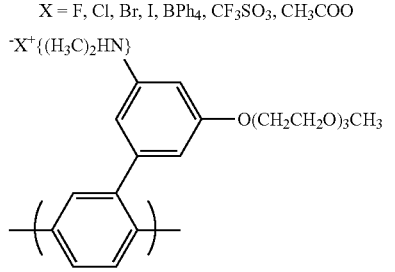

X = F, Cl, Br, I, BPh₄, CF₃SO₃, CH₃COO

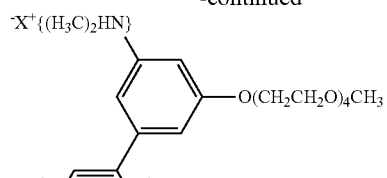

X = F, Cl, Br, I, BPh4, CF3SO3, CH3COO

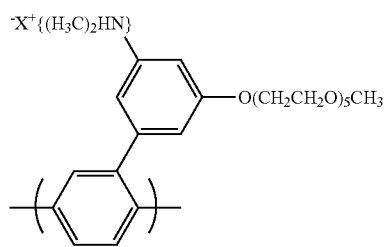

X = F, Cl, Br, I, BPh4, CF3SO3, CH3COO

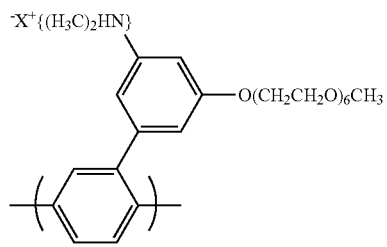

X = F, Cl, Br, I, BPh4, CF3SO3, CH3COO

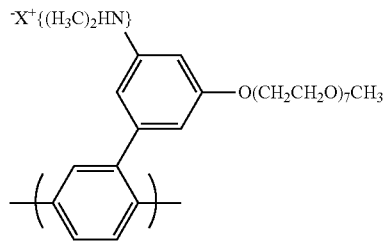

X = F, Cl, Br, I, BPh4, CF3SO3, CH3COO

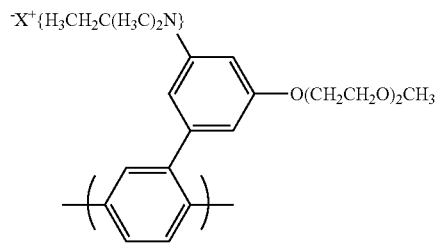

X = F, Cl, Br, I, BPh4, CF3SO3, CH3COO

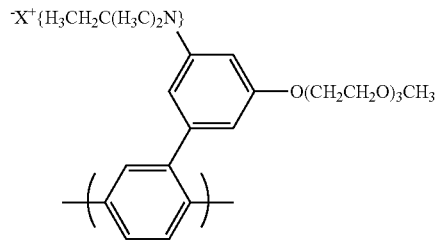

X = F, Cl, Br, I, BPh4, CF3SO3, CH3COO

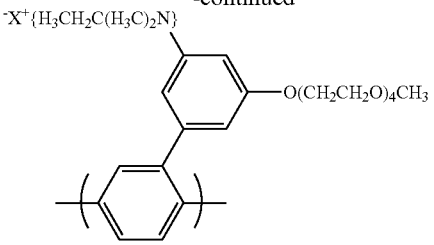

X = F, Cl, Br, I, BPh4, CF3SO3, CH3COO

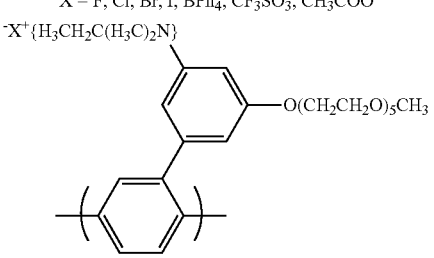

X = F, Cl, Br, I, BPh4, CF3SO3, CH3COO

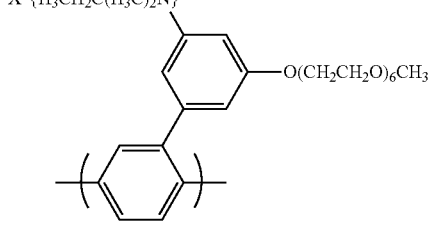

X = F, Cl, Br, I, BPh4, CF3SO3, CH3COO

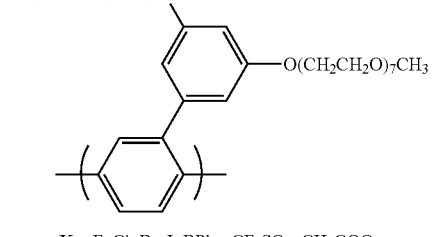

X = F, Cl, Br, I, BPh4, CF3SO3, CH3COO

Example of Structural Unit Represented by Formula (17)

From the viewpoint of the electron transport property of the obtained ionic polymer, the structural unit represented by Formula (17) is preferably a structural unit represented by Formula (29).

[Chemical Formula 35]

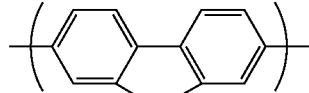

(29)

In Formula (29), $R^{19}$ represents a single bond or a (1+m21) valent organic group; $R^{20}$ represents a single bond or a (1+m22) valent organic group; $Q^1, Q^3, Y^1, M^1, M^1, Z^1, Y^3$, n1, a1, b1 and n3 represent the same as defined above; m21 and m22 represent independently an integer of 1 or more, with the proviso that when $R^{19}$ is a single bond, m21 represents 1 and when $R^{20}$ is a single bond, m 22 represents 1; when $Q^1$ is plurally present, they may be the same as or different from each other; when $Q^3$ is plurally present, they may be the same as or different from each other; when $Y^1$ is plurally present, they may be the same as or different from each other; when $M^1$ is plurally present, they may be the same as or different from each other; when $Z^1$ is plurally present, they may be the same as or different from each other; when $Y^3$ is plurally present, they may be the same as or different from each other; when n1 is plurally present, they may be the same as or different from each other; when a1 is plurally present, they may be the same as or different from each other; when b1 is plurally present, they may be the same as or different from each other; and when n3 is plurally present, they may be the same as or different from each other.

In Formula (29), examples of the (1+m21) valent organic group represented by $R^{19}$ may include: a group remaining after removing (m21) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m21) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m21) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m21) hydrogen atoms from an amino group having a substituent containing a carbon atom; and a group remaining after removing (m21) hydrogen atoms from a silyl group having a substituent containing a carbon atom. From the viewpoint of simplicity of synthesis of the raw material monomer, the (1+m21) valent organic group represented by $R^{19}$ is preferably a group remaining after removing (m21) hydrogen atoms from an alkyl group, a group remaining after removing (m21) hydrogen atoms from an aryl group, or a group remaining after removing (m21) hydrogen atoms from an alkoxy group.

In Formula (29), examples of the (1+m22) valent organic group represented by $R^{20}$ may include: a group remaining after removing (m22) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m22) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m22) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m22) hydrogen atoms from an amino group having a substituent containing a carbon atom; and a group remaining after removing (m22) hydrogen atoms from a silyl group having a substituent containing a carbon atom. From the viewpoint of simplicity of synthesis of the raw material monomer, the (1+m22) valent organic group represented by $R^{20}$ is preferably a group remaining after removing (m22) hydrogen atoms from an alkyl group, a group remaining after removing (m22) hydrogen atoms from an aryl group, or a group remaining after removing (m22) hydrogen atoms from an alkoxy group.

Examples of the structural unit represented by Formula (29) may include the following structural units.

[Chemical Formula 36]

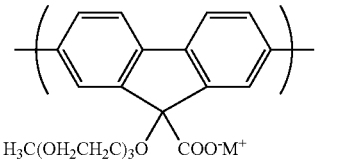

M = Li, Na, K, Cs, N(CH$_3$)$_4$

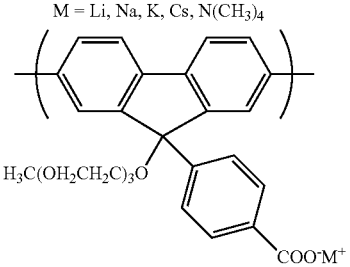

M = Li, Na, K, Cs, N(CH$_3$)$_4$

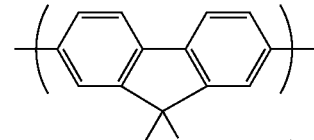

M = Li, Na, K, Cs, N(CH$_3$)$_4$

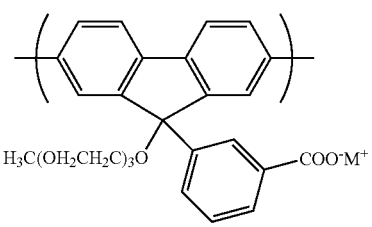

M = Li, Na, K, Cs, N(CH$_3$)$_4$

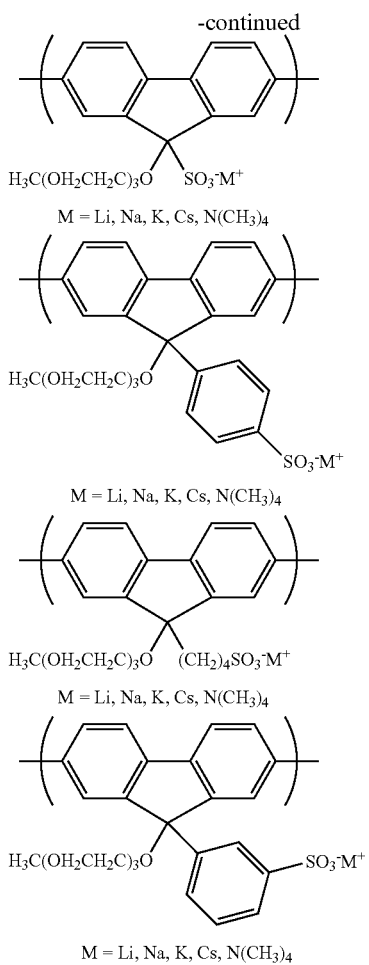

From the viewpoint of the durability of the obtained ionic polymer, the structural unit represented by Formula (17) is preferably a structural unit represented by Formula (30).

[Chemical Formula 37]

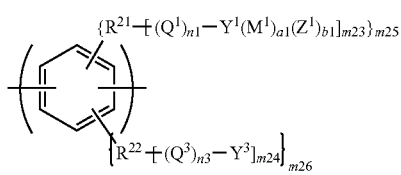

In Formula (30), $R^{21}$ represents a single bond or a (1+m23) valent organic group; $R^{22}$ represents a single bond or a (1+m24) valent organic group; $Q^1$, $Q^3$, $Y^1$, $M^1$, $Z^1$, $Y^3$, n1, a1, b1 and n3 represent the same as defined above; m23 and m24 represent independently an integer of 1 or more, with the proviso that when $R^{21}$ is a single bond, m23 represents 1 and when $R^{22}$ is a single bond, m24 represents 1; m25 and m26 represent independently an integer of 1 or more; when m23 is plurally present, they may be the same as or different from each other; when m24 is plurally present, they may be the same as or different from each other; when $R^{21}$ is plurally present, they may be the same as or different from each other; when $R^{22}$ is plurally present, they may be the same as or different from each other; when $Q^2$ is plurally present, they may be the same as or different from each other; when $Q^3$ is plurally present, they may be the same as or different from each other; when $Y^2$ is plurally present, they may be the same as or different from each other; when $M^2$ is plurally present, they may be the same as or different from each other; when $Z^2$ is plurally present, they may be the same as or different from each other; when $Y^3$ is plurally present, they may be the same as or different from each other; when n1 is plurally present, they may be the same as or different from each other; when a1 is plurally present, they may be the same as or different from each other; when b1 is plurally present, they may be the same as or different from each other; and when n3 is plurally present, they may be the same as or different from each other.

In Formula (30), examples of the (1+m23) valent organic group represented by $R^{21}$ may include: a group remaining after removing (m23) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m23) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m23) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m23) hydrogen atoms from an amino group having a substituent containing a carbon atom; and a group remaining after removing (m23) hydrogen atoms from a silyl group having a substituent containing a carbon atom. From the viewpoint of simplicity of synthesis of the raw material monomer, the (1+m23) valent organic group represented by $R^{21}$ is preferably a group remaining after removing (m23) hydrogen atoms from an alkyl group, a group remaining after removing (m23) hydrogen atoms from an aryl group, or a group remaining after removing (m23) hydrogen atoms from an alkoxy group.

In Formula (30), examples of the (1+m24) valent organic group represented by $R^{22}$ may include: a group remaining after removing (m24) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m24) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m24) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m24) hydrogen atoms from an amino group having a substituent containing a carbon atom; and a group remaining after removing (m24) hydrogen atoms from a silyl group having a substituent containing a carbon atom. From the viewpoint of simplicity of synthesis of the raw material monomer, the (1+m24) valent organic group represented by $R^{22}$ is preferably a group remaining after removing (m24) hydrogen atoms from an alkyl group, a group remaining after removing (m24) hydrogen atoms from an aryl group, or a group remaining after removing (m24) hydrogen atoms from an alkoxy group.

Examples of the structural unit represented by Formula (30) may include the following structural units.

[Chemical Formula 38]

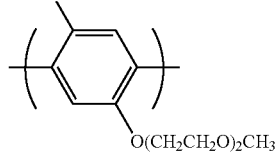

M = Li, Na, K, Cs, NMe$_4$

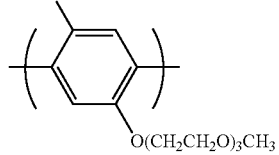

M = Li, Na, K, Cs, NMe$_4$

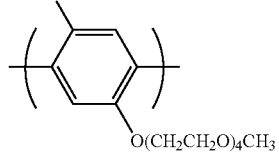

M = Li, Na, K, Cs, NMe$_4$

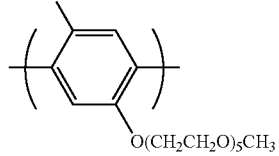

M = Li, Na, K, Cs, NMe$_4$

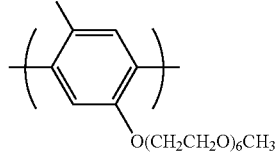

M = Li, Na, K, Cs, NMe$_4$

-continued

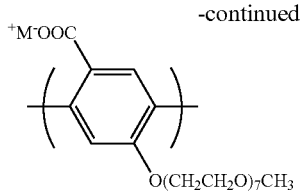

M = Li, Na, K, Cs, NMe$_4$

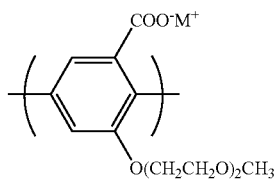

M = Li, Na, K, Cs, NMe$_4$

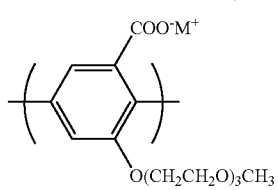

M = Li, Na, K, Cs, NMe$_4$

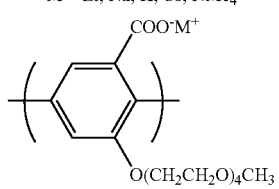

M = Li, Na, K, Cs, NMe$_4$

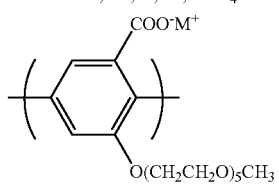

M = Li, Na, K, Cs, NMe$_4$

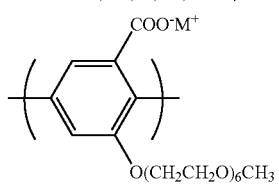

M = Li, Na, K, Cs, NMe$_4$

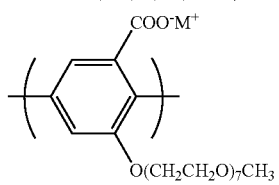

M = Li, Na, K, Cs, NMe$_4$

-continued

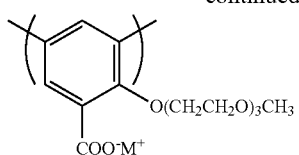
M = Li, Na, K, Cs, NMe$_4$

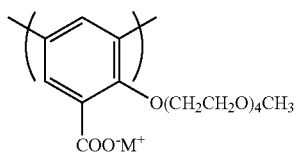
M = Li, Na, K, Cs, NMe$_4$

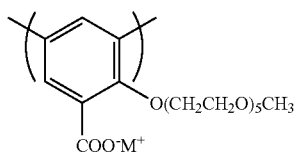
M = Li, Na, K, Cs, NMe$_4$

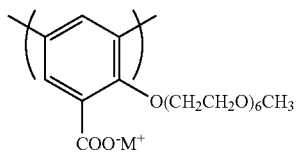
M = Li, Na, K, Cs, NMe$_4$

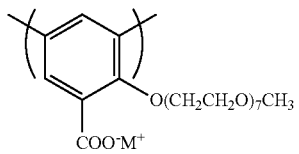
M = Li, Na, K, Cs, NMe$_4$

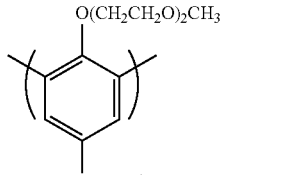
M = Li, Na, K, Cs, NMe$_4$

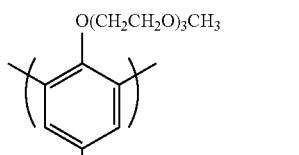
M = Li, Na, K, Cs, NMe$_4$

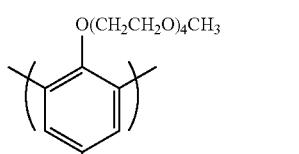
M = Li, Na, K, Cs, NMe$_4$

-continued

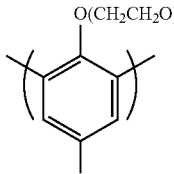
M = Li, Na, K, Cs, NMe$_4$

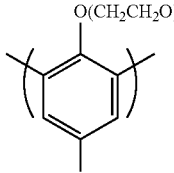
M = Li, Na, K, Cs, NMe$_4$

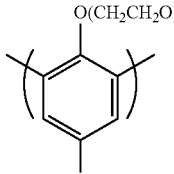
M = Li, Na, K, Cs, NMe$_4$

Example of Structural Unit Represented by Formula (20)

From the viewpoint of the obtained electron transport property, the structural unit represented by Formula (20) is preferably a structural unit represented by Formula (31).

[Chemical Formula 39]

(31)

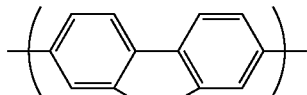

In Formula (31), $R^{23}$ represents a single bond or a (1+m27) valent organic group; $R^{24}$ represents a single bond or a (1+m28) valent organic group; $Q^2$, $Q^3$, $Y^2$, $M^2$, $Z^2$, $Y^3$, n2, a2, b2 and n3 represent the same as defined above; m27 and m28 represent independently an integer of 1 or more, with the proviso that when $R^{23}$ is a single bond, m27 represents 1 and when $R^{24}$ is a single bond, m28 represents 1; when $Q^2$ is plurally present, they may be the same as or different from each other; when $Q^3$ is plurally present, they may be the same as or different from each other; when $Y^2$ is plurally present, they may be the same as or different from each other; when $M^2$ is plurally present, they may be the same as or different from each other; when $Z^2$ is plurally present, they may be the same as or different from each other; when $Y^3$ is plurally present, they may be the same as or different from each other; when n2 is plurally present, they may be the same as or different from each other; when a2 is plurally present, they may be the same as or different from each other; when b2 is plurally present, they may be the same as or different from each other; and when n3 is plurally present, they may be the same as or different from each other.

In Formula (31), examples of the (1+m27) valent organic group represented by $R^{23}$ may include: a group remaining after removing (m27) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m27) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m27) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m27) hydrogen atoms from an amino group having a substituent containing a carbon atom; and a group remaining after removing (m27) hydrogen atoms from a silyl group having a substituent containing a carbon atom. From the viewpoint of simplicity of synthesis of the raw material monomer, the (1+m27) valent organic group represented by $R^{23}$ is preferably a group remaining after removing (m27) hydrogen atoms from an alkyl group, a group remaining after removing (m27) hydrogen atoms from an aryl group, or a group remaining after removing (m27) hydrogen atoms from an alkoxy group.

In Formula (31), examples of the (1+m28) valent organic group represented by $R^{24}$ may include: a group remaining after removing (m28) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m28) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m28) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m28) hydrogen atoms from an amino group having a substituent containing a carbon atom; and a group remaining after removing (m28) hydrogen atoms from a silyl group having a substituent containing a carbon atom. From the viewpoint of simplicity of synthesis of the raw material monomer, the (1+m28) valent organic group represented by $R^{24}$ is preferably a group remaining after removing (m28) hydrogen atoms from an alkyl group, a group remaining after removing (m28) hydrogen atoms from an aryl group, or a group remaining after removing (m28) hydrogen atoms from an alkoxy group.

Examples of the structural unit represented by Formula (31) may include the following structural units.

[Chemical Formula 40]

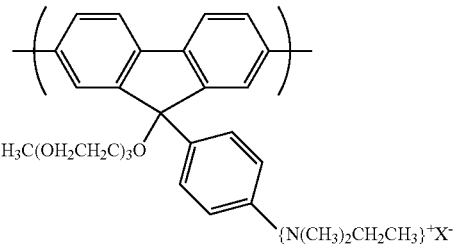

X = F, Cl, Br, I, $BPh_4$, $CF_3SO_3$, $CH_3COO$

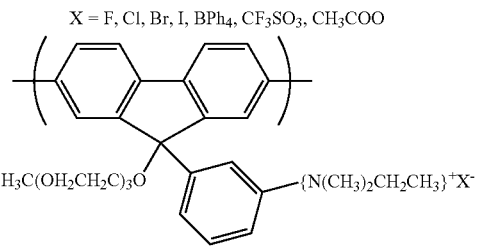

X = F, Cl, Br, I, $BPh_4$, $CF_3SO_3$, $CH_3COO$

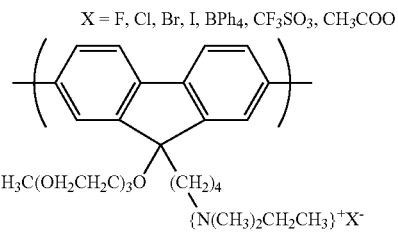

X = F, Cl, Br, I, $BPh_4$, $CF_3SO_3$, $CH_3COO$

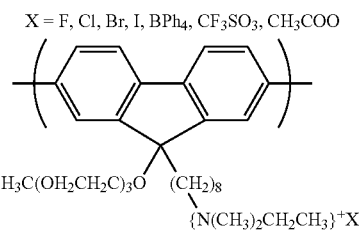

X = F, Cl, Br, I, $BPh_4$, $CF_3SO_3$, $CH_3COO$

From the viewpoint of the durability of the obtained ionic polymer, the structural unit represented by Formula (20) is preferably a structural unit represented by Formula (32).

[Chemical Formula 41]

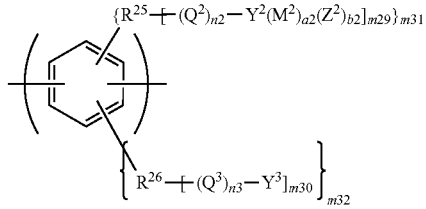

(32)

In Formula (32), $R^{25}$ represents a single bond or a (1+m29) valent organic group; $R^{26}$ represents a single bond or a (1+m30) valent organic group; $Q^2$, $Q^3$, $Y^2$, $M^2$, $Z^2$, $Y^3$, n2, a2, b2 and n3 represent the same as defined above; m29 and m30 represent independently an integer of 1 or more, with the proviso that when $R^{25}$ is a single bond, m29 represents 1 and when $R^{26}$ is a single bond, m30 represents 1; m31 and m32 represent independently an integer of 1 or more; when m29 is plurally present, they may be the same as or different from each other; when m30 is plurally present, they may be the same as or different from each other; when $R^{25}$ is plurally present, they may be the same as or different from each other; when $R^{26}$ is plurally present, they may be the same as or different from each other; when $Q^2$ is plurally present, they may be the same as or different from each other; when $Q^3$ is plurally present, they may be the same as or different from each other; when $Y^2$ is plurally present, they may be the same as or different from each other; when $M^2$ is plurally present, they may be the same as or different from each other; when $Z^2$ is plurally present, they may be the same as or different from each other; when $Y^3$ is plurally present, they may be the same as or different from each other; when n2 is plurally present, they may be the same as or different from each other; when a2 is plurally present, they may be the same as or different from each other; when b2 is plurally present, they may be the same as or different from each other; and when n3 is plurally present, they may be the same as or different from each other.

In Formula (32), examples of the (1+m29) valent organic group represented by $R^{25}$ may include: a group remaining after removing (m29) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m29) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m29) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m29) hydrogen atoms from an amino group having a substituent containing a carbon atom; and a group remaining after removing (m29) hydrogen atoms from a silyl group having a substituent containing a carbon atom. From the viewpoint of simplicity of synthesis of the raw material monomer, the (1+m29) valent organic group represented by $R^{25}$ is preferably a group remaining after removing (m29) hydrogen atoms from an alkyl group, a group remaining after removing (m29) hydrogen atoms from an aryl group, or a group remaining after removing (m29) hydrogen atoms from an alkoxy group.

In Formula (32), examples of the (1+m30) valent organic group represented by $R^{26}$ may include: a group remaining after removing (m30) hydrogen atoms from a $C_{1-20}$ alkyl group optionally having a substituent such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a nonyl group, a decyl group, a dodecyl group and a group in which at least one hydrogen atom in these groups is substituted with a substituent; a group remaining after removing (m30) hydrogen atoms from a $C_{6-30}$ aryl group optionally having a substituent such as a phenyl group, a 1-naphthyl group, a 2-naphthyl group, a 1-anthracenyl group, a 2-anthracenyl group, a 9-anthracenyl group and a group in which at least one hydrogen atom in these groups is substituted with a substituent; a group remaining after removing (m30) hydrogen atoms from a $C_{1-50}$ alkoxy group optionally having a substituent such as a methoxy group, an ethoxy group, a propoxy group, a butoxy group, a pentyloxy group, a hexyloxy group, a nonyloxy group, a dodecyloxy group, a cyclopropyloxy group, a cyclobutyloxy group, a cyclopentyloxy group, a cyclohexyloxy group, a cyclononyloxy group, a cyclododecyloxy group, a norbornyloxy group, an adamantyloxy group and a group in which at least one hydrogen atom in these groups is substituted with a substituent; a group remaining after removing (m30) hydrogen atoms from an amino group having a substituent containing a carbon atom; and a group remaining after removing (m30) hydrogen atoms from a silyl group having a substituent containing a carbon atom. From the viewpoint of simplicity of synthesis of the raw material monomer, the (1+m30) valent organic group represented by $R^{26}$ is preferably a group remaining after removing (m30) hydrogen atoms from an alkyl group, a group remaining after removing (m30) hydrogen atoms from an aryl group, or a group remaining after removing (m30) hydrogen atoms from an alkoxy group.

Examples of the structural unit represented by Formula (32) may include the following structural units.

[Chemical Formula 42]

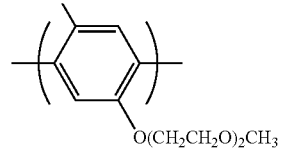

X = F, Cl, Br, I, BPh$_4$, CF$_3$SO$_3$, CH$_3$COO

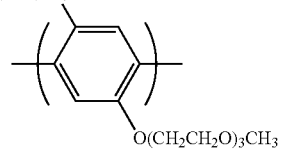

X = F, Cl, Br, I, BPh$_4$, CF$_3$SO$_3$, CH$_3$COO

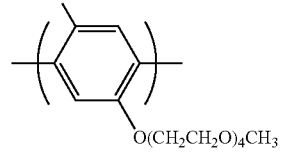

X = F, Cl, Br, I, BPh$_4$, CF$_3$SO$_3$, CH$_3$COO

-continued
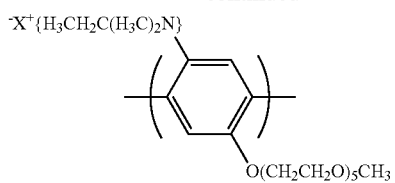
X = F, Cl, Br, I, BPh4, CF3SO3, CH3COO
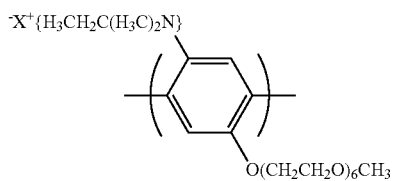
X = F, Cl, Br, I, BPh4, CF3SO3, CH3COO
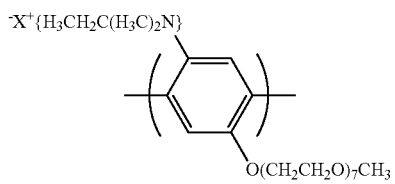
X = F, Cl, Br, I, BPh4, CF3SO3, CH3COO
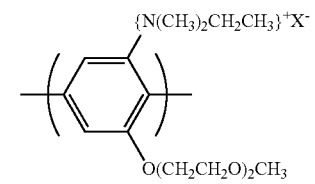
X = F, Cl, Br, I, BPh4, CF3SO3, CH3COO
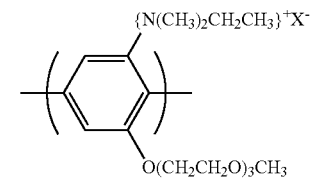
X = F, Cl, Br, I, BPh4, CF3SO3, CH3COO
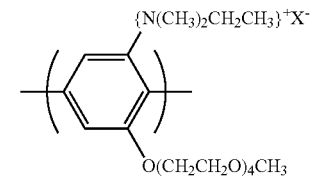
X = F, Cl, Br, I, BPh4, CF3SO3, CH3COO
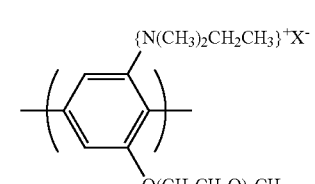
X = F, Cl, Br, I, BPh4, CF3SO3, CH3COO
-continued
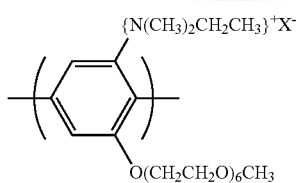
X = F, Cl, Br, I, BPh4, CF3SO3, CH3COO
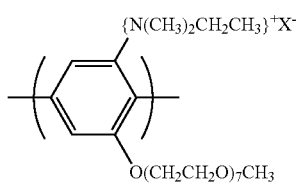
X = F, Cl, Br, I, BPh4, CF3SO3, CH3COO
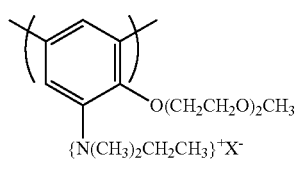
X = F, Cl, Br, I, BPh4, CF3SO3, CH3COO
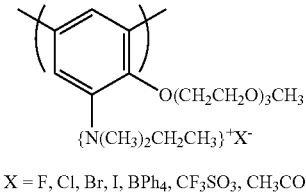
X = F, Cl, Br, I, BPh4, CF3SO3, CH3COO
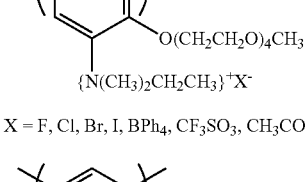
X = F, Cl, Br, I, BPh4, CF3SO3, CH3COO
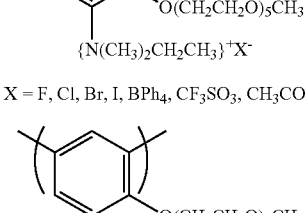
X = F, Cl, Br, I, BPh4, CF3SO3, CH3COO
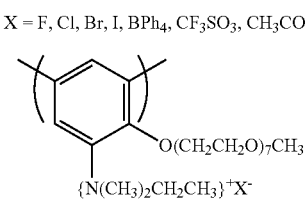
X = F, Cl, Br, I, BPh4, CF3SO3, CH3COO -continued

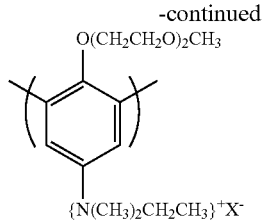

X = F, Cl, Br, I, BPh4, CF3SO3, CH3COO

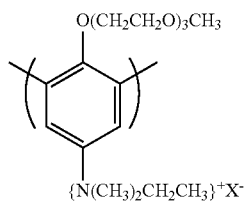

X = F, Cl, Br, I, BPh4, CF3SO3, CH3COO

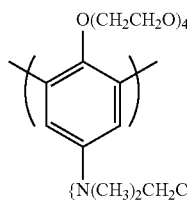

X = F, Cl, Br, I, BPh4, CF3SO3, CH3COO

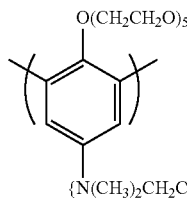

X = F, Cl, Br, I, BPh4, CF3SO3, CH3COO

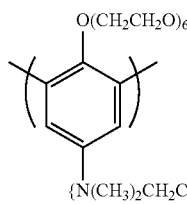

X = F, Cl, Br, I, BPh4, CF3SO3, CH3COO

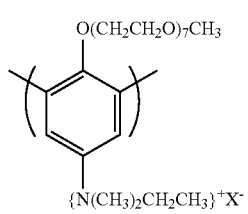

X = F, Cl, Br, I, BPh4, CF3SO3, CH3COO

Other Structural Units

The ionic polymer used in the present invention may further comprise one or more type(s) of structural unit represented by Formula (33).

[Chemical Formula 43]

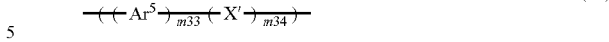

(33)

In Formula (33), $Ar^5$ represents a divalent aromatic group optionally having a substituent or a divalent aromatic amine residue optionally having a substituent; X' represents an imino group optionally having a substituent, a silylene group optionally having a substituent, an ethenylene group optionally having a substituent, or an ethynylene group; and m33 and m34 represent independently 0 or 1, with the proviso that at least one of m33 and m34 is 1.

Examples of the divalent aromatic group represented by $Ar^5$ in Formula (33) may include a divalent aromatic hydrocarbon group and a divalent aromatic heterocyclic group. Examples of the divalent aromatic group may include: a divalent group remaining after removing two hydrogen atoms from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a thiophene ring, a pyrazole ring, an imidazole ring, an oxazole ring, an oxadiazole ring and an azadiazole ring; a divalent group remaining after removing two hydrogen atoms from a fused polycyclic aromatic ring in which two or more rings selected from the group consisting of the above monocyclic aromatic rings are fused; a divalent group remaining after removing two hydrogen atoms from an aromatic ring assembly in which two or more aromatic rings selected from the group consisting of the above monocyclic aromatic rings and the above fused polycyclic aromatic rings are linked through a single bond, an ethenylene group or an ethynylene group; and a divalent group remaining after removing two hydrogen atoms from a crosslinkage-having polycyclic aromatic ring in which two aromatic rings adjacent to each other of the above fused polycyclic aromatic ring or the above aromatic ring assembly are crosslinked through a divalent group such as a methylene group, an ethylene group, a carbonyl group and an imino group.

In the fused polycyclic aromatic ring, the number of monocyclic aromatic rings to be fused is preferably 2 to 4, more preferably 2 to 3, further preferably 2, from the viewpoint of the solubility of the ionic polymer. In the aromatic ring assembly, the number of aromatic rings to be linked is preferably 2 to 4, more preferably 2 to 3, further preferably 2, from the viewpoint of the solubility of the ionic polymer. In the crosslinkage-having polycyclic aromatic ring, the number of aromatic rings to be crosslinked is preferably 2 to 4, more preferably 2 to 3, further preferably 2, from the viewpoint of the solubility of the ionic polymer.

Examples of the monocyclic aromatic ring may include the following rings.

[Chemical Formula 44]

45

46

-continued
47
48
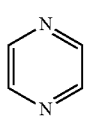
49
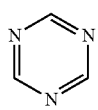
50
51
52
53
54
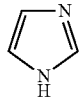
55
56
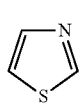
57
58
59
60
Examples of the fused polycyclic aromatic ring may include the following rings.
[Chemical Formula 45]
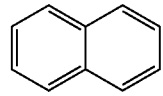
61
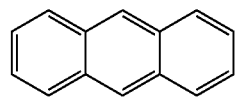
62
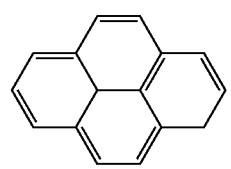
63
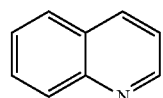
64
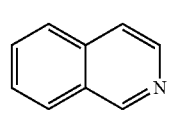
65
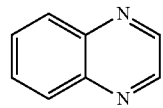
66
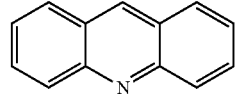
67
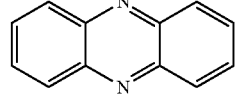
68
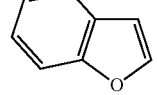
69
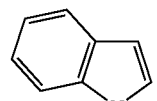
70
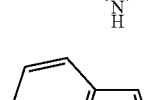
71
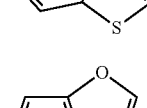
72
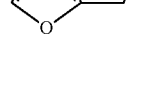

73 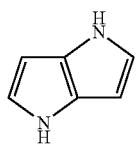
74 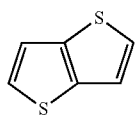
75 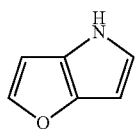
76 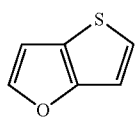
77 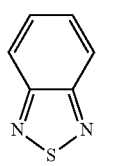
78 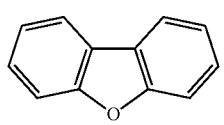
79 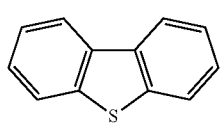
80 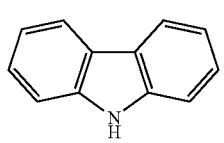
Examples of the aromatic ring assembly may include the following rings.
[Chemical Formula 46]
81 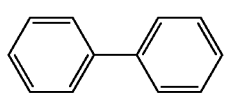
82 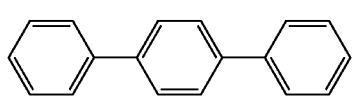
83 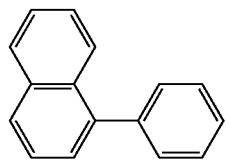
84 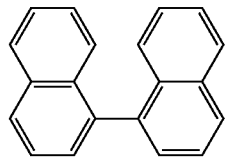
85 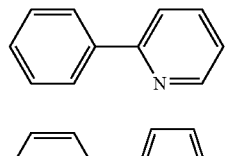
86 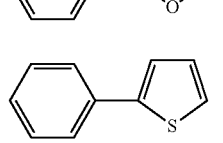
87 
88 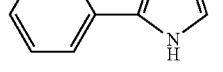
89 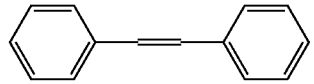
90 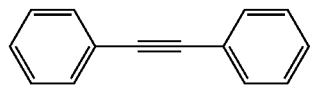
91 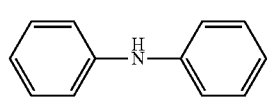
Examples of the crosslinkage-having polycyclic aromatic ring may include the following rings.
[Chemical Formula 47]
92 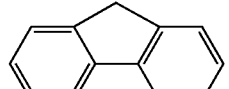
93 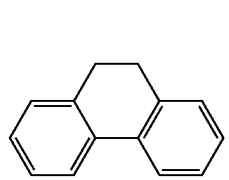

-continued

94
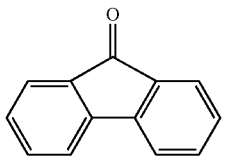

95
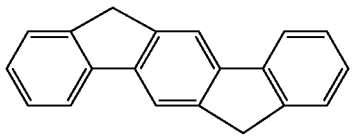

96
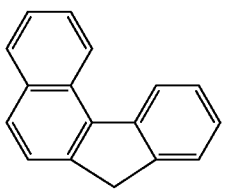

97
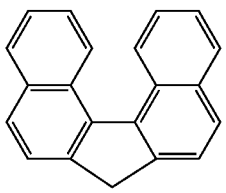

98
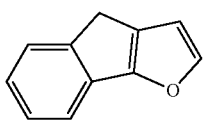

99
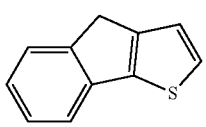

100
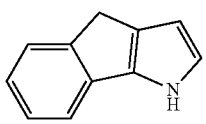

From the viewpoint of any one of or both of the electron acceptability and the hole acceptability of the ionic polymer, the divalent aromatic group represented by $Ar^5$ is preferably a divalent group remaining after removing two hydrogen atoms from a ring represented by any one of Formulae 45 to 60, 61 to 71, 77 to 80, 91, 92, 93 and 96, more preferably a divalent group remaining after removing two hydrogen atoms from a ring represented by any one of Formulae 45 to 50, 59, 60, 77, 80, 91, 92 and 96.

The divalent aromatic group may have a substituent. Examples of the substituent may include the same as the substituent exemplified in the description with respect to $Q^1$.

Examples of the divalent aromatic amine residue represented by $Ar^5$ in Formula (33) may include a group represented by Formula (34).

[Chemical Formula 48]

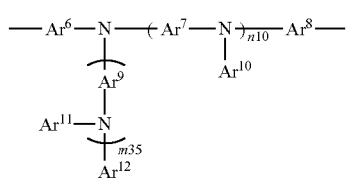

(34)

In Formula (34), $Ar^6$, $Ar^7$, $Ar^8$ and $Ar^9$ each independently represents an arylene group optionally having a substituent or a divalent heterocyclic group optionally having a substituent; $Ar^{10}$, $Ar^{11}$ and $Ar^{12}$ each independently represents an aryl group optionally having a substituent or a monovalent heterocyclic group optionally having a substituent; and n10 and m35 each independently represents 0 or 1.

Examples of the substituent that the arylene group, the aryl group, the divalent heterocyclic group or the monovalent heterocyclic group may have include a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amido group, an acid imido group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, a heteroaryloxycarbonyl group, and a carboxyl group. The substituent may be also a crosslinkable group such as a vinyl group, an acetylene group, a butenyl group, an acryl group, an arcylate group, an arcylamido group, a methacryl group, a metharcylate group, a metharcylamido group, a vinyl ether group, a vinylamino group, a silanol group, a group having a small ring (such as a cyclopropyl group, a cyclobutyl group, an epoxy group, an oxetane group, a diketene group, and an episulfide group), a lactone group, a lactam group, and a group containing a structure of a siloxane derivative.

When n10 is 0, a carbon atom in $Ar^6$ and a carbon atom in $Ar^8$ may be bonded with each other directly or may be bonded with each other through a divalent group such as —O— and —S—.

Each of the aryl group and the monovalent heterocyclic group represented by $Ar^{10}$, $Ar^{11}$ and $Ar^{12}$ is the same as the aryl group and the monovalent heterocyclic group described and exemplified above.

Examples of the arylene group represented by $Ar^6$, $Ar^7$, $Ar^8$ and $Ar^9$ may include an atomic group remaining after removing two hydrogen atoms bonded to a carbon atom constituting an aromatic ring from an aromatic hydrocarbon. Examples of the arylene group may include a group having a benzene ring, a group having a fused ring, and a group in which two or more independent benzene rings or fused rings are bonded with each other through a single bond or a divalent organic group (for example, an alkenylene group such as a vinylene group). The arylene group has usually 6 to 60 carbon atoms, preferably 7 to 48 carbon atoms. Specific examples of the arylene group may include a phenylene group, a biphenylene group, a $C_{1-17}$ alkoxyphenylene group, a $C_{1-17}$ alkylphenylene group, a 1-naphthylene group, a 2-naphthylene group, a 1-anthracenylene group, a 2-anthracenylene group and a 9-anthracenylene group. A hydrogen atom in the arylene group may be substituted with a fluorine atom. Examples of such a fluorine atom-substituted arylene group may include a tetrafluorophenylene group. Among the arylene groups, a phenylene group, a biphenylene group, a $C_{1-12}$ alkoxyphenylene group, and a $C_{1-12}$ alkylphenylene group are preferred.

Examples of the divalent heterocyclic group represented by $Ar^6$, $Ar^7$, $Ar^8$ and $Ar^9$ may include an atomic group remaining after removing two hydrogen atoms from a heterocyclic compound. The heterocyclic compound refers to an organic compound containing not only a carbon atom, but also a hetero atom such as an oxygen atom, a sulfur atom, a nitrogen atom, a phosphorus atom, a boron atom, a silicon atom, a selenium atom, a tellurium atom and an arsenic atom as an element constituting the ring, among organic compounds having a cyclic structure. The divalent heterocyclic group may have a substituent. The divalent heterocyclic group has usually 4 to 60 carbon atoms, preferably 4 to 20 carbon atoms. The number of carbon atoms of the divalent heterocyclic group does not include the number of carbon atoms of the substituent. Examples of such a divalent heterocyclic group may include a thiophenediyl group, a $C_{1-12}$ alkylthiophenediyl group, a pyrroldiyl group, a furandiyl group, a pyridinediyl group, a $C_{1-12}$ alkylpyridinediyl group, a pyridazinediyl group, a pyrimidinediyl group, a pyrazinediyl group, a triazinediyl group, a pyrrolidinediyl group, a piperidinediyl group, a quinolinediyl group and an isoquinolinediyl group. Among them, a thiophenediyl group, a $C_{1-12}$ alkylthiophenediyl group, a pyridinediyl group and a $C_{1-12}$ alkylpyridinediyl group are more preferred.

The ionic polymer comprising a divalent aromatic amine residue as a structural unit may further comprise other structural units. Examples of the other structural unit may include an arylene group such as a phenylene group and a fluorenediyl group. Among these ionic polymers, those containing a crosslinkable group are preferred.

Examples of the divalent aromatic amine residue represented by Formula (34) may include a group remaining after removing two hydrogen atoms from an aromatic amine represented by any one of Formulae 101 to 110 below.

[Chemical Formula 49]

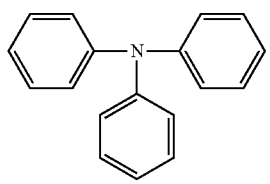
101

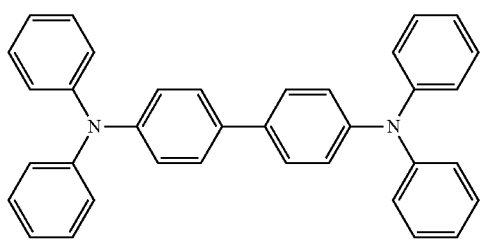
102

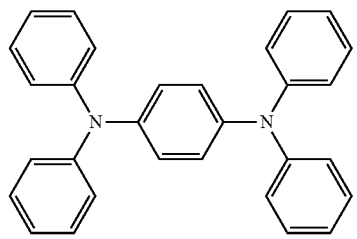
103

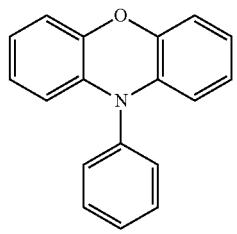
104

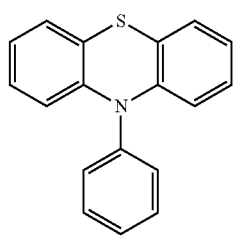
105

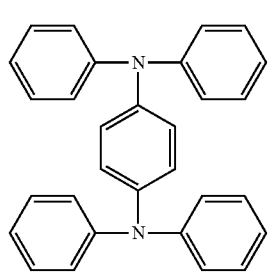
106

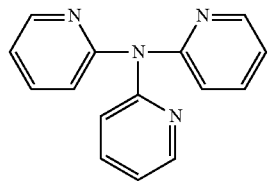
107

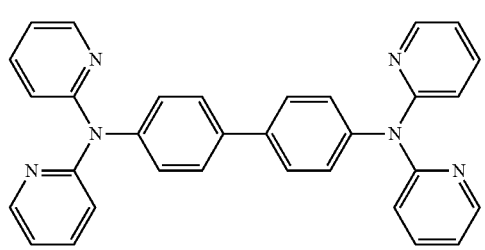
108

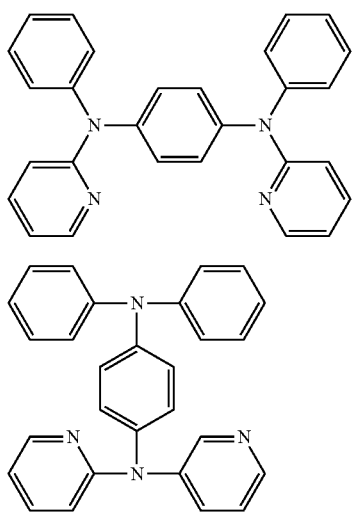

109

110

The aromatic amine represented by Formulae 101 to 110 may have a substituent so long as the aromatic amine can generate a divalent aromatic amine residue. The substituent may include the same substituent exemplified in the above description with respect to $Q^1$. When the substituent is plurally present, they may be the same as or different from each other.

In Formula (33), X' represents an imino group optionally having a substituent, a silylene group optionally having a substituent, an ethenylene group optionally having a substituent, or an ethynylene group. Examples of the substituent that the imino group, the silyl group or the ethenylene group may have include: a $C_{1-20}$ alkyl group such as a methyl group, an ethyl group, a propyl group, an isopropyl group, a butyl group, an isobutyl group, a sec-butyl group, a tert-butyl group, a pentyl group, a hexyl group, a cyclohexyl group, a heptyl group, an octyl group, a 2-ethylhexyl group, a nonyl group, a decyl group, a 3,7-dimethyloctyl group and a dodecyl group; and a $C_{6-30}$ aryl group such as a phenyl group, a 1-naphthyl group, a 2-naphthyl group, a 1-anthracenyl group, a 2-anthracenyl group and a 9-anthracenyl group. When the substituent is plurally present, they may be the same as or different from each other.

From the viewpoint of the stability of the ionic polymer against air, moisture or heat, X' is preferably an imino group, an ethenylene group or an ethynylene group.

From the viewpoint of the electron acceptability and the hole acceptability of the ionic polymer, it is preferred that m33 is 1 and m34 is 0.

From the viewpoint of the electron acceptability of the ionic polymer, the structural unit represented by Formula (33) is preferably a structural unit represented by Formula (35).

[Chemical Formula 50]

$$\mathrm{-\!\!\!+\!Ar^{13}\!\!+\!\!\!-} \quad (35)$$

In Formula (35), $Ar^{13}$ represents a pyridinediyl group optionally having a substituent, a pyrazinediyl group optionally having a substituent, a pyrimidinediyl group optionally having a substituent, a pyridazinediyl group optionally having a substituent, or a triazinediyl group optionally having a substituent.

Examples of the substituent that the pyridinediyl group may have include the same as the substituent exemplified in the above description with respect to $Q^1$. When the substituent is plurally present, they may be the same as or different from each other.

Examples of the substituent that the pyrazinediyl group may have include the same as the substituent exemplified in the above description with respect to $Q^1$. When the substituent is plurally present, they may be the same as or different from each other.

Examples of the substituent that the pyrimidinediyl group may have include the same as the substituent exemplified in the above description with respect to $Q^1$. When the substituent is plurally present, they may be the same as or different from each other.

Examples of the substituent that the pyridazinediyl group may have include the same as the substituent exemplified in the above description with respect to $Q^1$. When the substituent is plurally present, they may be the same as or different from each other.

Examples of the substituent that the triazinediyl group may have include the same as the substituent exemplified in the above description with respect to $Q^1$. When the substituent is plurally present, they may be the same as or different from each other.

Ratio of Structural Unit

From the viewpoint of the light-emitting efficiency of the organic EL element, the ratio of the sum of the structural unit represented by Formula (13), the structural unit represented by Formula (15), the structural unit represented by Formula (17) and the structural unit represented by Formula (20) contained in the ionic polymer used in the present invention is more preferably 30 to 100% by mole, based on the number of moles of all structural units contained in the ionic polymer (with the proviso that the terminal structural units is excluded).

Terminal Structural Unit

Examples of the terminal structural unit (terminal group) of the ionic polymer used in the present invention may include a hydrogen atom, a methyl group, an ethyl group, a propyl group, an isopropyl group, a butyl group, an isobutyl group, a sec-butyl group, a tert-butyl group, a pentyl group, an isoamyl group, a hexyl group, a cyclohexyl group, a heptyl group, an octyl group, a nonyl group, a decyl group, a dodecyl group, a methoxy group, an ethoxy group, a propyloxy group, an isopropyloxy group, a butoxy group, an isobutoxy group, a sec-butoxy group, a tert-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a dodecyloxy group, a methylthio group, an ethylthio group, a propylthio group, an isopropylthio group, a butylthio group, an isobutylthio group, a sec-butylthio group, a tert-butylthio group, a pentylthio group, a hexylthio group, a cyclohexylthio group, a heptylthio group, an octylthio group, a nonylthio group, a decylthio group, a dodecylthio group, a methoxyphenyl group, an ethoxyphenyl group, a propyloxyphenyl group, an isopropyloxyphenyl group, a butoxyphenyl group, an isobutoxyphenyl group, a sec-butoxyphenyl group, a tert-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group, a dodecyloxyphenyl group, a methylphenyl group, an ethylphenyl group, a dimethylphenyl group, a propylphenyl group, a mesityl group, a methylethylphenyl group, an isopropylphenyl group, a butylphenyl group, an isobutylphenyl group, a tert-butylphenyl group, a pentylphenyl group, an isoamylphenyl group, a hexylphenyl group, a heptylphenyl group, an octylphenyl group, a nonylphenyl group, a decylphenyl group, a dodecylphenyl group, a methylamino group, a dimethylamino group, an ethylamino group, a diethylamino group, a propylamino group, a dipropylamino group, an isopropylamino group, a diisopropylamino group, a butylamino group, an isobutylamino group, a sec-butylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a dodecylamino group, a cyclopentylamino group, a dicyclopentylamino group, a cyclohexylamino group, a dicyclohexylamino group, a ditrifluoromethylamino group, a phenylamino group, a diphenylamino group, a ($C_{1-12}$ alkoxyphenyl)amino group, a di($C_{1-12}$ alkoxyphenyl)amino group, a di($C_{1-12}$ alkylphenyl)amino group, a 1-naphthylamino group, a 2-naphthylamino group, a pentafluorophenylamino group, a pyridylamino group, a pyridazinylamino group, a pyrimidylamino group, a pyrazinylamino group, a triazinylamino group, a (Phenyl-$C_{1-12}$ alkyl)amino group, a ($C_{1-12}$ alkoxyphenyl-$C_{1-12}$ alkyl)amino group, a ($C_{1-12}$ alkylphenyl-$C_{1-12}$ alkyl)amino group, a di($C_{1-12}$ alkoxyphenyl-$C_{1-12}$ alkyl)amino group, a di($C_{1-12}$ alkylphenyl-$C_{1-12}$ alkyl)amino group, a 1-naphthyl-$C_{1-12}$ alkylamino group, a 2-naphthyl-$C_{1-12}$ alkylamino group, a trimethylsilyl group, a triethylsilyl group, a tripropylsilyl group, a triisopropylsilyl group, an isopropyldimethylsilyl group, an isopropyldiethylsilyl group, a tert-butyldimethylsilyl group, a pentyldimethylsilyl group, a hexyldimethylsilyl group, a heptyldimethylsilyl group, an octyldimethylsilyl group, a 2-ethylhexyldimethylsilyl group, a nonyldimethylsilyl group, a decyldimethylsilyl group, a 3,7-dimethyloctyldimethylsilyl group, a dodecyldimethylsilyl group, a (phenyl-$C_{1-12}$ alkyl)silyl group, a ($C_{1-12}$ alkoxyphenyl-$C_{1-12}$ alkyl)silyl group, a ($C_{1-12}$ alkylphenyl-$C_{1-12}$alkyl)silyl group, a (1-naphthyl-$C_{1-12}$ alkyl)silyl group, a (2-naphthyl-$C_{1-12}$ alkyl)silyl group, a (phenyl-$C_{1-12}$ alkyl)dimethylsilyl group, a triphenylsilyl group, a tri(p-xylyl)silyl group, a tribenzylsilyl group, a diphenylmethylsilyl group, a tert-butyldiphenylsilyl group, a dimethylphenylsilyl group, a thienyl group, a $C_{1-12}$ alkylthienyl group, a pyrrolyl group, a furyl group, a pyridyl group, a $C_{1-12}$ alkylpyridyl group, a pyridazinyl group, a pyrimidyl group, a pyrazinyl group, a triazinyl group, a pyrrolidyl group, a piperidyl group, a quinolyl group, an isoquinolyl group, a hydroxy group, a mercapto group, a fluorine atom, a chlorine atom, a bromine atom and an iodine atom. When the terminal structural unit is plurally present, they may be the same as or different from each other.

Characteristics of Ionic Polymer

The ionic polymer used in the present invention is preferably a conjugated compound. That the ionic polymer used in the present invention is a conjugated compound means that the ionic polymer contains, in the main chain thereof, a region in which multiple bonds (for example, double bond, triple bond) or unshared electron pairs (for example, unshared electron pairs of a nitrogen atom, an oxygen atom, or the like) are linked through a single bond. When the ionic polymer is a conjugated compound, the ionic polymer has a ratio calculated by a formula of {(the number of atoms contained in the region in which multiple bonds or unshared electron pairs are linked through a single bond on the main chain)/(the number of all atoms on the main chain)}×100% of preferably 50% or more, more preferably 60% or more, more preferably 70% or more, more preferably 80% or more, further preferably 90% or more, from the viewpoint of the electron transport property of the conjugated compound.

The ionic polymer used in the present invention is preferably a macromolecular compound, more preferably a conjugated macromolecular compound. The macromolecular compound refers to a compound having a number average molecular weight in terms of polystyrene of $1\times10^3$ or more. That the ionic polymer used in the present invention is a conjugated macromolecular compound means that the ionic polymer is a conjugated compound and also a macromolecular compound.

From the viewpoint of the film formation property of the ionic polymer used in the present invention when applying the ionic polymer to form a film, the ionic polymer has a number average molecular weight in terms of polystyrene of preferably $1\times10^3$ to $1\times10^8$, more preferably $2\times10^3$ to $1\times10^7$, more preferably $3\times10^3$ to $1\times10^7$, further preferably $5\times10^3$ to $1\times10^7$. From the viewpoint of the purity of the ionic polymer, the ionic polymer has a weight average molecular weight in terms of polystyrene of preferably $1\times10^3$ to $5\times10^7$, more preferably $1\times10^3$ to $1\times10^7$, further preferably $1\times10^3$ to $5\times10^6$. From the viewpoint of the solubility of the ionic polymer, the ionic polymer has a number average molecular weight in terms of polystyrene of preferably $1\times10^3$ to $5\times10^5$, more preferably $1\times10^3$ to $5\times10^4$, further preferably $1\times10^3$ to $3\times10^3$. The number average molecular weight and the weight average molecular weight in terms of polystyrene of the ionic polymer used in the present invention can be measured, for example, using gel permeation chromatography (GPC).

From the viewpoint of the purity of the ionic polymer used in the present invention, the number of all structural units contained in the ionic polymer excluding the terminal structural unit (that is, a polymerization degree) is preferably 1 or more and 20 or less, more preferably 1 or more and 10 or less, further preferably 1 or more and 5 or less.

From the viewpoint of the electron acceptability and the hole acceptability of the ionic polymer used in the present invention, the ionic polymer has an orbital energy of the lowest unoccupied molecular orbital (LUMO) of preferably −5.0 eV or more and −2.0 eV or less, more preferably −4.5 eV or more and −2.0 eV or less. From the same viewpoint, the ionic polymer has an orbital energy of the highest occupied molecular orbital (HOMO) of preferably −6.0 eV or more and −3.0 eV or less, more preferably −5.5 eV or more and −3.0 eV or less, with the proviso that the orbital energy of HOMO is lower than the orbital energy of LUMO. The orbital energy of the highest occupied molecular orbital (HOMO) of the ionic polymer is obtained by measuring the ionization potential of the ionic polymer as the orbital energy of HOMO. On the other hand, the orbital energy of the lowest unoccupied molecular orbital (LUMO) of the ionic polymer is obtained by measuring the energy difference between HOMO and LUMO and calculating the sum of the energy difference and the above measured ionization potential as the orbital energy of LUMO. For measuring the ionization potential, a photoelectron spectrophotometer is used. The energy difference between HOMO and LUMO is obtained from an absorption edge of an absorption spectrum of the ionic polymer measured using an ultraviolet-visible-near infrared spectrophotometer.

It is preferable that the polymer used in the present invention is substantially non-luminescent when the polymer is used for an electroluminescent element. Here, that a polymer is substantially non-luminescent means as follows. First, an electroluminescent element A having a polymer-containing layer is prepared. An electroluminescent element 2 that is different from the electroluminescent element A only in not having the polymer-containing layer is also prepared. Next, to the electroluminescent element A and the electroluminescent element 2, a forward voltage is applied to measure a luminescent spectrum. A wavelength λ giving a maximum peak in the luminescent spectrum obtained with respect to the electroluminescent element 2, is measured. While assuming the luminescence intensity at the wavelength λ as 1, the luminescent spectrum obtained with respect to the electroluminescent element 2 is normalized and is integrated relative to the wavelength to calculate a normalized luminescence amount $S_0$. While assuming the luminescence intensity at the wavelength λ as 1, the luminescent spectrum obtained with respect to the electroluminescent element A is also normalized and is integrated relative to the wavelength to calculate a normalized luminescence amount S. When the value calculated by a formula of $(S-S_0)/S_0 \times 100\%$ is 30% or less, that is, when an increment of the normalized luminescence amount of the electroluminescent element A having a polymer-containing layer from the normalized luminescence amount of the electroluminescent element 2 not having the polymer-containing layer is 30% or less, the used polymer is regarded as substantially non-luminescent. The value calculated by a formula of $(S-S_0)/S_0 \times 100$ is preferably 15% or less, more preferably 10% or less.

Examples of the ionic polymer comprising the group represented by Formula (1) and the group represented by Formula (3) may include: an ionic polymer consisting of a structural unit represented by Formula (23); an ionic polymer consisting of a structural unit represented by Formula (23) and one or more group(s) selected from the group consisting of a group remaining after removing two hydrogen atoms from a group represented by any one of Formulae 45 to 50, 59, 60, 77, 80, 91, 92, 96, and 101 to 110; an ionic polymer consisting of a structural unit represented by Formula (24); an ionic polymer consisting of a structural unit represented by Formula (24) and one or more group(s) selected from the group consisting of a group remaining after removing two hydrogen atoms from a group represented by any one of Formulae 45 to 50, 59, 60, 77, 80, 91, 92, 96, and 101 to 110; an ionic polymer consisting of a structural unit represented by Formula (25); an ionic polymer consisting of a structural unit represented by Formula (25) and one or more group(s) selected from the group consisting of a group remaining after removing two hydrogen atoms from a group represented by any one of Formulae 45 to 50, 59, 60, 77, 80, 91, 92, 96, and 101 to 110; an ionic polymer consisting of a structural unit represented by Formula (29); an ionic polymer consisting of a structural unit represented by Formula (29) and one or more group(s) selected from the group consisting of a group remaining after removing two hydrogen atoms from a group represented by any one of Formulae 45 to 50, 59, 60, 77, 80, 91, 92, 96, and 101 to 110; an ionic polymer consisting of a structural unit represented by Formula (30); and an ionic polymer consisting of a structural unit represented by Formula (30) and one or more group(s) selected from the group consisting of a group remaining after removing two hydrogen atoms from a group represented by any one of Formulae 45 to 50, 59, 60, 77, 80, 91, 92, 96, and 101 to 110.

Examples of the ionic polymer comprising the group represented by Formula (1) and the group represented by Formula (3) may include the macromolecular compounds below. Among these macromolecular compounds, in macromolecular compounds represented by a formula in which two types of structural unit are delimited by a slash "/", the ratio of the left structural unit is p % by mole and the ratio of the right structural unit is (100-p) % by mole, and these structural units are arranged at random. In the formulae below, n represents the degree of polymerization.

[Chemical Formula 51]

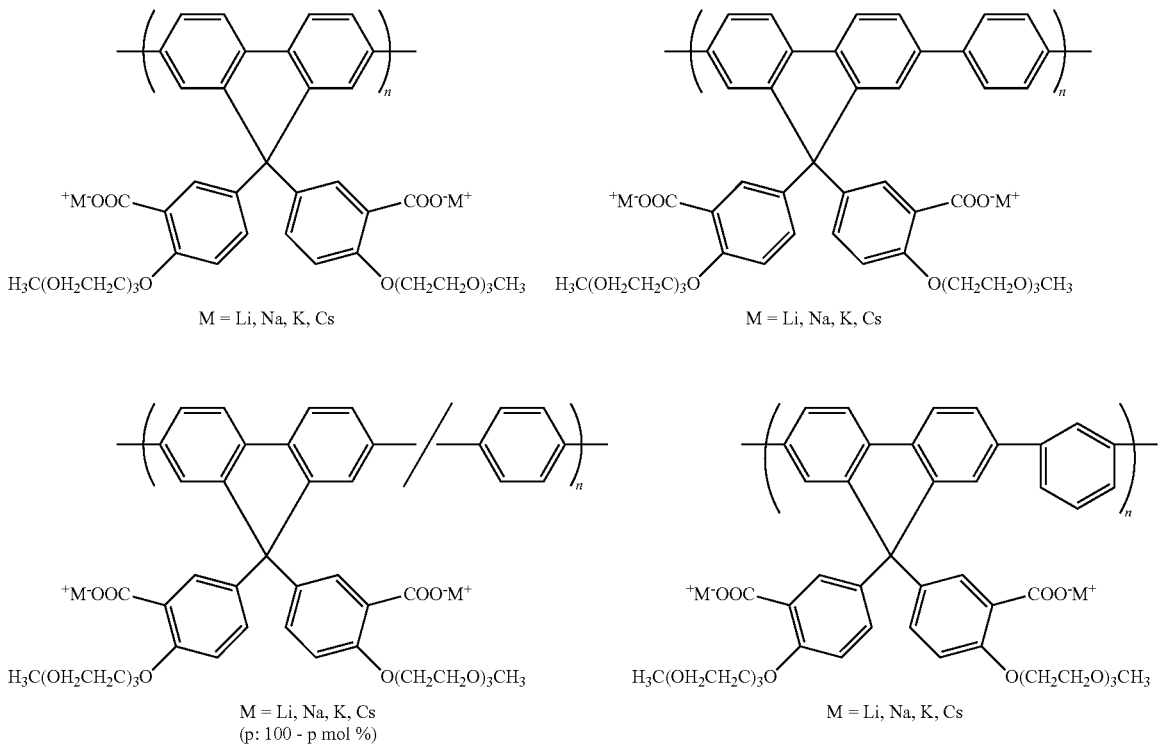

109 -continued 110
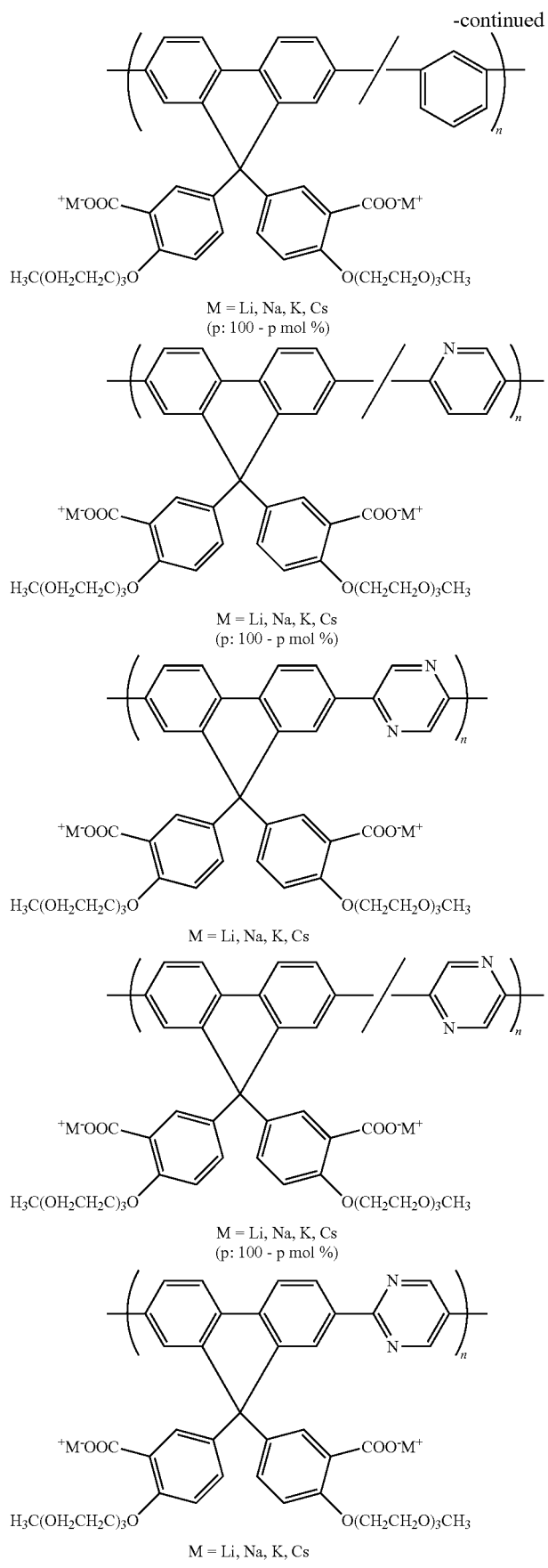
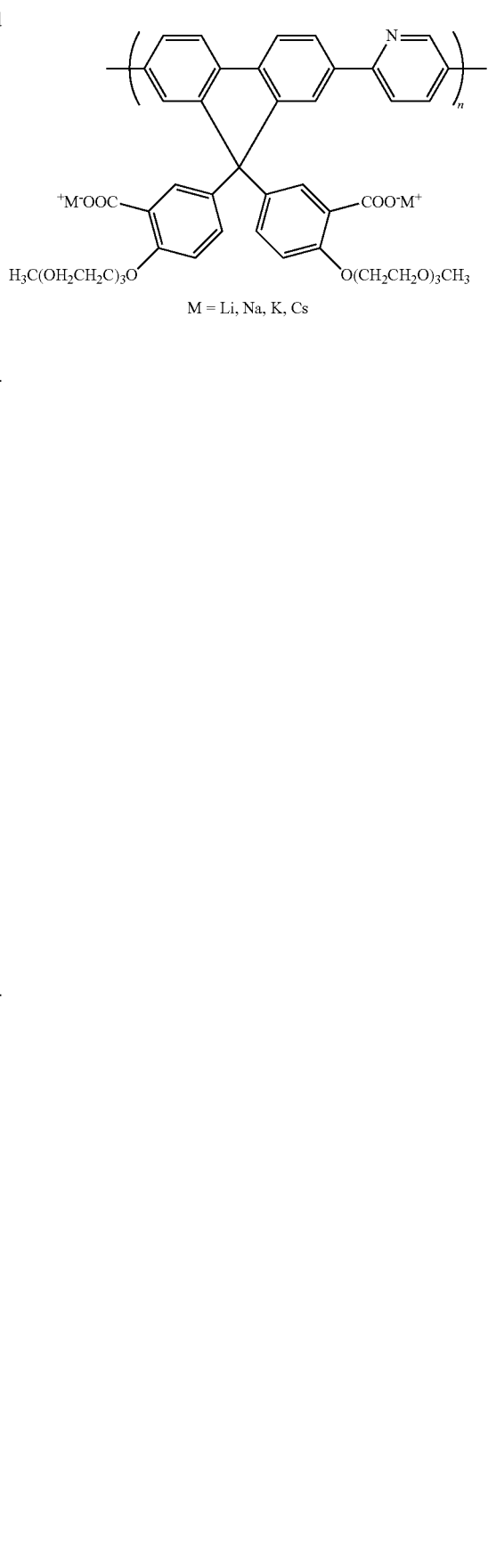

-continued
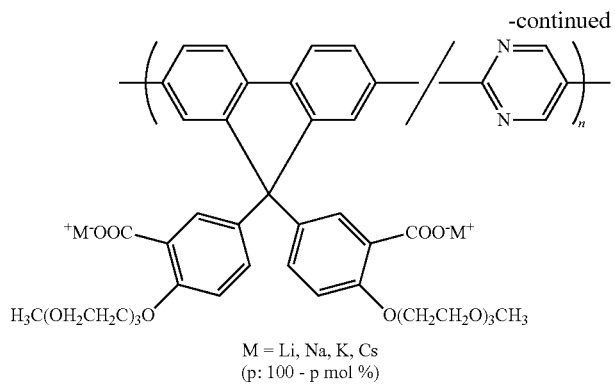
M = Li, Na, K, Cs
(p: 100 - p mol %)
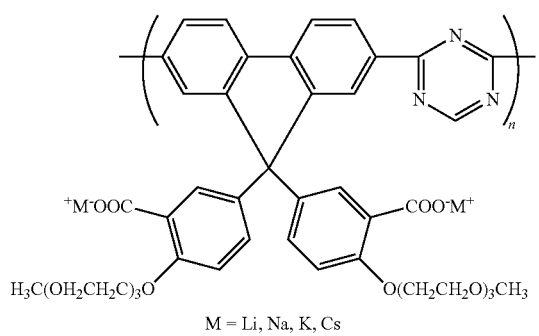
M = Li, Na, K, Cs
[Chemical Formula 52]
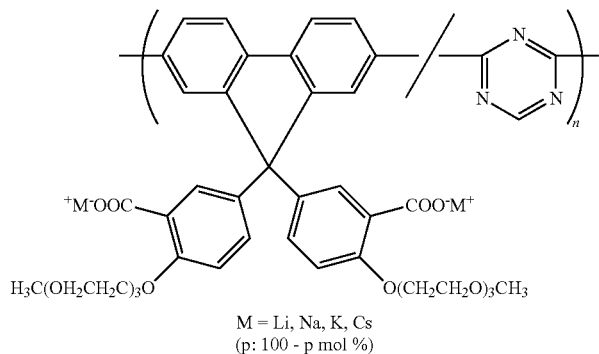
M = Li, Na, K, Cs
(p: 100 - p mol %)
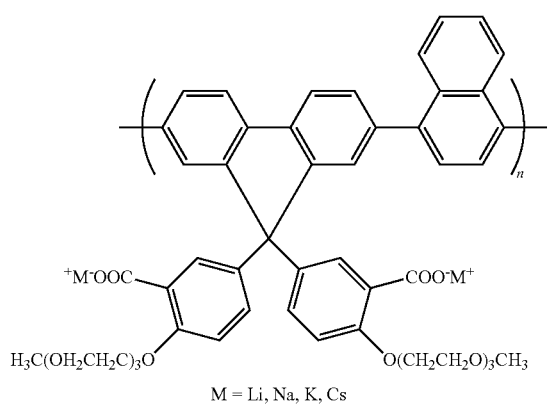
M = Li, Na, K, Cs -continued
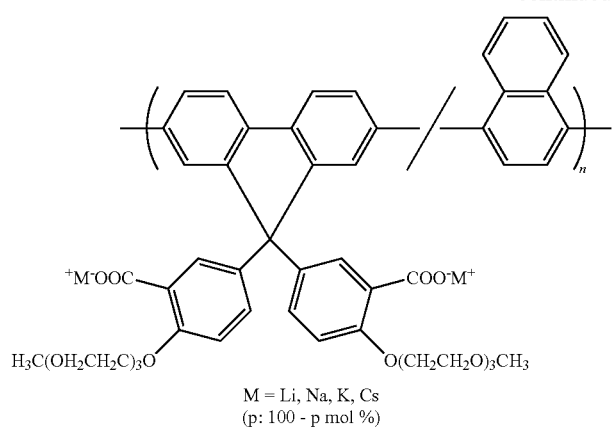
M = Li, Na, K, Cs
(p: 100 - p mol %)
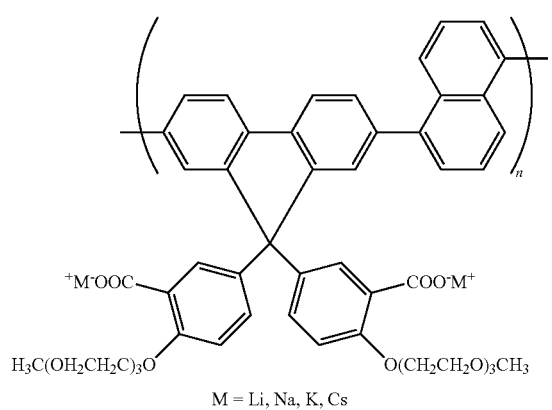
M = Li, Na, K, Cs
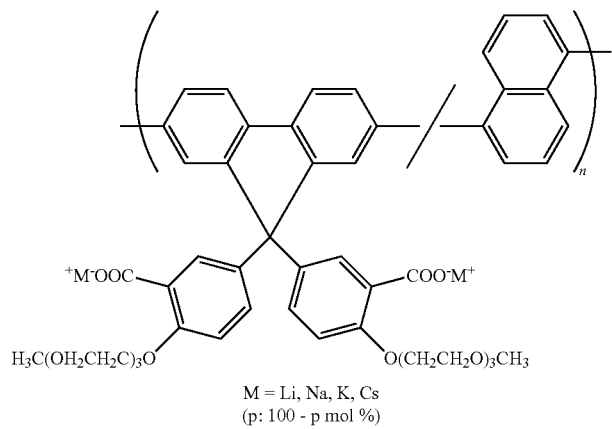
M = Li, Na, K, Cs
(p: 100 - p mol %)
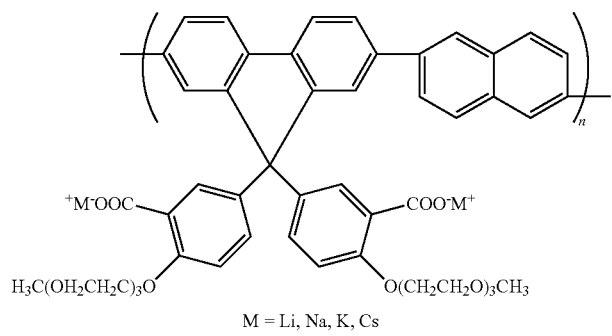
M = Li, Na, K, Cs -continued
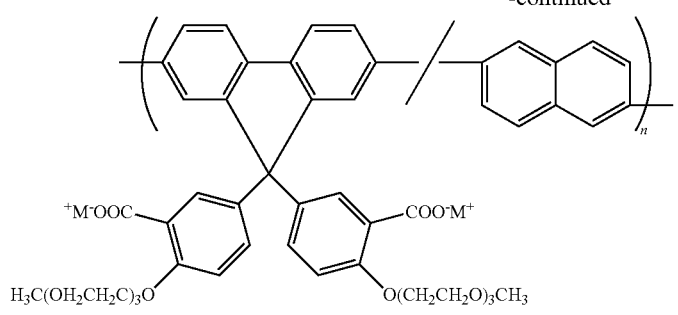
M = Li, Na, K, Cs
(p: 100 - p mol %)
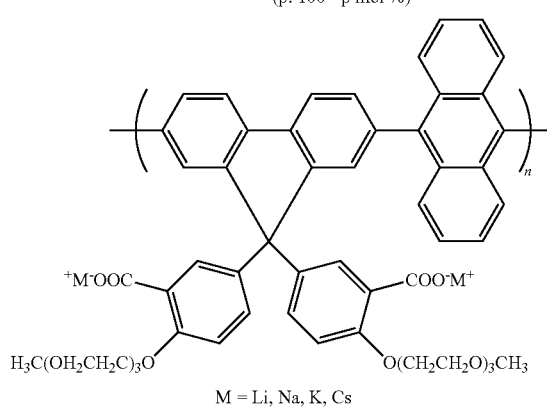
M = Li, Na, K, Cs
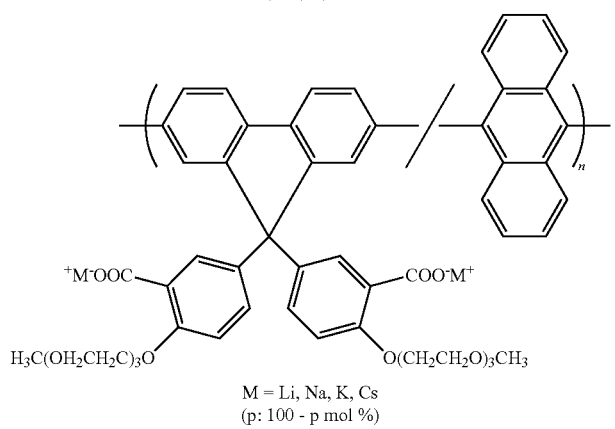
M = Li, Na, K, Cs
(p: 100 - p mol %)
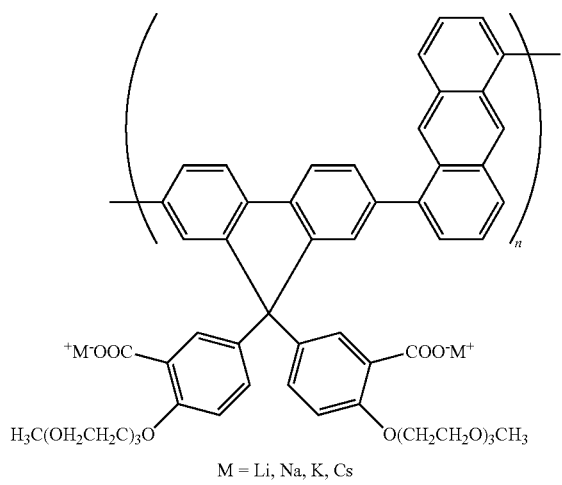
M = Li, Na, K, Cs -continued
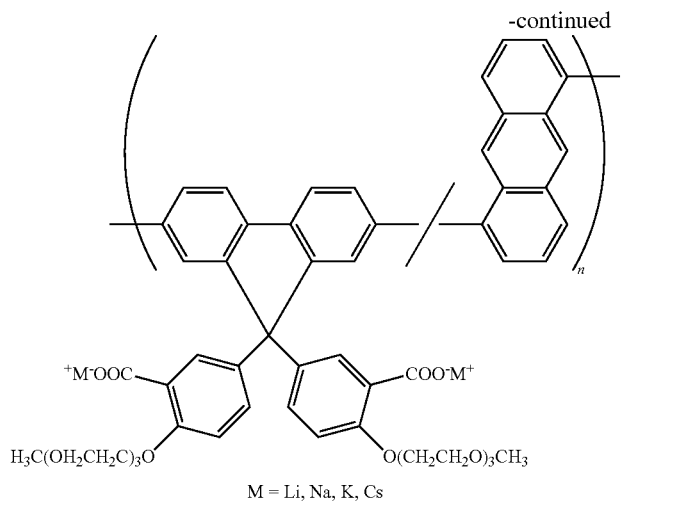
M = Li, Na, K, Cs
(p: 100 - p mol %)
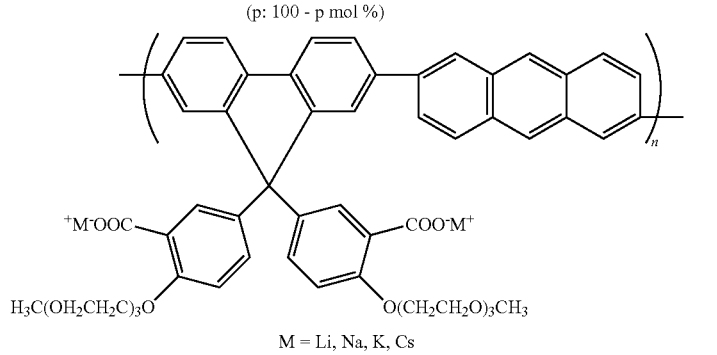
M = Li, Na, K, Cs
[Chemical Formula 53]
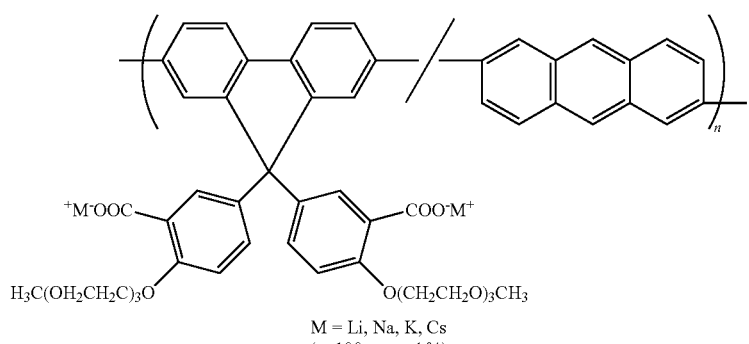
M = Li, Na, K, Cs
(p: 100 - p mol %)
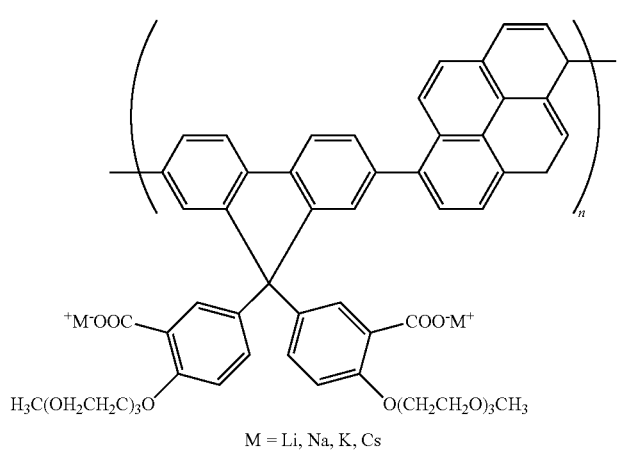
M = Li, Na, K, Cs -continued
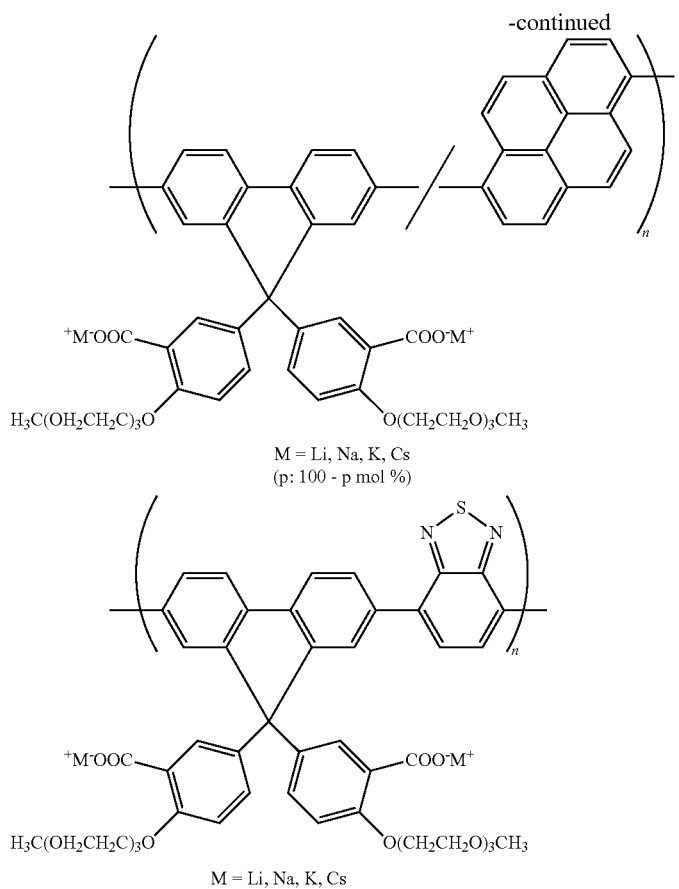
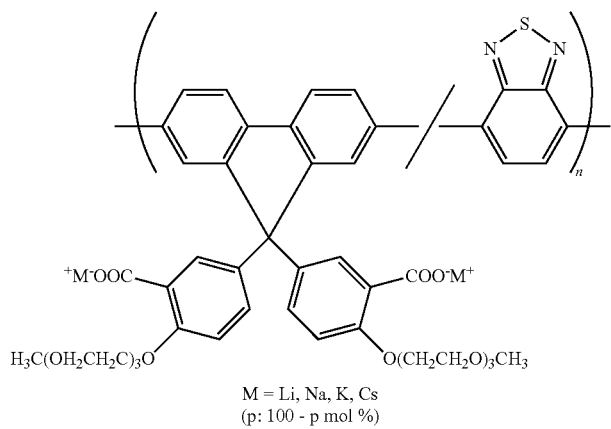
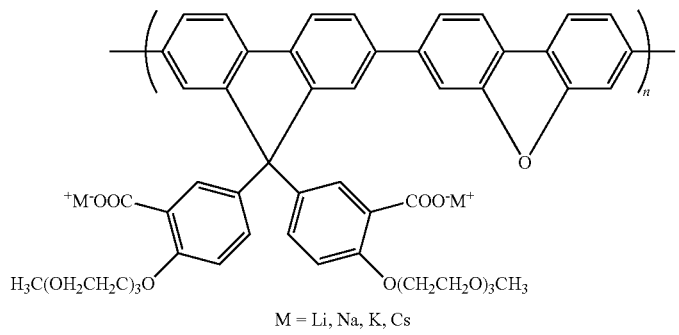

-continued
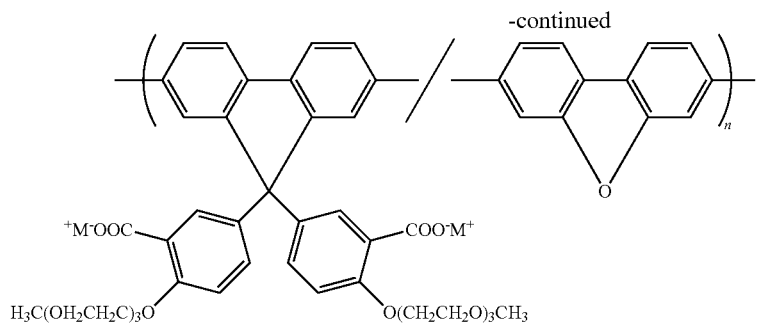
M = Li, Na, K, Cs
(p: 100 - p mol %)
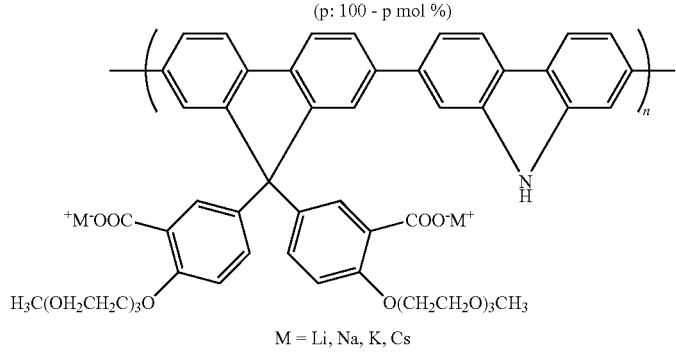
M = Li, Na, K, Cs
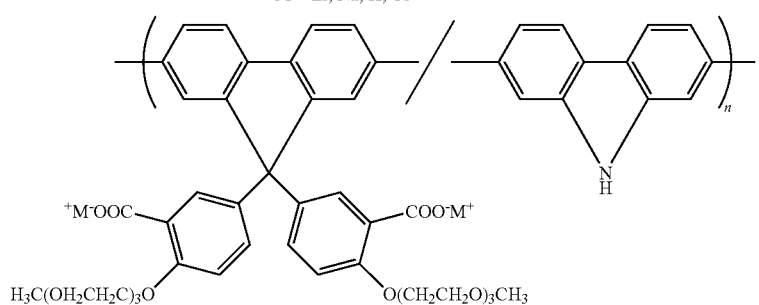
M = Li, Na, K, Cs
(p: 100 - p mol %)
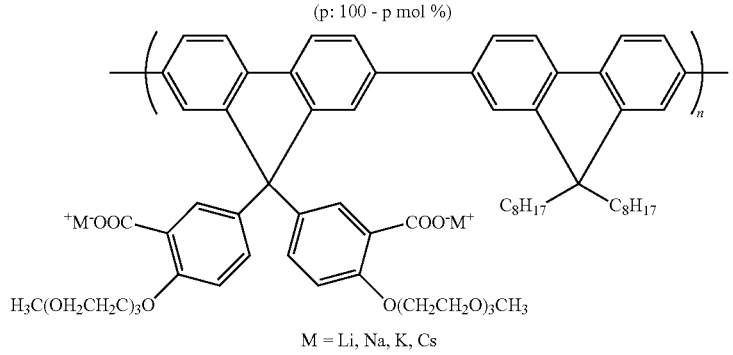
M = Li, Na, K, Cs
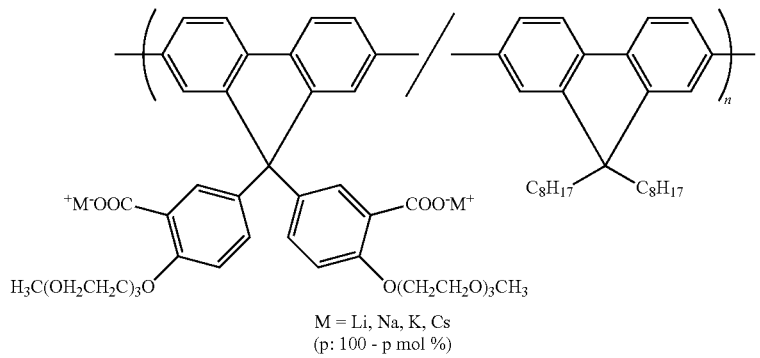
M = Li, Na, K, Cs
(p: 100 - p mol %)

-continued
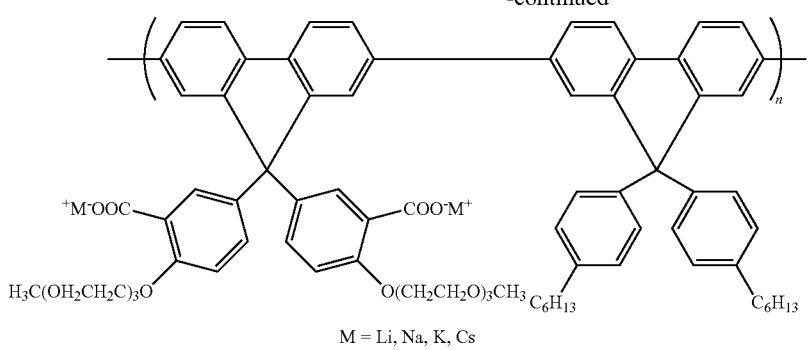
M = Li, Na, K, Cs
[Chemical Formula 54]
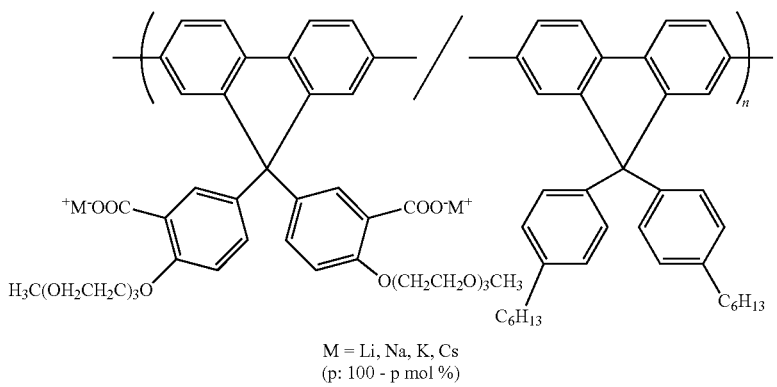
M = Li, Na, K, Cs
(p: 100 - p mol %)
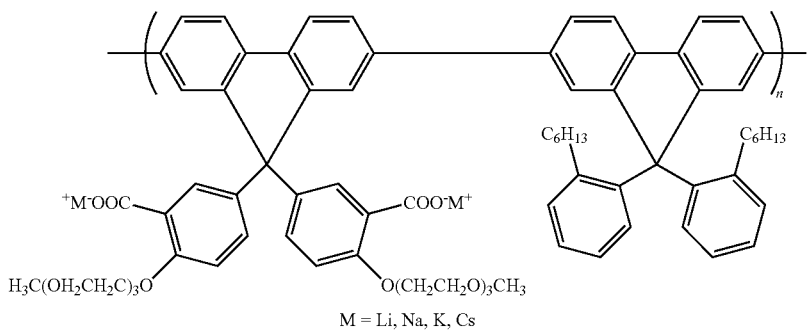
M = Li, Na, K, Cs
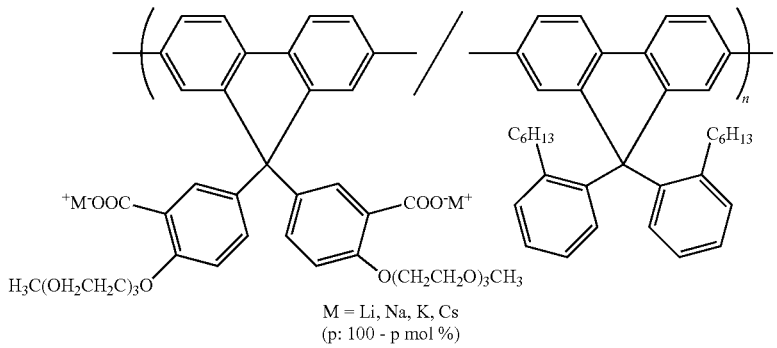
M = Li, Na, K, Cs
(p: 100 - p mol %)

-continued
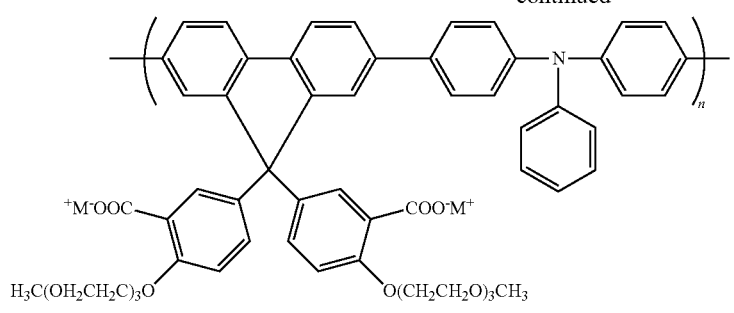
M = Li, Na, K, Cs
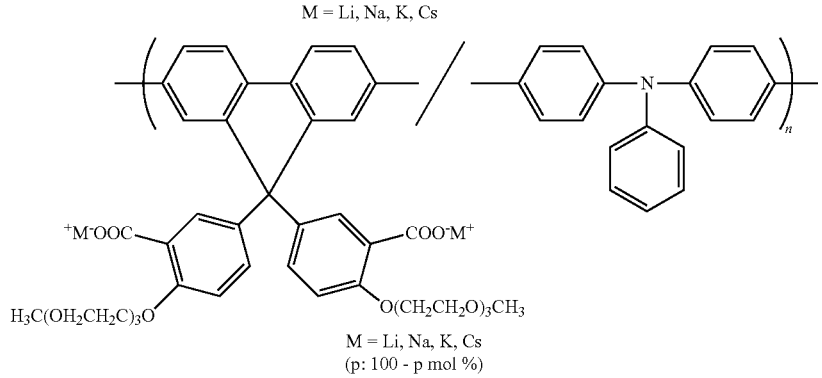
M = Li, Na, K, Cs
(p: 100 − p mol %)
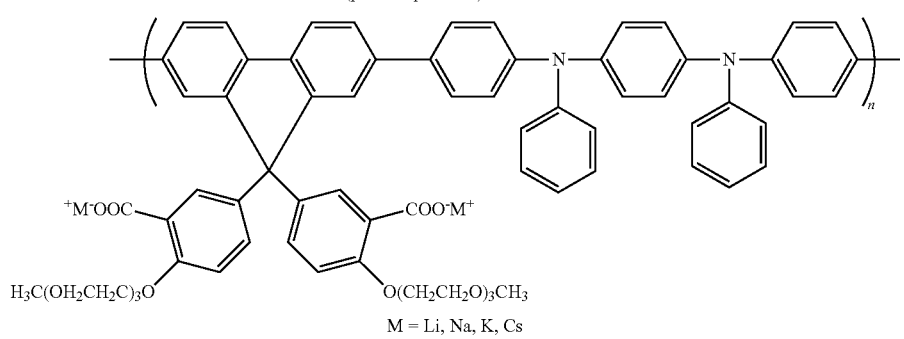
M = Li, Na, K, Cs
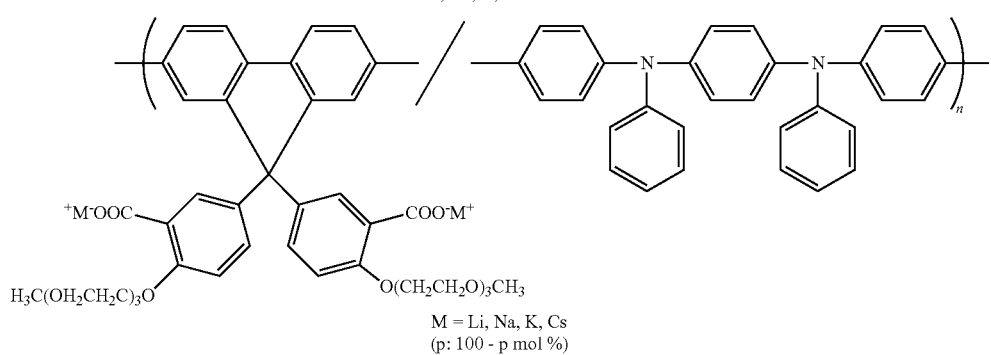
M = Li, Na, K, Cs
(p: 100 − p mol %)
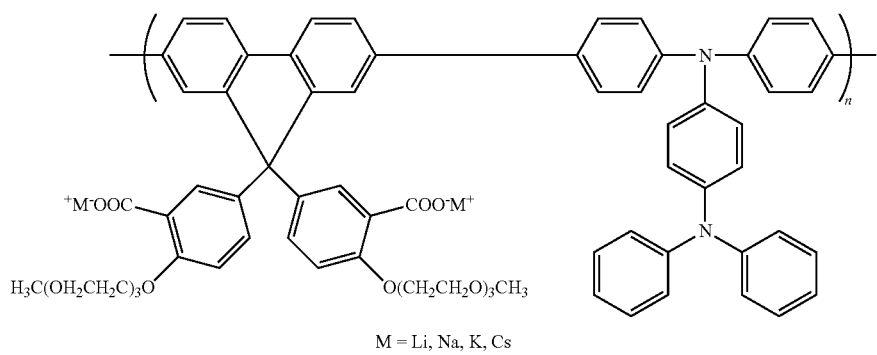
M = Li, Na, K, Cs -continued
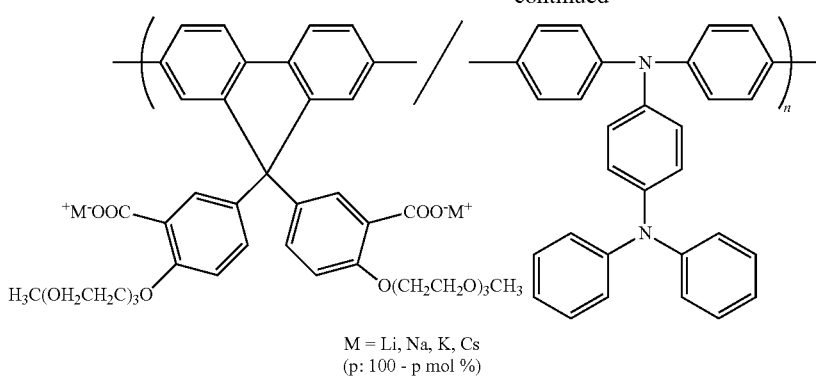
[Chemical Formula 55]
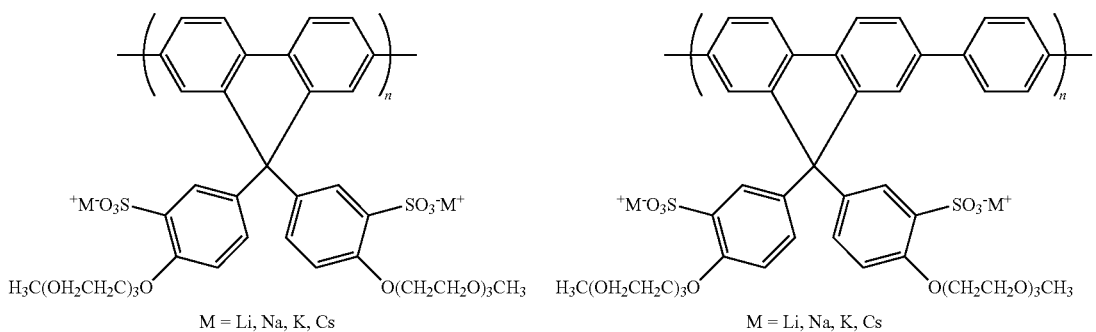
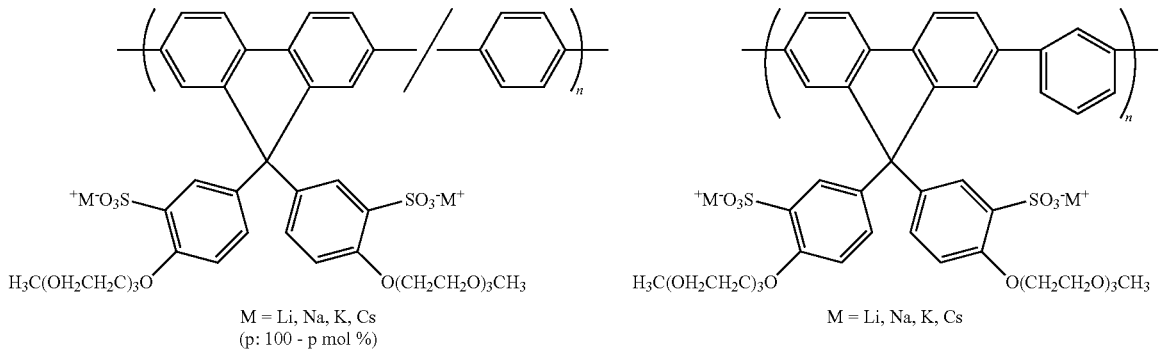
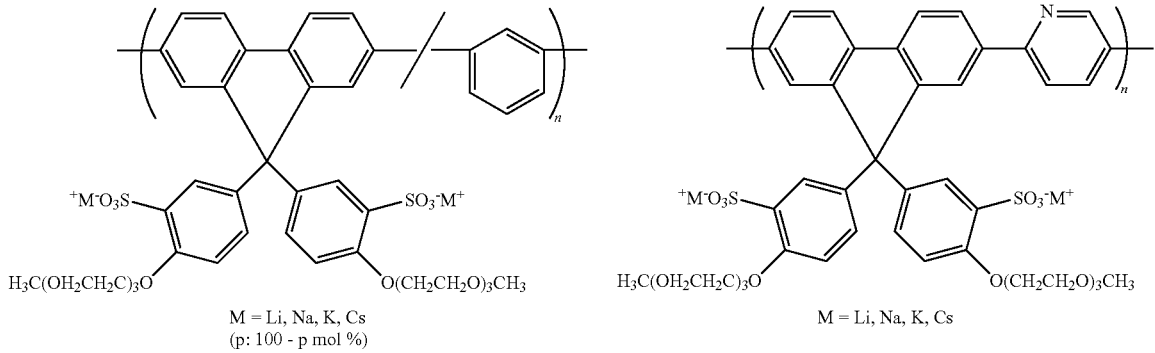

-continued
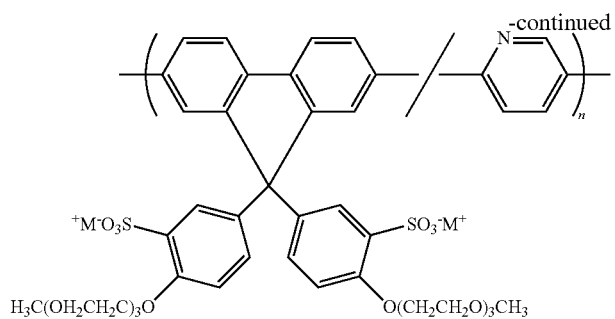
M = Li, Na, K, Cs
(p: 100 - p mol %)
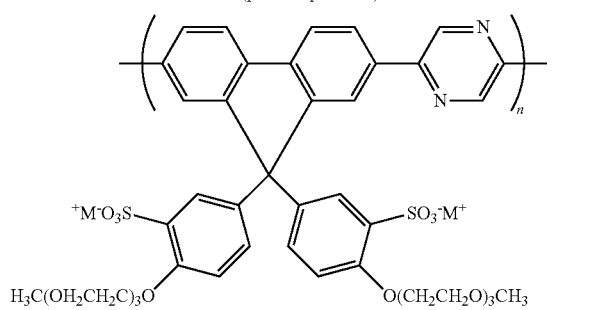
M = Li, Na, K, Cs
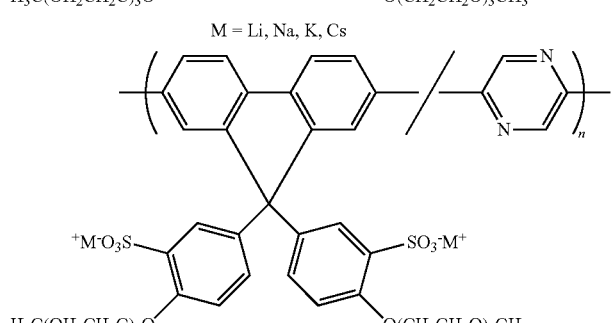
M = Li, Na, K, Cs
(p: 100 - p mol %)
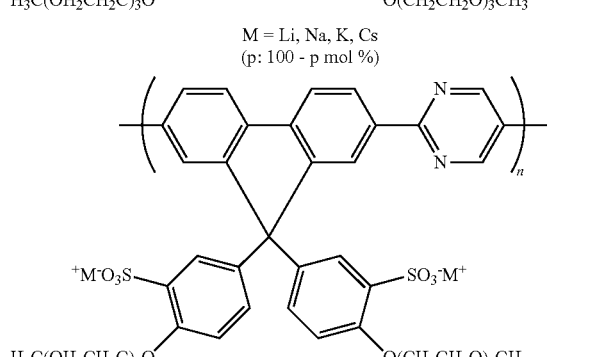
M = Li, Na, K, Cs
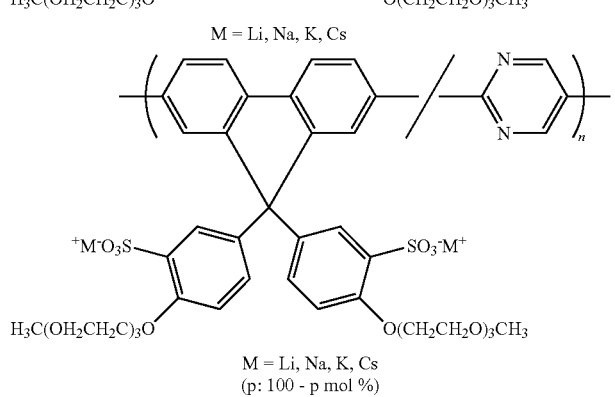
M = Li, Na, K, Cs
(p: 100 - p mol %)

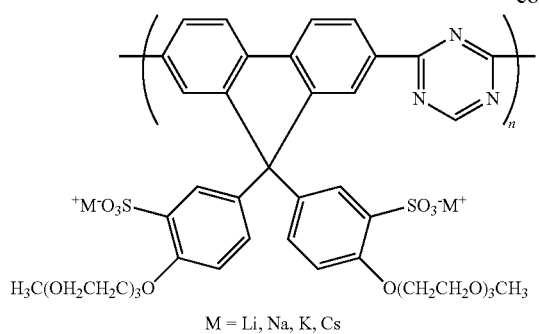
M = Li, Na, K, Cs
[Chemical Formula 56]
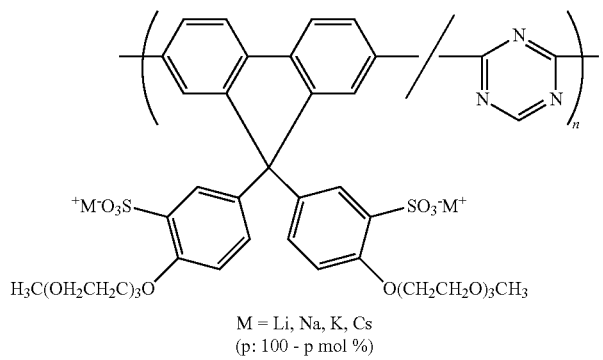
M = Li, Na, K, Cs
(p: 100 - p mol %)
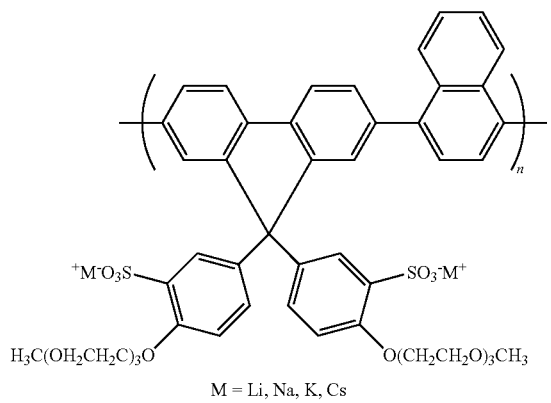
M = Li, Na, K, Cs
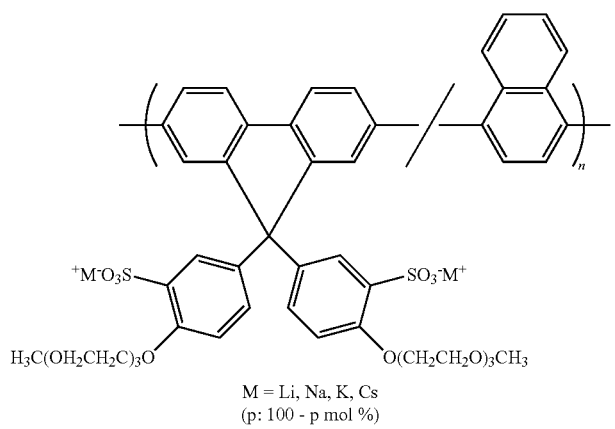
M = Li, Na, K, Cs
(p: 100 - p mol %)

-continued
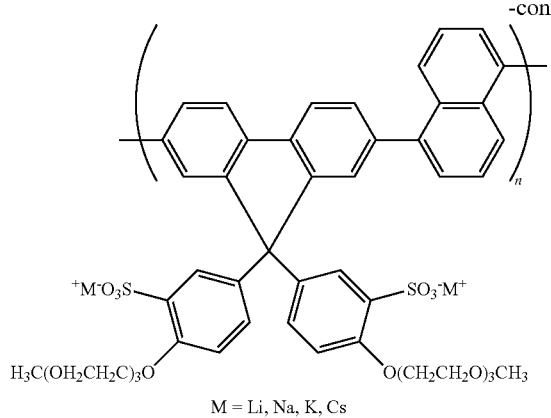
M = Li, Na, K, Cs
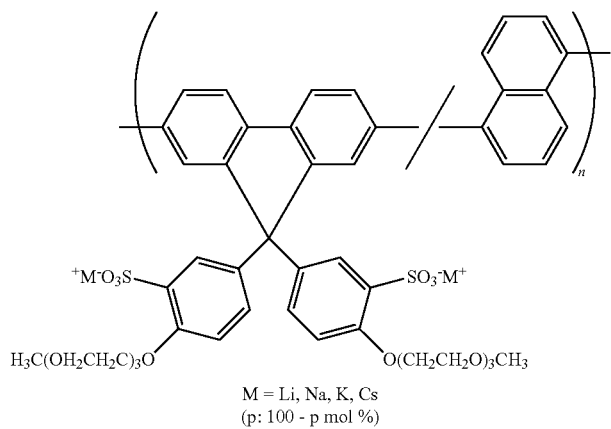
M = Li, Na, K, Cs
(p: 100 - p mol %)
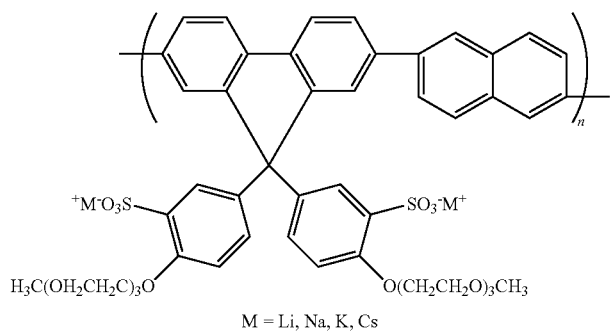
M = Li, Na, K, Cs
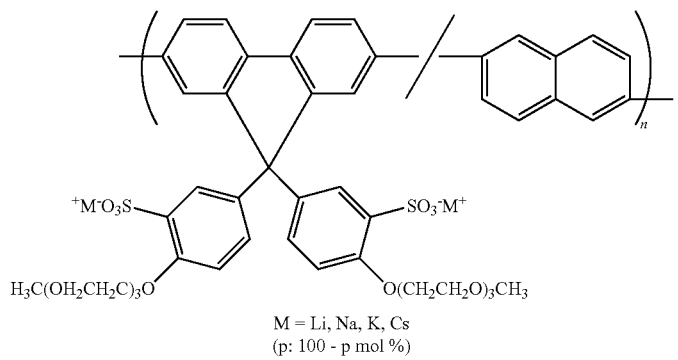
M = Li, Na, K, Cs
(p: 100 - p mol %)

-continued
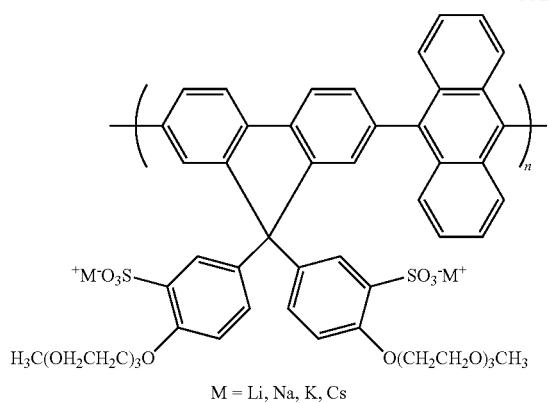
M = Li, Na, K, Cs
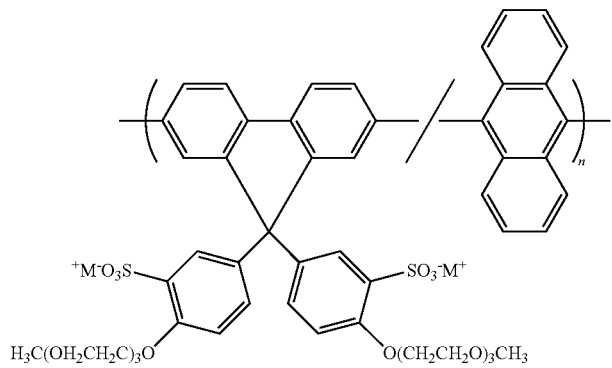
M = Li, Na, K, Cs
(p: 100 - p mol %)
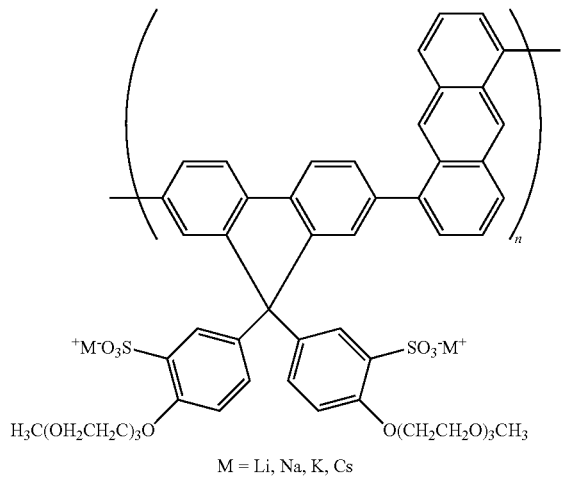
M = Li, Na, K, Cs -continued
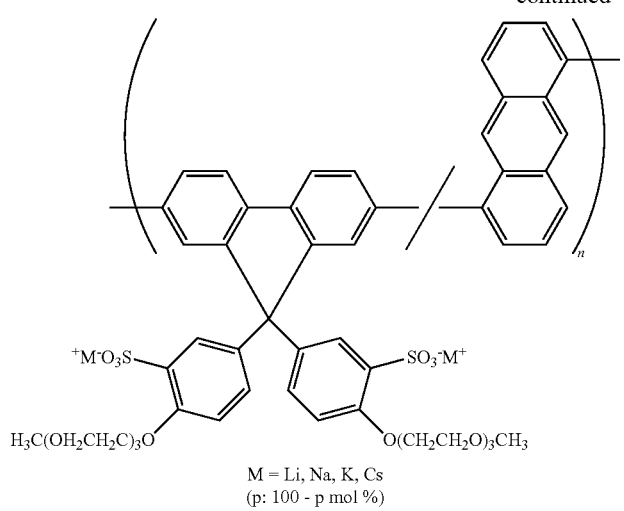
M = Li, Na, K, Cs
(p: 100 - p mol %)
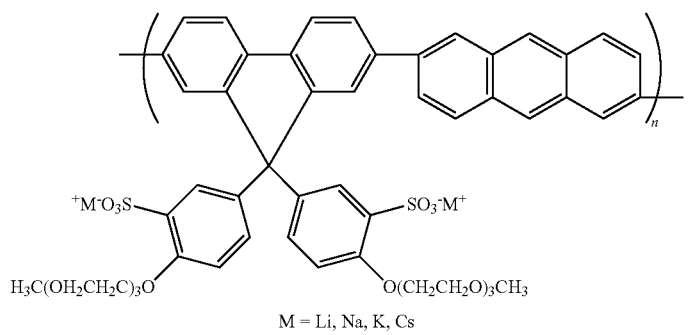
M = Li, Na, K, Cs
[Chemical Formula 57]
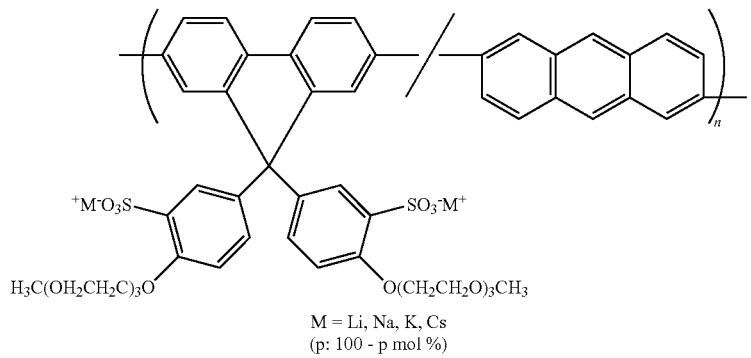
M = Li, Na, K, Cs
(p: 100 - p mol %)
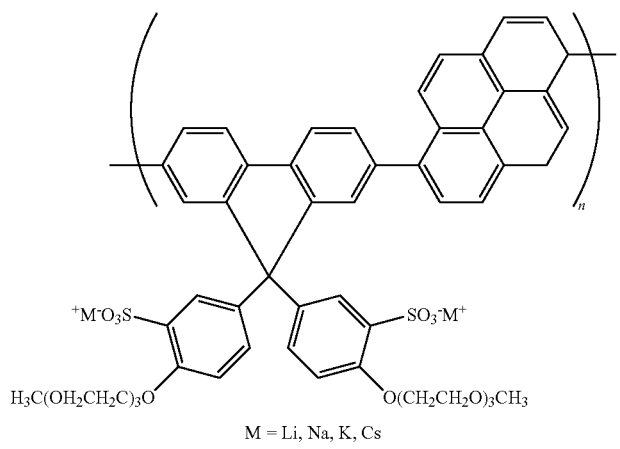
M = Li, Na, K, Cs -continued
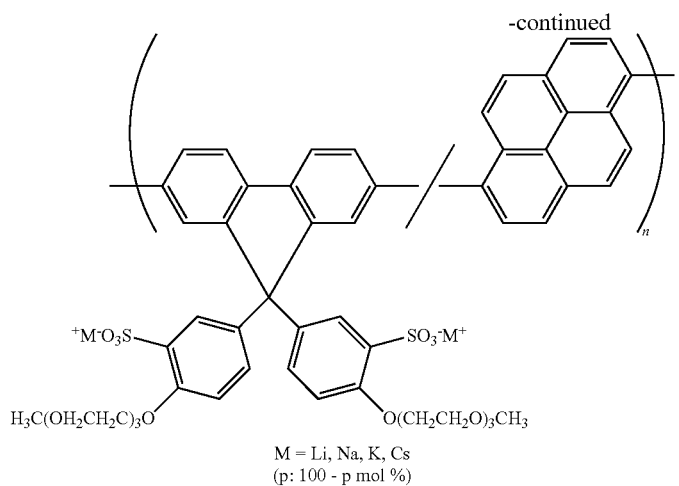
M = Li, Na, K, Cs
(p: 100 - p mol %)
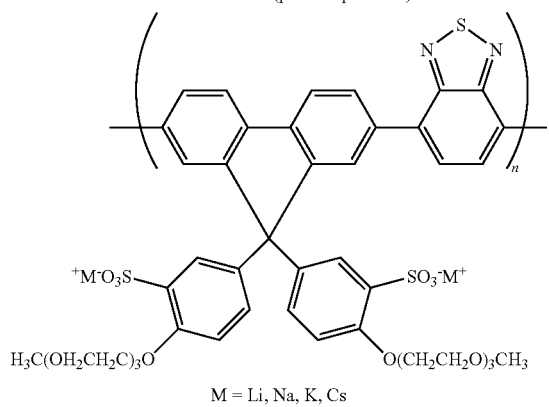
M = Li, Na, K, Cs
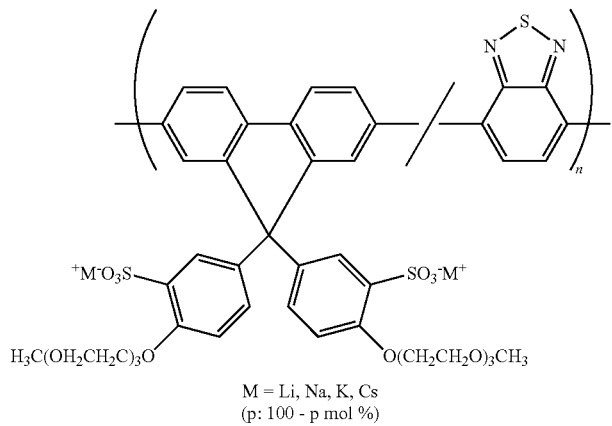
M = Li, Na, K, Cs
(p: 100 - p mol %)
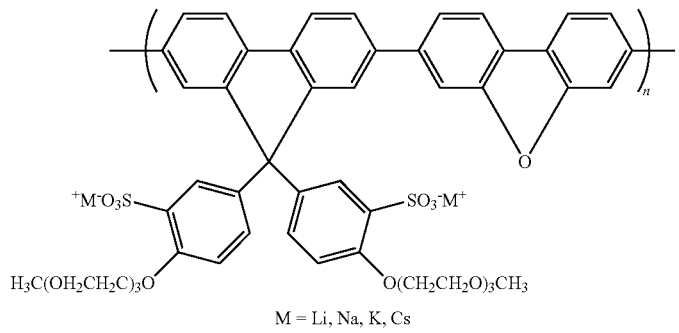
M = Li, Na, K, Cs

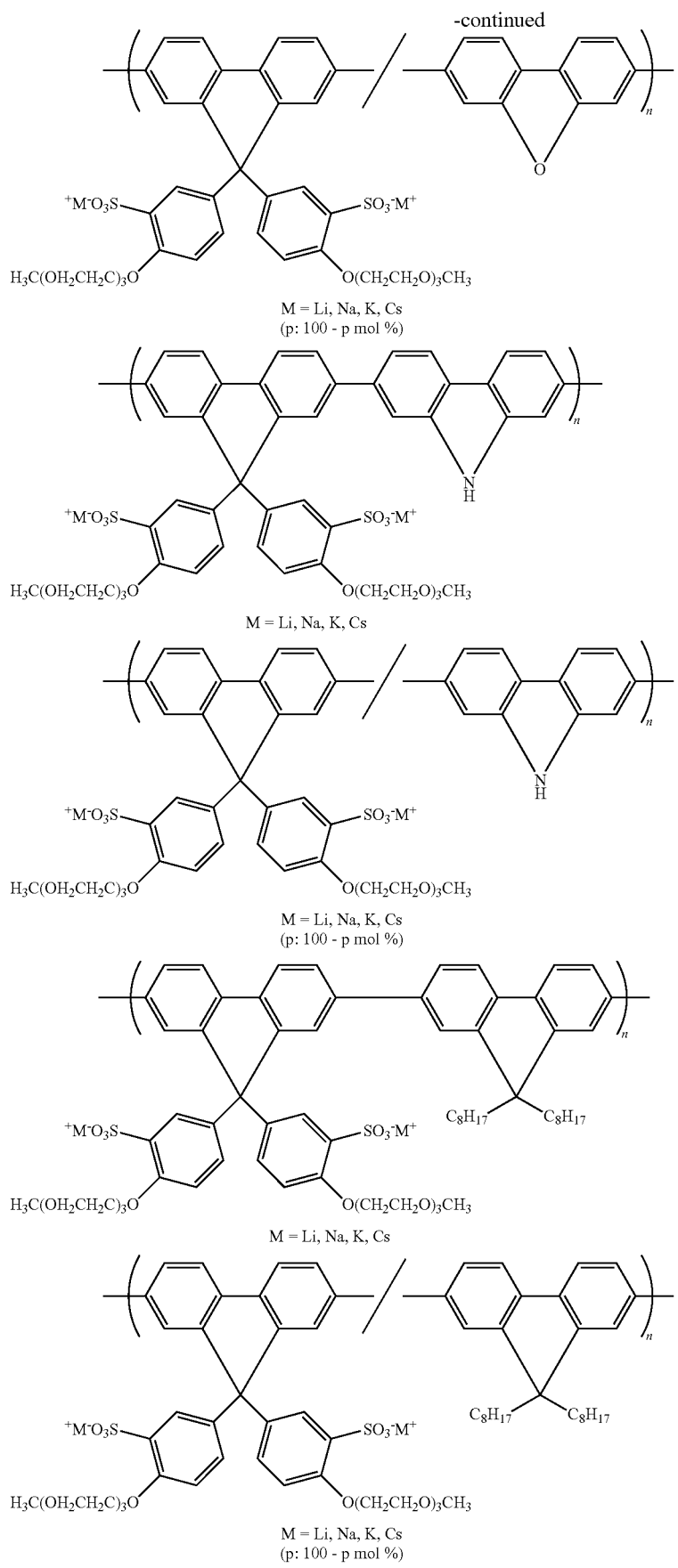

-continued
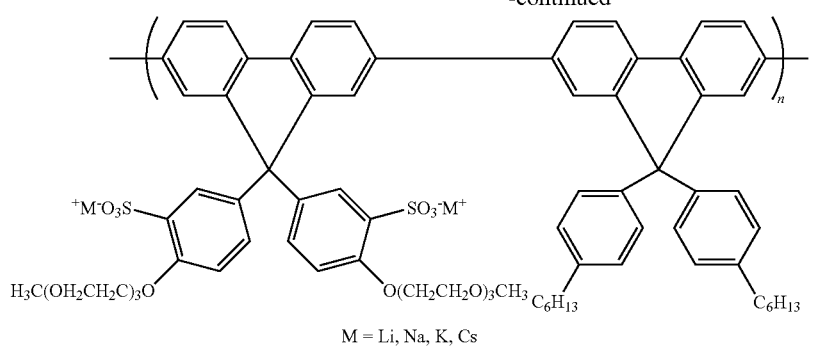
M = Li, Na, K, Cs
[Chemical Formula 58]
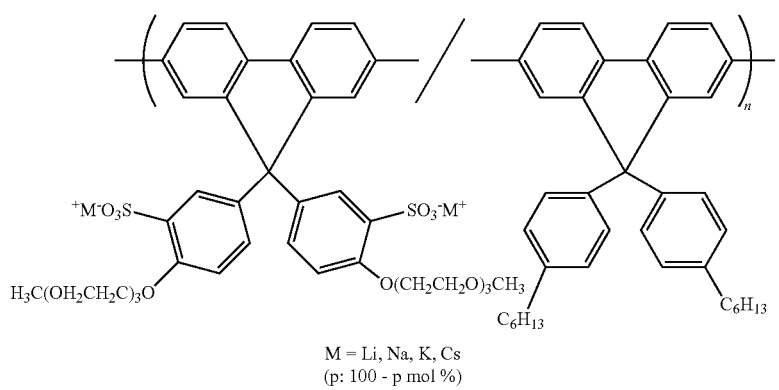
M = Li, Na, K, Cs
(p: 100 - p mol %)
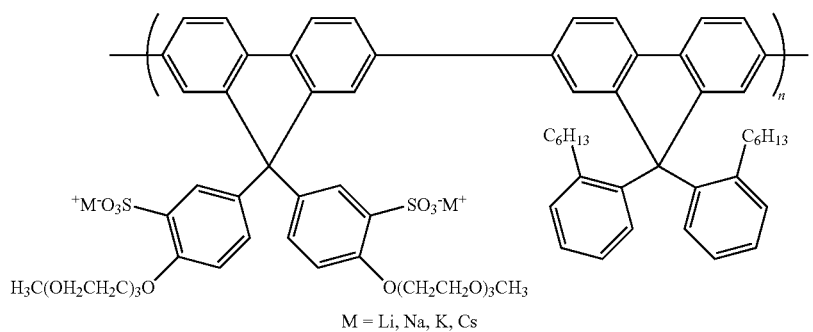
M = Li, Na, K, Cs
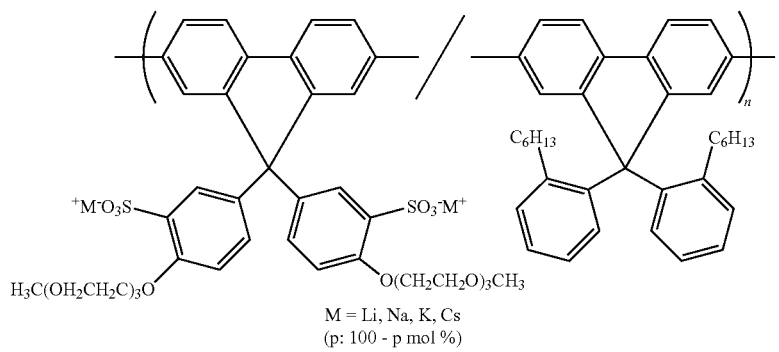
M = Li, Na, K, Cs
(p: 100 - p mol %)

-continued
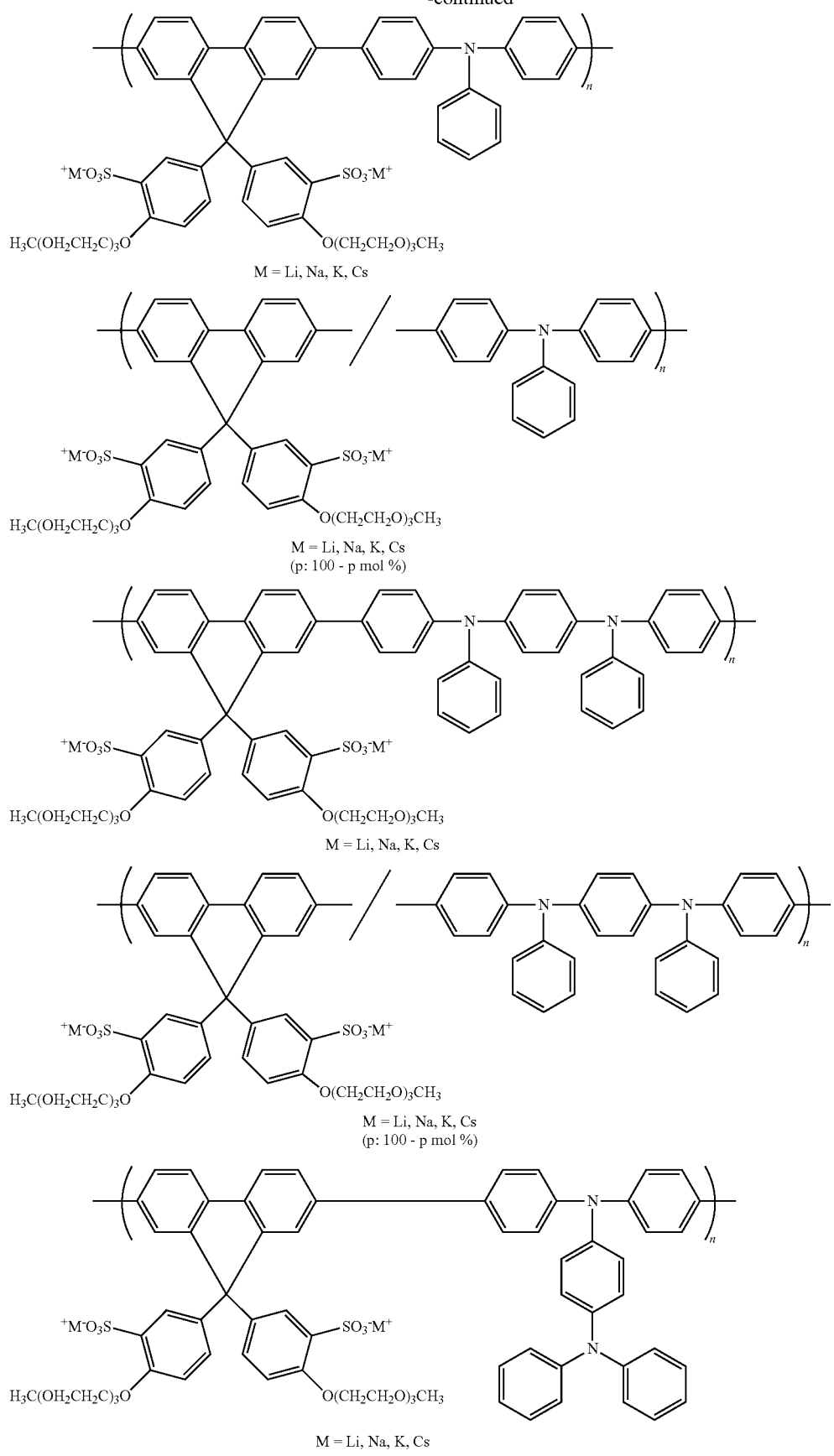

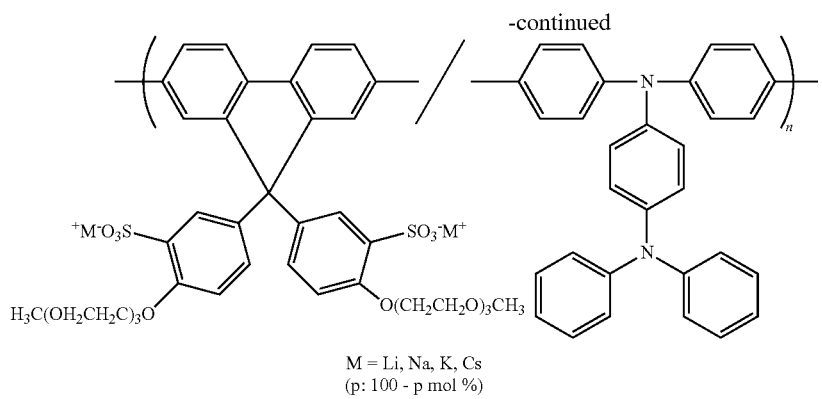

M = Li, Na, K, Cs
(p: 100 - p mol %)

In the above formulae, p represents a number of 15 to 100.

Examples of the ionic polymer containing the group represented by Formula (2) and the group represented by Formula (3) may include: an ionic polymer consisting of a structural unit represented by Formula (26); an ionic polymer consisting of a structural unit represented by Formula (26) and one or more group(s) selected from the group consisting of a group remaining after removing two hydrogen atoms from a group represented by any one of Formulae 45 to 50, 59, 60, 77, 80, 91, 92, 96, and 101 to 110; an ionic polymer consisting of a structural unit represented by Formula (27); an ionic polymer consisting of a structural unit represented by Formula (27) and one or more group(s) selected from the group consisting of a group remaining after removing two hydrogen atoms from a group represented by any one of Formulae 45 to 50, 59, 60, 77, 80, 91, 92, 96, and 101 to 110; an ionic polymer consisting of a structural unit represented by Formula (28); an ionic polymer consisting of a structural unit represented by Formula (28) and one or more group(s) selected from the group consisting of a group remaining after removing two hydrogen atoms from a group represented by any one of Formulae 45 to 50, 59, 60, 77, 80, 91, 92, 96, and 101 to 110; an ionic polymer consisting of a structural unit represented by Formula (31); an ionic polymer consisting of a structural unit represented by Formula (31) and one or more group(s) selected from the group consisting of a group remaining after removing two hydrogen atoms from a group represented by any one of Formulae 45 to 50, 59, 60, 77, 80, 91, 92, 96, and 101 to 110; an ionic polymer consisting of a structural unit represented by Formula (32); and an ionic polymer consisting of a structural unit represented by Formula (32) and one or more group(s) selected from the group consisting of a group remaining after removing two hydrogen atoms from a group represented by any one of Formulae 45 to 50, 59, 60, 77, 80, 91, 92, 96, and 101 to 110.

Examples of the ionic polymer comprising the group represented by Formula (2) and the group represented by Formula (3) may include the macromolecular compounds below. Among these macromolecular compounds, in macromolecular compounds represented by a formula in which two types of structural unit are delimited by a slash "/", the ratio of the left structural unit is p % by mole and the ratio of the right structural unit is (100-p) % by mole, and these structural units are arranged at random. In the formulae below, n represents the degree of polymerization.

[Chemical Formula 59]

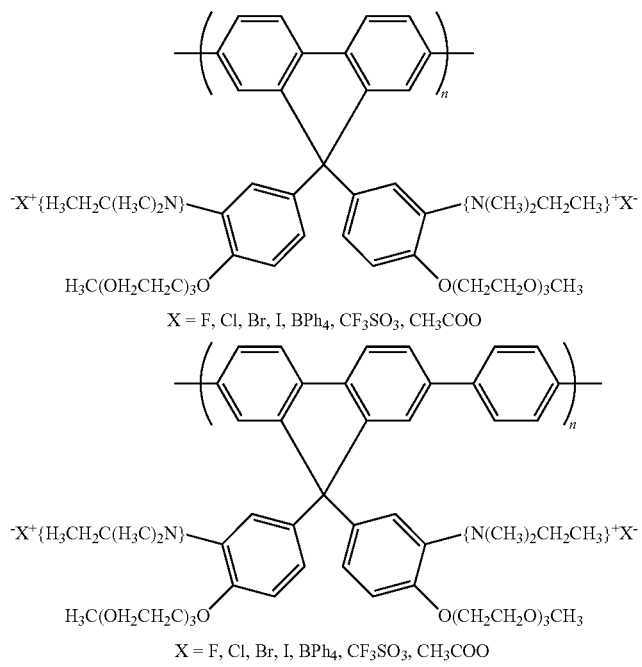

X = F, Cl, Br, I, BPh$_4$, CF$_3$SO$_3$, CH$_3$COO

X = F, Cl, Br, I, BPh$_4$, CF$_3$SO$_3$, CH$_3$COO

-continued
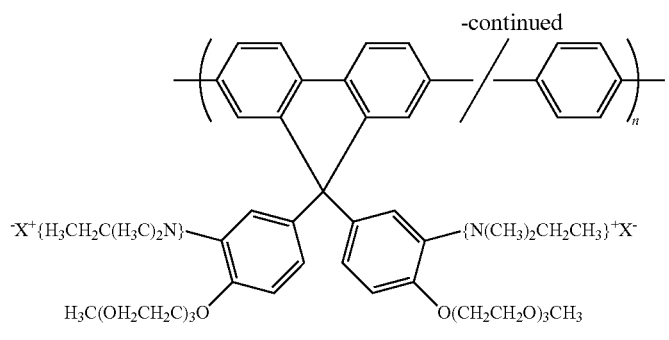
X = F, Cl, Br, I, BPh₄, CF₃SO₃, CH₃COO
(p: 100-p mol %)
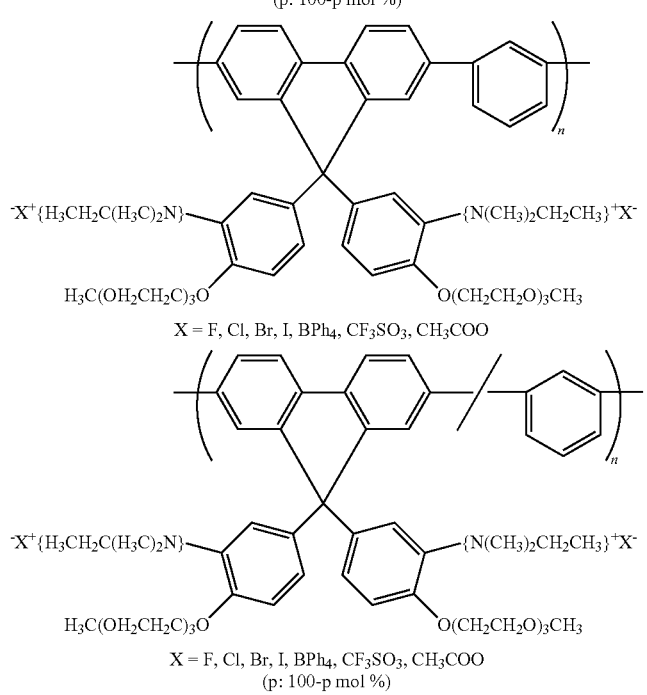
X = F, Cl, Br, I, BPh₄, CF₃SO₃, CH₃COO
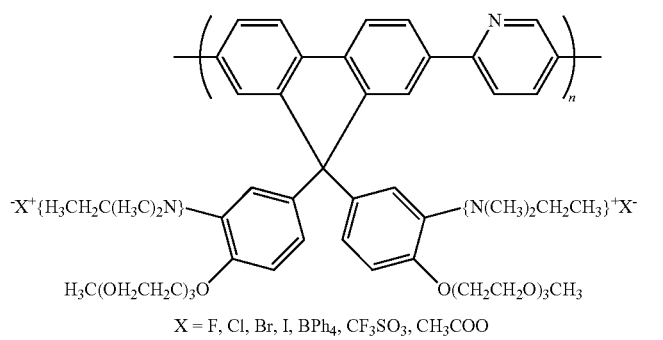
X = F, Cl, Br, I, BPh₄, CF₃SO₃, CH₃COO
(p: 100-p mol %)
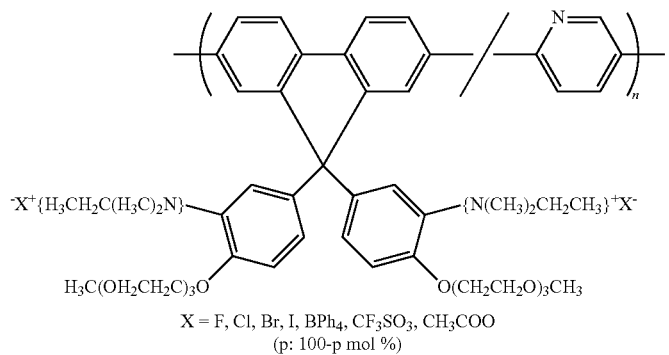
X = F, Cl, Br, I, BPh₄, CF₃SO₃, CH₃COO
X = F, Cl, Br, I, BPh₄, CF₃SO₃, CH₃COO
(p: 100-p mol %)

-continued
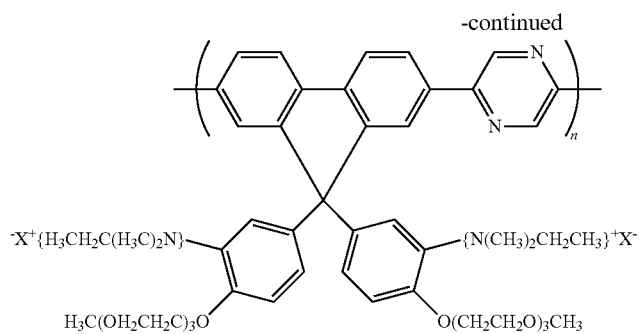
X = F, Cl, Br, I, BPh₄, CF₃SO₃, CH₃COO
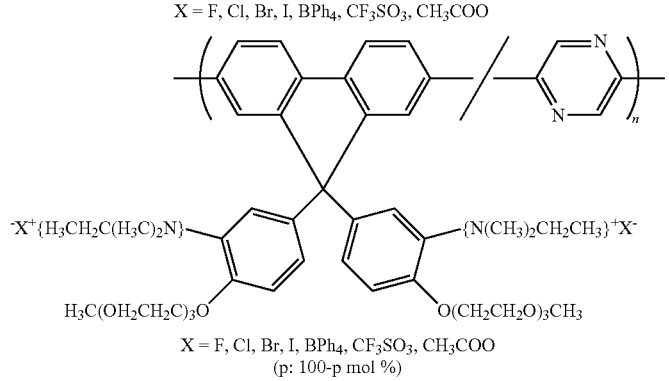
X = F, Cl, Br, I, BPh₄, CF₃SO₃, CH₃COO
(p: 100-p mol %)
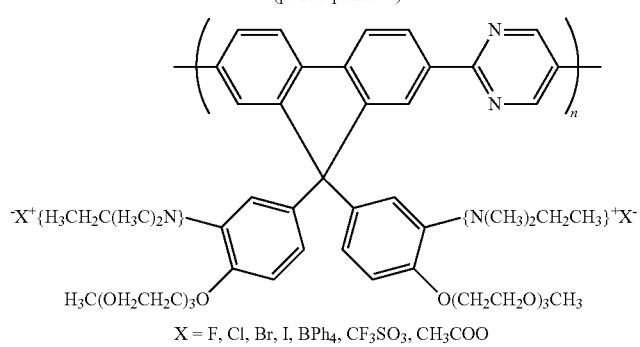
X = F, Cl, Br, I, BPh₄, CF₃SO₃, CH₃COO
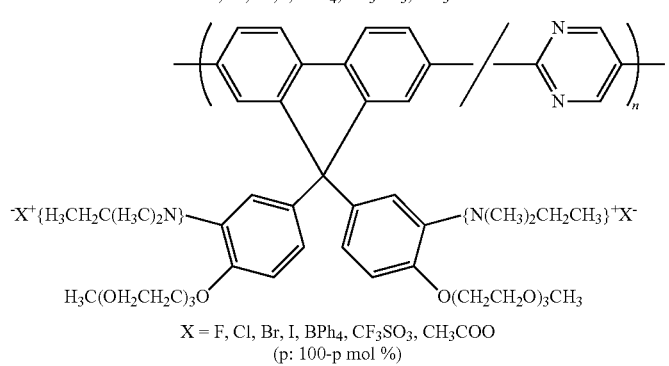
X = F, Cl, Br, I, BPh₄, CF₃SO₃, CH₃COO
(p: 100-p mol %)
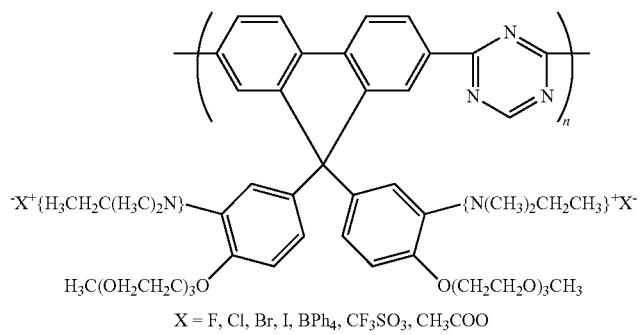
X = F, Cl, Br, I, BPh₄, CF₃SO₃, CH₃COO

[Chemical Formula 60]
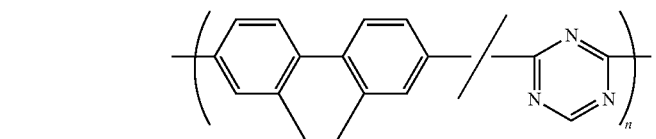
X = F, Cl, Br, I, BPh$_4$, CF$_3$SO$_3$, CH$_3$COO
(p: 100-p mol %)
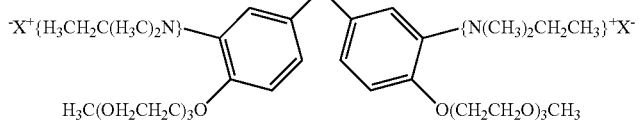
X = F, Cl, Br, I, BPh$_4$, CF$_3$SO$_3$, CH$_3$COO
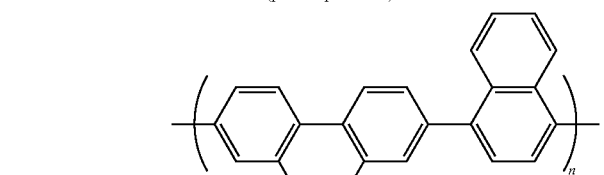
X = F, Cl, Br, I, BPh$_4$, CF$_3$SO$_3$, CH$_3$COO
(p: 100-p mol %)
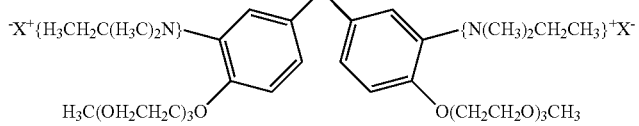
X = F, Cl, Br, I, BPh$_4$, CF$_3$SO$_3$, CH$_3$COO
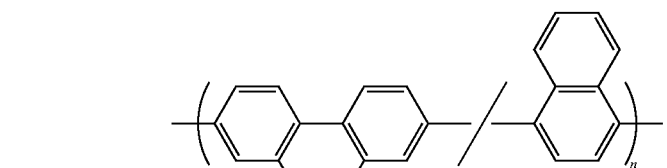
X = F, Cl, Br, I, BPh$_4$, CF$_3$SO$_3$, CH$_3$COO
(p: 100-p mol %)
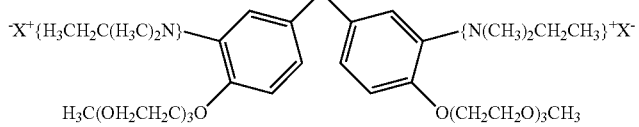
X = F, Cl, Br, I, BPh$_4$, CF$_3$SO$_3$, CH$_3$COO
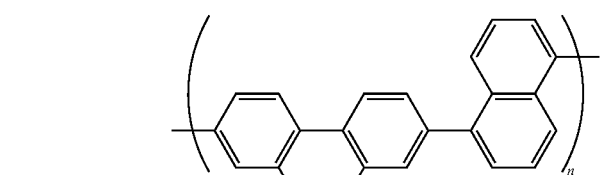
X = F, Cl, Br, I, BPh$_4$, CF$_3$SO$_3$, CH$_3$COO
(p: 100-p mol %)
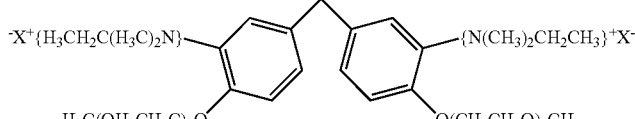
X = F, Cl, Br, I, BPh$_4$, CF$_3$SO$_3$, CH$_3$COO -continued
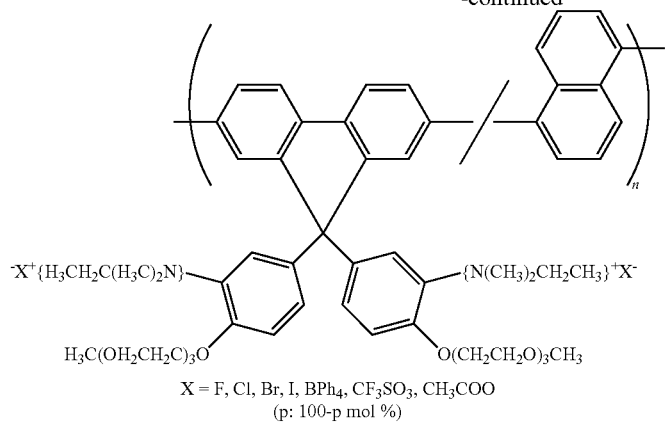
X = F, Cl, Br, I, BPh$_4$, CF$_3$SO$_3$, CH$_3$COO
(p: 100-p mol %)
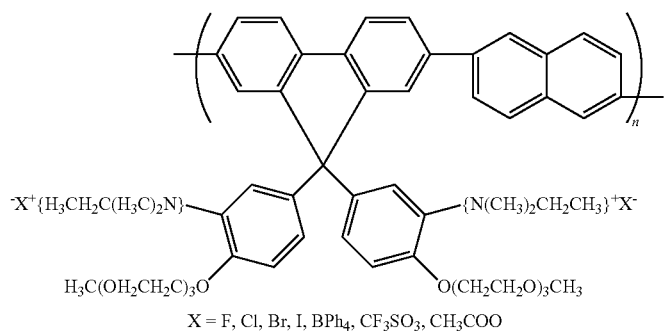
X = F, Cl, Br, I, BPh$_4$, CF$_3$SO$_3$, CH$_3$COO
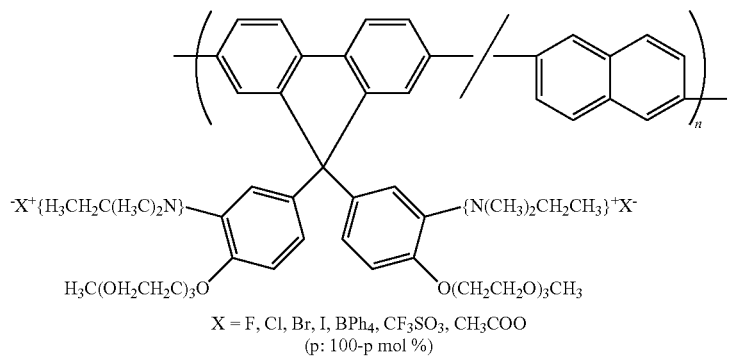
X = F, Cl, Br, I, BPh$_4$, CF$_3$SO$_3$, CH$_3$COO
(p: 100-p mol %)
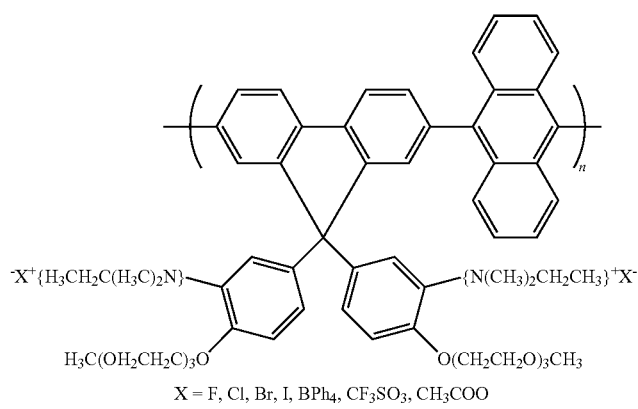
X = F, Cl, Br, I, BPh$_4$, CF$_3$SO$_3$, CH$_3$COO -continued
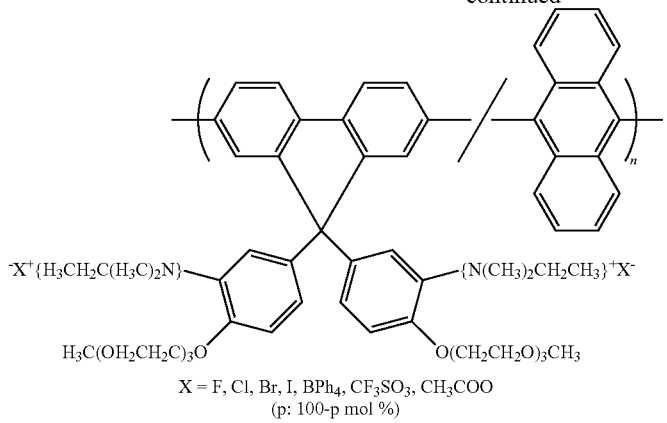
X = F, Cl, Br, I, BPh4, CF3SO3, CH3COO
(p: 100-p mol %)
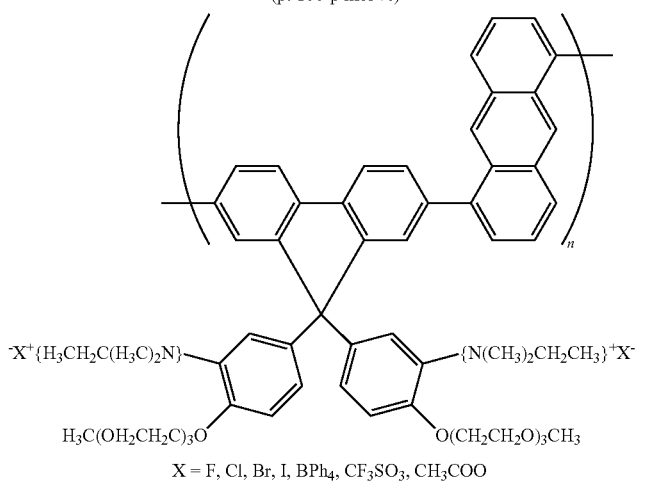
X = F, Cl, Br, I, BPh4, CF3SO3, CH3COO
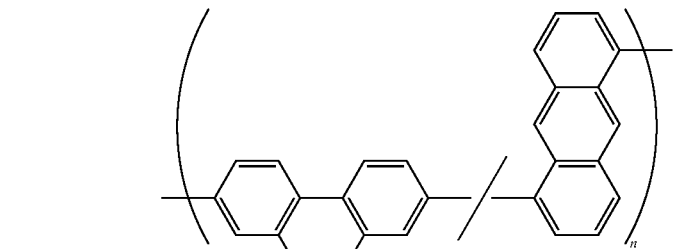
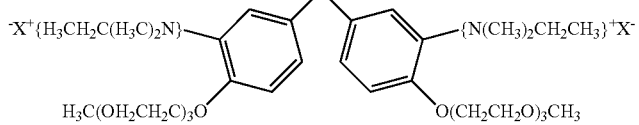
X = F, Cl, Br, I, BPh4, CF3SO3, CH3COO
(p: 100-p mol %)
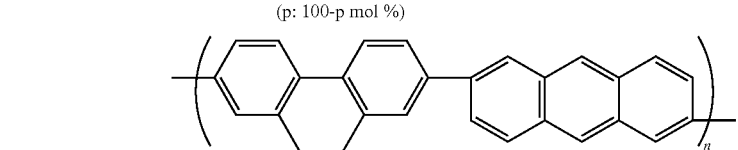
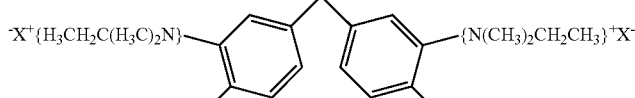
X = F, Cl, Br, I, BPh4, CF3SO3, CH3COO

[Chemical Formula 61]
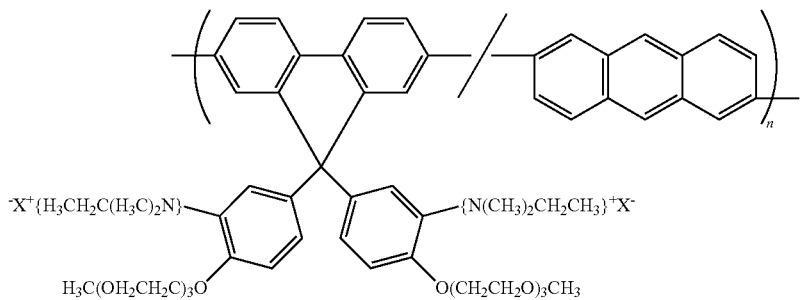
X = F, Cl, Br, I, BPh₄, CF₃SO₃, CH₃COO
(p: 100-p mol %)
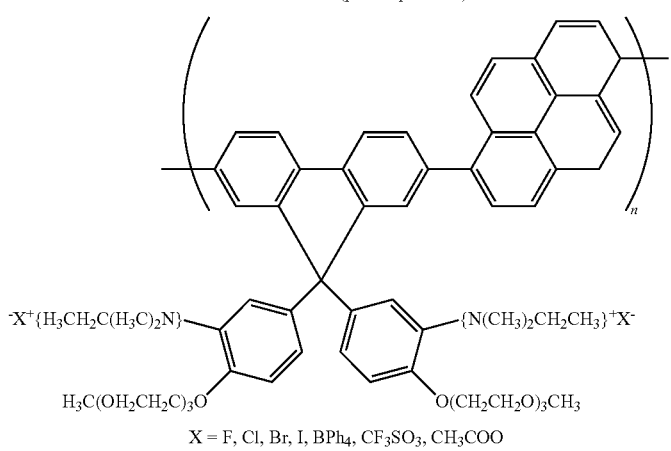
X = F, Cl, Br, I, BPh₄, CF₃SO₃, CH₃COO
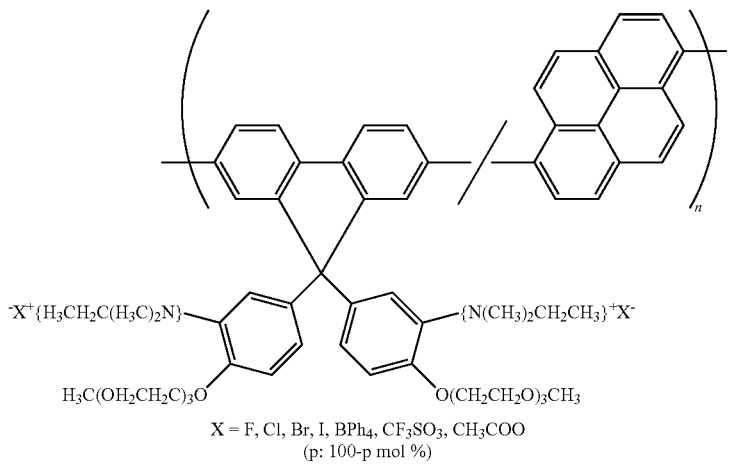
X = F, Cl, Br, I, BPh₄, CF₃SO₃, CH₃COO
(p: 100-p mol %)
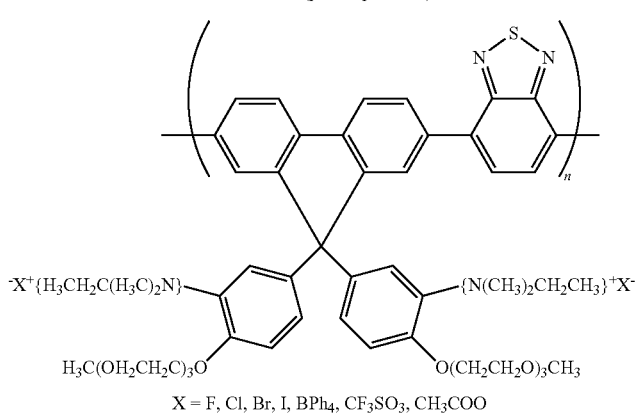
X = F, Cl, Br, I, BPh₄, CF₃SO₃, CH₃COO -continued
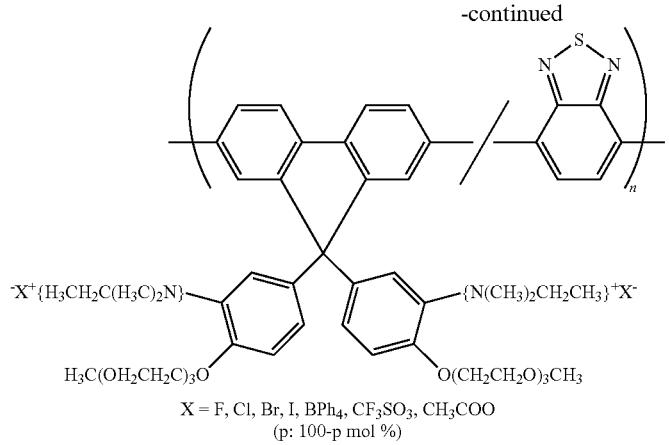
X = F, Cl, Br, I, BPh4, CF3SO3, CH3COO
(p: 100-p mol %)
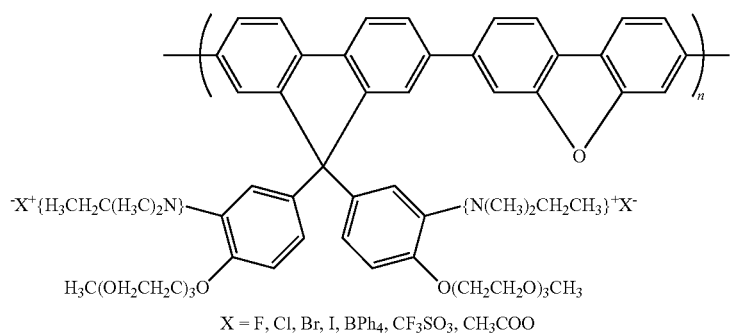
X = F, Cl, Br, I, BPh4, CF3SO3, CH3COO
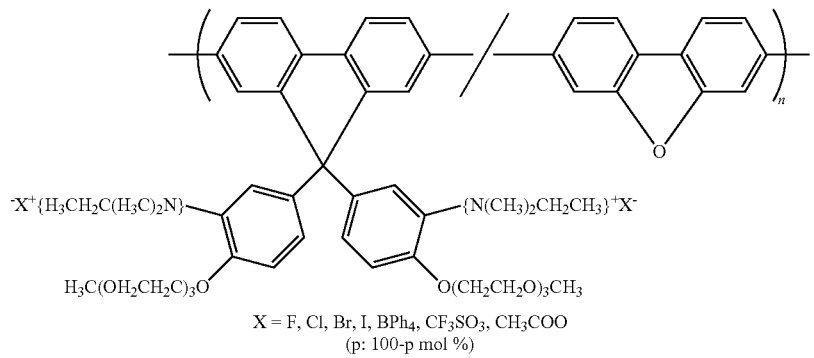
X = F, Cl, Br, I, BPh4, CF3SO3, CH3COO
(p: 100-p mol %)
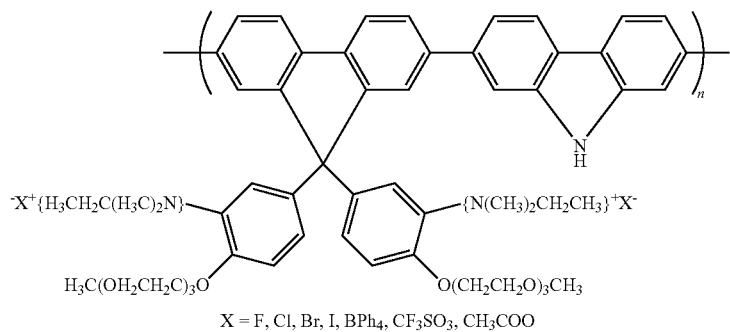
X = F, Cl, Br, I, BPh4, CF3SO3, CH3COO -continued
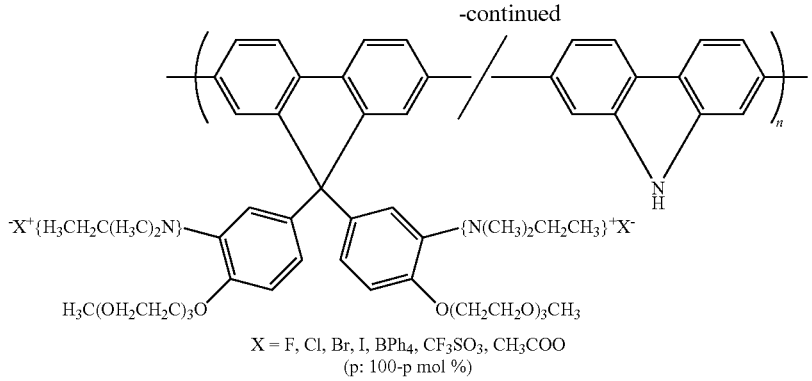
X = F, Cl, Br, I, BPh4, CF3SO3, CH3COO
(p: 100-p mol %)
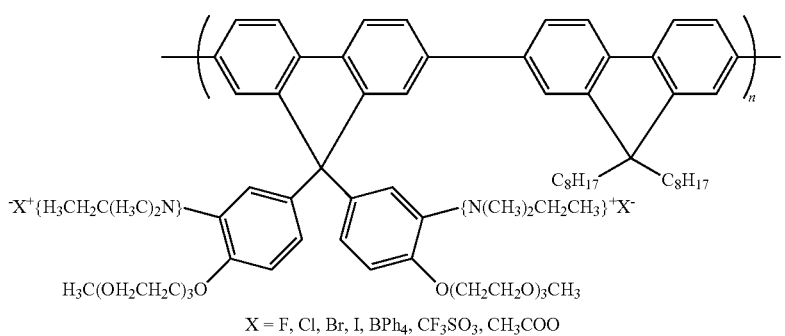
X = F, Cl, Br, I, BPh4, CF3SO3, CH3COO
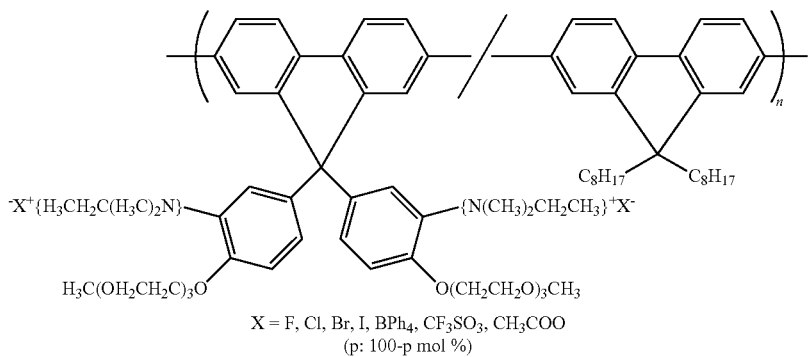
X = F, Cl, Br, I, BPh4, CF3SO3, CH3COO
(p: 100-p mol %)
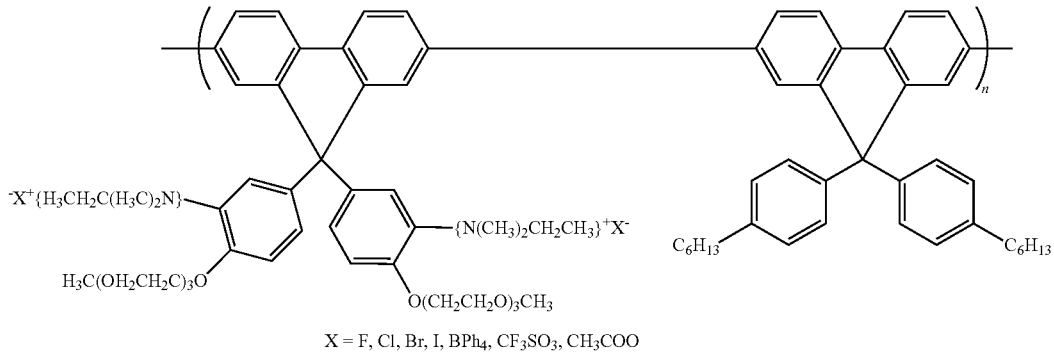
X = F, Cl, Br, I, BPh4, CF3SO3, CH3COO

[Chemical Formula 62]
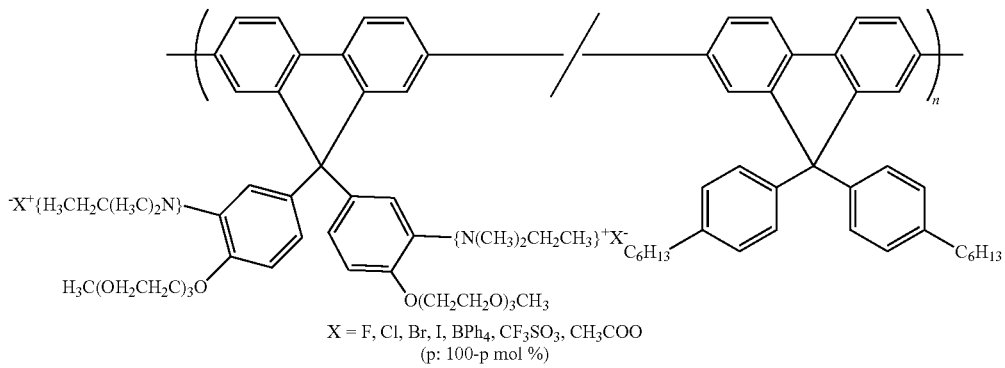
X = F, Cl, Br, I, BPh₄, CF₃SO₃, CH₃COO
(p: 100-p mol %)
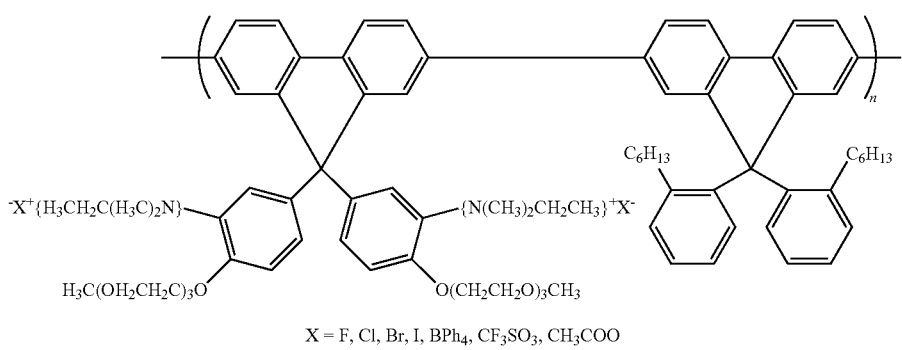
X = F, Cl, Br, I, BPh₄, CF₃SO₃, CH₃COO
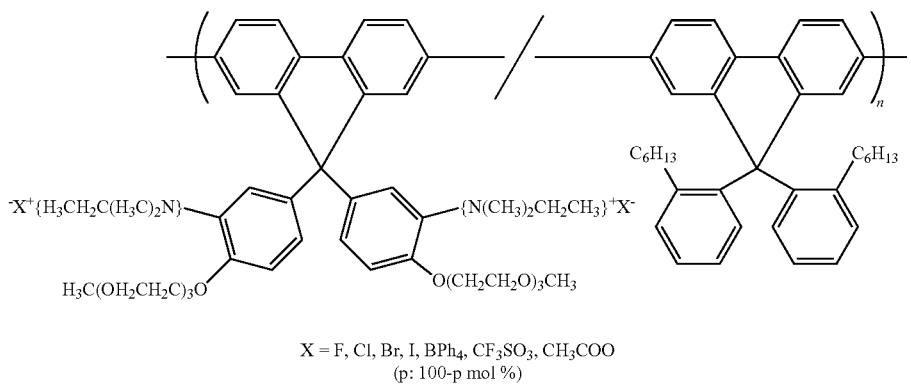
X = F, Cl, Br, I, BPh₄, CF₃SO₃, CH₃COO
(p: 100-p mol %)
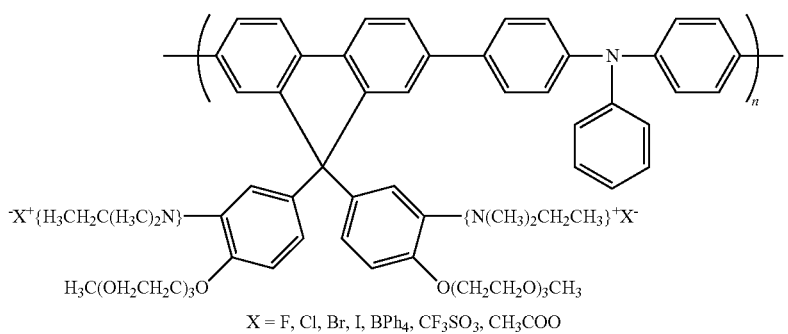
X = F, Cl, Br, I, BPh₄, CF₃SO₃, CH₃COO -continued
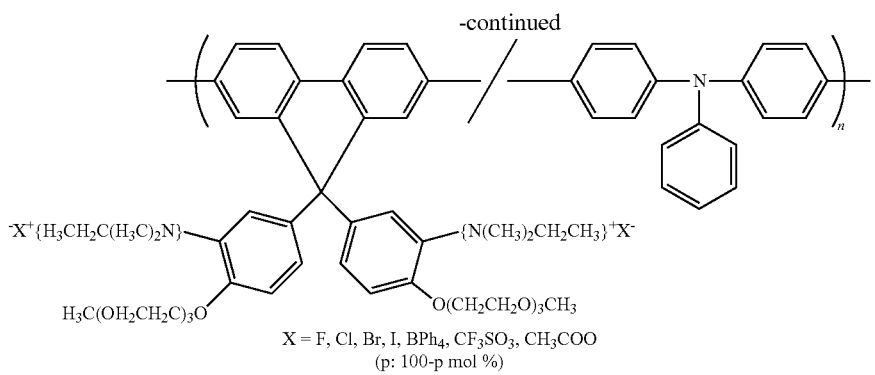
X = F, Cl, Br, I, BPh4, CF3SO3, CH3COO
(p: 100-p mol %)
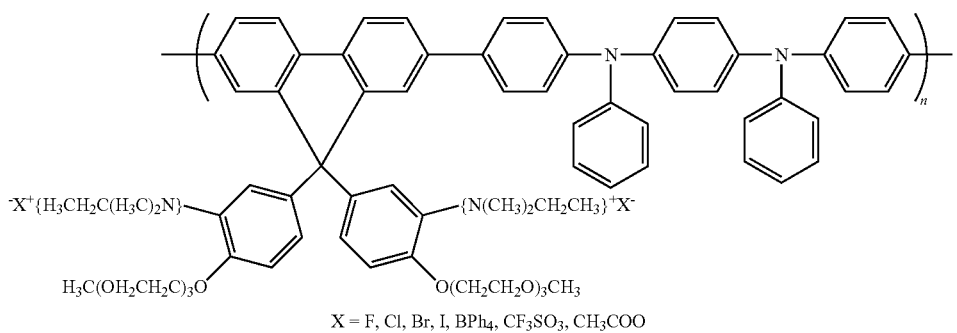
X = F, Cl, Br, I, BPh4, CF3SO3, CH3COO
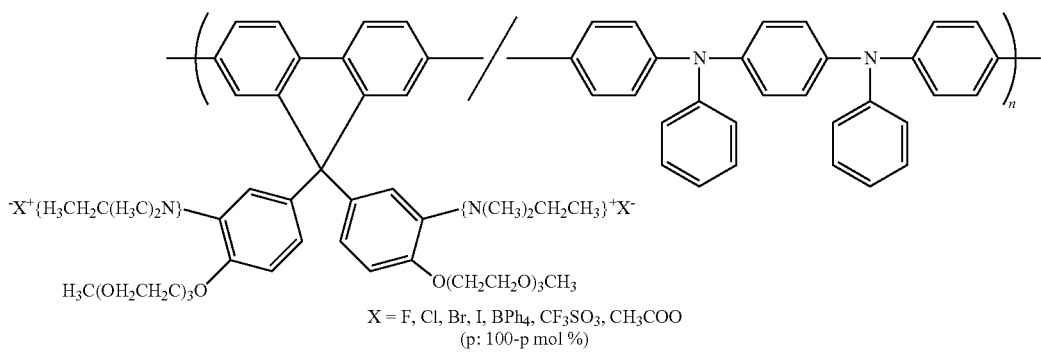
X = F, Cl, Br, I, BPh4, CF3SO3, CH3COO
(p: 100-p mol %)
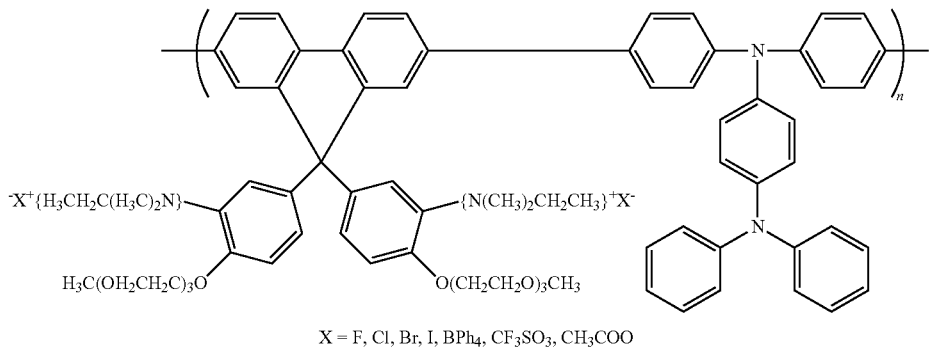
X = F, Cl, Br, I, BPh4, CF3SO3, CH3COO -continued

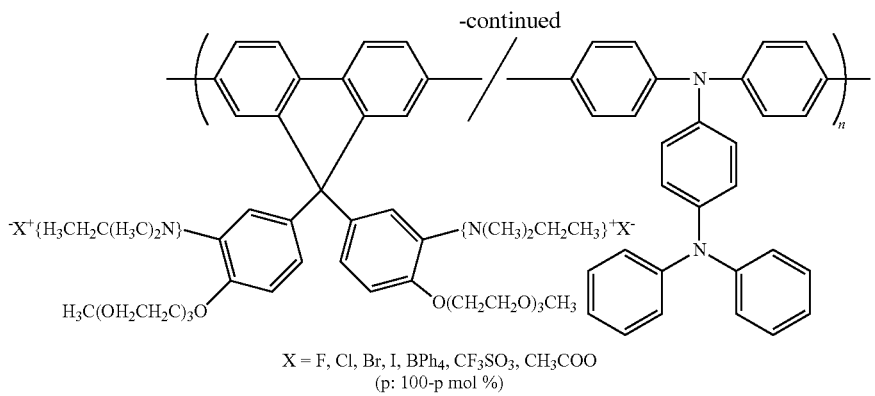

X = F, Cl, Br, I, BPh4, CF3SO3, CH3COO
(p: 100-p mol %)

In the above formulae, p represents a number of 15 to 100.

Method for Manufacturing Ionic Polymer

Next, a method for manufacturing the ionic polymer used in the present invention is described. Examples of a preferred method for manufacturing the ionic polymer used in the present invention may include a method including: a method in which a compound represented by General Formula (36) below is employed as one of raw materials and the raw materials are condensation polymerized. Among them, preferred is a method where at least one type of a compound in which -$A_a$- in General Formula (36) is a structural unit represented by Formula (13), a compound in which -$A_a$- is a structural unit represented by Formula (15), a compound in which -$A_a$- is a structural unit represented by Formula (17) and a compound in which -$A_a$- is a structural unit represented by Formula (20) is employed as an essential raw material and raw materials are condensation polymerized.

$$Y^4\text{-}A_a\text{-}Y^5 \qquad (36)$$

In Formula (36), $A_a$ represents a repeating unit comprising one or more type(s) of group represented by Formula (3) and one or more type(s) of group selected from the group consisting of a group represented by Formula (1) and a group represented by Formula (2); and $Y^4$ and $Y^5$ each independently represents a group involved in condensation-polymerization.

In the ionic polymer used in the present invention, other structural unit than -$A_a$- may be contained together with a structural unit represented by -$A_a$- in Formula (36). In this case, a compound having two substituents to be involved in condensation-polymerization which becomes the other structural unit than -$A_a$- is used and may be allowed to coexist with a compound represented by Formula (36) to be subjected to condensation-polymerization.

Examples of the compound having two condensation-polymerizable substituents used for introducing the other structural unit may include compounds represented by Formula (37). Thus, by condensation-polymerizing a compound represented by Formula (37) in addition to a compound represented by $Y^4$-$A_a$-$Y^5$, an ionic polymer further comprising a structural unit represented by -$A_b$- used in the present invention can be manufactured.

$$Y^6\text{-}A_b\text{-}Y^7 \qquad (37)$$

In Formula (37), $A_b$ is a structural unit represented by General Formula (33) or a structural unit represented by General Formula (35); and $Y^6$ and $Y^7$ each independently represent a group involved in condensation-polymerization.

Examples of such a group involved in condensation-polymerization ($Y^4$, $Y^5$, $Y^6$ and $Y^7$) may include a hydrogen atom, a halogen atom, an alkyl sulfonate group, an aryl sulfonate group, an arylalkyl sulfonate group, a boric acid ester residue, a sulfonium methyl group, a phosphonium methyl group, a phosphonate methyl group, a monohalogenated methyl group, —$B(OH)_2$, a formyl group, a cyano group and a vinyl group.

Examples of the halogen atom capable of being selected as such a group involved in condensation-polymerization may include a fluorine atom, a chlorine atom, a bromine atom and an iodine atom.

Examples of the alkyl sulfonate group capable of being selected as the group involved in condensation-polymerization may include a methane sulfonate group, an ethane sulfonate group and a trifluoromethane sulfonate group. Examples of the aryl sulfonate group capable of being selected as the group involved in condensation-polymerization may include a benzene sulfonate group and a p-toluene sulfonate group.

Examples of the arylalkyl sulfonate group capable of being selected as the group involved in condensation-polymerization may include a benzyl sulfonate group.

Examples of the boric acid ester residue capable of being selected as the group involved in condensation-polymerization may include the groups represented by the following formulae.

[Chemical Formula 63]

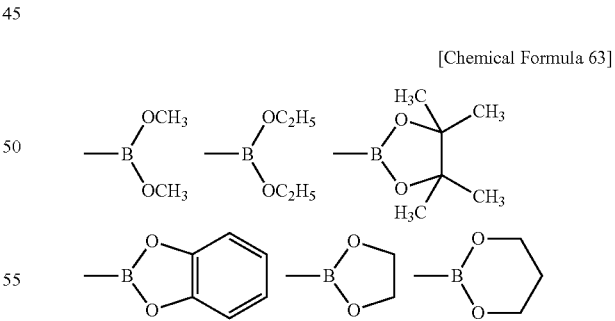

Furthermore, examples of the sulfoniummethyl group capable of being selected as the group involved in condensation-polymerization may include a group represented by the following formula:

—$CH_2S^+Me_2E^-$ or —$CH_2S^+Ph_2E^-$ wherein E represents a halogen atom and Ph represents a phenyl group, the same shall apply hereinafter.

Examples of the phosphoniummethyl group capable of being selected as the group involved in condensation-polymerization may include a group represented by the following formula:

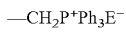

wherein E represents a halogen atom.

Examples of the phosphonate methyl group capable of being selected as the group involved in condensation-polymerization may include a group represented by the following formula:

wherein $R^d$ represents an alkyl group, an aryl group or an arylalkyl group.

Examples of the monohalogenated methyl group capable of being selected as the group involved in condensation-polymerization may include a fluorinated methyl group, a chlorinated methyl group, a brominated methyl group and a iodinated methyl group.

The group preferred as the group involved in condensation-polymerization varies depending on the type of polymerization reaction. For example, when a 0 valent nickel complex is used such as for the Yamamoto coupling reaction, the group is preferably a halogen atom, an alkyl sulfonate group, an aryl sulfonate group or an arylalkyl sulfonate group. When a nickel catalyst or a palladium catalyst is used such as for the Suzuki coupling reaction, the group is preferably an alkyl sulfonate group, a halogen atom, a boric acid ester residue or —B(OH)$_2$. When an oxidation polymerization is performed using an oxidant or performed electrochemically, the group is preferably a hydrogen atom.

For example, a polymerization method comprising: dissolving a compound (monomer) represented by General Formula (36) or (37) having a plurality of groups involved in condensation-polymerization into an organic solvent, if necessary; and reacting the resultant solution using an alkali or an appropriate catalyst at a temperature that is a melting point of the organic solvent or higher and a boiling point of the organic solvent or lower, may be employed for the preparation of the ionic polymer used in the present invention. Examples of such a polymerization method may include publicly known methods described in, for example, "Organic Reactions, vol. 14, pp. 270-490 (1965), published by John Wiley & Sons, Inc.", "Organic Syntheses, Collective Volume VI, pp. 407-411 (1988), published by John Wiley & Sons, Inc.", "Chemical Review (Chem. Rev.), vol. 95, p. 2457 (1995)", "Journal of Organometallic Chemistry (J. Organomet. Chem.), vol. 576, p. 147 (1999)", and "Macromolecular Chemistry, Macromolecular Symposium (Macromol. Chem., Macromol. Symp.) vol. 12, p. 229 (1987)".

When the ionic polymer used in the present invention is manufactured, a known condensation-polymerization reaction may be employed according to the group involved in condensation-polymerization. Examples of such a polymerization method may include: a method of polymerizing the relevant monomer by the Suzuki coupling reaction; a method of polymerizing the relevant monomer by the Grignard reaction; a method of polymerizing the relevant monomer by a Ni(O) complex; a method of polymerizing the relevant monomer by an oxidant such as FeCl$_3$; a method of polymerizing the relevant monomer by an electrochemical oxidation polymerization; and a method of polymerizing the relevant monomer by a decomposition of an intermediate polymer having an appropriate leaving group. Among such polymerization reactions, the method of polymerizing by the Suzuki coupling reaction, the method of polymerizing by the Grignard reaction, and the method of polymerizing by a nickel 0 valent complex are preferred in terms that the structure of the obtained ionic polymer can be easily controlled.

A preferred embodiment of the method for manufacturing the ionic polymer used in the present invention is a method for manufacturing the ionic polymer comprising: using a raw material monomer comprising a group selected from the group consisting of a halogen atom, an alkyl sulfonate group, an aryl sulfonate group and an arylalkyl sulfonate group as the group involved in condensation-polymerization; and condensation polymerizing the raw material monomer in the presence of a nickel 0 valent complex. Examples of the raw material monomer used for such a method may include a dihalogenated compound, a bis(alkyl sulfonate) compound, a bis(aryl sulfonate) compound, a bis(arylalkyl sulfonate) compound, a halogen-alkyl sulfonate compound, a halogen-aryl sulfonate compound, a halogen-arylalkyl sulfonate compound, an alkyl sulfonate-aryl sulfonate compound, an alkyl sulfonate-arylalkyl sulfonate compound and an aryl sulfonate-arylalkyl sulfonate compound.

Another preferred embodiment of the method for manufacturing the ionic polymer is a method for manufacturing the ionic polymer comprising: using a raw material monomer comprising a group selected from the group consisting of a halogen atom, an alkyl sulfonate group, an aryl sulfonate group, an arylalkyl sulfonate group, —B(OH)$_2$ and a boric acid ester residue as the group involved in condensation-polymerization, the raw material monomer in which the ratio (K/J) of the sum (J) of the number of moles of a halogen atom, an alkyl sulfonate group, an aryl sulfonate group and an arylalkyl sulfonate group that all raw material monomers have and the sum (K) of the number of moles of —B(OH)$_2$ and a boric acid ester residue that all raw material monomers have, is substantially 1 (usually, K/J is in a range of 0.7 to 1.2); and condensation polymerizing the raw material monomer in the presence of a nickel catalyst or a palladium catalyst.

The organic solvent varies depending on the used compounds and the reaction. For the organic solvent, in order to suppress a side reaction, an organic solvent subjected thoroughly to deoxygenation treatment is generally preferred to be used. When the ionic polymer is manufactured, it is preferred that the reaction is progressed using such an organic solvent in an inert gas atmosphere. The organic solvent is preferably subjected to a dehydration treatment as well as the deoxygenation treatment, with the proviso that this may not be the case for the reaction in a two-phase system with water such as the Suzuki coupling reaction.

Examples of such an organic solvent may include: a saturated hydrocarbon such as pentane, hexane, heptane, octane and cyclohexane; an unsaturated hydrocarbon such as benzene, toluene, ethylbenzene and xylene; a halogenated saturated hydrocarbon such as carbon tetrachloride, chloroform, dichloromethane, chlorobutane, bromobutane, chloropentane, bromopentane, chlorohexane, bromohexane, chlorocyclohexane and bromocyclohexane; a halogenated unsaturated hydrocarbon such as chlorobenzene, dichlorobenzene and trichlorobenzene; alcohols such as methanol, ethanol, propanol, isopropanol, butanol and tert-butyl alcohol; carboxylic acids such as formic acid, acetic acid and propionic acid; ethers such as dimethyl ether, diethyl ether, methyl tert-butyl ether, tetrahydrofuran, tetrahydropyran and dioxane; amines such as trimethylamine, triethylamine, N,N,N',N'-tetramethylethylenediamine and pyridine; and amides such as N,N-dimethylformamide, N,N-dimethylacetamide, N,N-diethylacetamide and N-methylmorpholine oxide. These organic solvents may be used alone or in combination of two or more types thereof. Among such organic solvents, from the viewpoint of the reactivity, ethers are more preferred, tetrahydrofuran and diethyl ether are further preferred. From the viewpoint of the reaction rate, the organic solvent is preferably toluene or xylene.

Upon manufacturing the ionic polymer, it is preferred that an alkali or an appropriate catalyst is added in order to react the raw material monomer. Such an alkali or a catalyst may be selected according to the employed polymerization method. Such an alkali and a catalyst are preferably those capable of being thoroughly dissolved in the solvent used for the reaction. Examples of the method for mixing the alkali or the catalyst may include a method in which while stirring the reaction mixture in an inert gas atmosphere such as argon and nitrogen, a solution of the alkali or the catalyst is slowly added thereto and a method in which the reaction mixture is slowly added to a solution of the alkali or the catalyst.

Regarding the ionic polymer used in the present invention, if a polymerization-active group remains at the position of a terminal group, there is such a probability that the light-emitting characteristics and the life characteristics of the obtained light-emitting element might lower. Therefore, the terminal group may be protected with a stable group. In the case where the terminal group is protected with a stable group, when the ionic polymer used in the present invention is a conjugated compound, the ionic polymer has preferably a conjugated bond in conjunction with a conjugated structure of the main chain of the ionic polymer. Examples of such a structure may include a structure in which the terminal group is bonded with an aryl group or a heterocyclic group through a carbon-carbon bond. Examples of such a stable group for protecting the terminal group may include a substituent such as a monovalent aromatic compound group represented by a structural formula of [Chemical Formula 10] in JP 9-45478 A.

Examples of another preferred method for manufacturing an ionic polymer comprising a structural unit represented by Formula (1) may include a method in which in a first step, an ionic polymer having no cation is polymerized and in a second step, an ionic polymer containing a cation is manufactured from the former ionic polymer. Examples of the method for polymerizing the ionic polymer having no cation in the first step may include the condensation-polymerization reaction noted above. Examples of the reaction in the second step may include a hydrolysis reaction using a metal hydroxide, an alkylammonium hydroxide, or the like.

Examples of another preferred method for manufacturing an ionic polymer comprising a group represented by Formula (2) may include a method in which in a first step, a polymer having no ion is polymerized and in a second step, an ionic polymer containing an ion is manufactured from the polymer. Examples of the method for polymerizing the polymer having no ion in the first step may include the condensation-polymerization reaction noted above. Examples of the reaction in the second step may include a reaction of converting an amine into a quaternary ammonium salt using a halogenated alkyl and a halogen abstraction reaction by $SbF_5$.

The ionic polymer used in the present invention is excellent in injection property and transport property of electric charge, so that the ionic polymer can provide an element emitting light with a high brightness.

Examples of the method for forming a layer comprising the ionic polymer may include a method of forming a film by using a solution containing the ionic polymer to form a film.

Examples of the solvent used for the film formation using a solution may include solvents such as alcohols, ethers, esters, nitrile compounds, nitro compounds, halogenated alkyls, halogenated aryls, thiols, sulfides, sulfoxides, thioketones, amides and carboxylic acids except water. Among them, preferred are solvents having a solubility parameter of 9.3 or more. Examples of the solvent (a value in each parenthesis represents the value of solubility parameter of each solvent) may include methanol (12.9), ethanol (11.2), 2-propanol (11.5), 1-butanol (9.9), tert-butyl alcohol (10.5), acetonitrile (11.8), 1,2-ethandiol (14.7), N,N-dimethylformamide (11.5), dimethylsulfoxide (12.8), acetic acid (12.4), nitrobenzene (11.1), nitromethane (11.0), 1,2-dichloroethane (9.7), dichloromethane (9.6), chlorobenzene (9.6), bromobenzene (9.9), dioxane (9.8), propylene carbonate (13.3), pyridine (10.4), carbon disulfide (10.0) and a solvent mixture of these solvents. Here, as for the solvent mixture prepared by mixing two types of solvents (solvent 1 and solvent 2), the solubility parameter ($\delta_m$) of the solvent mixture is to be obtained according to an equation: $\delta_m = \delta_1 \times \phi_1 + \delta_2 \times \phi_2$ ($\delta_1$ is the solubility parameter of the solvent 1; $\phi_1$ is the volume fraction of the solvent 1; $\delta_2$ is the solubility parameter of the solvent 2; and $\phi_2$ is the volume fraction of the solvent 2).

The optimal value of the thickness of the layer comprising the ionic polymer varies depending on the used ionic polymer. The thickness may be selected so that the driving voltage and the light-emitting efficiency will be moderate values. The layer needs to be thick enough to cause no pin hole. From the viewpoint of reducing the driving voltage of the element, the thickness of the layer comprising the ionic polymer is preferably 1 nm to 1 µm, more preferably 2 nm to 500 nm, further preferably 2 nm to 200 nm. From the viewpoint of protecting the light-emitting layer, the thickness of the layer is preferably 5 nm to 1 µm.

With respect to more preferred several types of specific examples among the above-described ionic polymers used in the present invention, the synthesis examples thereof and the organic EL elements manufactured using the synthesized ionic polymers are illustrated as Experiment Example below.

Hereinafter, the present invention is more specifically described based on Experiment Example. Experiment Examples below should not be construed as limiting the scope of the present invention.

The weight average molecular weight (Mw) and the number average molecular weight (Mn) were measured using gel permeation chromatography (GPC) (manufactured by Tosoh Corporation: HLC-8220GPC) as the weight average molecular weight and the number average molecular weight in terms of polystyrene. The sample to be measured was dissolved in tetrahydrofuran so as to have a concentration of about 0.5% by weight and 50 µL of the resultant solution was injected into GPC. For the mobile phase of GPC, tetrahydrofuran was used and the mobile phase was flowed at a flow rate of 0.5 mL/min. The structural analysis of the polymer was performed by a $^1$H-NMR analysis using 300 MHz NMR spectrometer (manufactured by Varian Inc.). The measurement was performed by dissolving the sample in a deuterated solvent (a solvent in which a hydrogen atom in a solvent molecule is substituted with a deuterium atom) capable of dissolving the sample so as to have a concentration of 20 mg/mL. The orbital energy of the highest occupied molecular orbital (HOMO) of the polymer was obtained by measuring the ionization potential of the polymer as the orbital energy of HOMO. On the other hand, the orbital energy of the lowest unoccupied molecular orbital (LUMO) of the polymer was obtained by measuring the energy difference between HOMO and LUMO and by calculating the sum of the energy difference and the above measured ionization potential as the orbital energy of LUMO. For measuring the ionization potential, a photoelectronic spectrophotometer (RIKEN KEIKI Co., Ltd.: AC-2) was used. The energy difference between HOMO and LUMO is obtained from an absorption terminal of an absorption spectrum of the polymer measured using an ultraviolet-visible-near infrared spectrophotometer (manufactured by Varian Inc.: Cary 5E).

REFERENCE EXAMPLE 1

Synthesis of 2,7-dibromo-9,9-bis[3-ethoxycarbonyl-4-[2-[2-(2-methoxyethoxy)ethoxy]ethoxy]phenyl]-fluorene (compound A)

2,7-dibromo-9-fluorenone (52.5 g), ethyl salicylate (154.8 g), and mercapto acetic acid (1.4 g) were charged into a 300 mL flask and was purged with nitrogen. Thereto, methanesulfonic acid (630 mL) was added thereto and the resultant reaction mixture was stirred at 75° C. all night. The reaction mixture was left to be cooled down and was charged into ice water and the resultant reaction mixture was stirred for 1 hour. A generated solid was filtered and the solid was washed with heated acetonitrile. The washed solid was dissolved in acetone and from the resultant acetone solution, a solid was recrystallized and was filtered. The resultant solid (62.7 g), 2-[2-(2-methoxyethoxy)ethoxy]-p-toluene sulfonate (86.3 g), potassium carbonate (62.6 g), and 18-crown-6 (7.2 g) were dissolved in N,N-dimethylformamide (DMF) (670 mL) and the resultant reaction solution was transferred into a flask and was stirred at 105° C. all night. The resultant reaction mixture was left to be cooled down to room temperature and was charged into ice water, followed by stirring the resultant reaction mixture for 1 hour. To the reaction mixture, chloroform (300 mL) was added to subject the resultant reaction mixture to phase-separation extraction and the resultant extract was concentrated, thus obtaining 2,7-dibromo-9,9-bis[3-ethoxycarbonyl-4-[2-[2-(2-methoxyethoxy)ethoxy]ethoxy]phenyl]-fluorene (compound A) (51.2 g).

[Chemical Formula 64]

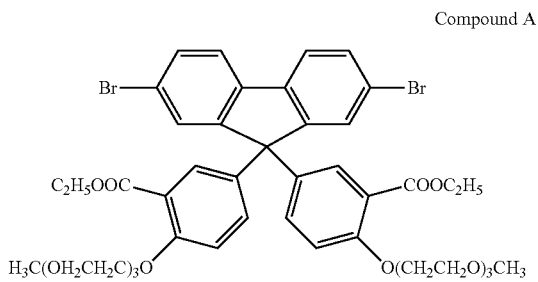

Compound A

REFERENCE EXAMPLE 2

Synthesis of 2,7-bis(4,4,5,5-tetramethyl-1,3,2-dioxaborolan-2-yl)-9,9-bi s[3-ethoxycarbonyl-4-[2-[2-(2-methoxyethoxy)ethoxy]ethoxy]phenyl]-fluorene (compound B)

In a nitrogen atmosphere, the compound A (15 g), bis(pinacolate)diboron (8.9 g), [1,1'-bis(diphenylphosphino)ferrocene]dichloropalladium (II) dichloromethane complex (0.8 g), 1,1'-bis(diphenylphosphino)ferrocene (0.5 g), potassium acetate (9.4 g), and dioxane (400 mL) were mixed and the resultant reaction mixture was heated to 110° C. to heating-reflux the reaction mixture for 10 hours. The reaction mixture was left to be cooled down and was filtered and the filtrate was concentrated under reduced pressure. The reaction mixture was washed with methanol for three times. The resultant precipitate was dissolved in toluene and to the resultant solution, an activated carbon was added, followed by stirring the resultant mixture. Then, the mixture was filtered and the filtrate was concentrated under reduced pressure, thus obtaining 2,7-bis(4,4,5,5-tetramethyl-1,3,2-dioxaborolan-2-yl)-9,9-bis[3-ethoxycarbonyl-4-[2-[2-(2-methoxyethoxy)ethoxy]ethoxy]phenyl]-fluorene (compound B) (11.7 g).

[Chemical Formula 65]

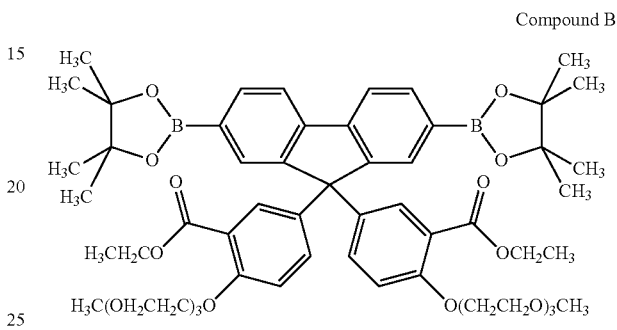

Compound B

REFERENCE EXAMPLE 3

Synthesis of poly[9,9-bis[3-ethoxycarbonyl-4-[2-[2-(2-methoxyethoxy)ethoxy]ethoxy]phenyl]-fluorene (polymer A)

In an inert atmosphere, the compound A (0.55 g), the compound B (0.61 g), (triphenylphosphine)palladium (0.01 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 8 hours. To the reaction mixture, 4-tert-butylphenylboronic acid (0.01 g) was added and the resultant reaction mixture was refluxed for 6 hours. Next, to the reaction mixture, a sodium diethyldithiocarbamate aqueous solution (10 mL, concentration: 0.05 g/mL) was added and the resultant reaction mixture was stirred for 2 hours. The reaction mixture was dropped into 300 mL of methanol and the resultant reaction mixture was stirred for 1 hour. Then, a deposited precipitate was filtered and the precipitate was dried under reduced pressure for 2 hours, followed by dissolving the precipitate in 20 mL of tetrahydrofuran. The resultant reaction solution was dropped into a solvent mixture of 120 mL of methanol and 50 mL of a 3% by weight acetic acid aqueous solution and the resultant reaction mixture was stirred for 1 hour. A deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered to obtain a solid. The obtained solid was dissolved in tetrahydrofuran and the resultant solution was passed through an alumina column and a silica gel column to purify the solution. The tetrahydrofuran solution recovered from the column was concentrated and the concentrate was dropped into methanol (200 mL), followed by filtering and drying a deposited solid. The yield of obtained poly[9,9-bis

[3-ethoxycarbonyl-4-bis[2-[2-(2-methoxyethoxy)ethoxy]ethoxy]phenyl]-fluorene] (polymer A) was 520 mg.

The number average molecular weight in terms of polystyrene of the polymer A was $5.2 \times 10^4$. The polymer A contains a structural unit represented by Formula (A).

[Chemical Formula 66]

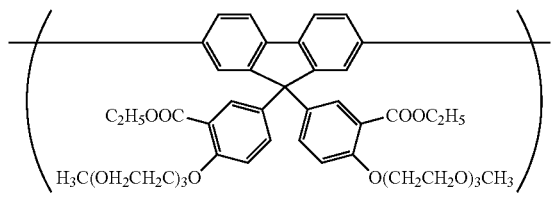

(A)

EXPERIMENT EXAMPLE 1

Synthesis of Cesium Salt of Polymer A

The polymer A (200 mg) was charged into a 100 mL flask and was purged with nitrogen. To the polymer A, tetrahydrofuran (20 mL) and ethanol (20 mL) were added and the temperature of the resultant reaction mixture was elevated to 55° C. Thereto, an aqueous solution prepared by dissolving cesium hydroxide (200 mg) in water (2 mL) was added and the resultant reaction mixture was stirred at 55° C. for 6 hours. The reaction mixture was cooled down to room temperature and therefrom, the reaction solvent was distilled off under reduced pressure. A generated solid was washed with water and was dried under reduced pressure, thus obtaining a light yellow solid (150 mg). By an NMR spectrum of the solid, it was confirmed that a signal ascribed to an ethyl group in an ethyl ester moiety in the polymer A disappeared completely. The obtained polymer A cesium salt is called a conjugated macromolecular compound 1. The conjugated macromolecular compound 1 contains a structural unit represented by Formula (B) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are 100% by mole). The orbital energy of HOMO and the orbital energy of LUMO of the conjugated macromolecular compound 1 were −5.5 eV and −2.7 eV, respectively.

[Chemical Formula 67]

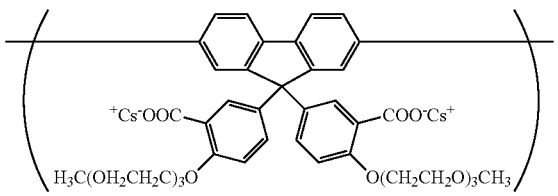

(B)

EXPERIMENT EXAMPLE 2

Synthesis of Potassium Salt of Polymer A

The polymer A (200 mg) was charged into a 100 mL flask and was purged with nitrogen. Tetrahydrofuran (20 mL) and methanol (10 mL) were mixed with the polymer A. To the reaction mixture, an aqueous solution prepared by dissolving potassium hydroxide (400 mg) in water (2 mL) was added and the resultant reaction mixture was stirred at 65° C. for 1 hour. To the reaction mixture, 50 mL of methanol was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (131 mg). By an NMR spectrum of the solid, it was confirmed that a signal ascribed to an ethyl group in an ethyl ester moiety in the polymer A disappeared completely. The obtained polymer A potassium salt is called a conjugated macromolecular compound 2. The conjugated macromolecular compound 2 contains a structural unit represented by Formula (C) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are 100% by mole). The orbital energy of HOMO and the orbital energy of LUMO of the conjugated macromolecular compound 2 were −5.5 eV and −2.7 eV, respectively.

[Chemical Formula 68]

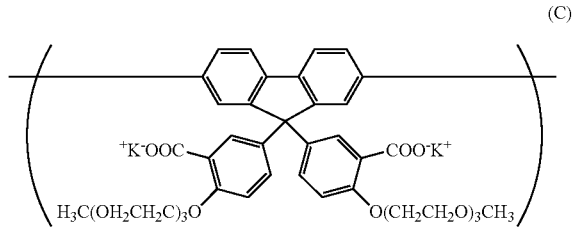

(C)

EXPERIMENT EXAMPLE 3

Synthesis of Sodium Salt of Polymer A

The polymer A (200 mg) was charged into a 100 mL flask and was purged with nitrogen. Tetrahydrofuran (20 mL) and methanol (10 mL) were mixed with the polymer A. To the resultant reaction mixture, an aqueous solution prepared by dissolving sodium hydroxide (260 mg) in water (2 mL) was added and the resultant reaction mixture was stirred at 65° C. for 1 hour. To the reaction mixture, 30 mL of methanol was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (123 mg). By an NMR spectrum of the solid, it was confirmed that a signal ascribed to an ethyl group in an ethyl ester moiety in the polymer A disappeared completely. The obtained polymer A sodium salt is called a conjugated macromolecular compound 3. The conjugated macromolecular compound 3 contains a structural unit represented by Formula (D) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are 100% by mole). The orbital energy of HOMO and the orbital energy of LUMO of the conjugated macromolecular compound 3 were −5.6 eV and −2.8 eV, respectively.

[Chemical Formula 69]

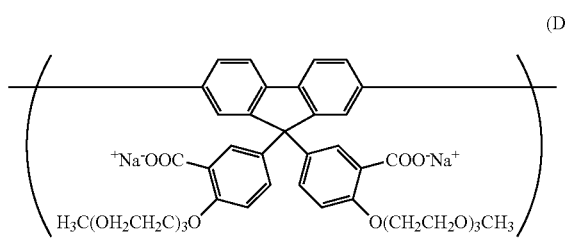

(D)

EXPERIMENT EXAMPLE 4

Synthesis of Ammonium Salt of Polymer A

The polymer A (200 mg) was charged into a 100 mL flask and was purged with nitrogen. Tetrahydrofuran (20 mL) and methanol (15 mL) were mixed with the polymer A. To the resultant reaction mixture, an aqueous solution prepared by dissolving tetramethylammonium hydroxide (50 mg) in water (1 mL) was added and the resultant reaction mixture was stirred at 65° C. for 6 hours. To the reaction mixture, an aqueous solution prepared by dissolving tetramethylammonium hydroxide (50 mg) in water (1 mL) was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (150 mg). By an NMR spectrum of the solid, it was confirmed that a signal ascribed to an ethyl group in an ethyl ester moiety in the polymer A disappeared by 90%. The obtained polymer A ammonium salt is called a conjugated macromolecular compound 4. The conjugated macromolecular compound 4 contains a structural unit represented by Formula (E) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are 90% by mole). The orbital energy of HOMO and the orbital energy of LUMO of the conjugated macromolecular compound 4 were −5.6 eV and −2.8 eV, respectively.

[Chemical Formula 70]

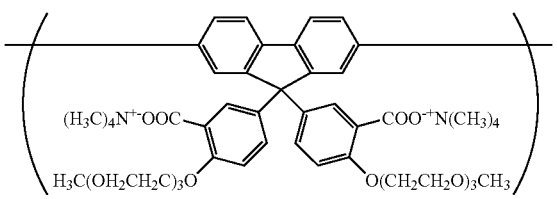

(E)

REFERENCE EXAMPLE 4

Synthesis of 2,7-bis[7-(4-methylphenyl)-9,9-dioctylfluorene-2-yl]-9,9-bi s[3-ethoxycarbonyl-4-[2-[2-(2-methoxyethoxy)ethoxy]ethoxy]phenyl]-fluorene (polymer B)

In an inert atmosphere, the compound A (0.52 g), 2,7-bis (1,3,2-dioxaborolan-2-yl)-9,9-dioctylfluorene (1.29 g), (triphenylphosphine)palladium (0.0087 g), methyltrioctylammonium chloride (manufactured by Aldrich Corp.; trade name: Aliquat 336 (registered trade mark)) (0.20 g), toluene (10 mL), and a 2M sodium carbonate aqueous solution (10 mL) were mixed and the resultant reaction mixture was heated to 80° C. The reaction mixture was subjected to the reaction for 3.5 hours. Then, to the reaction mixture, p-bromotoluene (0.68 g) was added and the resultant reaction mixture was further subjected to the reaction for 2.5 hours. After the completion of the reaction, the reaction mixture was cooled down to room temperature and to the reaction mixture, ethyl acetate 50 mL/distilled water 50 mL was added, followed by removing the aqueous phase. Next, to the reaction mixture, 50 mL of distilled water was added again and the aqueous phase was removed. Subsequently, to the reaction mixture, magnesium sulfate as a drying agent was added and insoluble matters were filtered, followed by removing the organic solvent. Then, the resultant residue was dissolved in 10 mL of THF again and to the resultant solution, 2 mL of saturated sodium diethyldithiocarbamate water was added. The resultant reaction mixture was stirred for 30 minutes and therefrom, the organic solvent was removed. The resultant residue was passed through an alumina column (eluent: hexane:ethyl acetate=1:1, v/v) to purify the residue. A deposited precipitate was filtered and the precipitate was dried under reduced pressure for 12 hours, thus obtaining 524 mg of 2,7-bis[7-(4-methylphenyl)-9,9-dioctylfluorene-2-yl]-9,9-bis[3-ethoxycarbonyl-4-[2-[2-(2-methoxyethoxy)ethoxy]ethoxy]phenyl]-fluorene (polymer B).

The number average molecular weight in terms of polystyrene of the polymer B was $2.0 \times 10^3$. The polymer B is represented by Formula (F).

[Chemical Formula 71]

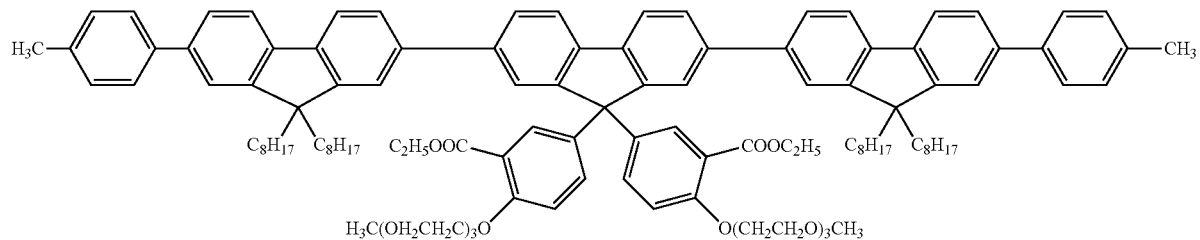

(F)

EXPERIMENT EXAMPLE 5

Synthesis of Cesium Salt of Polymer B

The polymer B (262 mg) was charged into a 100 mL flask and was purged with argon. Here, tetrahydrofuran (10 mL) and methanol (15 mL) were added and the temperature of the resultant reaction mixture was elevated to 55° C. Here, an aqueous solution prepared by dissolving cesium hydroxide (341 mg) in water (1 mL) was added and the resultant reaction mixture was stirred at 55° C. for 5 hours. The reaction mixture was cooled down to room temperature and therefrom, the reaction solvent was distilled off under reduced pressure. A generated solid was washed with water and was dried under reduced pressure, thus obtaining a light yellow solid (250 mg). By an NMR spectrum of the solid, it was confirmed that a signal ascribed to an ethyl group in an ethyl ester moiety disappeared completely. The obtained polymer B cesium salt is called a conjugated macromolecular compound 5. The conjugated macromolecular compound 5 is represented by Formula (G) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are calculated by rounding off to one decimal place as 33.3% by mole). The orbital energy of HOMO and the orbital energy of LUMO of the conjugated macromolecular compound 5 were −5.6 eV and −2.6 eV, respectively.

t-butyl-2,6-dimethylphenyl)-1,4-phenylenediamine (35 mg), (triphenylphosphine)palladium (8 mg), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 8 hours. To the reaction mixture, phenylboronic acid (0.01 g) was added and the resultant reaction mixture was refluxed for 6 hours. Next, to the reaction mixture, a sodium diethyldithiocarbamate aqueous solution (10 mL, concentration: 0.05 g/mL) was added and the resultant reaction mixture was stirred for 2 hours. The reaction mixture was dropped into 300 mL of methanol and the resultant reaction mixture was stirred for 1 hour. Next, a deposited precipitate was filtered and the precipitate was dried under reduced pressure for 2 hours, followed by dissolving the precipitate in 20 mL of tetrahydrofuran. The resultant reaction solution was dropped into a solvent mixture of 120 mL of methanol and 50 mL of a 3% by weight acetic acid aqueous solution and the resultant reaction mixture was stirred for 1 hour. Next, a deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered, thus obtaining a solid. The obtained solid was dissolved in tetrahydrofuran and the resultant solution was

[Chemical Formula 72]

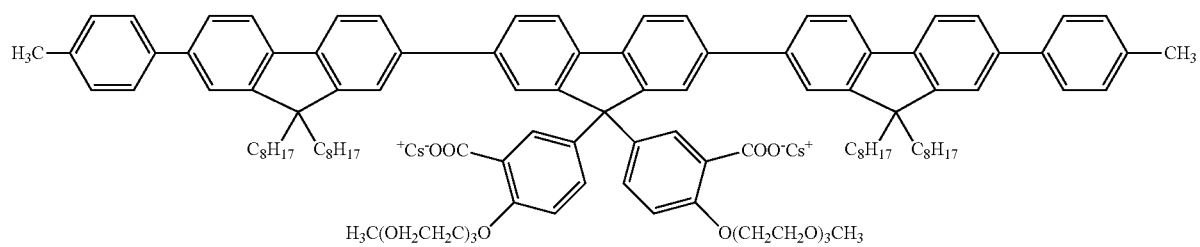

(G)

REFERENCE EXAMPLE 5

Synthesis of Polymer C

In an inert atmosphere, the compound A (0.40 g), the compound B (0.49 g), N,N'-bis(4-bromophenyl)-N,N'-bis(4- passed through an alumina column and a silica gel column to purify the solution. The tetrahydrofuran solution recovered from the column was concentrated and was dropped into methanol (200 mL), followed by filtering and drying a deposited solid. The yield of the obtained solid (polymer C) was 526 mg.

The number average molecular weight in terms of polystyrene of the polymer C was 3.6×10⁴. The polymer C contains a structural unit represented by Formula (H).

Here, N,N'-bis(4-bromophenyl)-N,N'-bis(4-t-butyl-2,6-dimethylphenyl)-1,4-phenylenediamine can be synthesized, for example, by a method described in JP 2008-74917 A.

[Chemical Formula 73]

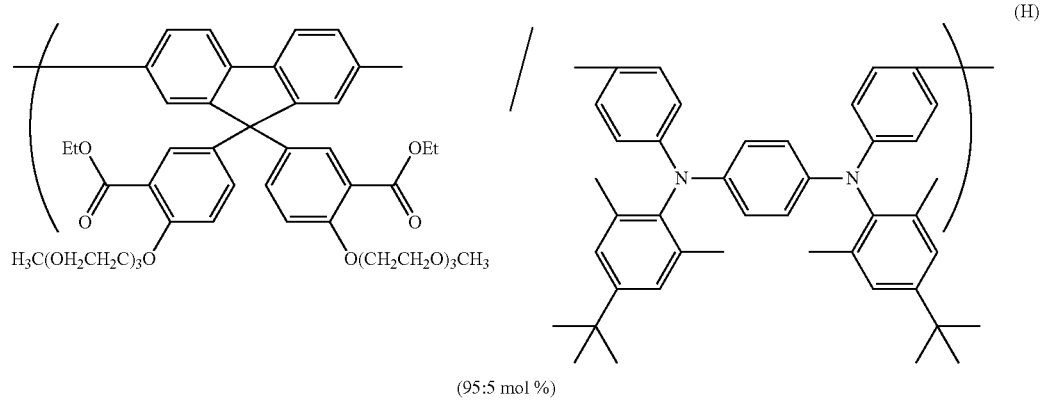

(95:5 mol %)

(H)

EXPERIMENT EXAMPLE 6

Synthesis of Cesium Salt of Polymer C

The polymer C (200 mg) was charged into a 100 mL flask and was purged with nitrogen. Tetrahydrofuran (20 mL) and methanol (20 mL) were added and the resultant reaction mixture was mixed. To the reaction mixture, an aqueous solution prepared by dissolving cesium hydroxide (200 mg) in water (2 mL) was added and the resultant reaction mixture was stirred at 65° C. for 1 hour. To the reaction mixture, 30 mL of methanol was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (150 mg). By an NMR spectrum of the solid, it was confirmed that a signal ascribed to an ethyl group in an ethyl ester moiety in the polymer C disappeared completely. The obtained polymer C cesium salt is called a conjugated macromolecular compound 6. The conjugated macromolecular compound 6 contains a structural unit represented by Formula (I) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are 95% by mole). The orbital energy of HOMO and the orbital energy of LUMO of the conjugated macromolecular compound 6 were −5.3 eV and −2.6 eV, respectively.

[Chemical Formula 74]

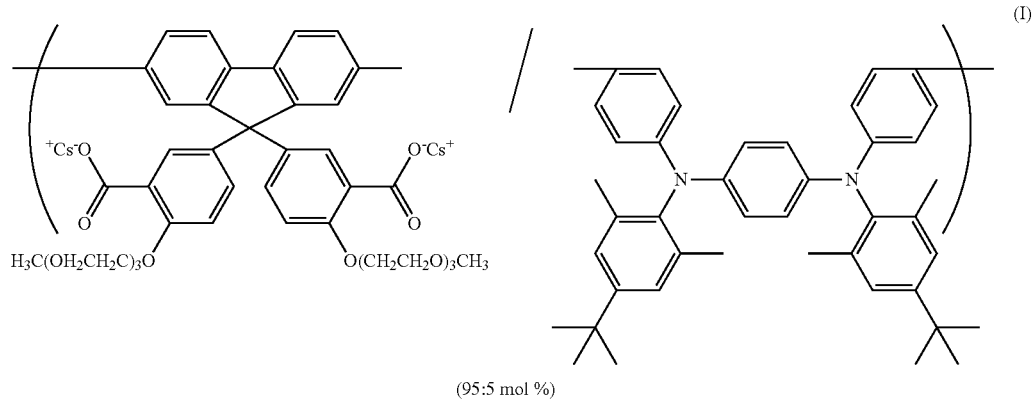

(95:5 mol %)

(I)

REFERENCE EXAMPLE 6

Synthesis of Polymer D

In an inert atmosphere, the compound A (0.55 g), the compound B (0.67 g), N,N'-bis(4-bromophenyl)-N,N'-bis(4- t-butyl-2,6-dimethylphenyl)-1,4-phenylenediamine (0.038 g), 3,7-dibromo-N-(4-n-butylphenyl)phenoxazine (0.009 g), (triphenylphosphine)palladium (0.01 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 2 hours. To the reaction mixture, phenylboronic acid (0.004 g) was added and the resultant reaction mixture was refluxed for 6 hours. Next, a sodium diethyldithiocarbamate aqueous solution (10 mL, concentration: 0.05 g/mL) was added and the resultant reaction mixture was stirred for 2 hours. The reaction mixture was dropped into 300 mL of methanol and the resultant reaction mixture was stirred for 1 hour. Next, a deposited precipitate was filtered and the precipitate was dried under reduced pressure for 2 hours, followed by dissolving the precipitate in 20 mL of tetrahydrofuran. The resultant reaction solution was dropped into a solvent mixture of 120 mL of methanol and 50 mL of a 3% by weight acetic acid aqueous solution and the resultant reaction mixture was stirred for 1 hour. A deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered, thus obtaining a solid. The obtained solid was dissolved in tetrahydrofuran and the resultant solution was passed through an alumina column and a silica gel column to purify the solution. The tetrahydrofuran solution recovered from the column was concentrated and the concentrated tetrahydrofuran solution was dropped into methanol (200 mL), followed by filtering and drying a deposited solid. The yield of the obtained polymer D was 590 mg.

The number average molecular weight in terms of polystyrene of the polymer D was $2.7 \times 10^4$. The polymer D contains a structural unit represented by Formula (J).

Here, 3,7-dibromo-N-(4-n-butylphenyl)phenoxazine was synthesized according to a method described in JP 2007-70620 A (or referring to a method described in JP 2004-137456 A).

EXPERIMENT EXAMPLE 7

Synthesis of Cesium Salt of Polymer D

The polymer D (200 mg) was charged into a 100 mL flask and an atmosphere in the flask was purged with nitrogen. Tetrahydrofuran (15 mL) and methanol (10 mL) were mixed with the polymer D. To the reaction mixture, an aqueous solution prepared by dissolving cesium hydroxide (360 mg) in water (2 mL) was added and the resultant reaction mixture was stirred at 65° C. for 3 hours. To the reaction mixture, 10 mL of methanol was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (210 mg). By an NMR spectrum of the solid, it was confirmed that a signal ascribed to an ethyl group in an ethyl ester moiety in the polymer D disappeared completely. The obtained polymer D cesium salt is called a conjugated macromolecular compound 7. The conjugated macromolecular compound 7 contains a structural unit represented by Formula (K) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are 90% by mole). The orbital energy of HOMO and the orbital energy of LUMO of the conjugated macromolecular compound 7 were −5.3 eV and −2.4 eV, respectively.

[Chemical Formula 75]

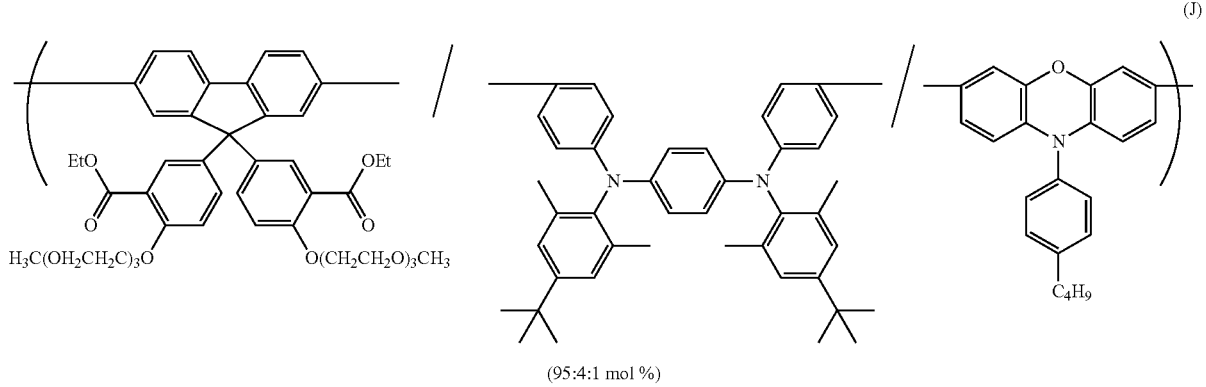

(J)

(95:4:1 mol %)

[Chemical Formula 76]

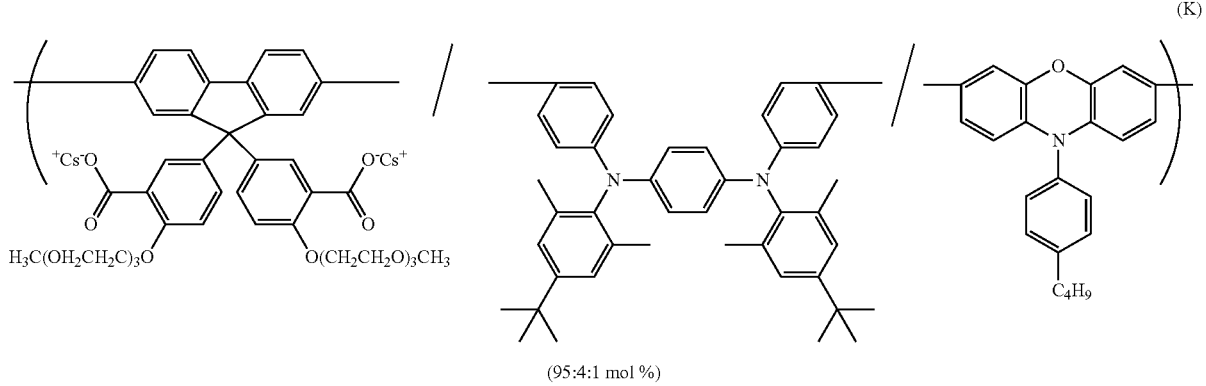

(95:4:1 mol %)

REFERENCE EXAMPLE 7

Synthesis of Polymer E

In an inert atmosphere, the compound A (0.37 g), the compound B (0.82 g), 1,3-dibromobenzene (0.09 g), (triphenylphosphine)palladium (0.01 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 7 hours. To the reaction mixture, phenylboronic acid (0.002 g) was added and the resultant reaction mixture was refluxed for 10 hours. Next, a sodium diethyldithiocarbamate aqueous solution (10 mL, concentration: 0.05 g/mL) was added and the resultant reaction mixture was stirred for 1 hour. The resultant reaction mixture was dropped into 300 mL of methanol and the resultant reaction mixture was stirred for 1 hour. A deposited precipitate was filtered and the precipitate was dried under reduced pressure for 2 hours, followed by dissolving the precipitate in 20 mL of tetrahydrofuran. The resultant reaction solution was dropped into a solvent mixture of 120 mL of methanol and 50 mL of a 3% by weight acetic acid aqueous solution and the resultant reaction mixture was stirred for 1 hour. A deposited precipitate was filtered and the precipitate was dissolved in 20 mL of tetrahydrofuran. The thus obtained reaction solution was dropped into 200 mL of methanol and the resultant reaction mixture was stirred for 30 minutes. A deposited precipitate was filtered, thus obtaining a solid. The obtained solid was dissolved in tetrahydrofuran and the resultant solution was passed through an alumina column and a silica gel column to purify the solution. The tetrahydrofuran solution recovered from the column was concentrated and the concentrate was dropped into methanol (200 mL), followed by filtering and drying a deposited solid. The yield of the obtained solid (polymer E) was 293 mg.

The number average molecular weight in terms of polystyrene of the polymer E was $1.8\times10^4$. The polymer E contains a structural unit represented by Formula (L).

[Chemical Formula 77]

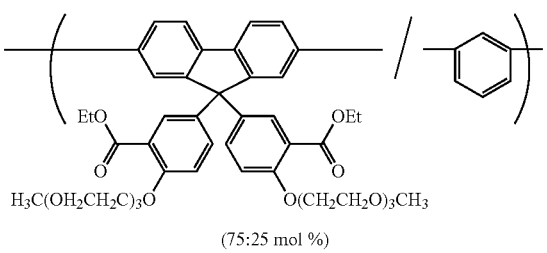

(75:25 mol %)

EXPERIMENT EXAMPLE 8

Synthesis of Cesium Salt of Polymer E

The polymer E (200 mg) was charged into a 100 mL flask and was purged with nitrogen. Tetrahydrofuran (10 mL) and methanol (5 mL) were mixed with the polymer E. To the resultant reaction mixture, an aqueous solution prepared by dissolving cesium hydroxide (200 mg) in water (2 mL) was added and the resultant reaction mixture was stirred at 65° C. for 2 hours. To the reaction mixture, 10 mL of methanol was added and further, the resultant reaction mixture was stirred at 65° C. for 5 hours. The reaction mixture was cooled down to room temperature and therefrom, the reaction solvent was distilled off under reduced pressure. A generated solid was washed with water and was dried under reduced pressure, thus obtaining a light yellow solid (170 mg). By an NMR spectrum of the solid, it was confirmed that a signal ascribed to an ethyl group in an ethyl ester moiety in the polymer E disappeared completely. The obtained polymer E cesium salt is called a conjugated macromolecular compound 8. The conjugated macromolecular compound 8 contains a structural unit represented by Formula (M) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are 75% by mole). The orbital energy of HOMO and the orbital energy of LUMO of the conjugated macromolecular compound 8 were −5.6 eV and −2.6 eV, respectively.

[Chemical Formula 78]

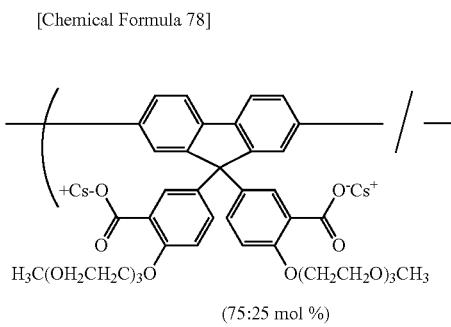

(M)

H$_3$C(OH$_2$CH$_2$C)$_3$O      O(CH$_2$CH$_2$O)$_3$CH$_3$ (75:25 mol %)

REFERENCE EXAMPLE 8

Synthesis of Polymer F

In an inert atmosphere, the compound B (1.01 g), 1,4-dibromo-2,3,5,6-tetrafluorobenzene (0.30 g), (triphenylphosphine)palladium (0.02 g), methyltrioctylammonium chloride (manufactured by Aldrich Corp.; trade name: Aliquat 336 (registered trade mark)) (0.20 g), and toluene (10 mL) were mixed and the resultant reaction mixture was heated to 105° C. Into the reaction mixture, a 2M sodium carbonate aqueous solution (6 mL) was dropped and the resultant reaction mixture was refluxed for 4 hours. To the reaction mixture, phenylboronic acid (0.002 g) was added and the resultant reaction mixture was refluxed for 4 hours. Next, a sodium diethyldithiocarbamate aqueous solution (10 mL, concentration: 0.05 g/mL) was added and the resultant reaction mixture was stirred for 1 hour. The resultant reaction mixture was dropped into 300 mL of methanol and the resultant reaction mixture was stirred for 1 hour. Next, a deposited precipitate was filtered and the precipitate was dried under reduced pressure for 2 hours, followed by dissolving the precipitate in 20 mL of tetrahydrofuran. The resultant reaction solution was dropped into a solvent mixture of 120 mL of methanol and 50 mL of a 3% by weight acetic acid aqueous solution and the resultant reaction mixture was stirred for 1 hour. Next, a deposited precipitate was filtered and the precipitate was dissolved in 20 mL of tetrahydrofuran. The thus obtained reaction solution was dropped into 200 mL of methanol and the resultant reaction mixture was stirred for 30 minutes. Next, a deposited precipitate was filtered, thus obtaining a solid. The obtained solid was dissolved in a solvent mixture of tetrahydrofuran/ethyl acetate (1/1 (volume ratio)) and the resultant solution was passed through an alumina column and a silica gel column to purify the solution. The tetrahydrofuran solution recovered from the column was concentrated and was dropped into methanol (200 mL), followed by filtering and drying a deposited solid. The yield of the obtained polymer F was 343 mg.

The number average molecular weight in terms of polystyrene of the polymer F was 6.0×10$^4$. The polymer F contains a structural unit represented by Formula (N).

[Chemical Formula 79]

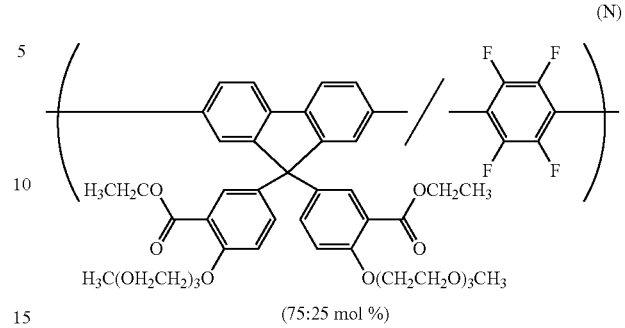

(N)

H$_3$CH$_2$CO      OCH$_2$CH$_3$

H$_3$C(OH$_2$CH$_2$)$_3$O      O(CH$_2$CH$_2$O)$_3$CH$_3$ (75:25 mol %)

EXPERIMENT EXAMPLE 9

Synthesis of Cesium Salt of Polymer F

The polymer F (150 mg) was charged into a 100 mL flask and was purged with nitrogen. Tetrahydrofuran (10 mL) and methanol (5 mL) were mixed with the polymer F. To the reaction mixture, an aqueous solution prepared by dissolving cesium hydroxide (260 mg) in water (2 mL) was added and the resultant reaction mixture was stirred at 65° C. for 2 hours. To the reaction mixture, 10 mL of methanol was added and further, the resultant reaction mixture was stirred at 65° C. for 5 hours. The reaction mixture was cooled down to room temperature and therefrom, the reaction solvent was distilled off under reduced pressure. A generated solid was washed with water and was dried under reduced pressure, thus obtaining a light yellow solid (130 mg). By an NMR spectrum of the solid, it was confirmed that a signal ascribed to an ethyl group in an ethyl ester moiety in the polymer F disappeared completely. The obtained polymer F cesium salt is called a conjugated macromolecular compound 9. The conjugated macromolecular compound 9 contains a structural unit represented by Formula (O) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are 75% by mole). The orbital energy of HOMO and the orbital energy of LUMO of the conjugated macromolecular compound 9 were −5.9 eV and −2.8 eV, respectively.

[Chemical Formula 80]

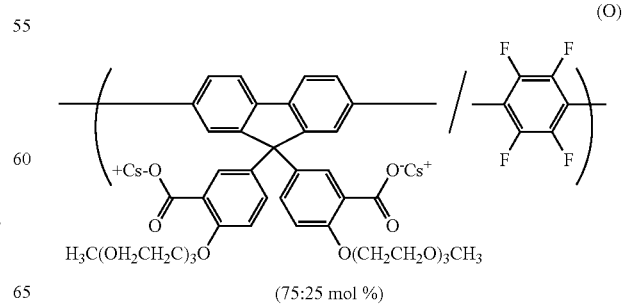

(O)

H$_3$C(OH$_2$CH$_2$C)$_3$O      O(CH$_2$CH$_2$O)$_3$CH$_3$ (75:25 mol %)

REFERENCE EXAMPLE 9

In an inert atmosphere, 2-[2-(2-methoxyethoxy)ethoxy]-p-toluene sulfonate (11.0 g), triethylene glycol (30.0 g), and potassium hydroxide (3.3 g) were mixed and the resultant reaction mixture was heated and stirred at 100° C. for 18 hours. The reaction mixture was left to be cooled down, was charged into water (100 mL), and was subjected to phase-separation extraction with chloroform, followed by concentrating the extract. The concentrated extract was subjected to the Kugel-Rhor distillation (10 mmTorr, 180° C.), thus obtaining 2-(2-(2-(2-(2-(2-methoxyethoxy)-ethoxy)-ethoxy)-ethoxy)-eth oxy)ethanol (6.1 g).

REFERENCE EXAMPLE 10

In an inert atmosphere, 2-(2-(2-(2-(2-(2-methoxyethoxy)-ethoxy)-ethoxy)-ethoxy)ethanol (8.0 g), sodium hydroxide (1.4 g), distilled water (2 mL), and tetrahydrofuran (2 mL) were mixed and the resultant reaction mixture was ice-cooled. Into the reaction mixture, a solution of p-tosyl chloride (5.5 g) in tetrahydrofuran (6.4 mL) was dropped over 30 minutes and thereafter, the temperature of the reaction mixture was elevated to room temperature, followed by stirring the reaction mixture for 15 hours. To the reaction mixture, distilled water (50 mL) was added and the resultant reaction mixture was neutralized with a 6M sulfuric acid, followed by subjecting the reaction mixture to phase-separation extraction with chloroform. The extract was concentrated, thus obtaining 2-(2-(2-(2-(2-(2-methoxyethoxy)-ethoxy)-ethoxy)-ethoxy)p-toluene sulfonate (11.8 g).

REFERENCE EXAMPLE 11

Synthesis of 2,7-dibromo-9,9-bis[3-ethoxycarbonyl-4-[2-(2-(2-(2-(2-(2-methoxyethoxy)-ethoxy)-ethoxy)-ethoxy)-ethoxy)ethoxy]phenyl]-fluorene (compound C)

2,7-dibromo-9-fluorenone (127.2 g), ethyl salicylate (375.2 g), and mercaptoacetic acid (3.5 g) were charged into a 300 mL flask and was purged with nitrogen. Here, methanesulfonic acid (1420 mL) was added and the resultant reaction mixture was stirred at 75° C. all night. The reaction mixture was left to be cooled down and was charged into ice water and the resultant reaction mixture was stirred for 1 hour. A generated solid was filtered and the solid was washed with heated acetonitrile. The washed solid was dissolved in acetone and from the resultant acetone solution, a solid was recrystallized and was filtered, thus obtaining a solid (167.8 g). The obtained solid (5 g), 2-(2-(2-(2-(2-(2-methoxyethoxy)-ethoxy)-ethoxy)-ethoxy)-ethoxy)p-toluene sulfonate (10.4 g), potassium carbonate (5.3 g), and 18-crown-6 (0.6 g) were dissolved in N,N-dimethylformamide (DMF) (100 mL) and the resultant reaction solution was transferred into a flask and was stirred at 105° C. for 4 hours. The resultant reaction mixture was left to be cooled down to room temperature and was charged into ice water and the resultant reaction mixture was stirred for 1 hour. To the reaction mixture, chloroform (300 mL) was added to subject the resultant reaction mixture to phase-separation extraction and the resultant extract was concentrated. The concentrate was dissolved in ethyl acetate and the resultant solution was passed through an alumina column, followed by concentrating the solution, thus obtaining 2,7-dibromo-9,9-bis[3-ethoxycarbonyl-4-[2-(2-(2-(2-(2-(2-methoxyethoxy)-ethoxy)-ethoxy)-ethoxy)-ethoxy)ethoxy]phenyl]-fluorene (compound C) (4.5 g).

[Chemical Formula 81]

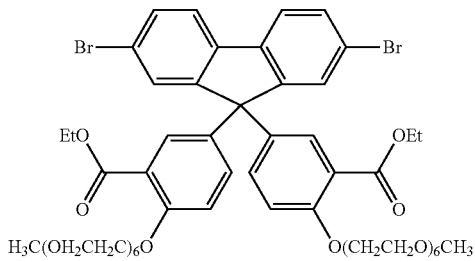

Compound C

REFERENCE EXAMPLE 12

Synthesis of Polymer G

In an inert atmosphere, the compound C (1.0 g), 4-t-butylphenyl bromide (0.9 g), 2,2'-bipyridine (0.3 g), and dehydrated tetrahydrofuran (50 mL) were charged into a 200 mL flask and were mixed. The temperature of the resultant reaction mixture was elevated to 55° C. and thereto, bis(1,5-cyclooctadiene)nickel (0.6 g) was added, followed by stirring the resultant reaction mixture at 55° C. for 5 hours. The reaction mixture was cooled down to room temperature and the reaction mixture was dropped into a solution mixture of methanol (200 mL) and a 1N diluted hydrochloric acid (200 mL). A generated precipitate was collected by filtering and was re-dissolved in tetrahydrofuran. The resultant reaction solution was dropped into a solution mixture of methanol (200 mL) and a 15% ammonia water (100 mL) and a generated precipitate was collected by filtering. The precipitate was re-dissolved in tetrahydrofuran and the resultant reaction solution was dropped into a solution mixture of methanol (200 mL) and water (100 mL), followed by collecting a generated precipitate by filtering. The collected precipitate was dried under reduced pressure, thus obtaining a polymer G (360 mg).

The number average molecular weight in terms of polystyrene of the polymer G was $6.0 \times 10^4$. The polymer G contains a structural unit represented by Formula (P).

[Chemical Formula 82]

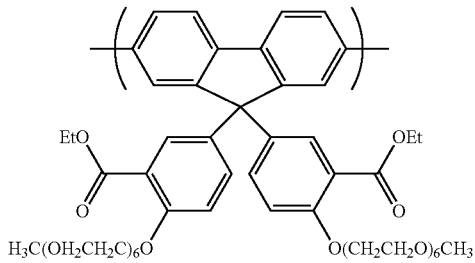

(P)

EXPERIMENT EXAMPLE 10

Synthesis of Cesium Salt of Polymer G

The polymer G (150 mg) was charged into a 100 mL flask and was purged with nitrogen. Tetrahydrofuran (15 mL) and methanol (5 mL) were mixed with the polymer G. To the resultant reaction mixture, an aqueous solution prepared by dissolving cesium hydroxide (170 mg) in water (2 mL) was added and the resultant reaction mixture was stirred at 65° C. for 6 hours. The reaction mixture was cooled down to room temperature and therefrom, the reaction solvent was distilled off under reduced pressure. A generated solid was washed with water and was dried under reduced pressure, thus obtaining a light yellow solid (95 mg). By an NMR spectrum of the solid, it was confirmed that a signal ascribed to an ethyl group in an ethyl ester moiety in the polymer G disappeared completely. The obtained polymer G cesium salt is called a conjugated macromolecular compound 10. The conjugated macromolecular compound 10 contains a structural unit represented by Formula (Q) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are 100% by mole). The orbital energy of HOMO and the orbital energy of LUMO of the conjugated macromolecular compound 10 were −5.7 eV and −2.9 eV, respectively.

[Chemical Formula 83]

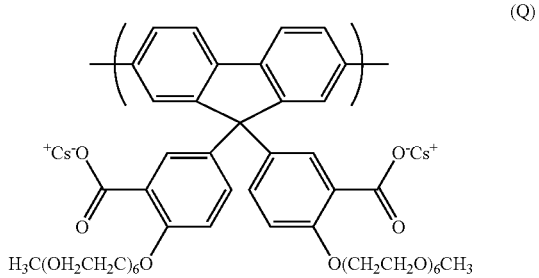

(Q)

REFERENCE EXAMPLE 13

Synthesis of 1,3-dibromo-5-ethoxycarbonyl-6-[2-[2-(2-methoxyethoxy)ethoxy]ethoxy]benzene In an inert atmosphere, 3,5-dibromosalicylic acid (20 g), ethanol (17 mL), concentrated sulfuric acid (1.5 mL), and toluene (7 mL) were mixed and the resultant reaction mixture was heated and stirred at 130° C. for 20 hours. The reaction mixture was left to be cooled down and the reaction mixture was charged into ice water (100 mL). The resultant reaction mixture was subjected to phase-separation extraction with chloroform and the extract was concentrated. The resultant solid was dissolved in isopropanol and the resultant reaction solution was dropped into distilled water. A resultant deposit was filtered, thus obtaining a solid (18 g). In an inert atmosphere, the obtained solid (1 g), 2-[2-(2-methoxyethoxy)ethoxy]-p-toluene sulfonate (1.5 g), potassium carbonate (0.7 g), and DMF (15 mL) were mixed and the resultant reaction mixture was heated and stirred at 100° C. for 4 hours. The reaction mixture was left to be cooled down and thereto, chloroform was added to subject the resultant reaction mixture to phase-separation extraction. The extract was concentrated. The concentrate was dissolved in chloroform and the resultant solution was passed through a silica gel column to purify the solution. The solution was concentrated, thus obtaining 1,3-dibromo-5-ethoxycarbonyl-6-[2-[2-(2-methoxyethoxy)ethoxy]ethoxy]benzene (1.0 g).

REFERENCE EXAMPLE 14

Synthesis of Polymer H

In an inert atmosphere, the compound A (0.2 g), the compound B (0.5 g), 1,3-dibromo-5-ethoxycarbonyl-6-[2-[2-(2-methoxyethoxy)ethoxy]ethoxy]benzene (0.1 g), (triphenylphosphine)palladium (30 mg), tetrabutylammonium bromide (4 mg), and toluene (19 mL) were mixed and the resultant reaction mixture was heated to 105° C. Into the reaction mixture, a 2M sodium carbonate aqueous solution (5 mL) was dropped and the resultant reaction mixture was refluxed for 5 hours. To the reaction mixture, phenylboronic acid (6 mg) was added and the resultant reaction mixture was refluxed for 14 hours. Next, to the reaction mixture, a sodium diethyldithiocarbamate aqueous solution (10 mL, concentration: 0.05 g/mL) was added and the resultant reaction mixture was stirred for 2 hours. The aqueous phase was removed and the organic phase was washed with distilled water and was concentrated, thus obtaining a solid. The obtained solid was dissolved in chloroform and the resultant solution was passed through an alumina column and a silica gel column to purify the solution. The eluent from the column was concentrated and dried. The yield of the obtained polymer H was 0.44 g.

The number average molecular weight in terms of polystyrene of the polymer H was $3.6 \times 10^4$. The polymer H contains a structural unit represented by Formula (R).

[Chemical Formula 84]

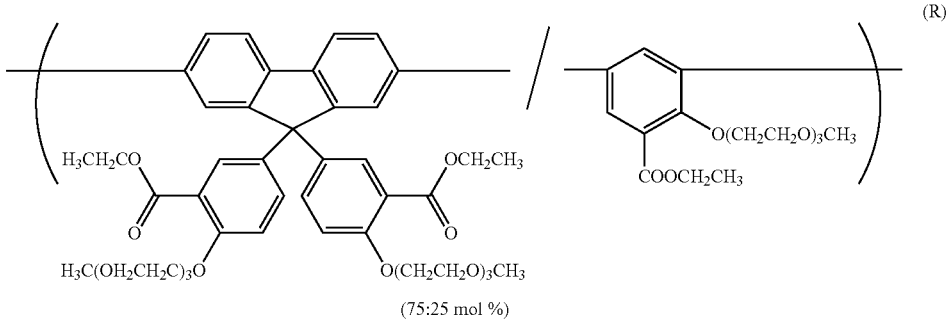

(R)

(75:25 mol %)

EXPERIMENT EXAMPLE 11

Synthesis of Cesium Salt of Polymer H

The polymer H (200 mg) was charged into a 100 mL flask and was purged with nitrogen. Tetrahydrofuran (14 mL) and methanol (7 mL) were added and the resultant reaction mixture was mixed. To the reaction mixture, an aqueous solution prepared by dissolving cesium hydroxide (90 mg) in water (1 mL) was added and the resultant reaction mixture was stirred at 65° C. for 1 hour. To the reaction mixture, 5 mL of methanol was added and further, the resultant reaction mixture was stirred at 65° C. for 4 hours. The reaction mixture was cooled down to room temperature and therefrom, the reaction solvent was distilled off under reduced pressure. A generated solid was washed with water and was dried under reduced pressure, thus obtaining a light yellow solid (190 mg). By an NMR spectrum of the solid, it was confirmed that a signal ascribed to an ethyl group in an ethyl ester moiety in the polymer H disappeared completely. The obtained polymer H cesium salt is called a conjugated macromolecular compound 11. The conjugated macromolecular compound 11 contains a structural unit represented by Formula (S) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are 100% by mole). The orbital energy of HOMO and the orbital energy of LUMO of the conjugated macromolecular compound 11 were −5.6 eV and −2.8 eV, respectively.

[Chemical Formula 85]

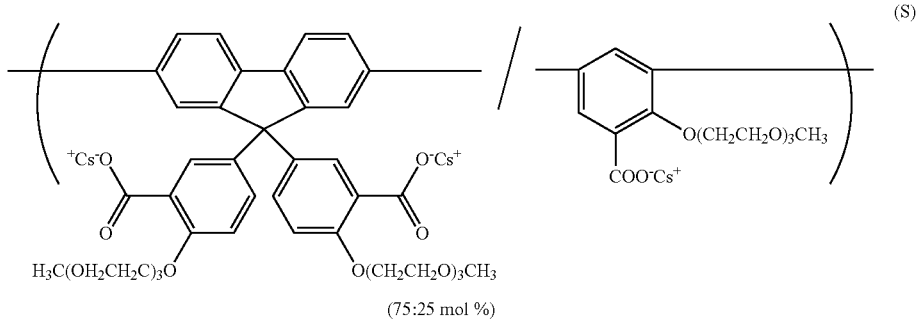

(75:25 mol %)

REFERENCE EXAMPLE 15

Synthesis of 2,7-dibromo-9,9-bis[3,4-bis[2-[2-(2-methoxyethoxy)ethoxy]ethoxy]-5-methoxycarbonylphenyl]fluorene (compound D)

2,7-dibromo-9-fluorenone (34.1 g), methyl 2,3-dihydroxybenzoate (101.3 g), and mercaptoacetic acid (1.4 g) were charged into a 500 mL flask and was purged with nitrogen. Here, methanesulfonic acid (350 mL) was added and the resultant reaction mixture was stirred at 90° C. for 19 hours. The reaction mixture was left to be cooled down and was charged into ice water and the resultant reaction mixture was stirred for 1 hour. A generated solid was filtered and the solid was washed with heated acetonitrile. The washed solid was dissolved in acetone and from the resultant acetone solution, a solid was recrystallized and was filtered, thus obtaining a solid. The obtained solid (16.3 g), 2-[2-(2-methoxyethoxy)ethoxy]-p-toluene sulfonate (60.3 g), potassium carbonate (48.6 g), and 18-crown-6 (2.4 g) were dissolved in N,N-dimethylformamide (DMF) (500 mL) and the resultant reaction solution was transferred into a flask and was stirred at 110° C. for 15 hours. The resultant reaction mixture was left to be cooled down to room temperature and was charged into ice water and the resultant reaction mixture was stirred for 1 hour. To the reaction mixture, ethyl acetate (300 mL) was added to subject the resultant reaction mixture to phase-separation extraction and the resultant extract was concentrated. The concentrate was dissolved in a solvent mixture of chloroform/methanol (50/1 (volume ratio)) and the resultant solution was passed through a silica gel column to purify the solution. The solution passed through the column was concentrated, thus obtaining 2,7-dibromo-9,9-bis[3,4-bis[2-[2-(2-methoxyethoxy)ethoxy]ethoxy]-5-methoxycarbonylphenyl]fluorene (compound D) (20.5 g).

REFERENCE EXAMPLE 16

Synthesis of 2,7-bis[7-(4-methylphenyl)-9,9-dioctylfluorene-2-yl]-9,9-bis[5-methoxycarbonyl-3,4-bis[2-[2-(2-methoxyethoxy)ethoxy]ethoxy]phenyl]-fluorene (polymer I)

In an inert atmosphere, the compound D (0.70 g), 2-(4,4,5,5-tetramethyl-1,2,3-dioxaborolan-2-yl)-9,9-dioctyl fluorene (0.62 g), (triphenylphosphine)palladium (0.019 g), dioxane (40 mL), water (6 mL), and a potassium carbonate aqueous solution (1.38 g) were mixed and the resultant reaction mixture was heated to 80° C. The reaction mixture was subjected to the reaction for 1 hour. After the completion of the reaction, to the reaction mixture, 5 mL of saturated sodium diethyldithiocarbamate water was added. The resultant reaction mixture was stirred for 30 minutes and therefrom, the organic solvent was removed. The resultant solid was passed through an alumina column (eluent: hexane:ethyl acetate=1:1 (volume ratio)) to purify the solid. The resultant solution was concentrated, thus obtaining 660 mg of 2,7-bis[7-(4-methylphenyl)-9,9-dioctylfluorene-2-yl]-9,9-bis[3-ethoxycarbonyl-4-[2-[2-(2-methoxyethoxy)ethoxy]ethoxy]phenyl]-fluorene (polymer I).

The number average molecular weight in terms of polystyrene of the polymer I was $2.0 \times 10^3$. The polymer I is represented by Formula (T). Here, 2-(4,4,5,5-tetramethyl-1,2,3-dioxaborolan-2-yl)-9,9-dioctyl fluorene can be synthesized, for example, by a method described in "The Journal of Physical Chemistry B 2000, 104, 9118-9125".

[Chemical Formula 86]

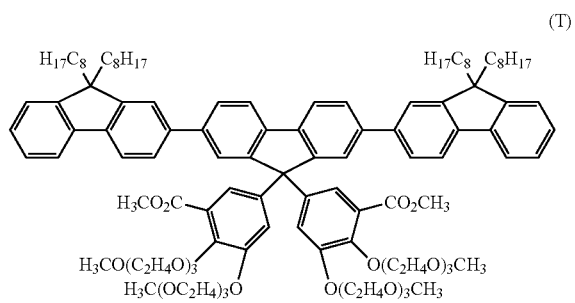

(T)

EXPERIMENT EXAMPLE 12

Synthesis of Cesium Salt of Polymer I

The polymer I (236 mg) was charged into a 100 mL flask and was purged with argon. Here, tetrahydrofuran (20 mL) and methanol (10 mL) were added and the temperature of the resultant reaction mixture was elevated to 65° C. Into the flask, an aqueous solution prepared by dissolving cesium hydroxide (240 mg) in water (2 mL) was added and the resultant reaction mixture was stirred at 65° C. for 7 hours. The resultant reaction mixture was cooled down to room temperature and therefrom, the reaction solvent was distilled off under reduced pressure. A generated solid was washed with water and was dried under reduced pressure, thus obtaining a light yellow solid (190 mg). By an NMR spectrum of the solid, it was confirmed that a signal ascribed to an ethyl group in the ethyl ester moiety disappeared completely. The obtained polymer I cesium salt is called a conjugated macromolecular compound 12. The conjugated macromolecular compound 12 is represented by Formula (U) ("the ratio of a structural unit containing one or more group(s) represented by Formula (3) and one or more group(s) selected from the group consisting of a group represented by Formula (1) and a group represented by Formula (2) in all structural units" and "the total ratio of the structural units represented by Formulae (13), (15), (17) and (20) in all structural units" are calculated by rounding off to one decimal place as 33.3% by mole). The orbital energy of HOMO and the orbital energy of LUMO of the conjugated macromolecular compound 12 were −5.6 eV and −2.8 eV, respectively.

[Chemical Formula 87]

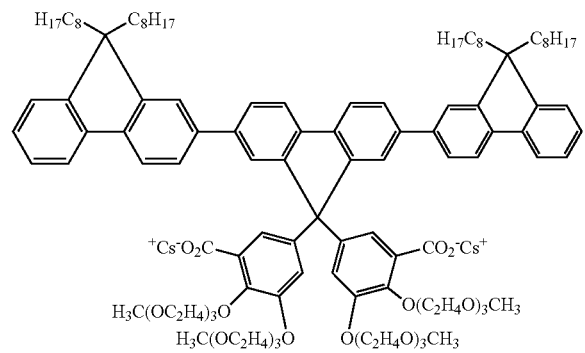

(U)

REFERENCE EXAMPLE 17

Synthesis of Compound E

In a nitrogen atmosphere, 2,7-dibromo-9-fluorenone (92.0 g, 272 mmol) and diethyl ether (3.7 L) were mixed and the resultant reaction mixture was cooled down to 0° C. Into the reaction mixture, a 1 mol/L methylmagnesium iodide-diethyl ether solution (0.5 L, 545 mmol) was dropped and the resultant reaction mixture was stirred for 3 hours. To the reaction mixture, an ammonium chloride aqueous solution was added and the aqueous phase was removed. The organic phase was dried over sodium sulfate anhydride and was concentrated under reduced pressure. The resultant crude product was purified by silica gel column chromatography, thus obtaining a compound E (92.81 g, 262 mmol, yield: 96%) represented by the formula below.

[Chemical Formula 88]

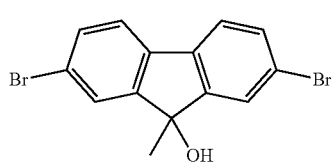

Compound E

Synthesis of Compound F

In a nitrogen atmosphere, the compound E (83.0 g, 234 mmol), p-toluenesulfonic acid monohydrate (4.49 g, 23.6 mmol), and chloroform (2.5 L) were refluxed for 1 hour. To the reaction mixture, an ammonium chloride aqueous solution was added and the aqueous phase was removed. The organic phase was dried over sodium sulfate anhydride and was concentrated under reduced pressure, thus obtaining a compound F (73.6 g, 219 mmol, yield: 93%) represented by the formula below.

[Chemical Formula 89]

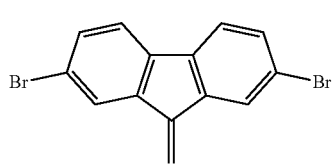

Compound F

Synthesis of Compound G

In a nitrogen atmosphere, the compound F (70.0 g, 208 mmol), ethyl salicylate (104 g, 625 mmol), mercaptoacetic acid (4.20 g, 45.6 mmol), and methanesulfonic acid (1214 g) were stirred at 70° C. for 8 hours. The reaction mixture was dropped into ice water and a deposited solid was filtered to be recovered, followed by washing the solid with methanol. The resultant crude product was purified by silica gel column chromatography, thus obtaining a compound G (52.14 g, 104 mmol, yield: 50%) represented by the formula below.

[Chemical Formula 90]

Compound G

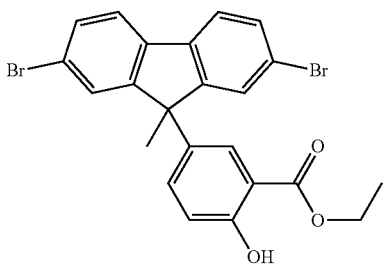

Synthesis of Compound H

In a nitrogen atmosphere, the compound G (41.2 g, 82.0 mmol), 2-[2-(2-methoxyethoxy)ethoxy]-ethyl-p-toluene sulfonate (75.8 g, 238 mmol), dimethylformamide (214 g), potassium carbonate (54.4 g, 394 mmol), and 18-crown-6 (4.68 g, 18 mmol) were stirred at 105° C. for 2 hours. The reaction mixture was charged into water and the resultant reaction mixture was extracted with ethyl acetate. The organic phase was dried over sodium sulfate anhydride and was concentrated under reduced pressure. The resultant crude product was purified by silica gel column chromatography, thus obtaining a compound H (40.2 g, 62.0 mmol, yield: 76%) represented by the formula below.

$^1$H NMR (400 MHz, CDCl$_3$, rt) δ (ppm) 1.37 (3H), 1.84 (3H), 3.36 (3H), 3.53 (2H), 3.58-3.79 (6H), 3.73 (2H), 4.12 (2H), 4.34 (2H), 6.80 (1H), 6.90 (1H), 7.28 (2H), 7.48 (2H), 7.58 (2H), 7.70 (1H).

[Chemical Formula 91]

Compound H

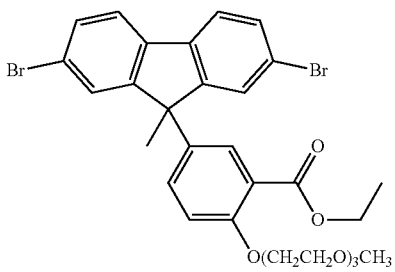

Synthesis of Compound I

In a nitrogen atmosphere, the compound H (28.4 g, 43.8 mmol), bis(pinacolato)diboron (24.30 g, 95.7 mol), [1,1'-bis(diphenylphosphino)ferrocene]palladium (II) dichloride dichlorometane adduct (0.35 g, 0.4 mmol), 1,1'-bis(diphenylphosphino)ferrocene (0.24 g, 0.4 mmol), potassium acetate (25.60 g, 260 mmol), and 1,4-dioxane (480 mL) were stirred at 120° C. for 17 hours. The reaction mixture was filtered and the filtrate was washed with ethyl acetate. The filtrate was concentrated under reduced pressure, was purified by silica gel column chromatography, and next was recrystallized to be purified, thus obtaining a compound I (18.22 g, 24.5 mmol, yield: 56%) represented by the formula below.

$^1$H NMR (400 MHz, CDCl$_3$, rt) δ (ppm) 1.30-1.47 (27H), 1.88 (3H), 3.35 (3H), 3.53 (2H), 3.60-3.69 (4H), 3.73 (2H), 3.84 (2H), 4.10 (2H), 4.34 (2H), 6.74 (1H), 6.87 (1H), 7.58 (2H), 7.72-7.89 (5H).

[Chemical Formula 92]

Compound I

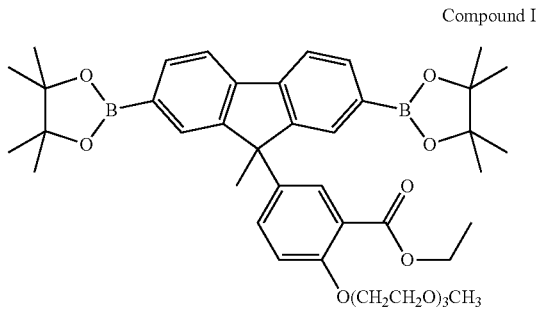

Synthesis of Polymer J

In an argon atmosphere, the compound H (0.47 g), the compound I (0.48 g), dichlorobis(triphenylphosphine) palladium (0.6 mg), tetrabutylammonium bromide (6 mg), toluene (6 mL), and a 2 mol/L sodium carbonate aqueous solution (2 mL) were stirred at 105° C. for 6 hours. Next, phenylboronic acid (35 mg) was added and the resultant reaction mixture was stirred at 105° C. for 14 hours. To the reaction mixture, sodium diethyldithiocarbamate trihydrate (0.65 g) and water (13 mL) were added and the resultant reaction mixture was stirred at 80° C. for 2 hours. The reaction mixture was dropped into methanol and a deposit was filtered to be recovered, followed by drying the recovered deposit. The resultant solid was dissolved in chloroform and was purified by alumina column chromatography and silica gel column chromatography. The resultant eluent was dropped into methanol and a deposit was filtered to be recovered. The recovered deposit was dried, thus obtaining a polymer J (0.57 g).

The number average molecular weight in terms of polystyrene of the polymer J was 2.0×10$^4$. The polymer J contains a structural unit represented by Formula (V).

[Chemical Formula 93]

(V)

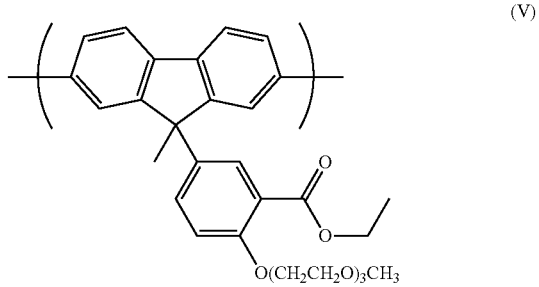

EXPERIMENT EXAMPLE 13

Synthesis of Cesium Salt of Polymer J

In an argon atmosphere, the polymer J (0.20 g), THF (18 mL), methanol (9 mL), cesium hydroxide monohydrate (97 mg), and water (1 mL) were stirred at 65° C. for 2 hours. Next, methanol (52 mL) was added and the resultant reaction mixture was stirred at 65° C. for 6 hours. The reaction mixture was concentrated and dried. To the resultant solid, methanol was added and the resultant reaction mixture was filtered, followed by dropping the filtrate into isopropanol. The solid was filtered to be recovered and was dried, thus obtaining a polymer J cesium salt (0.20 g). The obtained polymer J cesium salt is called a conjugated macromolecular compound 13. The conjugated macromolecular compound 13 contains a structural unit represented by Formula (W).

[Chemical Formula 94]

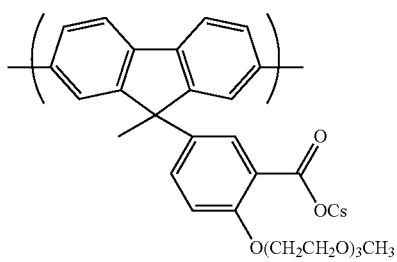

(W)

The orbital energy of HOMO and the orbital energy of LUMO of the conjugated macromolecular compound 13 were −5.51 eV and −2.64 eV, respectively.

REFERENCE EXAMPLE 18

Synthesis of Compound J

In a nitrogen stream, 2,7-dibromo-9,9-bis(3,4-dihydroxy)-fluorene (138.4 g), 2-[2-(2-methoxyethoxy)ethoxy]-ethyl-p-toluene sulfonate (408.6 g), potassium carbonate (358.5 g), and acetonitrile (2.5 L) were mixed and the resultant reaction mixture was heated-refluxed for 3 hours. The reaction mixture was left to be cooled down and was filtered. The resultant filtrate was concentrated under reduced pressure. The resultant crude product was purified by silica gel column chromatography, thus obtaining a compound J (109.4 g) represented by the formula below.

[Chemical Formula 95]

Compound J

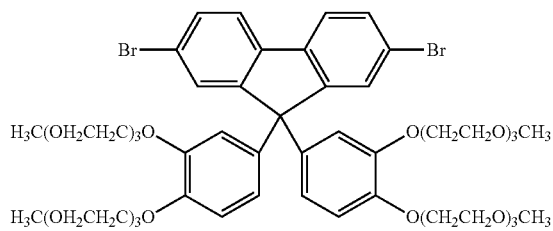

Synthesis of Compound K

In a nitrogen atmosphere, the compound J (101.2 g), bis (pinacolato)diboron (53.1 g), [1,1'-bis(diphenylphosphino) ferrocene]dichloropalladium (II) dichlorometane complex (3.7 g), 1,1'-bis(diphenylphosphino)ferrocene (5.4 g), potassium acetate (90.6 g), and dioxane (900 mL) were mixed and the resultant reaction mixture was heated to 110° C. and was heated-refluxed for 8 hours. The reaction mixture was left to be cooled down and was filtered. The resultant filtrate was concentrated under reduced pressure. The resultant crude product was purified by silica gel column chromatography, thus obtaining a compound K (51.4 g) represented by the formula below.

[Chemical Formula 96]

Compound K

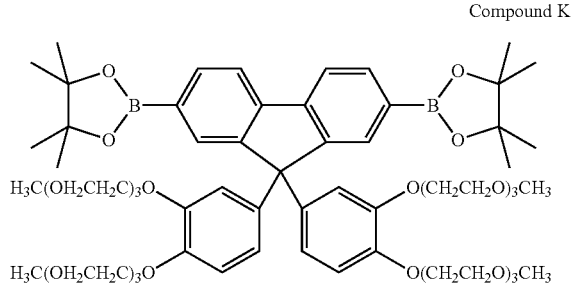

Synthesis of Polymer K

The compound K (0.715 g), the compound J (0.426 g), aliquot 336 (6.60 mg), bis(triphenylphosphine) dichloropalladium (0.460 mg), a 2 mol/L sodium carbonate aqueous solution (10 mL), and toluene (20 mL) were mixed and the resultant reaction mixture was stirred at 105° C. for 5 hours. Next, to the reaction mixture, phenylboronic acid (32 mg) was added and the resultant reaction mixture was stirred at 105° C. for 6 hours. To the reaction mixture, sodium diethyldithiocarbamate trihydrate (0.72 g) and water (14 mL) were added and the resultant reaction mixture was stirred at 80° C. for 2 hours. The reaction mixture was dropped into methanol and a deposit was filtered to be recovered, followed by drying the recovered deposit. The resultant solid was dissolved in chloroform and was purified by alumina column chromatography and silica gel column chromatography. The resultant eluent was concentrated and dried. The concentrate was dissolved in toluene and the resultant solution was dropped into methanol. The resultant deposit was filtered to be recovered. The recovered deposit was dried, thus obtaining a polymer K (0.55 g).

The number average molecular weight in terms of polystyrene of the polymer K was $2.3 \times 10^4$. The polymer K contains a structural unit represented by Formula (X) below.

[Chemical Formula 97]

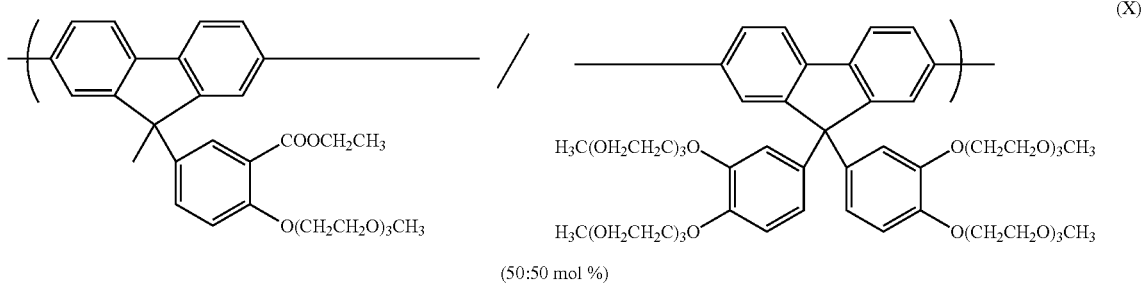

(50:50 mol %)

EXPERIMENT EXAMPLE 14

Synthesis of Cesium Salt of Polymer K

In an argon atmosphere, the polymer K (0.15 g), THF (20 mL), methanol (10 mL), cesium hydroxide monohydrate (103 mg), and water (1 mL) were stirred at 65° C. for 2 hours. Next, methanol (20 mL) was added and the resultant reaction mixture was stirred at 65° C. for 2 hours. The reaction mixture was concentrated and dried. To the resultant solid, methanol was added and the resultant reaction mixture was filtered. The resultant filtrate was concentrated and was dried. The resultant solid was washed with water and was dried, thus obtaining a polymer K cesium salt (0.14 g). The obtained polymer K cesium salt is called a conjugated macromolecular compound 14. The conjugated macromolecular compound 14 contains a structural unit represented by Formula (Y).

[Chemical Formula 98]

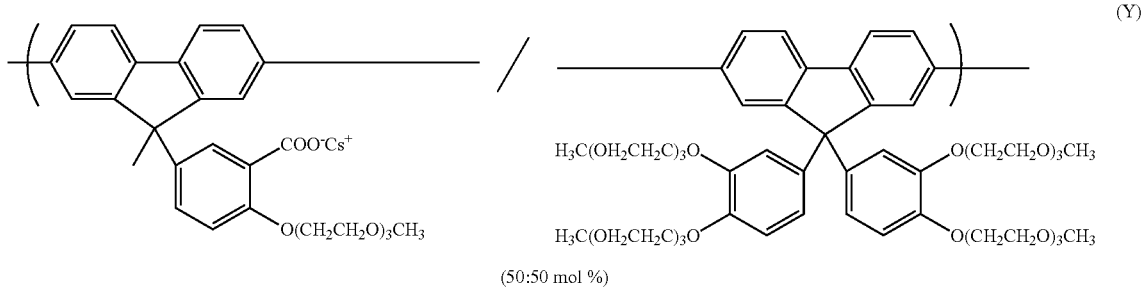

(50:50 mol %)

The orbital energy of HOMO and the orbital energy of LUMO of the conjugated macromolecular compound 14 were −5.56 eV and −2.67 eV, respectively.

REFERENCE EXAMPLE 19

Synthesis of Compound L

In a nitrogen atmosphere, 5-bromo-2-hydroxybenzoic acid (92.85 g), ethanol (1,140 mL), and concentrated sulfuric acid (45 mL) were refluxed for 48 hours and concentrated under reduced pressure. To the resultant reaction mixture, ethyl acetate (1,000 mL) was added. The resultant organic phase was washed with water and a 10% by weight sodium carbonate aqueous solution. The organic phase was dried over sodium sulfate anhydride and was concentrated under reduced pressure. The resultant crude product was purified by silica gel column chromatography, thus obtaining a compound L (95.38 g, yield: 91%) represented by the formula below.

[Chemical Formula 99]

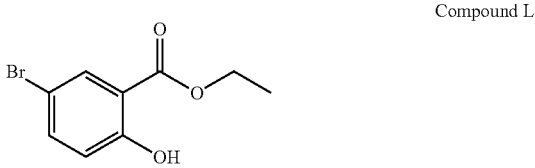

Compound L

Synthesis of Compound M

In a nitrogen atmosphere, the compound L (95.0 g), bis(pinacolato)diboron (108.5 g), [1,1'-bis(diphenylphosphino)ferrocene]palladium (II) dichloride dichlorometane adduct (3.3 g), 1,1'-bis(diphenylphosphino)ferrocene (2.2 g), potassium acetate (117.2 g), and 1,4-dioxane (1.3 L) were stirred at 105° C. for 22 hours. The reaction mixture was filtered and was washed with dioxane and toluene. The filtrate was concentrated under reduced pressure and thereto, ethyl acetate was added. The resultant reaction mixture was washed with saturated saline and the organic phase was dried over sodium sulfate anhydride and was concentrated under reduced pressure. The resultant crude product was purified by silica gel column chromatography, thus obtaining a compound M (90.1 g, 308 mmol) represented by the formula below.

[Chemical Formula 100]

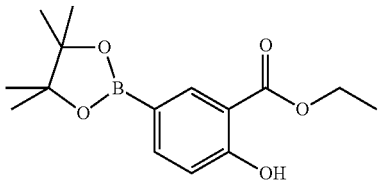

Compound M

Synthesis of Compound N

In a nitrogen atmosphere, 1,5-dihydroxynaphthalene (15.0 g), triethylamine (28.5 g), and chloroform (150 mL) were mixed and the resultant reaction mixture was cooled down to 0° C. Into the mixture, trifluoromethanesulfonic acid anhydride (68.7 g) was dropped and the resultant reaction mixture was stirred for 1 hour. To the reaction mixture, water and chloroform were added and the aqueous phase was removed. The organic phase was washed with water, was dried over sodium sulfate anhydride, and was concentrated under reduced pressure. The resultant solid was recrystallized to be purified, thus obtaining a compound N (31.46 g) represented by the formula below. In the formula below, Tf represents a trifluoromethylsulfonyl group.

[Chemical Formula 101]

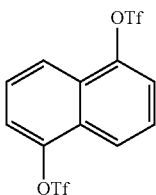

Compound N

Synthesis of Compound O

In a nitrogen atmosphere, the compound N (16.90 g), the compound M (23.30 g), tetrakis(triphenylphosphine)palladium (0) (4.60 g), potassium phosphate (42.30 g), and 1,2-dimethoxethane (340 mL) were mixed and the resultant reaction mixture was stirred at 80° C. for 14 hours. The reaction mixture was filtered and the resultant filtrate was washed with chloroform and methanol. The washed filtrate was concentrated under reduced pressure and The resultant crude product was purified by silica gel column chromatography, thus obtaining a compound O (8.85 g) represented by the formula below.

[Chemical Formula 102]

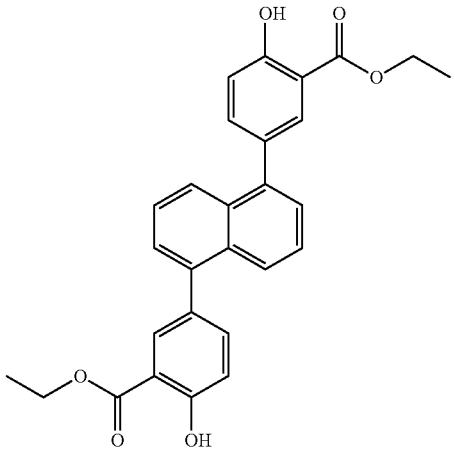

Compound O

Synthesis of Compound P

In a nitrogen atmosphere, the compound O (8.80 g), 2-[2-(2-methoxyethoxy)ethoxy]-ethyl-p-toluene sulfonate (12.52 g), dimethylformamide (380 mL), potassium carbonate (13.32 g), and 18-crown-6 (1.02 g) were stirred at 100° C. for 23 hours. The reaction mixture was charged into water and the resultant reaction mixture was extracted with ethyl acetate.

The organic phase was washed with a sodium chloride aqueous solution, was dried over sodium sulfate anhydride, and was concentrated under reduced pressure. The resultant crude product was purified by silica gel column chromatography, thus obtaining a compound P (7.38 g) represented by the formula below.

[Chemical Formula 105]

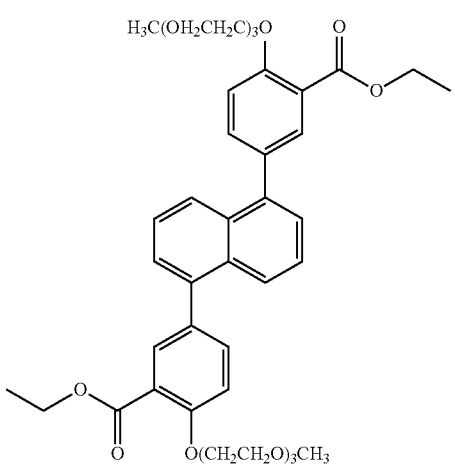

Compound P

Synthesis of Compound Q

In a nitrogen atmosphere, the compound P (5.53 g), bis(pinacolato)diboron (11.25 g), (1,5-cyclooctadiene)(methoxy) iridium (I) dimer (0.15 g, manufactured by Sigma Aldrich Corp.), 4,4'-di-tert-butyl-2,2'-dipyridyl (0.12 g, manufactured by Sigma Aldrich Corp.), and 1,4-dioxane (300 mL) were mixed and the resultant reaction mixture was stirred at 110° C. for 19 hours. The reaction mixture was concentrated under reduced pressure. The resultant crude product was purified by silica gel column chromatography and next, was purified by recrystallization, thus obtaining a compound Q (5.81 g) represented by the formula below.

$^1$H NMR (400 MHz, CDCl$_3$, rt) δ (ppm) 1.27-1.41 (30H), 3.39 (6H), 3.57 (4H), 3.66-3.75 (8H), 3.83 (4H), 3.99 (4H), 4.27-4.42 (8H), 7.13 (2H), 7.60 (2H), 7.76 (2H), 7.93 (2H), 8.30 (2H).

[Chemical Formula 104]

Compound Q

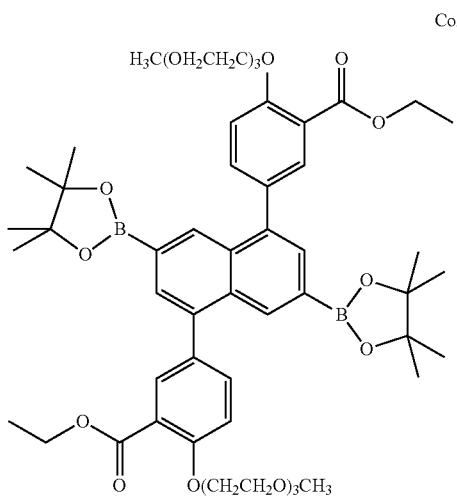

[Chemical Formula 105]

Synthesis of Polymer L

In an argon atmosphere, the compound J (0.53 g), the compound Q (0.43 g), dichlorobis(triphenylphosphine)palladium (0.3 mg), Aliquat 336 (5 mg, manufactured by Sigma Aldrich Corp.), toluene (12 mL), and a 2 mol/L sodium carbonate aqueous solution (1 mL) were stirred at 105° C. for 9 hours. Next, phenylboronic acid (23 mg) was added and the resultant reaction mixture was stirred at 105° C. for 14 hours. To the reaction mixture, sodium diethyldithiocarbamate trihydrate (0.40 g) and water (8 mL) were added and the resultant reaction mixture was stirred at 80° C. for 2 hours. The reaction mixture was dropped into methanol and the resultant deposit was filtered to be recovered and was dried. The resultant solid was dissolved in chloroform and the resultant solution was purified by alumina column chromatography and silica gel column chromatography, followed by dropping the resultant eluent into methanol. The deposit was filtered to be recovered and was dried, thus obtaining a polymer L (0.56 g).

The number average molecular weight in terms of polystyrene of the polymer L was 3.4×10$^4$. The polymer L contains a structural unit represented by Formula (Z) below.

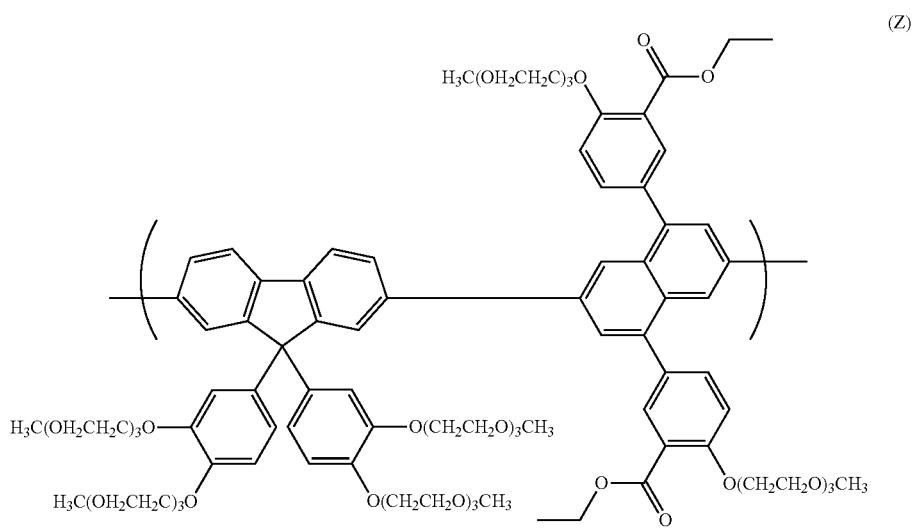

(Z)

EXPERIMENT EXAMPLE 15

Synthesis of Cesium Salt of Polymer L

In an argon atmosphere, the polymer L (0.25 g), THF (13 mL), methanol (6 mL), cesium hydroxide monohydrate (69 mg), and water (1 mL) were stirred at 65° C. for 6 hours. The resultant reaction mixture was concentrated and the concentrate was dropped into isopropanol, followed by filtering the resultant solid to be recovered and drying the recovered solid. To the resultant solid, methanol was added and the resultant reaction mixture was filtered. The resultant filtrate was dropped into isopropanol and the resultant solid was filtered to be recovered, followed by drying the recovered solid, thus obtaining a polymer L cesium salt (0.19 g). The obtained polymer L cesium salt is called a conjugated macromolecular compound 15. The conjugated macromolecular compound 15 contains a structural unit represented by Formula (AA) below.

[Chemical Formula 106]

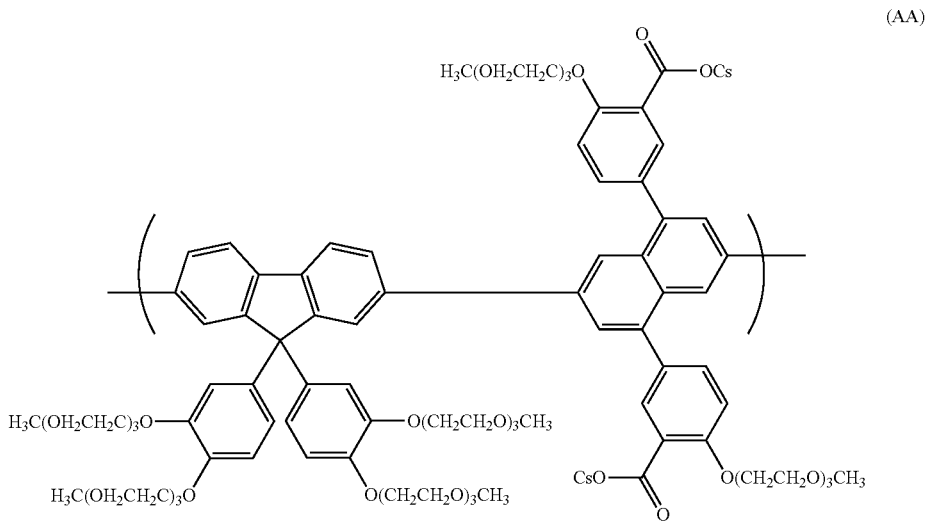

(AA)

The orbital energy of HOMO and the orbital energy of LUMO of the conjugated macromolecular compound 15 were −5.50 eV and −2.65 eV, respectively.

EXPERIMENT EXAMPLE 16

Methanol and the conjugated macromolecular compound 1 were mixed to obtain a composition containing 0.2% by weight of the conjugated macromolecular compound 1. Onto an ITO cathode (film thickness: 45 nm) that was prepared by forming a film and patterning on the surface of a glass substrate, the composition was applied in air by a spin coating method, thus obtaining a coating film having a film thickness of 10 nm. The substrate having the coating film provided thereon was heated in an inert atmosphere (nitrogen atmosphere) under normal pressure at 130° C. for 10 minutes to evaporate the solvent, and then the substrate was naturally cooled down to room temperature, thus obtaining the substrate in which the electron injection layer containing the conjugated macromolecular compound 1 was formed.

Next, a light-emitting macromolecular material (manufactured by Summation Co., Ltd.; "Lumation BP361") and xylene were mixed to obtain a composition for forming a light-emitting layer containing 1.4% by weight of a light-emitting macromolecular material. Onto the layer containing the conjugated macromolecular compound 1 of the thus-obtained substrate in which the layer containing the conjugated macromolecular compound 1 was formed, the composition for forming a light-emitting layer was applied in air by a spin coating method, thus obtaining a coating film having a film thickness of 80 nm. The substrate in which the coating film was provided was heated in an inert atmosphere (nitrogen atmosphere) at 130° C. for 15 minutes to evaporate the solvent, and then the substrate was naturally cooled down to room temperature, thus obtaining the substrate in which the light-emitting layer was formed.

Next, onto the light-emitting layer of the thus-obtained substrate in which the light-emitting layer was formed, a hole injection material solution was applied in air by a spin coating method, thus obtaining a coating film having a film thickness of 60 nm. The substrate in which the coating film was provided was heated in an inert atmosphere (nitrogen atmosphere) at 130° C. for 15 minutes to evaporate the solvent, and then the substrate was naturally cooled down to room temperature, thus obtaining the substrate in which the hole injection layer was formed. For the hole injection material solution, a PEDOT:PSS solution (poly(3,4-ethylenedioxythiophene-polystyrenesulfonic acid) (manufactured by Starck-V TECH Ltd.; trade name: "Baytron") was used.

The thus-obtained substrate in which the hole injection layer was formed was inserted into a vacuum apparatus and on the hole injection layer, an Au film was formed in a thickness of 80 nm by a vacuum deposition method to form the anode, thus manufacturing a layered structure 1.

The thus-obtained layered structure 1 was taken out of the vacuum apparatus and was sealed with a sealing glass through a two-fluid mixing type epoxy resin in an inert gas atmosphere (nitrogen atmosphere), thus obtaining the organic EL element 1.

To the thus-obtained organic EL element 1, a forward voltage of 10 V was applied to measure the light-emitting brightness and the light-emitting efficiency. The measurement results are shown in Table 1.

TABLE 1

|  | Light-emitting brightness (cd/m²) | Light-emitting efficiency (cd/A) |
|---|---|---|
| Organic EL element 1 | 3580 | 3.1 |

EXPERIMENT EXAMPLE 17

Manufacture of Dual-Sided Emission-Type Organic EL Element

By the same operation as in Experiment Example 16 except that the film thickness of Au was changed to 20 nm, a dual-sided emission-type organic EL element 2 was obtained.

To the dual-sided emission-type organic EL element 2, a forward voltage of 15 V was applied to measure the light-emitting brightness and the light-emitting efficiency. The measurement results are shown in Table 2.

TABLE 2

|  | Light-emitting brightness (cd/m²) | Light-emitting efficiency (cd/A) |
|---|---|---|
| Organic EL element 2 | Upper surface side: 1091<br>Lower surface side: 5341 | Upper surface side: 0.3<br>Lower surface side: 1.1 |

As shown in Tables 1 and 2, it was confirmed that an organic EL element of reverse stacking in which the electron injection layer was made by forming a film with the ionic polymer in air by an applying process could emit light.

EXPERIMENT EXAMPLE 18

A glass substrate on which an ITO thin film having a thickness of 50 nm was formed was prepared. The ITO thin film was formed by a sputtering method and corresponds to the anode. Onto the ITO thin film, a suspension of the macromolecular compound A was applied by a spin coating method, thus obtaining a coating film having a film thickness of 60 nm. The glass substrate having the thin film provided thereon was heated on a hot plate in the air atmosphere under normal pressure at 170° C. for 15 minutes to evaporate the solvent. Then, the glass substrate was naturally cooled down to room temperature, thus obtaining the glass substrate in which a hole injection layer containing the macromolecular compound A is formed.

Next, the macromolecular compound B was dissolved in xylene in a concentration of 0.8% by weight to obtain a xylene solution of the macromolecular compound B. This xylene solution of the macromolecular compound B was applied onto the hole injection layer in air by a spin coating method, thus obtaining a coating film for a hole transport layer having a film thickness of 20 nm. The glass substrate having the coating film for a hole transport layer provided thereon was retained in a nitrogen atmosphere where each of the oxygen concentration and the water concentration was controlled to 10 ppm or less in the volume ratio at 180° C. for 60 minutes to dry the coating film for the hole transport layer. Then, the glass substrate was naturally cooled down to room temperature, thus obtaining a glass substrate in which a hole injection layer (containing the macromolecular compound A) is formed on the surface of the glass substrate and a hole transport layer (containing the macromolecular compound B) is stacked on the hole injection layer.

Next, the macromolecular compound C was dissolved in xylene in a concentration of 1.3% by weight to obtain a xylene solution of the macromolecular compound C. This xylene solution of the macromolecular compound C was applied onto the hole transport layer in air by a spin coating method, thus obtaining a coating film for a light-emitting layer having a thickness of 80 nm. The glass substrate having the coating film for a light-emitting layer provided thereon was retained in a nitrogen atmosphere under the atmospheric pressure where each of the oxygen concentration and the water concentration was controlled to 10 ppm or less in the volume ratio at 170° C. for 10 minutes to dry the coating film for the light-emitting layer. Then, the glass substrate was naturally cooled down to room temperature, thus obtaining a glass substrate having a hole injection layer (containing the macromolecular compound A), a hole transport layer (containing the macromolecular compound B) and a light-emitting layer (containing the macromolecular compound C) sequentially stacked on the surface thereof.

Next, the conjugated macromolecular compound 1 was dissolved in methanol in a concentration of 0.2% by weight to obtain a methanol solution of the conjugated macromolecular compound 1. This methanol solution of the conjugated macromolecular compound 1 was applied onto the light-emitting layer in air by a spin coating method, thus obtaining a coating film for an electron injection layer having a film thickness of 6 nm. The glass substrate having the coating film for an electron injection layer provided thereon was retained in the air atmosphere at 130° C. for 10 minutes to dry the coating film for the electron injection layer. Then, the glass substrate was naturally cooled down to room temperature, thus obtaining a glass substrate having a hole injection layer (containing the macromolecular compound A), a hole transport layer (containing the macromolecular compound B), a light-emitting layer (containing the macromolecular compound C) and an electron injection layer (containing the conjugated macromolecular compound 1) sequentially stacked on the surface thereof.

Next, on the electron injection layer on the glass substrate, a cathode is formed by depositing aluminum in thickness of about 100 nm as a cathode material in a state where the pressure was reduced to $1.0 \times 10^{-4}$ Pa or less. Next, the layered side of the glass substrate having a hole injection layer (containing the macromolecular compound A), a hole transport layer (containing the macromolecular compound B), a light-emitting layer (containing the macromolecular compound C), and an electron injection layer (containing the conjugated macromolecular compound 1) sequentially stacked on the surface thereof was sealed using a glass substrate for sealing, thus obtaining an organic EL element 3.

EXPERIMENT EXAMPLE 19

In Experiment Example 19, the organic EL element was formed in the same manner as in Experiment Example 18 except that only heating temperature during the formation of the electron injection layer was changed. In order to omit an overlapped description, only the forming step of the electron injection layer is described below.

The conjugated macromolecular compound 1 was dissolved in methanol in a concentration of 0.2% by weight to obtain a methanol solution of the conjugated macromolecular compound 1. This methanol solution of the conjugated macromolecular compound 1 was applied onto the light-emitting layer by a spin coating method, thus obtaining a coating film for an electron injection layer having a film thickness of 6 nm. The glass substrate having the coating film for an electron injection layer provided thereon was retained in the air atmosphere at 170° C. for 10 minutes to dry the coating film for the electron injection layer. Then, the glass substrate was naturally cooled down to room temperature, thus obtaining a glass substrate having a hole injection layer (containing the macromolecular compound A), a hole transport layer (containing the macromolecular compound B), a light-emitting layer (containing the macromolecular compound C) and an electron injection layer (containing the conjugated macromolecular compound 1) sequentially stacked on the surface thereof.

EXPERIMENT EXAMPLE 20

In Experiment Example 20, the organic EL element was formed in the same manner as in Experiment Example 18 except that only heating time during the formation of the electron injection layer was changed. In order to omit an overlapped description, only the forming step of the electron injection layer is described below.

The conjugated macromolecular compound 1 was dissolved in methanol in a concentration of 0.2% by weight to obtain a methanol solution of the conjugated macromolecular compound 1. This methanol solution of the conjugated macromolecular compound 1 was applied onto the light-emitting layer by a spin coating method, thus obtaining a coating film for an electron injection layer having a film thickness of 6 nm. The glass substrate having the coating film for an electron injection layer provided thereon was retained in the air atmosphere at 130° C. for 30 minutes to dry the coating film for the electron injection layer. Then, the glass substrate was naturally cooled down to room temperature, thus obtaining a glass substrate having a hole injection layer (containing the macromolecular compound A), a hole transport layer (containing the macromolecular compound B), a light-emitting layer (containing the macromolecular compound C) and an electron injection layer (containing the conjugated macromolecular compound 1) sequentially stacked on the surface thereof.

EXPERIMENT EXAMPLE 21

In Experiment Example 21, the organic EL element was formed in the same manner as in Experiment Example 18 except that only heating time and heating time during the formation of the electron injection layer were changed. In order to omit an overlapped description, only the forming step of the electron injection layer is described below.

The conjugated macromolecular compound 1 was dissolved in methanol in a concentration of 0.2% by weight to obtain a methanol solution of the conjugated macromolecular compound 1. This methanol solution of the conjugated macromolecular compound 1 was applied onto the light-emitting layer by a spin coating method, thus obtaining a coating film for an electron injection layer having a film thickness of 6 nm. The glass substrate having the coating film for an electron injection layer provided thereon was retained in the air atmosphere at 150° C. for 30 minutes to dry the coating film for the electron injection layer. Then, the glass substrate was naturally cooled down to room temperature, thus obtaining a glass substrate having a hole injection layer (containing the macromolecular compound A), a hole transport layer (containing the macromolecular compound B), a light-emitting layer (containing the macromolecular compound C) and an electron injection layer (containing the conjugated macromolecular compound 1) sequentially stacked on the surface thereof.

EXPERIMENT EXAMPLE 22

In Experiment Example 22, the organic EL element was formed in the same manner as in Experiment Example 18 except that only atmosphere during the formation of the electron injection layer was changed. In order to omit an overlapped description, only the forming step of the electron injection layer is described below.

The conjugated macromolecular compound 1 was dissolved in methanol in a concentration of 0.2% by weight to obtain a methanol solution of the conjugated macromolecular compound 1. This methanol solution of the conjugated macromolecular compound 1 was applied onto the light-emitting layer by a spin coating method, thus obtaining a coating film for an electron injection layer having a film thickness of 6 nm. The glass substrate having the coating film for an electron injection layer provided thereon was retained under the atmospheric pressure in a nitrogen atmosphere where each of the oxygen concentration and the water concentration was controlled to 10 ppm or less in the volume ratio at 130° C. for 10 minutes to dry the coating film for the electron injection layer. Then, the glass substrate was naturally cooled down to room temperature, thus obtaining a glass substrate having a hole injection layer (containing the macromolecular compound A), a hole transport layer (containing the macromolecular compound B), a light-emitting layer (containing the macromolecular compound C) and an electron injection layer (containing the conjugated macromolecular compound 1) sequentially stacked on the surface thereof.

[Measurement of Half-life of Brightness]

The half-life of brightness of each of the organic EL elements manufactured in Experiment Examples 18 to 22 was measured. That is, the time until the brightness becomes 50% of an initial brightness when each organic EL element was driven at constant current (half-life of brightness: LT50), was measured. The initial brightness when the constant current-driving is initiated was set at 5,000 cd/m$^2$. The lifetime ratio of each organic EL element was calculated on the basis that the half-life of brightness of the organic EL element manufactured in Experiment Example 22 was assumed to be 1.0.

The measurement results are shown in Table 3 together with the conditions for drying the coating film for the electron injection layer (atmosphere for drying, drying temperature and drying time).

TABLE 3

| | Atmosphere for drying | Drying Temperature | Drying Time | Life ratio (LT50) |
|---|---|---|---|---|
| Experiment Example 18 | Air | 130° C. | 10 min | 1.2 |
| Experiment Example 19 | Air | 170° C. | 10 min | 1.2 |
| Experiment Example 20 | Air | 130° C. | 30 min | 1.5 |
| Experiment Example 21 | Air | 150° C. | 30 min | 1.5 |
| Experiment Example 22 | N$_2$ | 130° C. | 10 min | 1.0 |

As shown above (Table 3), it was confirmed that an organic EL element in which the electron injection layer was formed in a nitrogen atmosphere or in air could emit light. Furthermore, in the case where the atmosphere used for drying the coating film for the electron injection layer is air (Air), the half-life of brightness is enhanced more than in a nitrogen (N2) atmosphere.

The above ionic polymer used in the organic light-emitting device including the organic EL element of the present invention is excellent in injection property and transport property of electric charge and is stable in an atmosphere at around normal pressure. Furthermore, the ionic polymer is stable in air and can be easily dissolved in a solvent for forming a solution, so that the ionic polymer can be formed to a film in air by applying. Accordingly, the use of a layer comprising the ionic polymer for an electron injection layer of an organic EL element can provide a method for manufacturing the organic light-emitting device capable of reducing the manufacturing cost and capable of preventing the performance degradation of the organic EL element in the manufacturing process including a sealing step.

[Configuration of Organic EL Element]

First, the organic EL element used in the organic light-emitting device of the present invention will be described. The organic EL element used in the present invention comprises at least one light-emitting layer between electrodes consisting of a pair of anode and cathode and an electron injection layer between the light-emitting layer and the cathode. At least one of the anode and the cathode is transparent or translucent. The light-emitting layer comprises a low molecular organic light-emitting material and/or macromolecular organic light-emitting material. The electron injection layer comprises the above ionic polymer.

In the organic EL element, the layer other than the cathode, the anode and the light-emitting layer is classified broadly into a layer provided between the cathode and the light-emitting layer and a layer provided between the anode and the light-emitting layer.

Examples of the layer provided between the cathode and the light-emitting layer may include an electron transport layer and a hole block layer besides the electron injection layer.

For example, when only one layer is provided between the cathode and the light-emitting layer, such one layer is the electron injection layer. When two or more layers are provided between the cathode and the light-emitting layer, a layer contacted with the cathode is referred to as the electron injection layer and other layers are referred to as the electron transport layer.

The electron injection layer is a layer having function to improve electron injection efficiency from the cathode. The electron transport layer is a layer having function to improve electron injection from the electron injection layer or the electron transport layer closer to the cathode.

When the electron injection layer or the electron transport layer has function to block the transport of holes, such layer may be referred to as the hole block layer.

The function to block the transport of holes can be confirmed by, for example, preparing an element in which only hole current flows and confirming an effect of blocking holes based on the reduction of the current value.

Examples of the layer provided between the anode and the light-emitting layer may include a hole injection layer, a hole transport layer and an electron block layer.

When only one layer is provided between the anode and the light-emitting layer, such one layer is the hole injection layer.

When two or more layers are provided between the anode and the light-emitting layer, a layer contacted with the anode is referred to as the hole injection layer and other layers are referred to as the hole transport layer. The hole injection layer is a layer having function to improve hole injection efficiency from the cathode. The hole transport layer is a layer having function to improve hole injection from the hole injection layer or the hole transport layer closer to the anode. When the hole injection layer or the hole transport layer has function to block the transport of electrons, such layer may be referred to as the electron block layer.

The function to block the transport of electrons can be confirmed by, for example, preparing an element in which only electron current flows and confirming an effect of blocking electrons based on the reduction of the current value.

The organic EL element used in the organic light-emitting device of the present invention may further comprise, besides the electron injection layer between the cathode and the light-emitting layer, one or more layer(s) selected from the group consisting of the electron transport layer between the cathode and the light-emitting layer, the hole transport layer between the anode and the light-emitting layer, and the hole injection layer between the anode and the light-emitting layer.

Examples of the structure of the organic EL element used for the organic light-emitting device of the present invention may include a) to f) below.

a) Anode/light-emitting layer/electron injection layer/cathode
b) Anode/hole injection layer/light-emitting layer/electron injection layer/cathode
c) Anode/hole injection layer/hole transport layer/light-emitting layer/electron injection layer/cathode
d) Anode/hole injection layer/light-emitting layer/electron transport layer/electron injection layer/cathode
e) Anode/light-emitting layer/electron transport layer/electron injection layer/cathode
f) Anode/hole injection layer/hole transport layer/light-emitting layer/electron transport layer/electron injection layer/cathode (The symbol "/" indicates that the layers are stacked adjacent to each other, the same shall apply hereinafter.)

The order and the number of layers to be stacked and the thickness of each layer may be determined appropriately by taking into consideration the light-emitting efficiency, the element life and the driving voltage.

In the method for manufacturing the organic light-emitting device of the present invention, the organic EL element formed on the supporting substrate has, for example, any one of the structure of the above a) to f), and comprises an electron injection layer that is a layer made by forming a film with a solution containing the above-mentioned ionic polymer.

[Method for Manufacturing Organic Light-Emitting Device (First Embodiment)]

Next, a first embodiment of the method for manufacturing the organic light-emitting device according to the present invention will be described with reference to FIG. 1.

The method for manufacturing the organic light-emitting device according to the present invention comprises the steps of: preparing a supporting substrate 1 having an organic EL element 2 formed thereon, the organic EL element 2 comprising an anode, a light-emitting layer, an electron injection layer made by forming a film with a solution containing the ionic polymer, and a cathode; and laminating the supporting substrate 1 and a sealing member 3 to one another through the organic EL element.

In the step of preparing the supporting substrate 1, the stacking order of each layer of the organic EL element 2 formed on the supporting substrate 1 is usually initiated with the stacking of the anode, and then the organic layers such as a light-emitting layer and an electron injection layer prepared by forming a film with a solution containing the ionic polymer are sequentially stacked, and finally the cathode is formed (hereinafter, such a stacking order is also referred to as order stacking). It is also possible to form the organic EL element 2 on the supporting substrate 1 by a reverse stacking order (also referred to as reverse stacking) from the order stacking. In a forming process of the organic EL element 2 by any stacking order, firstly, the supporting substrate 1 in which an anode or a cathode is patterned as an electrode is prepared. Then, the organic layers such as a light-emitting layer and an electron injection layer prepared by forming a film with a solution containing the ionic polymer are sequentially formed. Finally, a cathode or an anode is stacked as the opposite electrode.

When the organic layers are stacked in accordance with order stacking, a light-emitting layer is formed on an anode directly or formed on an anode through an organic layer such as a hole injection layer and a hole transport layer, and an electron injection layer is formed on the light-emitting layer directly or through an electron transport layer or the like. When the organic layers are stacked in accordance with reverse stacking: an electron injection layer is stacked on a cathode; a light-emitting layer is formed on the electron injection layer directly or through an electron transport layer or the like; and an organic layer such as a hole transport layer and a hole injection layer is formed on the light-emitting layer. In the present invention, the organic layer other than an electron injection layer may be formed by a conventionally publicly known method using a conventionally publicly known material and such a method and such a material are not particularly limited.

(Method for Forming Electron Injection Layer)

Examples of the method for forming the electron injection layer may include a method of forming a film by using a solution containing the ionic polymer. The ionic polymer is stable in an atmosphere at around normal pressure, and even in air, so that the method of forming a film with a solution can be simply performed in air without using special equipment. When the method of forming a film with a solution is used, an electron injection layer can be formed by applying a solution containing the ionic polymer and by solidifying the applied thin film (coating film). The step of applying a solution can be performed in an atmosphere at around normal pressure, and even in air. From the viewpoint of simplicity of implementation, the step is preferably performed in air. The solidification of the coating film may be performed by natural drying, irradiating with light, heat-drying in an atmosphere at around normal pressure, heat-drying in air, vacuum-drying, or the like. Among them, from the viewpoint of simplicity of implementation, the solidification of the coating film is preferably performed by heat-drying in an atmosphere at around normal pressure or heat-drying in air, and further, from the viewpoint of lengthening the element life, the solidification of the coating film is preferably performed by heat-drying in air. When the coating film is solidified by heat-drying, although the heating temperature varies depending on the heating time, the temperature is usually around 50° C. to 250° C., preferably 60° C. to 200° C. When the coating film is solidified by heat-drying, although the heating time varies depending on the heating temperature, the time is usually around 5 minutes to 120 minutes, preferably 10 minutes to 60 minutes.

As the solvent used for such method of forming a film with a solution, the above-mentioned solvent having a solubility parameter of 9.3 or more except water is preferred.

Examples of the method of forming a film with a solution may include an applying method such as a spin coating method, a casting method, a microgravure printing method, a gravure printing method, a bar coating method, a roll coating method, a wire bar coating method, a dip coating method, a slit coating method, a cap coating method, a spray coating method, a screen printing method, a flexo printing method, an offset printing method, an inkjet printing method and a nozzle coating method.

The film thickness of the electron injection layer is preferably adjusted to 1 nm to 1 μm.

FIG. 1 illustrates the case where one organic EL element 2 is formed on the supporting substrate 1. However, the number of organic EL element 2 formed on the supporting substrate 1 may be one or may be two or more according to the purpose. The emission color of the organic EL element 2 may be, according to the purpose, monochromatic or multicolor.

After the supporting substrate 1 having the organic EL element 2 formed thereon is prepared as described above, the supporting substrate 1 and the sealing member 3 are positioned so as to face each other with interposing the organic EL element therebetween, and the sealing member 3 and the supporting substrate 1 are laminated to one another using an adhesive member 4 so as to seal the organic EL element, as illustrated in FIG. 1. The adhesive member 4 is formed on the sealing member 3 in such a shape and size that the adhesive member 4 surrounds the organic EL element 2. Although the adhesive member 4 is formed on the sealing member 3 in this embodiment, the adhesive member 4 may be formed on the supporting substrate 1.

For the adhesive member 4, a curable resin adhesive or a fritted glass sealant may be used.

For the curable resin adhesive, a thermocurable resin adhesive or a photocurable resin adhesive may be used.

Examples of the thermocurable resin adhesive may include an epoxy-based adhesive and an acrylate-based adhesive.

Examples of the epoxy-based adhesive may include a bisphenol A-type epoxy resin adhesive, a bisphenol F-type epoxy resin adhesive and a phenoxy resin adhesive.

Examples of the acrylate-based adhesive may include a polymer prepared by copolymerizing a main component such as acrylic acid, methacrylic acid, ethyl acrylate, butyl acrylate, 2-hexyl acrylate, acrylamide, acrylonitrile and hydroxyacrylate with a monomer copolymerizable with the main component.

Examples of the photocurable resin adhesive may include a radical-based adhesive and a cation-based adhesive.

Examples of the radical-based adhesive may include an epoxy acrylate adhesive, an ester acrylate adhesive and an ester acrylate adhesive.

Examples of the cation-based adhesive may include an epoxy-based resin adhesive and a vinyl ether-based resin adhesive.

Examples of the fritted glass sealant may include a fritted glass sealant comprising a fritted glass such as a PbO—SnO—$P_2O_5$-based fritted glass, a Pb—B—Sn—Si—Al—O-based fritted glass and an Sn—P—Pb—O—F-based fritted glass, an organic binder, and an inorganic desiccant.

Specific examples of the fritted glass may include $B_2O_3$—PbO, $B_2O_3$—PbO—ZnO, $B_2O_3$—$SiO_2$—PbO, $B_2O_3$—$SiO_2$—ZnO, PbO—ZnO, PbO—SnO, $Pb_2O_5$—SnO, $P_2O_5$—ZnO—SnO and $B_2O_3$—$Bi_2O_3$.

Examples of the organic binder (solvent or dispersion medium for dissolving or dispersing the fritted glass or the inorganic absorbent) may include a vinyl chloride-based resin, a phenol-based resin, a silicone-based resin, an epoxy-based resin, a polyester-based resin, an urethane-based resin, an acrylic resin, an olefin-based resin, a fluorinated resin, a silicon-based resin and a cellulose-based resin.

Examples of the olefin-based resin may include tetrafluoroethylene.

Examples of the acrylic resin may include polymethyl acrylate.

Examples of the inorganic absorbent may include calcium oxide, barium oxide, strontium oxide, phosphorus pentaoxide and a synthetic zeolite.

(Laminating Method Using Curable Resin Adhesive)

Figure 2:
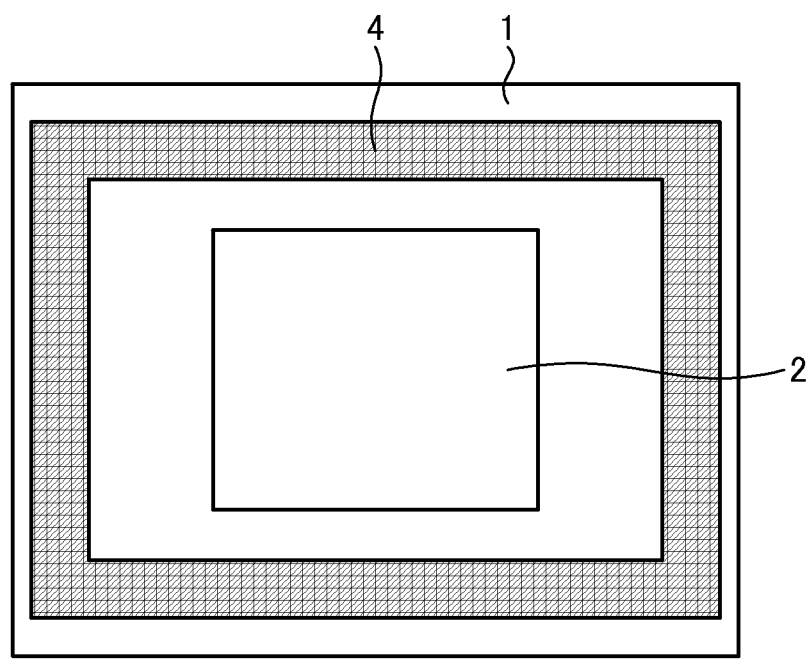
FIG. 2 is a plane block diagram of the organic light-emitting device along II-II line in FIG. 1.

As the adhesive member 4, any one of the above curable resin adhesives is applied onto a corresponding surface of the sealing member 3 and/or the supporting substrate 1. The application is performed, as illustrated in FIG. 2, by adjusting the adhesive member 4 into a shape and size capable of surrounding the organic EL element 2 after lamination. The solvent of the applied curable resin adhesive is evaporated to enhance the shape stability and the mechanical strength of the adhesive member 4, and then the supporting substrate 1 and the sealing member 3 are contacted with each other through the curable resin adhesive. And then, the curable resin adhesive is cured by heating the curable resin adhesive if the curable resin adhesive is a thermocurable resin adhesive, or by irradiating the curable resin adhesive with an actinic ray such as an ultraviolet ray if the curable resin adhesive is a photocurable resin adhesive. With the above operations, the organic EL element 2 on the supporting substrate 1 is sealed with the supporting substrate 1, the sealing member 3 and the adhesive member (curable resin adhesive) 4, so that the organic EL element 2 is protected from the external environment.

The heating temperature and time for curing the thermocurable resin adhesive may be determined according to a publicly known heating temperature and time recommended for the selected thermocurable resin adhesive.

The type and the irradiating time of the actinic ray for curing the photocurable resin adhesive may be determined according to a publicly known type and irradiating time of the actinic ray recommended for the selected photocurable resin adhesive.

Examples of the applying method of the curable resin adhesive may include an applying method using a dispenser and an applying method using a printing means such as screen printing.

(Laminating Method Using Fritted Glass Sealant)

As the adhesive member 4, the fritted glass sealant is applied onto a corresponding surface of the sealing member 3 and/or the supporting substrate 1. The application is performed, as illustrated in FIG. 2, by adjusting the adhesive member 4 into a shape and size capable of surrounding the organic EL element 2 after lamination. The applied fritted glass sealant is provisionally baked to vaporize the solvent, and then the supporting substrate 1 and the sealing member 3 are contacted with each other through the fritted glass sealant. And then, the fritted glass sealant is irradiated with laser light to melt the fritted glass sealant once. Then, the fritted glass sealant is cooled down to solidify the fritted glass sealant. With the above operations, the organic EL element 2 on the supporting substrate 1 is sealed with the supporting substrate 1, the sealing member 3 and the adhesive member (fritted glass sealant) 4, so that the organic EL element 2 is protected from the external environment.

Examples of the applying method of the fritted glass sealant may include an applying method using a dispenser and an applying method using a printing means such as screen printing.

Examples of the laser light used for melting the fritted glass sealant may include a YAG laser, a $CO_2$ laser and an excimer laser. In the melting of the fritted glass sealant by the laser light, it is important that light having a wavelength corresponding to each laser light is absorbed by the fritted glass sealant, which is the adhesive member 4, or the supporting substrate 1 and/or the sealing member 3 to generate heat and the fritted glass sealant is molten by the generated heat. Therefore, the selection of the material for the supporting substrate 1, the sealing member 3 and the fritted glass sealant and the selection of the laser light are performed. For example, when the fritted glass sealant absorbs laser light having a given wavelength, the fritted glass sealant itself is molten. When the sealing member 3 absorbs laser light having a given wavelength, the sealing member 3 generates heat and the fritted glass sealant is molten by the heat. When the supporting substrate 1 absorbs laser light having a given wavelength, the supporting substrate 1 generates heat and the fritted glass sealant is molten by the heat. Accordingly, from the viewpoint of the laminating process, all of the laser light, the fritted glass sealant, the supporting substrate 1, and the sealing member 3 are not particularly limited.

Figure 3:
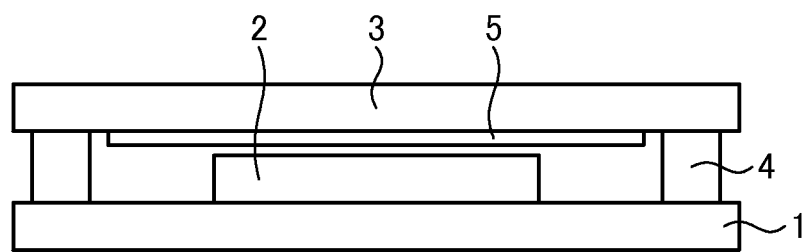
FIG. 3 is a sectional side block diagram illustrating a variant of the first embodiment of the organic light-emitting device according to the present invention.

In the first embodiment illustrated in FIG. 1, a space is formed between the supporting substrate 1 on which the organic EL element 2 is formed and the sealing member 3. Therefore, when the laminating process is performed in air, the air atmosphere remains in the space. The laminating process may be performed in an inert gas atmosphere such as a nitrogen gas atmosphere and an argon gas atmosphere. In a conventional organic EL element, the electron injection layer is made of a material unstable in air. On the contrary, in the present invention, the electron injection layer of the organic EL element is made of the ionic polymer that is stable in air. Accordingly, even when the air atmosphere remains in the above space, the organic EL element 2 does not degrade. Nevertheless, for the organic EL element 2, an environment where oxygen and moisture are removed as much as possible is preferred. Therefore, as illustrated in FIG. 3, it is desired to laminate a getter agent 5 in a space between the supporting substrate 1 on which the organic EL element 2 is formed and the sealing member 3. In FIG. 3, although the getter agent 5 is laminated on the surface of the sealing member 3 in the space, the getter agent 5 may be laminated in another position as long as the position is within the space. Examples of the getter agent 5 may include a drying agent, an oxygen absorbent and a complex agent of these agents.

Examples of the drying agent may include a silica gel, a zeolite, an activated alumina, an alkali metal oxide and an alkaline earth metal oxide.

Examples of the oxygen absorbent may include pyrogallol and sodium dithionite ($Na_2S_2O_4$).

As more preferred sealed structures by considering a term that the inside of the organic light-emitting device is converted into an environment where oxygen and moisture are removed as much as possible, a second embodiment and a third embodiment are described below.

[Method for Manufacturing Organic Light-Emitting Device (Second Embodiment)]

Figure 4:
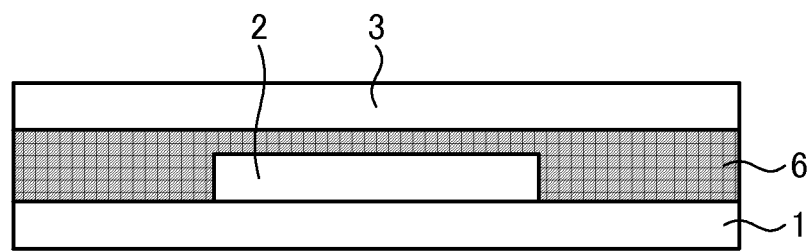
FIG. 4 is a sectional side block diagram illustrating a second embodiment of an organic light-emitting device according to the present invention.
Figure 5:
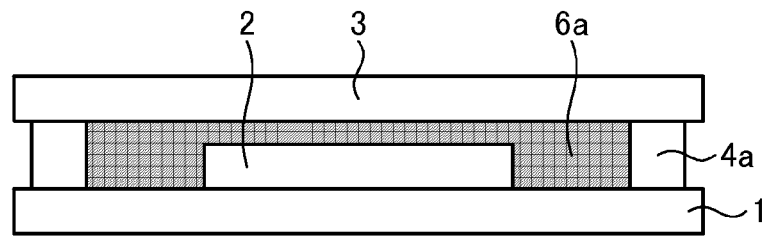
FIG. 5 is a sectional side block diagram illustrating a third embodiment of an organic light-emitting device according to the present invention.

After the supporting substrate 1 having the organic EL element 2 formed thereon is prepared, an adhesive member 6 is stacked on the whole surface of the supporting substrate 1 so as to cover the organic EL element 2, as illustrated in FIG. 4. For the adhesive member 6, curable resin adhesives exemplified in the first embodiment may be used. Particularly, it is preferred to select a material excellent in both of air tightness and filling characteristic. Since the adhesive member 6 is subjected to the stacking process in which the adhesive member 6 is brought into direct contact with the organic EL element 2 and the curing process of the adhesive member 6, it is more preferable that a photocurable resin adhesive which does not damage the organic EL element 2 by heat is used for the adhesive member 6.

Examples of the stacking method of the curable resin adhesive may include an applying method using a dispenser and an applying method using a printing means such as screen printing.

After the curable resin adhesive is stacked, the sealing member 3 is contacted with the curable resin adhesive layer on the supporting substrate 1. And then, the curable resin adhesive is cured by heating the curable resin adhesive if the curable resin adhesive is a thermocurable resin adhesive, or by irradiating the curable resin adhesive with an actinic ray if the curable resin adhesive is a photocurable resin adhesive. With the above operations, the organic EL element 2 on the supporting substrate 1 is sealed with the supporting substrate 1, the sealing member 3 and the adhesive member (curable resin adhesive) 6, so that the organic EL element 2 is protected from the external environment.

[Method for Manufacturing Organic Light-Emitting Device (Third Embodiment)]

After the supporting substrate 1 having the organic EL element 2 formed thereon is prepared, an adhesive member 4*a* is formed along the peripheral line of the supporting substrate 4 so that the adhesive member 4*a* surrounds the organic EL element on the supporting substrate 1.

For the adhesive member 4*a*, a curable resin adhesive or a fritted glass sealant may be used. Particularly, the adhesive member 4*a* preferably comprises a material more excellent in air tight characteristic. More preferably, the adhesive member 4*a* comprises a fritted glass sealant.

The adhesive member 4*a* is formed by applying as in the case in the first embodiment, and then the solvent is evaporated to enhance the shape stability and the mechanical strength of the adhesive member 4*a*.

Next, in a region surrounded by the adhesive member 4*a*, an adhesive member 6*a* is filled. By this filling, the whole organic EL element 2 is covered by the adhesive member 6*a*. For the adhesive member 6*a*, the curable resin adhesives exemplified in the first embodiment may be used. In this embodiment, the curable resin adhesive used for the adhesive member 6*a* has the main purpose of filling the space, so that the adhesive member 6*a* can be selected by preferentially considering the filling characteristic.

Examples of the method for forming the adhesive member 4*a* and the adhesive member 6*a* may include an applying method using a dispenser and an applying method using a printing means such as screen printing.

After the adhesive members 4*a*, 6*a* are formed as described above, the sealing member 3 is contacted with the adhesive members 4*a*, 6*a* on the supporting substrate 1. And then, the adhesive members 4*a*, 6*a* are simultaneously cured by heating the adhesive members 4*a*, 6*a* if both of the adhesive member 4*a* and adhesive member 6*a* are thermocurable resin adhesives, or by irradiating the adhesive members 4*a*, 6*a* with an actinic ray if both of the adhesive members 4*a*, 6*a* are photocurable resin adhesives. When the adhesive member 4*a* and the adhesive member 6*a* are made of materials different from each other, any one of them is cured formerly, and then another adhesive member is cured. The method for curing each material is the same as in the case in the first embodiment and the second embodiment described above.

With the above operations, the organic EL element 2 on the supporting substrate 1 is sealed with the supporting substrate 1, the sealing member 3 and the adhesive members (curable resin adhesives) 4*a*, 6*a*, so that the organic EL element 2 is protected from the external environment.

[Method for Manufacturing Organic Light-Emitting Device (Fourth Embodiment)]

Any of the above first embodiment, second embodiment and third embodiment is an embodiment on the assumption of the case where the supporting substrate 1 and the sealing member 3 are provided as sheets. In a fourth embodiment described below, a first belt-shaped flexible substrate is used as the supporting substrate and a second belt-shaped flexible substrate is used as the sealing member. Then, in a state where the second belt-shaped flexible substrate is contacted with the organic EL element on the first belt-shaped flexible substrate, the first belt-shaped flexible substrate and the second belt-shaped flexible substrate are passed through between two laminating rolls to laminate the first belt-shaped flexible substrate and the second belt-shaped flexible substrate to one another. For the sealing member, the second belt-shaped flexible substrate having a barrier film formed on the surface thereof is preferably used. Hereinafter, examples in which the second belt-shaped flexible substrate having a barrier film formed on the surface thereof is used for the sealing member will be described. Examples of the barrier film may include a thin film made of silicon oxide, silicon nitride, or the like. According to the laminating process of the fourth embodiment, numbers of organic light-emitting devices can be continuously manufactured. The laminating process is described in detail with reference to FIG. 6 below.

Figure 6:
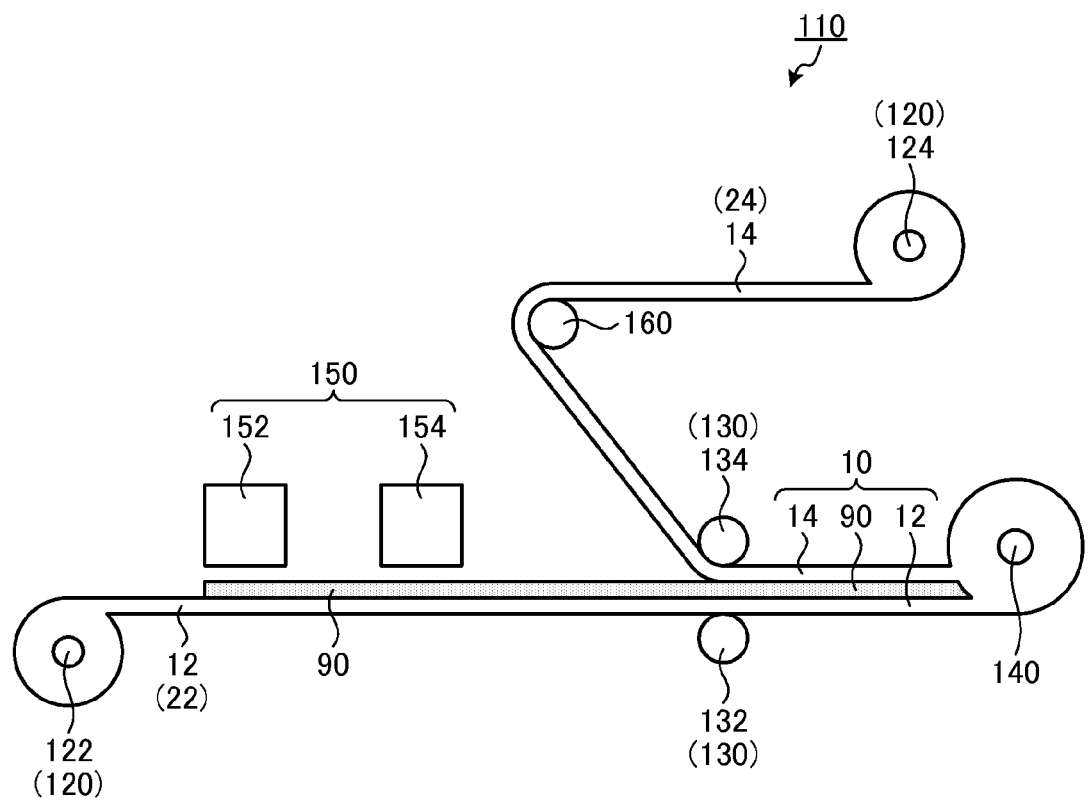
FIG. 6 is a schematic block diagram illustrating one example of a manufacturing device used in a fourth embodiment of an organic light-emitting device according to the present invention.

FIG. 6 is a schematic view illustrating a configuration example of the continuously laminating device capable of being preferably used in the above laminating process.

As illustrated in FIG. 6, a continuously laminating device 110 comprises: two unwinding rolls 120 including a first unwinding roll 122 and a second unwinding roll 124; one set of laminating rolls 130 consisting of a first laminating roll 132 and a second laminating roll 134; and a winding roll 140 for winding up the laminated film structure.

A first belt-shaped flexible substrate 12 is wound up on the first unwinding roll 122. On the surface of one side of the first belt-shaped flexible substrate 12, a plurality of organic EL elements (not illustrated in FIG. 6) are formed with a given interval.

A second belt-shaped flexible substrate 14 having a barrier film (not illustrated in FIG. 6) on the surface thereof is wound up on the second unwinding roll 124.

The first unwinding roll 122 and the second unwinding roll 124 are positioned so as to be apart from each other. The laminating rolls 130 are positioned so as to be capable of laminating the first belt-shaped flexible substrate 12 wound off from the first unwinding roll 122 and the second belt-shaped flexible substrate 14 wound off from the second unwinding roll 124 to one another. The laminating rolls 130 may be positioned in such a manner that for example, the first laminating roll 132 is fixed as a fixed roll and the second laminating roll 134 is positioned as a movable roll so that the surfaces to be contacted with each other of the first belt-shaped flexible substrate 12 and the second belt-shaped flexible substrate 14 faces to each other.

In the vicinity of a conveying route of the first belt-shaped flexible substrate 12 from the first unwinding roll 122 up to the laminating rolls 130, there are provided an applying device 152 that applies an adhesive member 90 for laminating onto the surface (in a side where the organic EL element is formed) of the first belt-shaped flexible substrate 12 on the way of conveying, and a drying device 154 that vaporizes the solvent contained in the adhesive member 90 applied onto the first belt-shaped flexible substrate 12. In the vicinity of a conveying route of the second belt-shaped flexible substrate 14 from the second unwinding roll 124 up to the laminating rolls 130, there may be provided one or more assistant roll(s) 160 for assisting the conveying of the second belt-shaped flexible substrate 14 or changing the conveying direction of the second belt-shaped flexible substrate 14, and the like. The adhesive member 90 comprises the thermocurable resin adhesive or the photocurable resin adhesive described above and is applied onto the belt-shaped flexible substrate 12, for example, in the same shape and size as those of the adhesive member 4 illustrated in the first embodiment.

For the unwinding rolls 120, the laminating rolls 130, the winding roll 140, the treating devices 150 and the assistant roll 160 included in the continuously laminating device 110, an arbitral suitable configuration which has conventionally been publicly known may be employed.

(Laminating Step)

The first belt-shaped flexible substrate 12 wound up on the first unwinding roll 122 and the second belt-shaped flexible substrate 14 wound up on the second unwinding roll 24 are wound off and the first belt-shaped flexible substrate 12 and the second belt-shaped flexible substrate 14 are sandwiched between the first laminating roll 132 and the second laminating roll 134 facing the first laminating roll 132 to be continuously laminated to one another, thus preparing an elongated film structure. In the film structure, a plurality of organic light-emitting devices 10 are formed at given intervals in the longitudinal direction of the film. The elongated film structure is continuously rolled up on the winding roll 40 to be recovered. After the elongated film structure is recovered, if necessary, the elongated film structure can be cut into a sheet-shaped organic light-emitting device 10 to be used. The organic EL element in the film structure recovered in a roll shape is sealed with the first belt-shaped flexible substrate 12, the adhesive member 90 and the second belt-shaped flexible substrate 14, so that the organic EL element is not influenced by the external environment and can be preserved in air.

If the above steps are performed in a vacuum atmosphere, the whole continuously laminating device 110 is necessary to be retained in a vacuum atmosphere and in this case, the device configuration becomes complicated. On the contrary, according to the manufacturing method of the present invention capable of performing the above steps in an atmosphere at around normal pressure or in air, the organic light-emitting device can be simply manufactured.

The invention claimed is:

1. A method for manufacturing an organic light-emitting device, comprising the steps of:
preparing a supporting substrate having an organic electroluminescent element formed thereon, the organic electroluminescent element that comprises an anode, a light-emitting layer, an electron injection layer made by forming a film with a solution containing an ionic polymer, and a cathode; and
laminating the supporting substrate and a sealing member to one another so as to seal the organic electroluminescent element,
wherein the step of preparing the supporting substrate having the organic electroluminescent element formed thereon comprises applying the solution containing the ionic polymer and drying in an air atmosphere to form the electron injection layer.

2. The method for manufacturing the organic light-emitting device according to claim 1, wherein the step of laminating the supporting substrate and the sealing member to one another is performed in an atmosphere of normal pressure.

3. The method for manufacturing the organic light-emitting device according to claim 1, wherein, in the step of laminating the supporting substrate and the sealing member to one another, a curable resin adhesive is used as an adhesive member for laminating the supporting substrate and the sealing member to one another.

4. The method for manufacturing the organic light-emitting device according to claim 1, wherein, in the step of laminating the supporting substrate and the sealing member to one another, a fritted glass sealant is used as an adhesive member for laminating the supporting substrate and the sealing member to one another.

5. The method for manufacturing the organic light-emitting device according to claim 1, wherein
using a first belt-shaped flexible substrate as the supporting substrate, and a second belt-shaped flexible substrate as the sealing member, and
contacting the second belt-shaped flexible substrate with the organic electroluminescent element on the first belt-shaped flexible, and passing the first and second-shaped flexible substrates between two laminating rollers, thereby laminating the first and second belt-shaped flexible substrates to one another.

6. An organic light-emitting device manufactured by the method of claim 1.

7. The method for manufacturing the organic light-emitting device according to claim 1, wherein the ionic polymer comprises a structural unit containing one or more groups selected from the group consisting of: a group represented by Formula (1) below and a group represented by Formula (2) below:

$$-(Q^1)_{n1}-Y^1(M^1)_{a1}(Z^1)_{b1} \quad (1)$$

wherein
$Q^1$ represents a divalent organic group,
$Y^1$ represents $-CO_2^-$, $-SO_3^-$, $-SO_2^-$, $-PO_3^{2-}$ or $-B(R^a)_3^-$,
$M^1$ represents a metal cation or an ammonium cation optionally having a substituent,
$Z^1$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$,
n1 represents an integer of 0 or more,
a1 represents an integer of 1 or more and b1 represents an integer of 0 or more, with the proviso that a1 and b1 are selected so that an electric charge of the group represented by Formula (1) becomes 0, $R^a$ represents a $C_{1-30}$ alkyl group optionally having a substituent or a $C_{6-50}$ aryl group optionally having a substituent,
when $Q^1$ is plurally present, they may be the same as or different from each other,
when $M^1$ is plurally present, they may be the same as or different from each other, and
when $Z^1$ is plurally present, they may be the same as or different from each other; and

$$-(Q^2)_{n2}-Y^2(M^2)_{a2}(Z^2)_{b2} \quad (2)$$

wherein
$Q^2$ represents a divalent organic group,
$Y^2$ represents a carbo cation, an ammonium cation, a phosphonyl cation, a sulfonyl cation or an iodonium cation,
$M^2$ represents $F^-$, $Cl^-$, $Br^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$,
$Z^2$ represents a metal cation or an ammonium cation optionally having a substituent,
n2 represents an integer of 0 or more,
a2 represents an integer or 1 or more and b2 represents an integer of 0 or more, with the proviso that a2 and b2 are selected so that an electric charge of the group represented by Formula (2) becomes 0,
$R^b$ represents a $C_{1-30}$ alkyl group optionally having a substituent or a $C_{6-50}$ aryl group optionally having a substituent,
when $Q^2$ is plurally present, they may be the same as or different from each other,
when $M^2$ is plurally present, they may be the same as or different from each other, and
when $Z^2$ is plurally present, they may be the same as or different from each other.

* * * * *